US012648296B2

(12) United States Patent
Jung et al.

(10) Patent No.: US 12,648,296 B2
(45) Date of Patent: Jun. 2, 2026

(54) ORGANIC PHOTODIODE AND ELECTRONIC APPARATUS COMPRISING ORGANIC PHOTODIODE AND ORGANIC LIGHT-EMITTING DEVICE

(71) Applicant: Samsung Display Co., LTD., Yongin-si (KR)

(72) Inventors: Jinsoo Jung, Yongin-si (KR); Minsoo Choi, Yongin-si (KR); Seokgyu Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 294 days.

(21) Appl. No.: 18/320,076

(22) Filed: May 18, 2023

(65) Prior Publication Data

US 2024/0155864 A1 May 9, 2024

(30) Foreign Application Priority Data

Oct. 18, 2022 (KR) ........................ 10-2022-0134452

(51) Int. Cl.
*H10K 50/16* (2023.01)
*C09K 11/06* (2006.01)
(Continued)

(52) U.S. Cl.
CPC ............ *H10K 50/166* (2023.02); *C09K 11/06* (2013.01); *H10K 50/805* (2023.02); *H10K 59/35* (2023.02);
(Continued)

(58) Field of Classification Search
CPC .... H10K 50/166; H10K 50/805; H10K 59/35; H10K 85/633; H10K 85/654; H10K 85/621; H10K 85/657; H10K 85/6572; H10K 30/20; H10K 30/30; H10K 39/34; H10K 39/601; H10K 85/656; H10K 85/6574; H10K 50/11; H10K 50/15;
(Continued)

(56) References Cited

U.S. PATENT DOCUMENTS 10,367,157 B2 7/2019 Thompson et al.
10,410,037 B2 * 9/2019 He ........................ G06F 3/0412
(Continued)

FOREIGN PATENT DOCUMENTS

CN 112521404 A 3/2021
CN 113286761 A 8/2021
(Continued)

*Primary Examiner* — Caleb E Henry
(74) *Attorney, Agent, or Firm* — Womble Bond Dickinson (US) LLP

(57) ABSTRACT

Provided is an organic photodiode including a first electrode, a common electrode facing the first electrode, and a photoactive layer located between the first electrode and the common electrode, wherein the photoactive layer includes a donor layer and an acceptor layer, the donor layer includes a donor compound represented by Formula 110, the acceptor layer includes a first acceptor layer including a first acceptor compound and a second acceptor compound, each independently represented by Formula 120, and the first acceptor compound and the second acceptor compound are different from each other. Formulae 110 and 120 are each as described herein.

20 Claims, 6 Drawing Sheets

(51) Int. Cl.
*H10K 50/805* (2023.01)
*H10K 59/35* (2023.01)
*H10K 85/60* (2023.01)

(52) U.S. Cl.
CPC ......... *H10K 85/633* (2023.02); *H10K 85/654* (2023.02); *C09K 2211/1022* (2013.01)

(58) Field of Classification Search
CPC ........ H10K 50/16; H10K 50/17; H10K 50/18; H10K 50/81; H10K 50/82; H10K 65/00; H10K 85/322; H10K 85/40; H10K 59/40; H10K 59/60; H10K 59/65; C09K 11/06; C09K 2211/1022; H01L 27/322; H01L 51/5237; H01L 51/56; H01L 51/5275; H01L 27/3211; H01L 27/3272; H01L 2227/323; G06V 40/1318; G06V 10/141; H10F 39/18; H10F 39/8063
See application file for complete search history.

(56) References Cited

U.S. PATENT DOCUMENTS

| | | | | |
|---|---|---|---|---|
| 10,950,795 | B2 | 3/2021 | Richter et al. | |
| 11,002,888 | B2 * | 5/2021 | Ma | H10K 77/10 |
| 11,003,266 | B2 * | 5/2021 | Kim | H10D 86/60 |
| 11,017,200 | B1 * | 5/2021 | Wickboldt | H04L 63/0861 |
| 11,600,099 | B2 * | 3/2023 | Wang | G06V 40/1318 |
| 2014/0145177 | A1 * | 5/2014 | Lee | H10D 86/441 438/34 |
| 2014/0346498 | A1 * | 11/2014 | Ahn | H10D 30/6723 257/43 |
| 2015/0021627 | A1 * | 1/2015 | Fujita | H10F 71/00 257/82 |
| 2015/0331508 | A1 * | 11/2015 | Nho | G06F 3/0443 345/173 |
| 2016/0302665 | A1 * | 10/2016 | Swedish | A61B 3/0091 |
| 2017/0213872 | A1 * | 7/2017 | Jinbo | H10K 59/40 |
| 2017/0220840 | A1 * | 8/2017 | Wickboldt | G06V 40/1335 |
| 2018/0012069 | A1 * | 1/2018 | Chung | G06V 40/1394 |
| 2018/0141969 | A1 * | 5/2018 | Hwang | G01N 33/582 |
| 2018/0239941 | A1 * | 8/2018 | Mackey | G06V 40/1318 |
| 2019/0214420 | A1 * | 7/2019 | Kim | H10F 39/8057 |
| 2020/0026898 | A1 * | 1/2020 | Fan | G06V 40/1318 |
| 2020/0117875 | A1 * | 4/2020 | Cai | G06V 40/13 |
| 2020/0184185 | A1 * | 6/2020 | Mackey | G06V 40/1324 |
| 2020/0242320 | A1 * | 7/2020 | Zeng | H10F 39/198 |
| 2020/0380239 | A1 * | 12/2020 | Lee | H10K 59/65 |
| 2020/0387684 | A1 * | 12/2020 | Setlak | G06V 40/1318 |
| 2021/0234103 | A1 | 7/2021 | Lim et al. | |
| 2022/0050992 | A1 * | 2/2022 | Wang | G06V 40/1318 |
| 2022/0069025 | A1 | 3/2022 | Yamazaki et al. | |
| 2022/0069239 | A1 * | 3/2022 | Lee | C09K 11/06 |
| 2022/0073550 | A1 * | 3/2022 | Ahn | H10K 85/346 |
| 2022/0173338 | A1 * | 6/2022 | Ko | H10K 85/654 |
| 2022/0209142 | A1 * | 6/2022 | Kim | C07F 15/0086 |
| 2022/0216434 | A1 * | 7/2022 | Kim | H10K 85/654 |
| 2022/0310926 | A1 * | 9/2022 | Park | C07F 5/027 |
| 2022/0310927 | A1 * | 9/2022 | Lee | H10K 85/346 |
| 2022/0310942 | A1 * | 9/2022 | Shin | H10K 85/346 |
| 2022/0336760 | A1 * | 10/2022 | Kim | H10K 85/346 |
| 2022/0340571 | A1 * | 10/2022 | Kim | C09K 11/7705 |
| 2022/0367570 | A1 | 11/2022 | Kim et al. | |
| 2022/0388989 | A1 * | 12/2022 | Lee | C07D 403/10 |

FOREIGN PATENT DOCUMENTS

| | | | |
|---|---|---|---|
| EP | 3 848 374 | A1 | 7/2021 |
| KR | 10-2160497 | B1 | 9/2020 |
| KR | 10-2021-0109566 | A | 9/2021 |
| KR | 10-2022-0147027 | A | 11/2022 |
| WO | WO 2014/055976 | A1 | 4/2014 |

* cited by examiner

ORGANIC PHOTODIODE AND ELECTRONIC APPARATUS COMPRISING ORGANIC PHOTODIODE AND ORGANIC LIGHT-EMITTING DEVICE

CROSS-REFERENCE TO RELATED APPLICATION

This application claims priority to and the benefit of Korean Patent Application No. 10-2022-0134452, filed on Oct. 18, 2022, in the Korean Intellectual Property Office, the entire content of which is incorporated by reference herein in its entirety.

BACKGROUND

1. Field

One or more embodiments of the present disclosure relate to an organic photodiode and an electronic apparatus including an organic light-emitting device.

2. Description of the Related Art

Organic photodiodes (OPDs) use organic semiconductors to absorb incident light and convert the incident light into electric currents. Due to the nature of organic substances, organic photodiodes are excellent in terms of process easiness, cost reduction, flexible device application, mass production, etc. as compared with inorganic photodiodes such as silicon photodetectors. As organic materials have a large extinction coefficient and may selectively absorb light in a set or specific wavelength region according to the molecular structure thereof, organic materials may facilitate improvements in sensitivity, wavelength selectivity, and high integration.

Structures of OPDs and organic light-emitting devices (OLEDs) are very similar. The two devices include a hole transport layer located between electrodes and a photoactive layer between electron transport layers or an emission layer. The similarity in structures may be used in integrating OPDs in OLEDs to be used in fingerprint recognition, etc.

SUMMARY

One or more embodiments include an organic photodiode having improved external quantum efficiency (EQE) and an electronic apparatus including the organic photodiode.

Additional aspects of embodiments will be set forth in part in the description which follows and, in part, will be apparent from the description, or may be learned by practice of the presented embodiments of the disclosure.

According to one or more embodiments, an organic photodiode includes; a first electrode, a common electrode facing the first electrode, and a photoactive layer between the first electrode and the common electrode, wherein:

the photoactive layer may include a donor layer and an acceptor layer, the donor layer may include a donor compound represented by Formula 110, the acceptor layer may include a first acceptor layer including a first acceptor compound and a second acceptor compound, each independently represented by Formula 120, and the first acceptor compound and the second acceptor compound are different from each other Formula 110

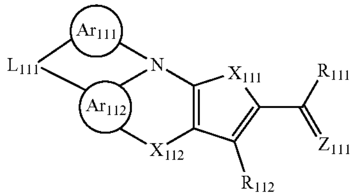

Formula 120

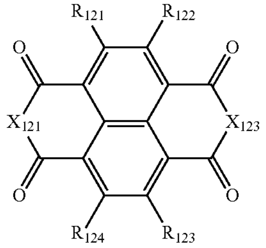

wherein, in Formula 110, $Ar_{111}$ and $Ar_{112}$ may each independently be a $C_6$-$C_{30}$ arylene group unsubstituted or substituted with at least one $R_{10a}$ or a $C_3$-$C_{30}$ heteroarylene group unsubstituted or substituted with at least one $R_{10a}$, $X_{111}$ may be selected from —Se—, —Te—, —S(=O)—, —S(=O)$_2$—, —N($Q_{111}$)-, —B($Q_{111}$)-, —C($Q_{111}$)($Q_{112}$)-, —Si($Q_{111}$)($Q_{112}$)-, and —Ge($Q_{111}$)($Q_{112}$)-, $X_{112}$ and $L_{111}$ may be selected from —O—, —S—, —Se—, —Te—, —S(=O)—, —S(=O)$_2$—, —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)=C($Q_{112}$))—, and —(C($Q_{111}$)=N))—, when $L_{111}$ is selected from —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)=C($Q_{112}$))—, and —(C($Q_{111}$)=N))—, $L_{111}$ may optionally be linked to $Ar_{111}$ or $Ar_{112}$ to form a condensed ring, $Z_{111}$ may be a $C_6$-$C_{30}$ carbocyclic group including at least one functional group selected from C=O, C=S, C=Se, and C=Te and unsubstituted or substituted with at least one $R_{10a}$, or a $C_1$-$C_{30}$ heterocyclic group including at least one functional group selected from C=O, C=S, C=Se, and C=Te and unsubstituted or substituted with at least one $R_{10a}$, $R_{111}$ to $R_{116}$ may each independently be hydrogen, deuterium, halogen, a cyano group, a nitro group, a hydroxy group, a $C_1$-$C_{30}$ alkyl group unsubstituted or substituted with at least one $R_{10a}$, a $C_1$-$C_{30}$ alkoxy group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10a}$, a $C_2$-$C_{30}$ acyl group unsubstituted or substituted with at least one $R_{10a}$, or a combination thereof, wherein, in Formula 120, $X_{121}$ and $X_{122}$ may each independently be O or $NR_{125}$, $R_{121}$ to $R_{124}$ and $R_{125}$ may each independently be hydrogen, deuterium, halogen, a cyano group, a nitro group, a hydroxy group, a $C_1$-$C_{30}$ alkyl group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10}$, or a combination thereof, in Formulae 110 and 120, $R_{10a}$ may be:

deuterium, —F, —Cl, —Br, —I, a hydroxyl group, a cyano group or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si$(Q_{11})(Q_{12})(Q_{13})$, —N$(Q_{11})(Q_{12})$, —B$(Q_{11})(Q_{12})$, —C(═O)$(Q_{11})$, —S(═O)$_2(Q_{11})$, —P(═O)$(Q_{11})(Q_{12})$, or a combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_2$-$C_{60}$ heteroaryloxy group, a $C_1$-$C_{60}$ heteroarylthio group, —Si$(Q_{21})(Q_{22})(Q_{23})$, —N$(Q_{21})(Q_{22})$, —B$(Q_{21})(Q_{22})$, —C(═O)$(Q_{21})$, —S(═O)$_2(Q_{21})$, —P(═O)$(Q_{21})(Q_{22})$, or a combination thereof, or Si$(Q_{31})(Q_{32})(Q_{33})$, —N$(Q_{31})(Q_{32})$, —B$(Q_{31})(Q_{32})$, —C(═O)$(Q_{31})$, —S(═O)$_2(Q_{31})$, or —P(═O)$(Q_{31})(Q_{32})$, wherein $Q_{11}$ to $Q_{13}$, $Q_{21}$ to $Q_{23}$, $Q_{31}$ to $Q_{33}$, and $Q_{41}$ to $Q_{43}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In an embodiment, $Z_{111}$ in Formula 110 may be a group represented by one selected from Formulae 111A to 111F:

111A

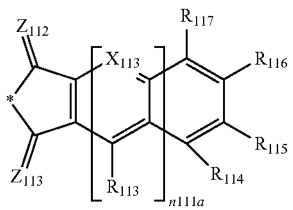

111B

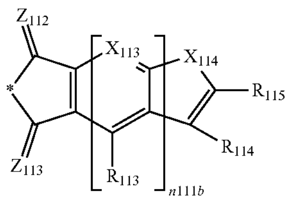

-continued

111C

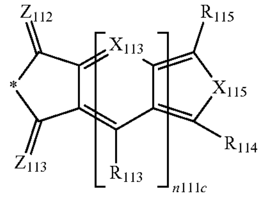

111D

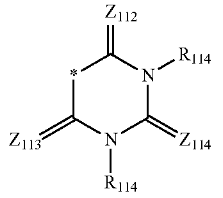

111E

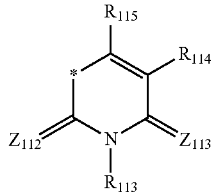

111F

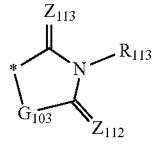

wherein, in Formulae 111A to 111F, $Z_{112}$ to $Z_{114}$ may be O, S, Se, or Te, $X_{113}$ may be N or $C(Q_{113})$, $X_{114}$ and $X_{115}$ may each independently be O, S, Se, Te, $Si(Q_{111})(Q_{112})$, or $Ge(Q_{111})(Q_{112})$, $n_{111a}$ to $n_{111c}$ may each be an integer from 0 to 3, $R_{113}$ to $R_{117}$ may each independently be as described for $R_{121}$, and $Q_{111}$ to $Q_{113}$ may each be as described for $Q_{111}$.

In an embodiment, a compound represented by Formula 110 may be selected from compounds of Groups 1 to 4:

Group 1

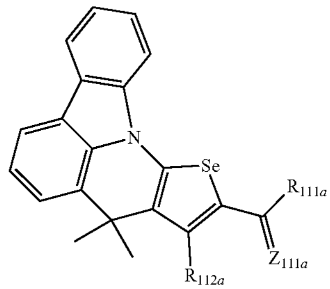

-continued
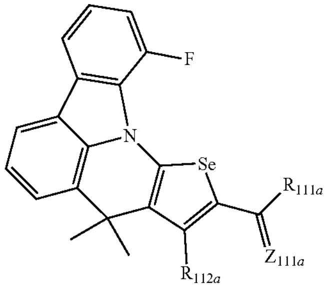
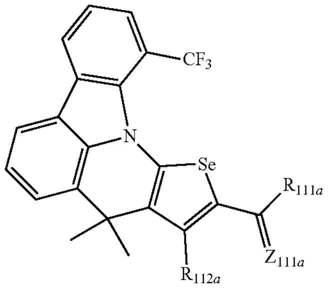
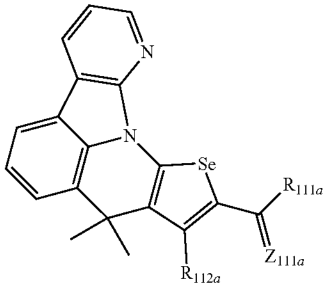
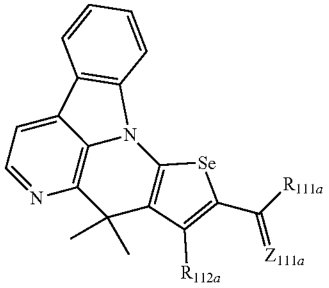
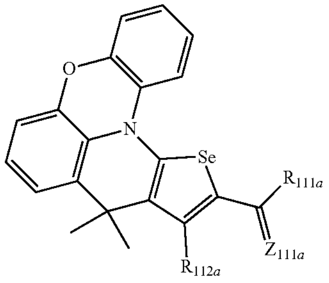
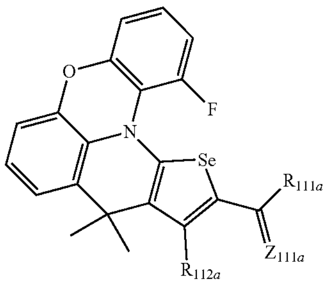
-continued
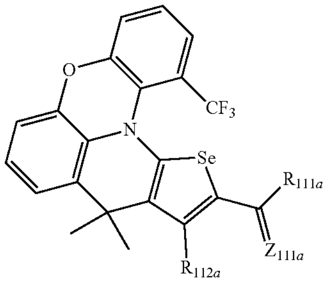
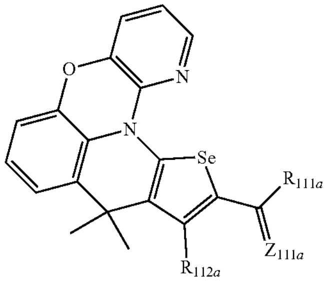
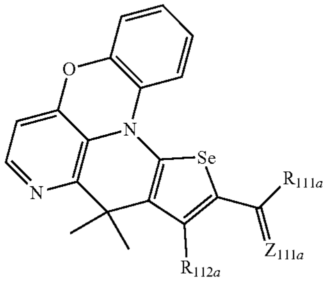
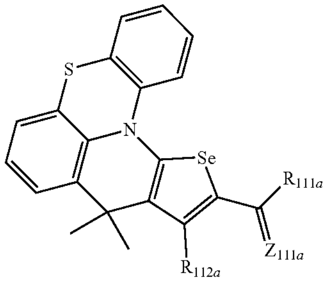
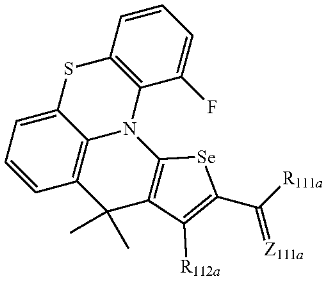
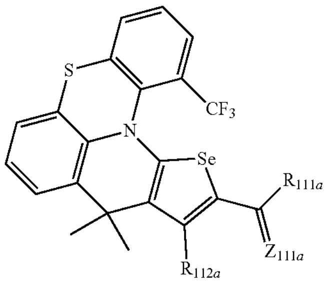

-continued
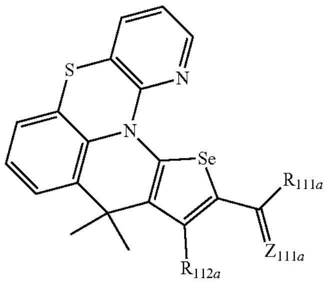
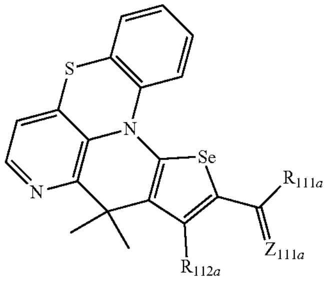
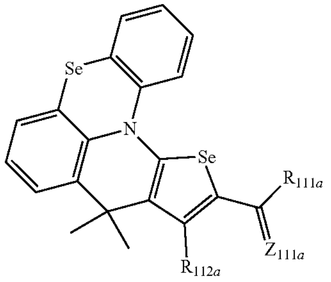
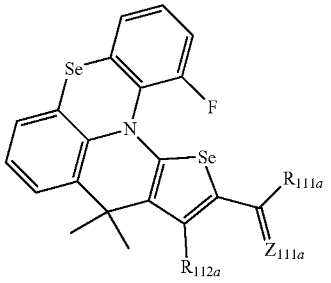
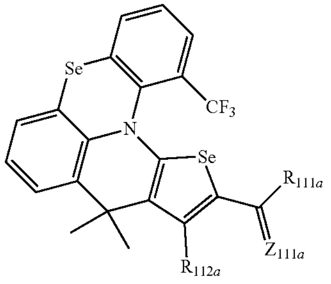
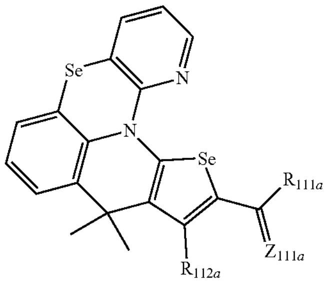
-continued
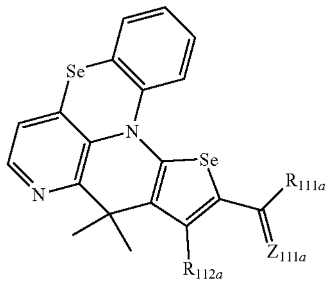
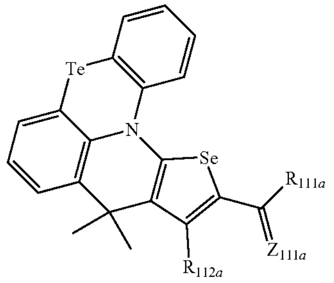
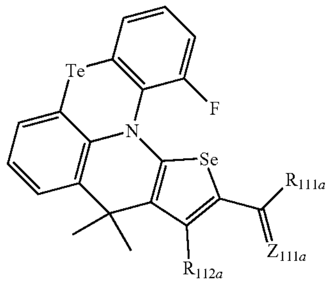
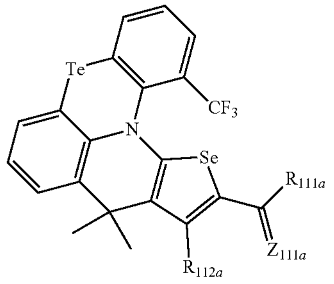
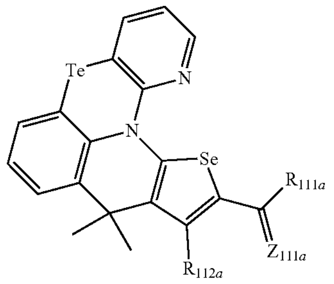
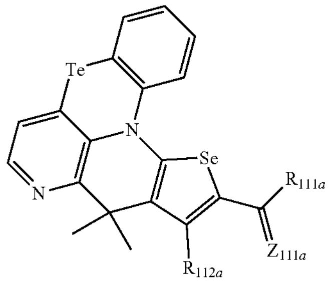

-continued
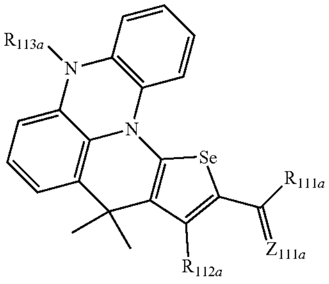
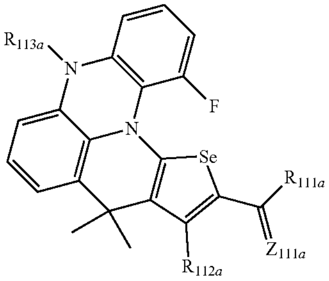
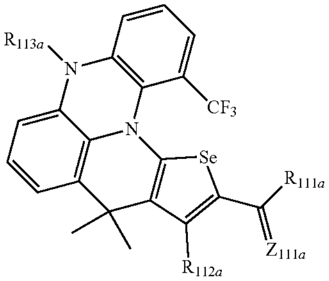
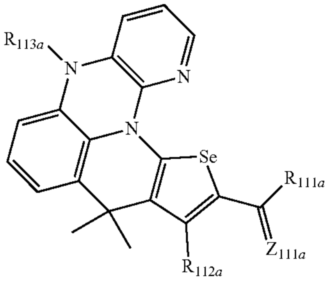
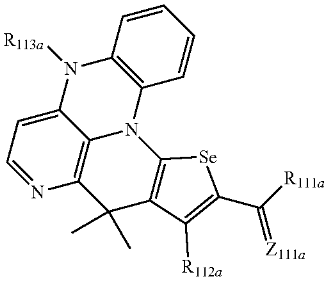
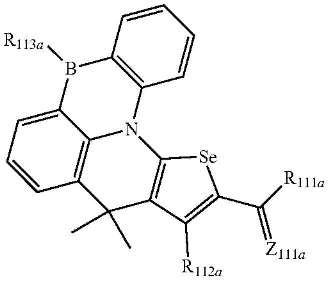
-continued
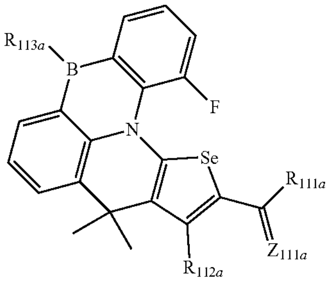
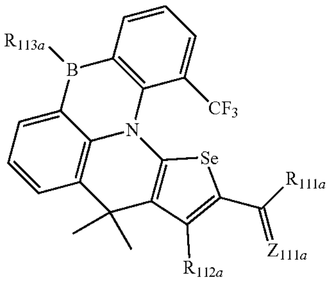
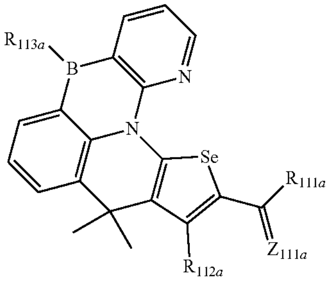
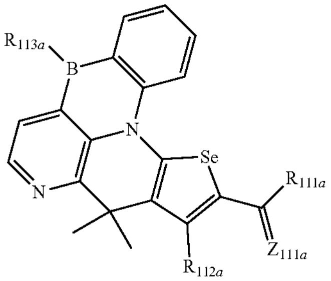
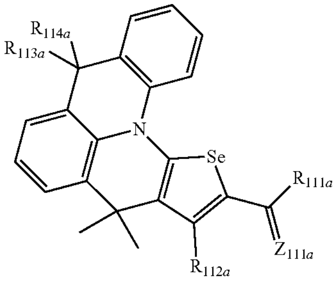
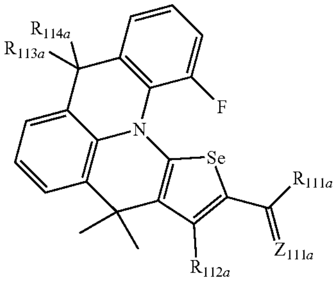

-continued
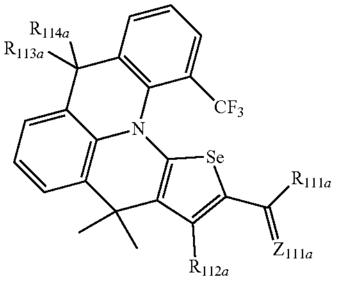
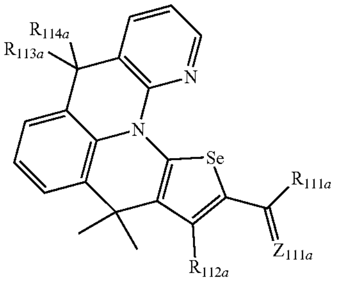
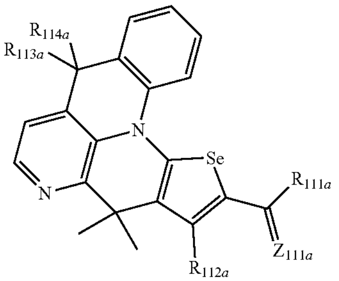
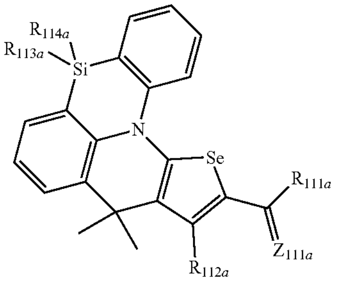
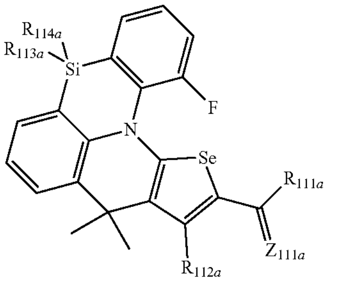
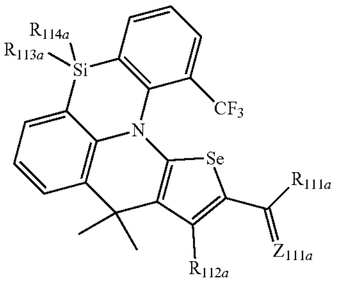
-continued
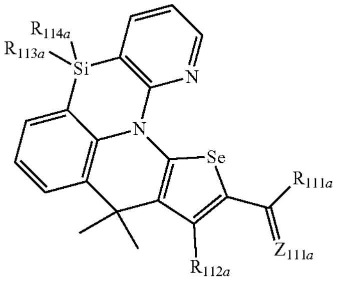
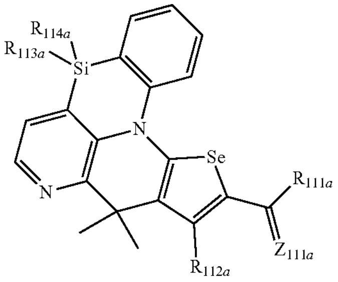
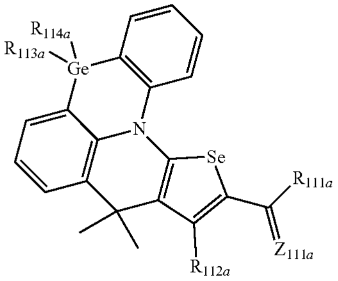
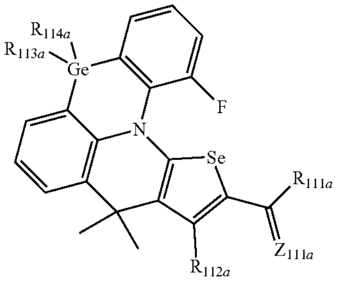
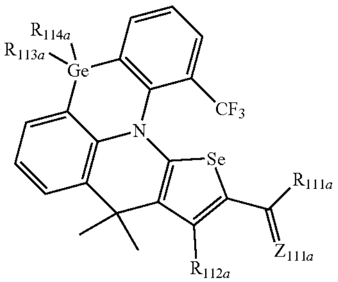
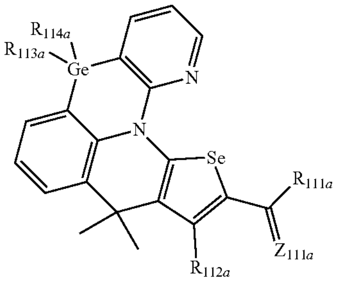

-continued
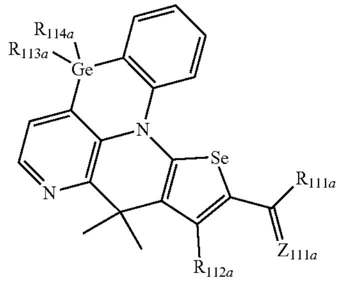
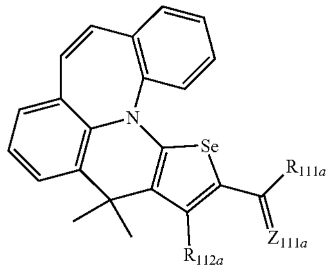
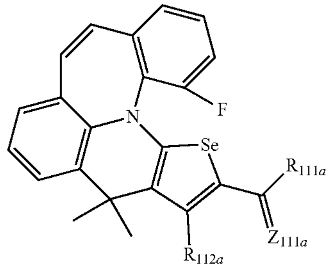
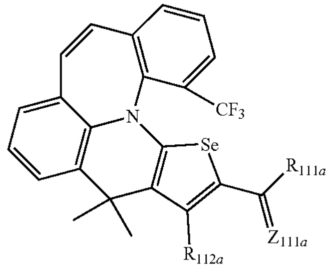
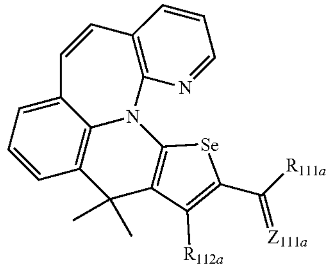
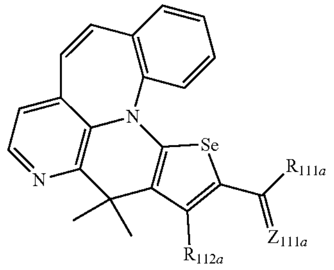
-continued
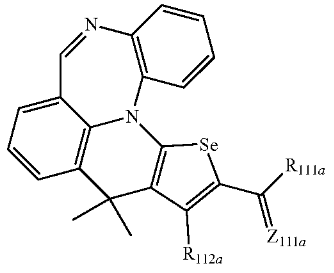
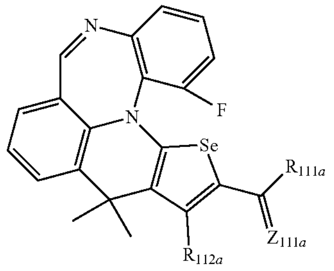
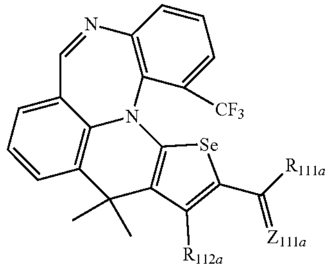
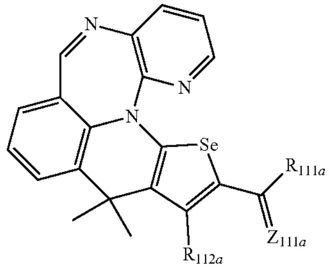
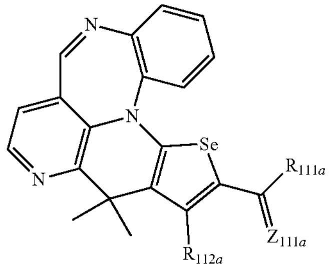
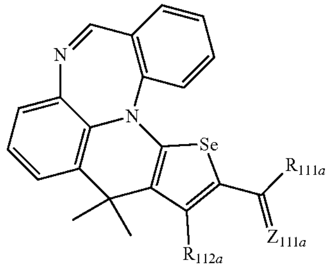

-continued
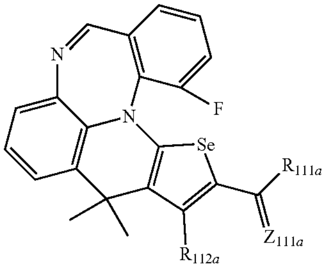
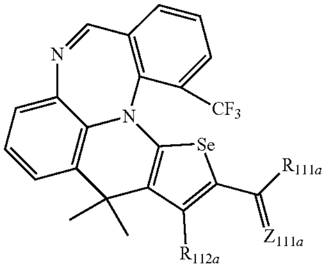
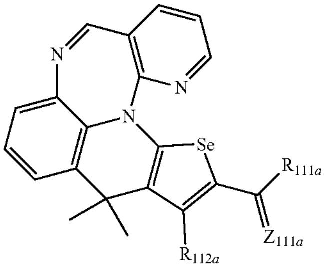
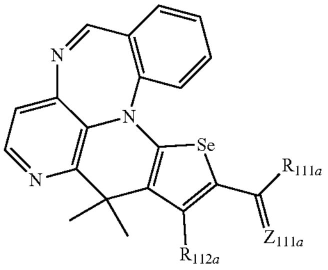
Group 2
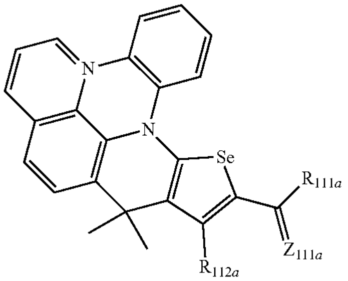
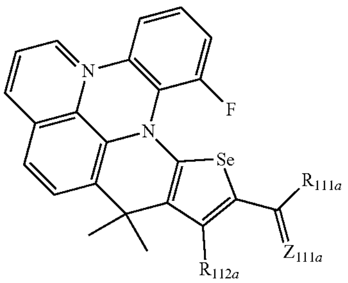
-continued
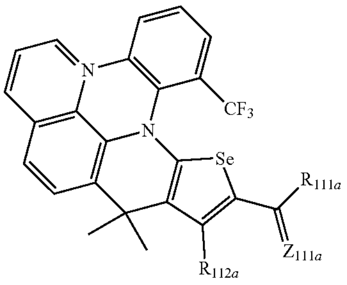
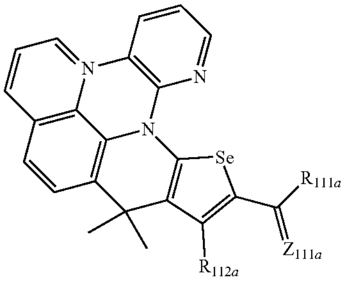
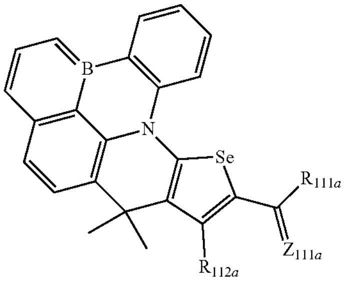
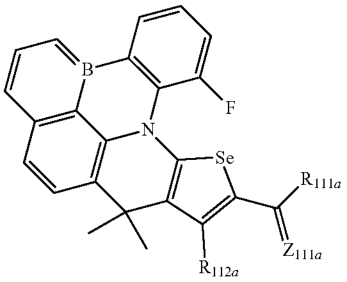
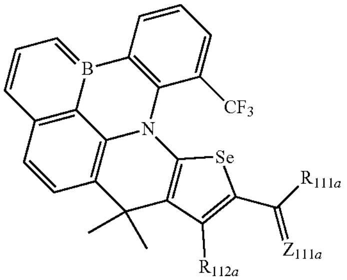
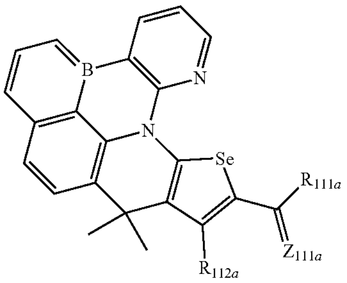

-continued
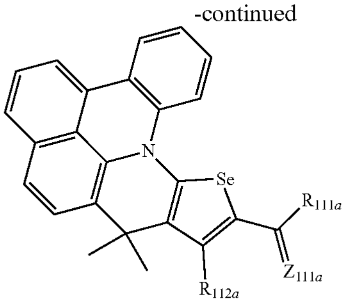
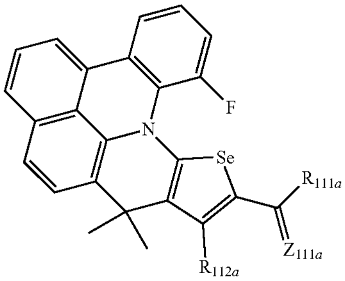
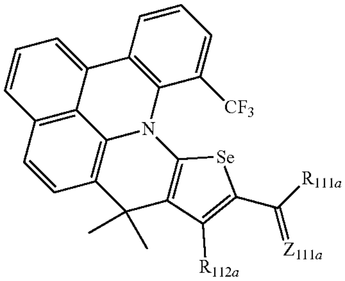
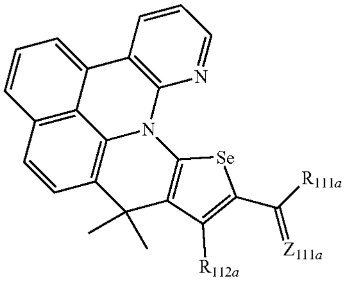
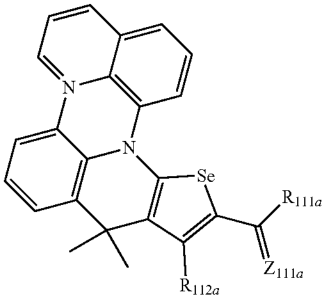
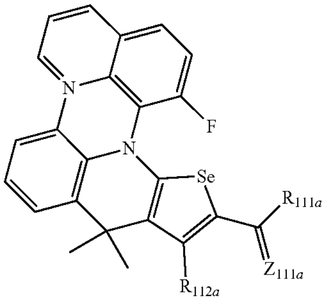
-continued
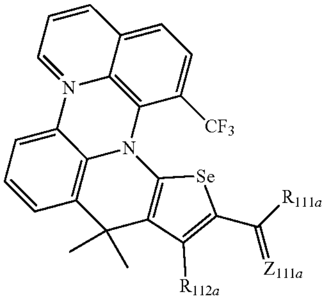
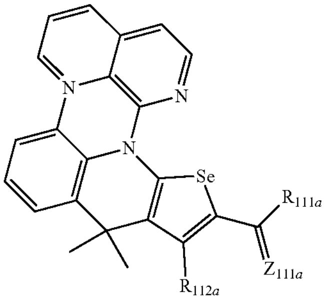
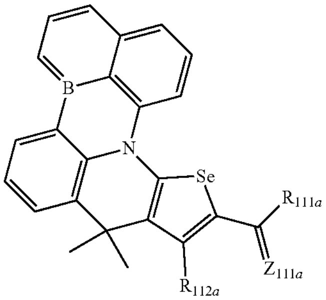
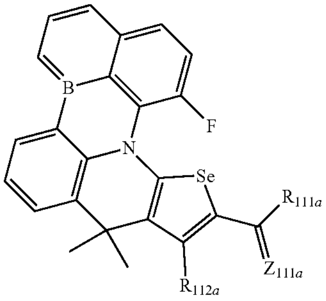
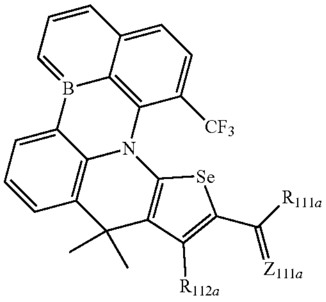

-continued
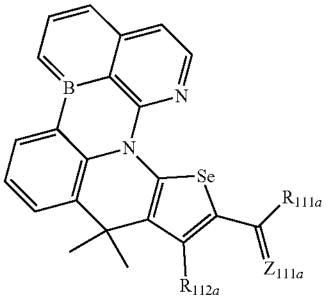
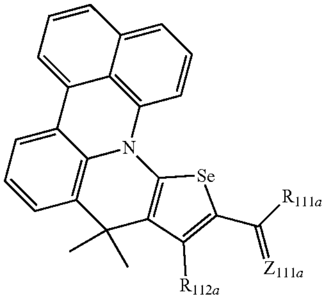
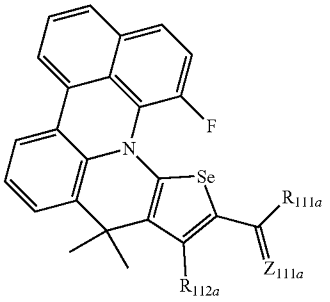
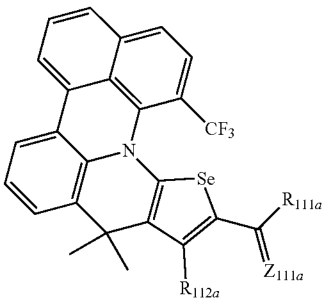
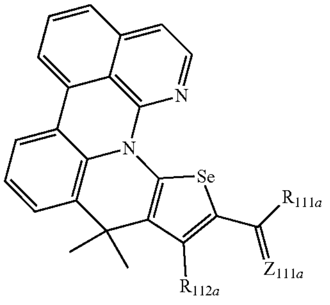
-continued
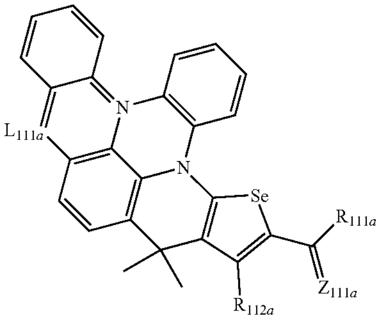
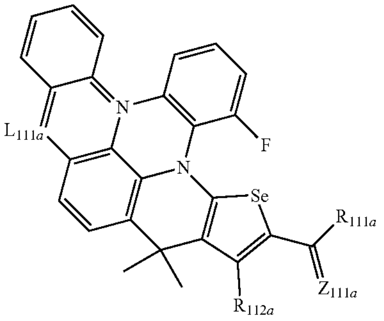
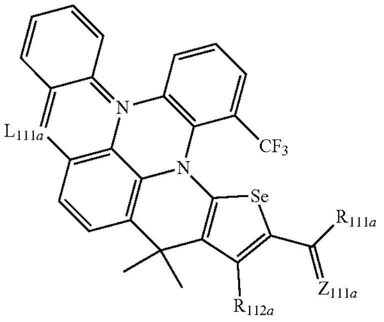
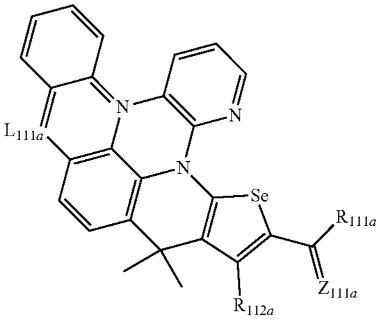
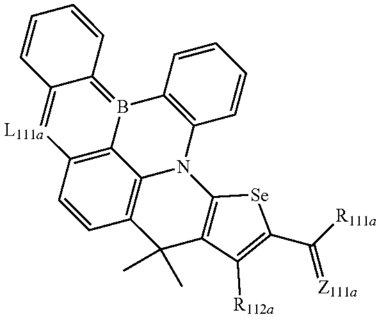

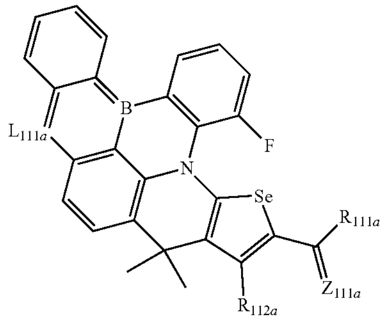
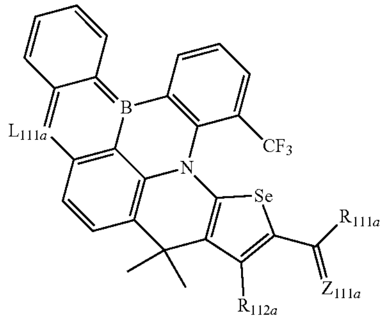
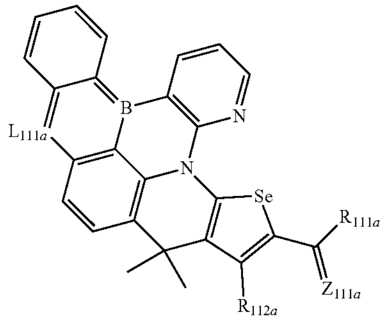
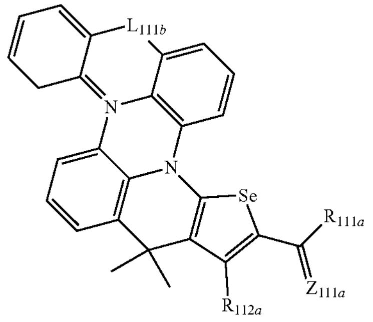
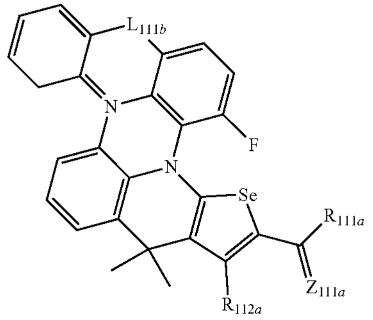
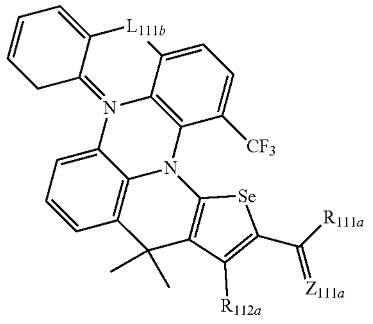
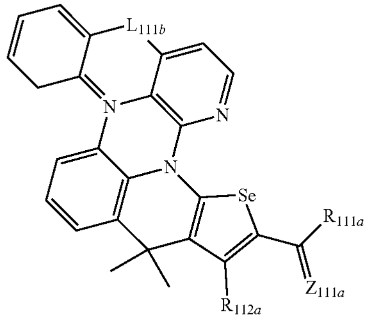
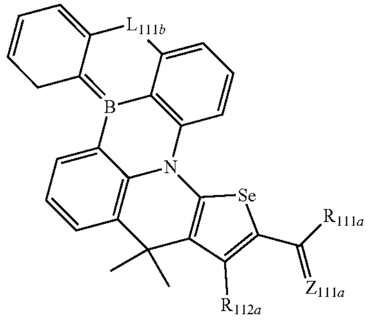
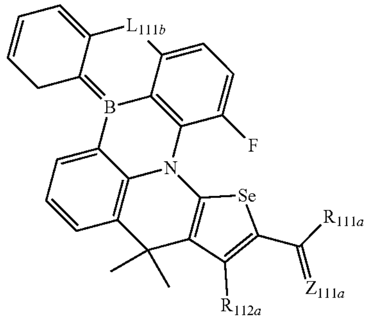
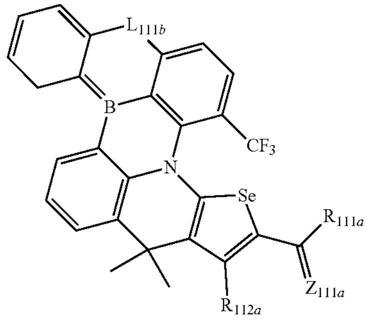

-continued
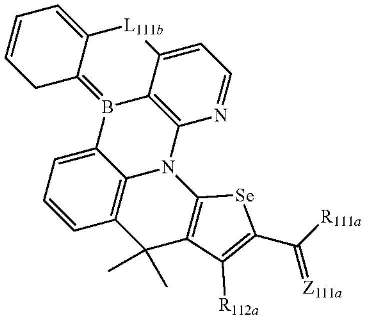
[Group 3]
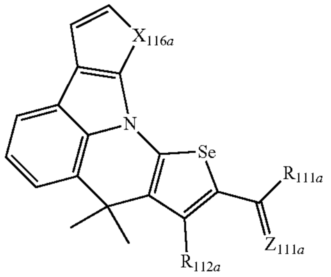
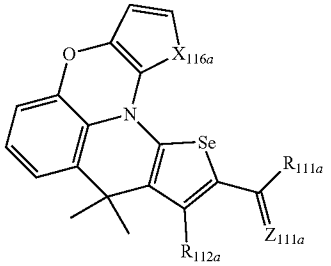
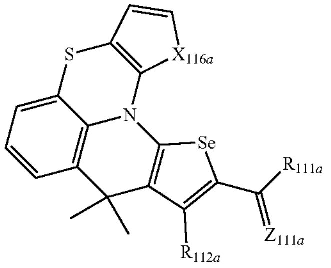
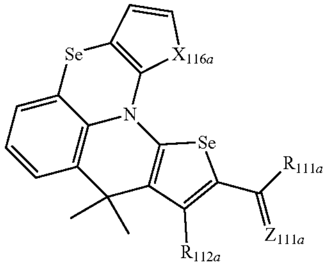
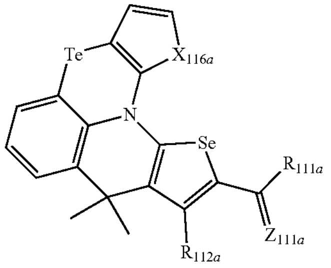
-continued
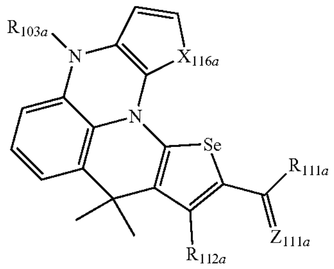
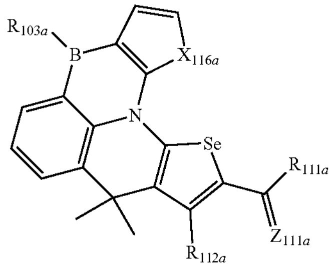
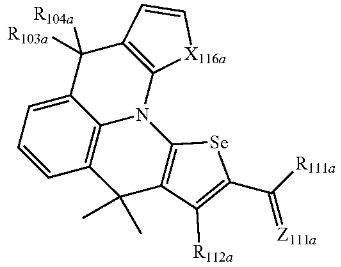
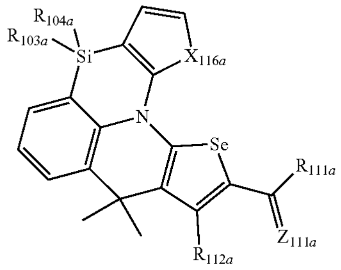
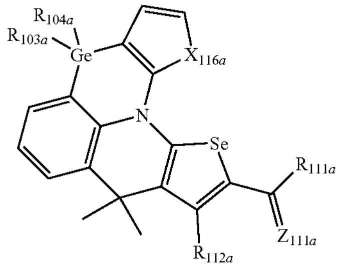
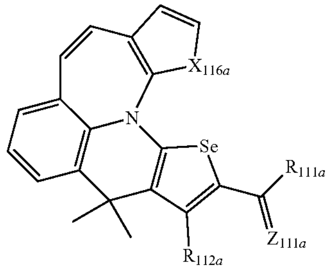

-continued
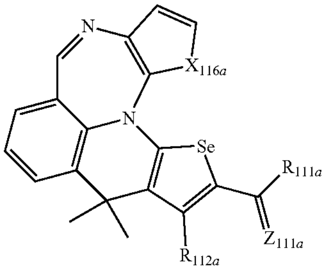
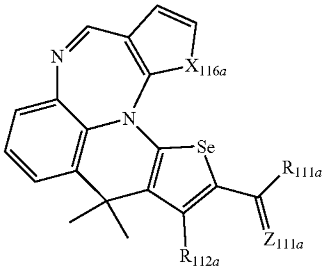
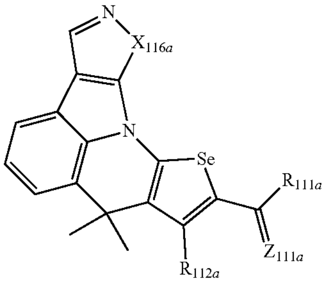
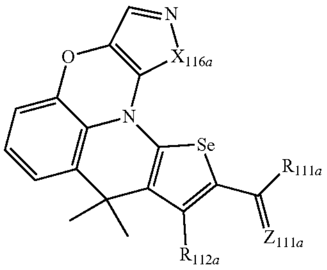
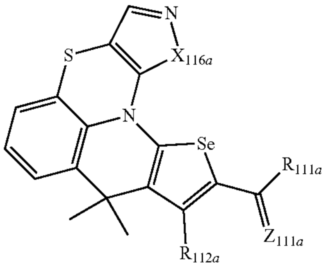
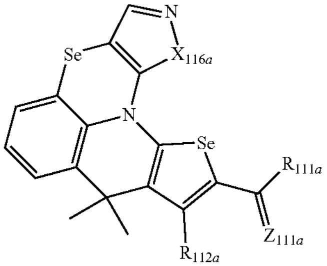
-continued
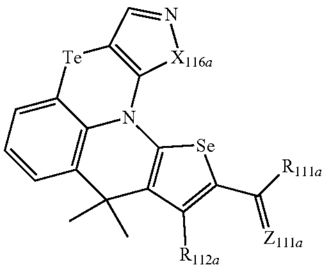
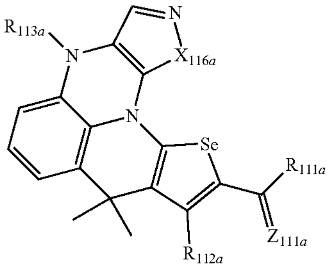
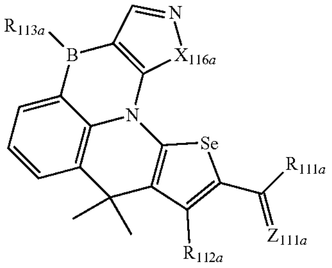
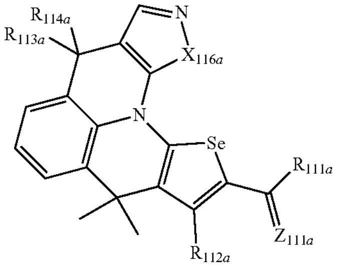
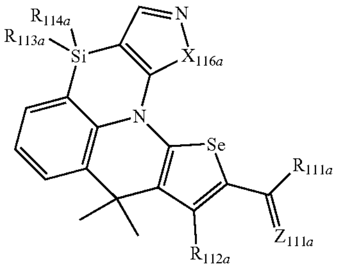
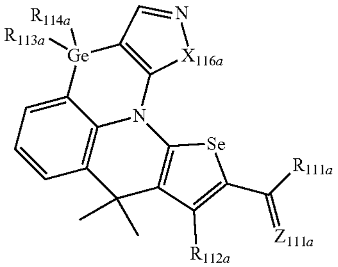

-continued
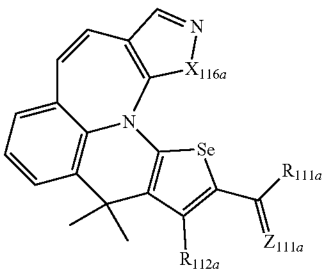
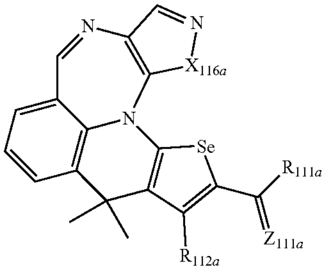
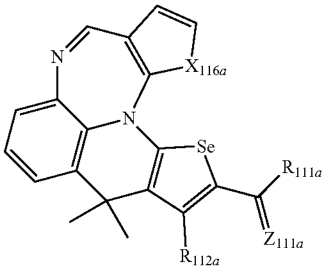
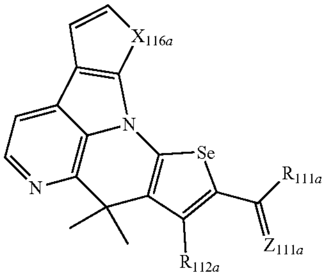
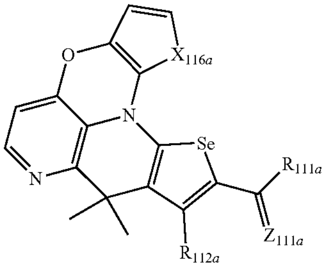
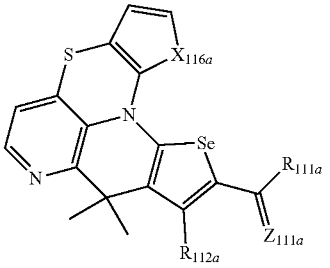
-continued
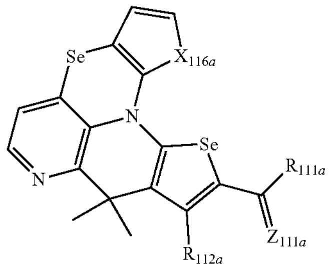
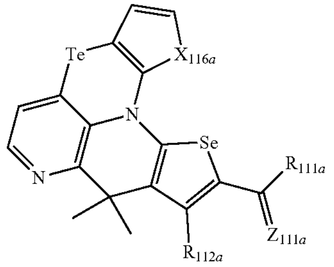
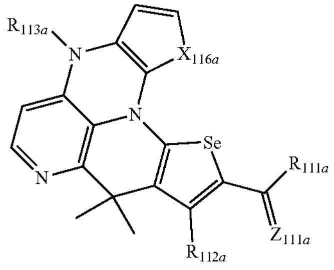
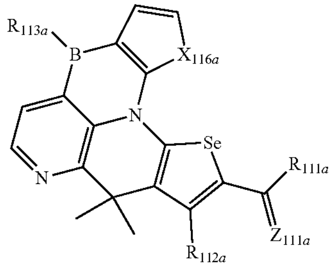
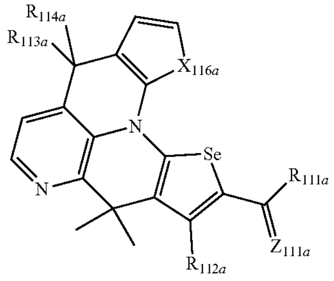
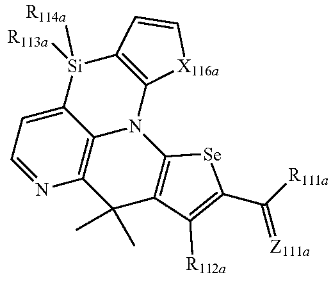

-continued

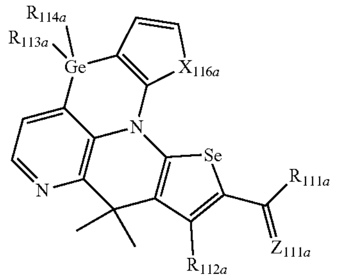

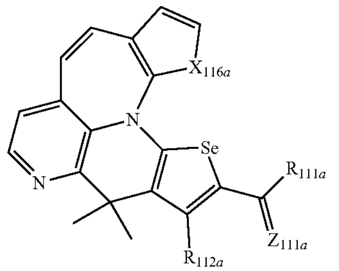

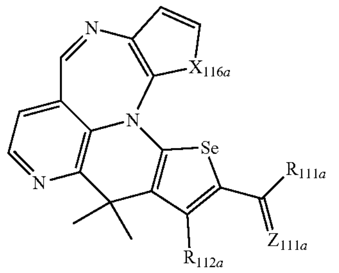

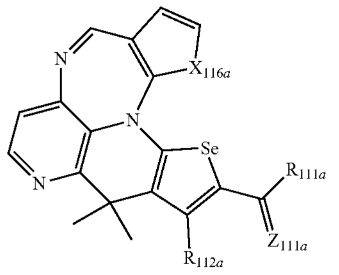

wherein, in the compounds of Groups 1 to 3, $R_{111a}$ to $R_{114a}$ may each be as described for $R_{111}$, $Z_{111a}$ may be as described for $Z_{111}$, and $X_{116}$a may be as described for $X_{116}$.

In an embodiment, the compound represented by Formula 120 may be a compound represented by Formula 121 or 122:

Formula 121

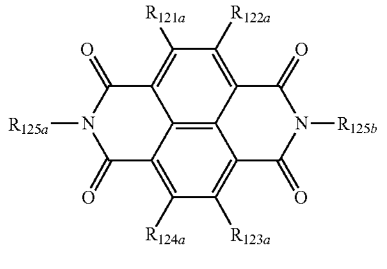

-continued

Formula 122

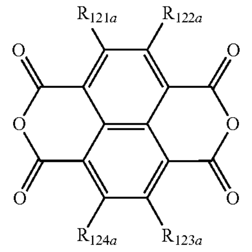

wherein, in Formulae 121 and 122, $R_{121a}$ to $R_{124a}$ may each independently be hydrogen, deuterium, halogen, a cyano group, a $C_1$-$C_{30}$ alkyl group, a $C_6$-$C_{30}$ aryl group, or a $C_3$-$C_{30}$ heteroaryl group, $R_{125a}$ and $R_{125b}$ may each independently be hydrogen, deuterium, halogen, a cyano group, a $C_1$-$C_{30}$ alkyl group unsubstituted or substituted with at least one $R_{10a}$, a $C_6$-$C_{30}$ aryl group unsubstituted or substituted with at least one $R_{10a}$, or a $C_3$-$C_{30}$ heteroaryl group unsubstituted or substituted with at least one $R_{10a}$, and $R_{10a}$ may be deuterium, a halogen group, or a cyano group, a $C_1$-$C_{30}$ alkyl group or a $C_2$-$C_{30}$ alkenyl group, each substituted with deuterium, a halogen group, a cyano group, a $C_3$-$C_{30}$ carbocyclic group, a $C_1$-$C_{30}$ heterocyclic group, or a combination thereof, or a $C_3$-$C_{30}$ carbocyclic group or a $C_1$-$C_{30}$ heterocyclic group, each substituted with deuterium, a halogen group, a cyano group, a $C_1$-$C_{30}$ alkyl group, a $C_2$-$C_{30}$ alkenyl group, or a combination thereof.

In an embodiment, a compound represented by Formula 120 may be selected from the compounds below.

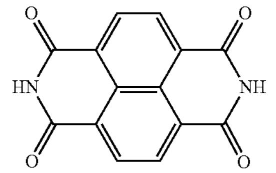

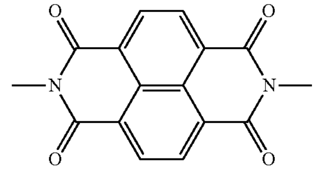

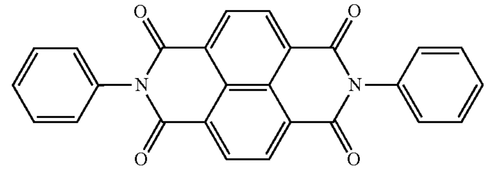

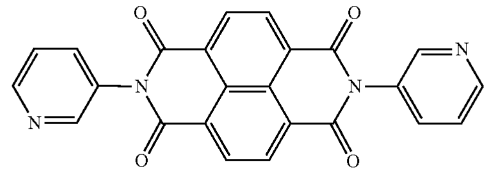

-continued

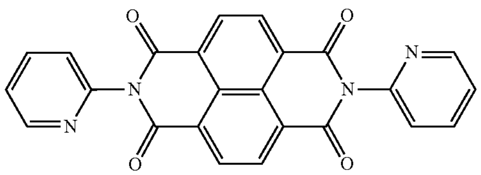

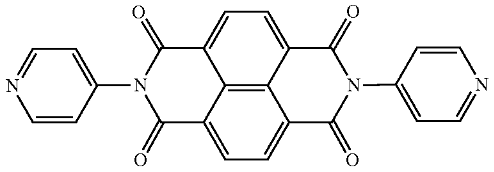

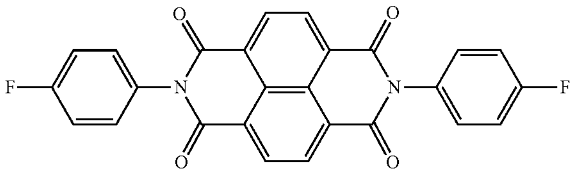

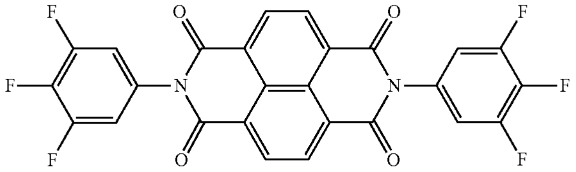

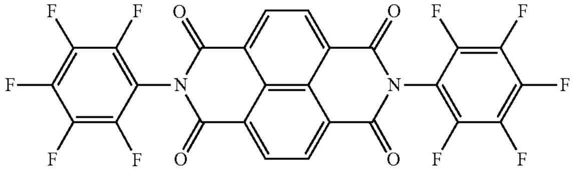

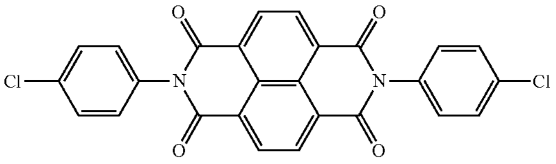

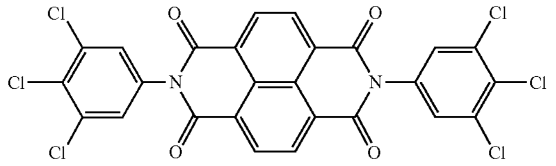

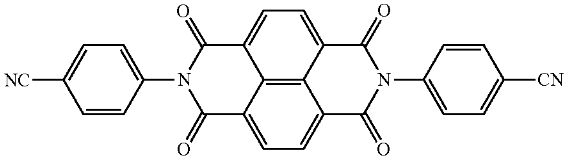

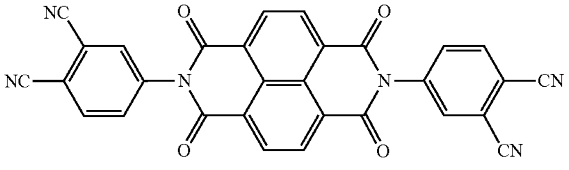

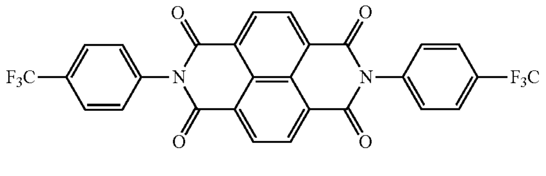

-continued

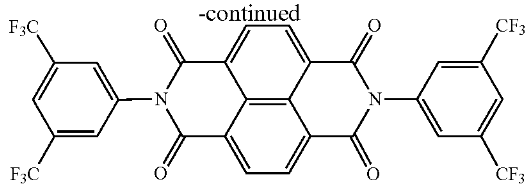

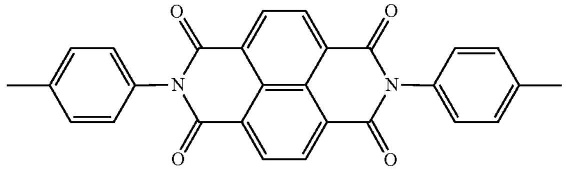

In an embodiment, the acceptor layer may further include a second acceptor layer, and the second acceptor layer may include a third acceptor compound represented by Formula 120. The third acceptor compound may be identical to any one selected from the first acceptor compound and the second acceptor compound. In an embodiment, the third acceptor compound may be different from the first acceptor compound and the second acceptor compound.

The donor layer may be in contact with the first acceptor layer, or the donor layer may be in contact with the second acceptor layer.

In an embodiment, the acceptor layer may further include a third acceptor layer including a fourth acceptor compound, and the first acceptor layer may be located between the second acceptor layer and the third acceptor layer. The third acceptor compound of the second acceptor layer and the fourth acceptor compound of the third acceptor layer may be identical to each other.

According to one or more embodiments, an electronic apparatus includes: a substrate, and at least one organic light-emitting device and at least one organic photodiode on the substrate.

According to one or more embodiments, the organic light-emitting device may include at least two organic light-emitting devices, and the at least two organic light-emitting devices may each independently include a pixel electrode, an emission layer, and the common electrode.

According to one or more embodiments, the organic light-emitting device may include a first light-emitting device, a second light-emitting device, and a third light-emitting device, wherein the first light-emitting device may sequentially include a second electrode, a first emission layer, and the common electrode, the second light-emitting device may sequentially include a third electrode, a second emission layer, and the common electrode, and the third light-emitting device may sequentially include a fourth electrode, a third emission layer, and the common electrode.

According to one or more embodiments, the first light-emitting device may emit a red color, the second light-emitting device may emit a green color, and the third light-emitting device may emit a blue color.

According to one or more embodiments, a first common layer may be included between the first electrode and the first photoactive layer, between the second electrode and the first emission layer, between the third electrode and the second emission layer, and between the fourth electrode and the third emission layer.

A second common layer may be included between the photoactive layer and the common electrode, between the first emission layer and the common electrode, between the second emission layer and the common electrode, and between the third emission layer and the common electrode.

The first common layer may include at least one selected from a hole injection layer, a hole transport layer, and an electron blocking layer. The second common layer may include at least one selected from a buffer layer, a hole blocking layer, an electron transport layer, and an electron injection layer.

The organic photodiode may detect light emitted from the second light-emitting device and reflected from a subject.

The at least one organic light-emitting device and the at least one organic photodiode may form one pixel, and the electronic apparatus may include a plurality of the pixels.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
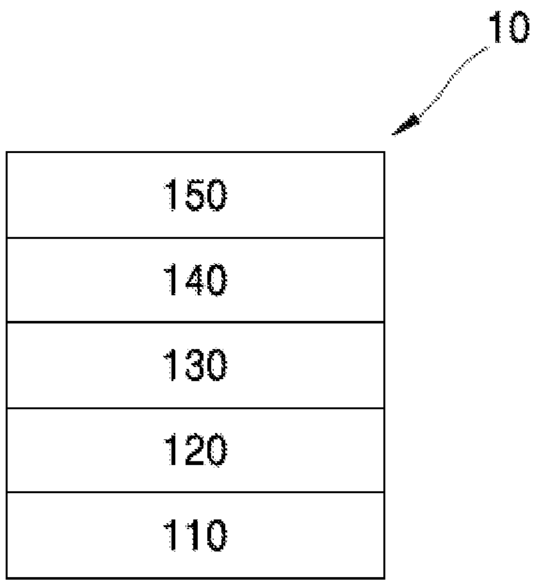
FIG. 1 is a schematic cross-sectional view of an organic photodiode according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure encompasses diverse modified embodiments, example embodiments are illustrated in the drawings and are described in the detailed description. An effect and a characteristic of the disclosure, and a method of accomplishing these will be apparent when referring to embodiments described with reference to the drawings. The subject matter of the disclosure may, however, be embodied in many different forms and should not be construed as limited to the embodiments set forth herein.

It will be understood that although the terms "first," "second," etc. used herein may be used herein to describe various components, these components should not be limited by these terms. These components are only used to distinguish one component from another.

An expression used in the singular encompasses the expression of the plural, unless it has a clearly different meaning in the context.

In the following embodiments, when various components such as layers, films, regions, plates, etc. are said to be "on" another component, this may include not only a case in which other components are "immediately on" the layers, films, regions, or plates, but also a case in which other components may be placed therebetween. Sizes of elements in the drawings may be exaggerated for convenience of explanation. In other words, because sizes and thicknesses of components in the drawings may be arbitrarily illustrated for convenience of explanation, the following embodiments are not limited thereto.

It will be further understood that the terms "includes" and/or "comprises" used herein specify the presence of stated features or elements, but do not preclude the presence or addition of one or more other features or elements. Unless defined otherwise, the terms "include or have" may refer to both the case of consisting of features or components described in a specification and the case of further including other components.

Organic Photodiode

Hereinafter, an organic photodiode according to an embodiment will be described in more detail with reference to FIGS. 1-2.

Description of FIGS. 1-2

The organic photodiode of the electronic apparatus will be described with reference to FIGS. 1-2.

FIG. 1 is a schematic cross-sectional view of an organic photodiode 10 according to an embodiment.

Referring to FIG. 1, the organic photodiode 10 may sequentially include a first electrode 110, a hole transport region 120, a photoactive layer 130, an electron transport region 140, and a second electrode 150.

One selected from the first electrode 110 and the second electrode 150 may be an anode, and the other one may be a cathode. In an embodiment, the first electrode 110 may be an anode, and the second electrode 150 may be a cathode.

The photoactive layer 130 may absorb incident light and form excitons, and charges may be separated from the excitons to form electrons and holes.

Holes generated in the photoactive layer 130 may pass through the hole transport region 120 to be transferred to the first electrode 110, and electrons generated in the photoactive layer 130 may pass through the electron transport region 140 to be transferred to the second electrode 150, thereby generating a photocurrent to detect light.

In an embodiment, the photoactive layer 130 may include a donor layer (p-type semiconductor layer) including a donor compound (p-type organic semiconductor) and an acceptor layer (n-type semiconductor layer) including an acceptor compound (n-type organic semiconductor), and the donor layer (p-type semiconductor layer) and the acceptor layer (n-type semiconductor layer) may form a PN junction. The PN junction may form, for example, a planar heterojunction.

Because the p-type organic semiconductor acts as an electron donor, and the n-type organic semiconductor acts as an electron acceptor, excitons may be efficiently divided into holes and electrons by photo-induced charge separation occurring at an interface between the donor layer (p-type semiconductor layer) and the acceptor layer (n-type semiconductor layer). In addition, because the photoactive layer is divided into the donor layer (p-type semiconductor layer)

and the acceptor layer (n-type semiconductor layer), capture and migration of holes and electrons generated at the interface may be facilitated.

In an embodiment, the donor layer may include a donor compound represented by Formula 110:

Formula 110

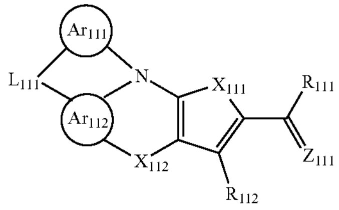

wherein, in Formula 110, $Ar_{111}$ and $Ar_{112}$ may each independently be a $C_6$-$C_{30}$ arylene group unsubstituted or substituted with at least one $R_{10a}$ or a $C_3$-$C_{30}$ heteroarylene group unsubstituted or substituted with at least one $R_{10a}$, $X_{111}$ may be selected from —Se—, —Te—, —S(═O)—, —S(═O)$_2$—, —N($Q_{111}$)-, —B($Q_{111}$)-, —C($Q_{111}$)($Q_{112}$)-, —Si($Q_{111}$)($Q_{112}$)-, and —Ge($Q_{111}$)($Q_{112}$)-, $X_{112}$ and $L_{111}$ may be each independently selected from —O—, —S—, —Se—, —Te—, —S(═O)—, —S(═O)$_2$—, —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)═C($Q_{112}$))—, and —(C($Q_{111}$)═N))—, when $L_{111}$ is selected from —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)═C($Q_{112}$))—, and —(C($Q_{111}$)═N))—, $L_{111}$ may optionally be linked to $Ar_{111}$ or $Ar_{112}$ to form a condensed ring, $Z_{111}$ may be a $C_6$-$C_{30}$ carbocyclic group including at least one functional group selected from C═O, C═S, C═Se, and C═Te and unsubstituted or substituted with at least one $R_{10a}$, or a $C_1$-$C_{30}$ heterocyclic group including at least one functional group selected from C═O, C═S, C═Se, and C═Te and unsubstituted or substituted with at least one $R_{10a}$, and $R_{111}$ to $R_{116}$ may each independently be hydrogen, deuterium, halogen, a cyano group, a nitro group, a hydroxy group, a $C_1$-$C_{30}$ alkyl group unsubstituted or substituted with at least one $R_{10a}$, a $C_1$-$C_{30}$ alkoxy group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10a}$, a $C_2$-$C_{30}$ acyl group unsubstituted or substituted with at least one $R_{10a}$, or a combination thereof.

In an embodiment, $Z_{111}$ in Formula 110 may be a group represented by one selected from Formulae 111A to 111F:

111A

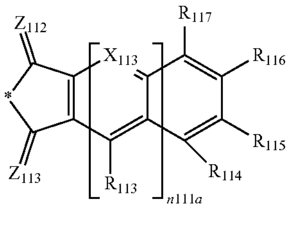

-continued

111B

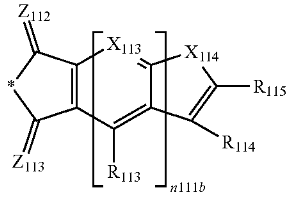

111C

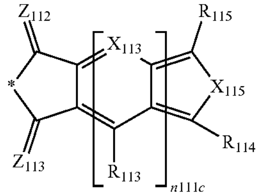

111D

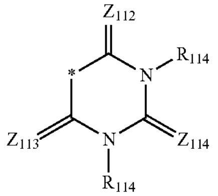

111E

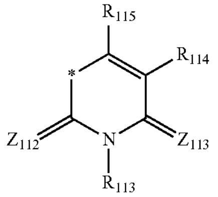

111F

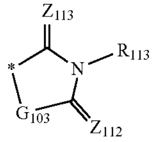

wherein, in Formulae 111A to 111F, $Z_{112}$ to $Z_{114}$ may be O, S, Se, or Te, $X_{113}$ may be N or C($Q_{113}$), and $X_{114}$ and $X_{115}$ may each independently be O, S, Se, Te, Si($Q_{111}$)($Q_{112}$), or Ge($Q_{111}$)($Q_{112}$).

$R_{113}$ to $R_{117}$ may each independently be as described for $R_{121}$, and $Q_{111}$ to $Q_{113}$ may each be as described for $Q_{111}$.

In an embodiment, a compound represented by Formula 110 may be selected from compounds of Groups 1 to 3:

Group 1

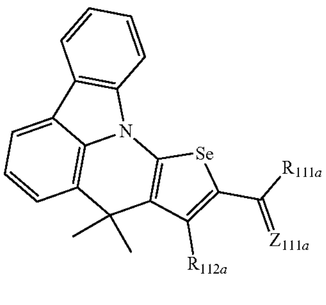

-continued
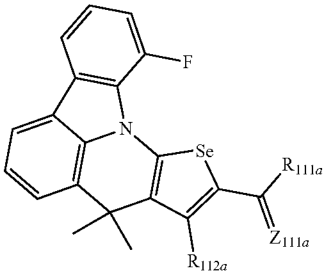
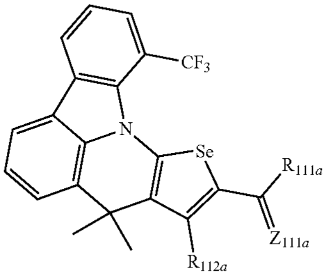
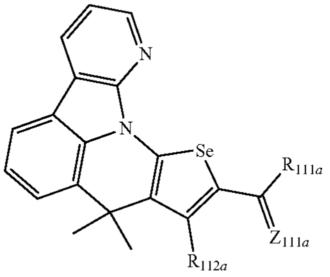
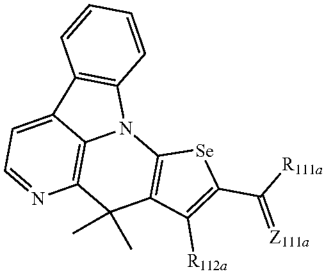
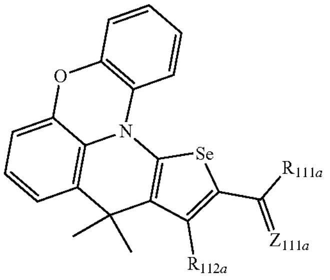
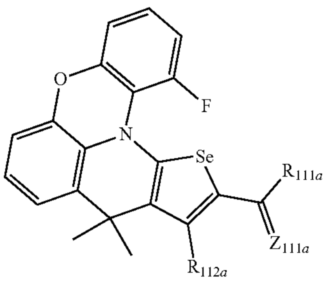
-continued
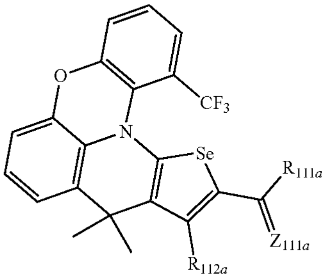
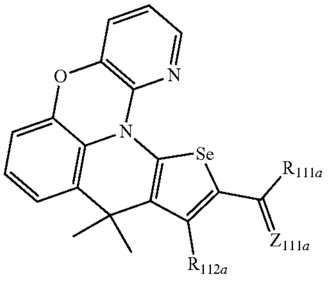
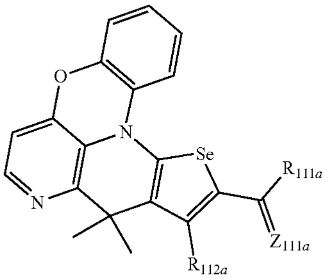
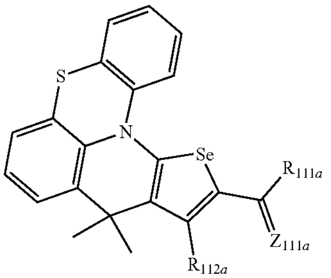
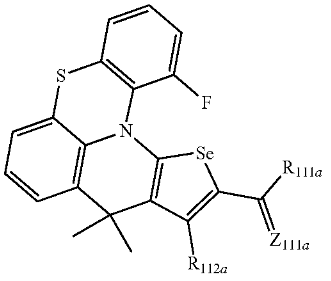
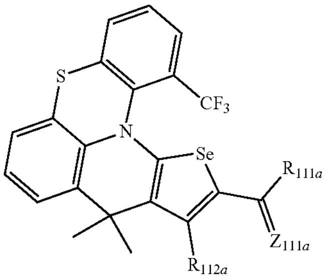

-continued
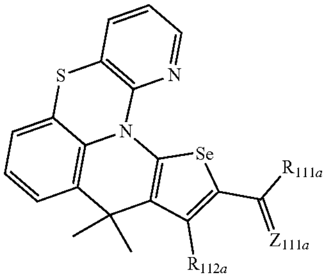
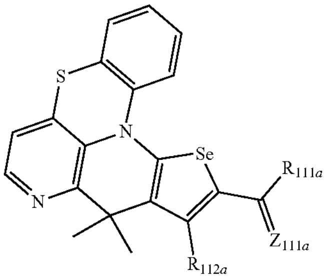
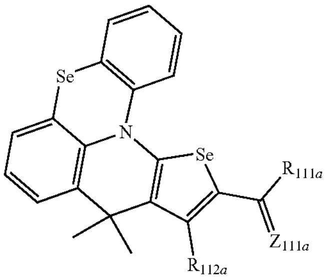
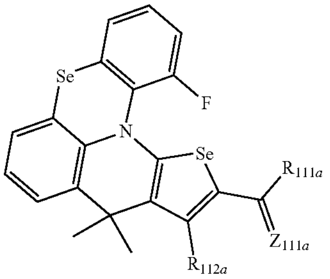
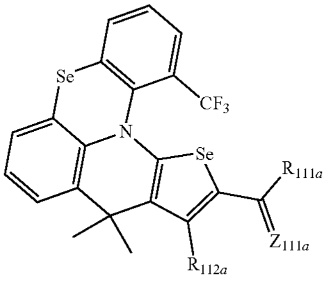
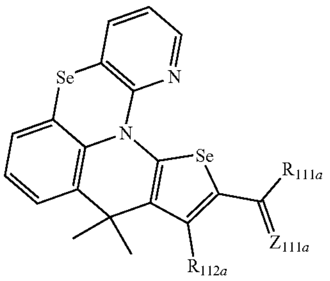
-continued
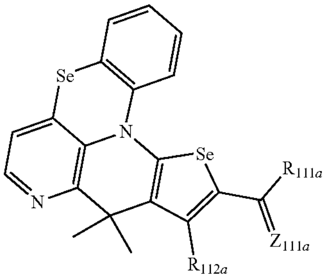
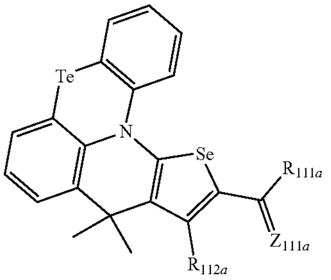
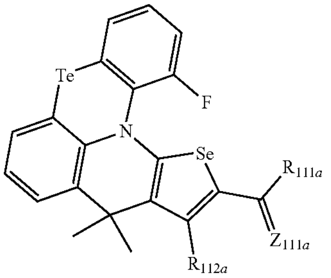
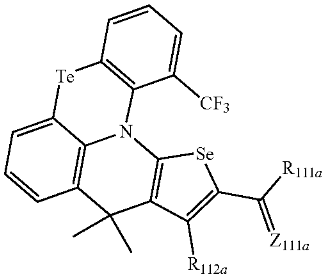
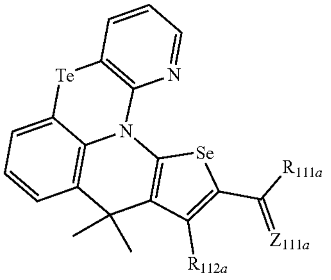
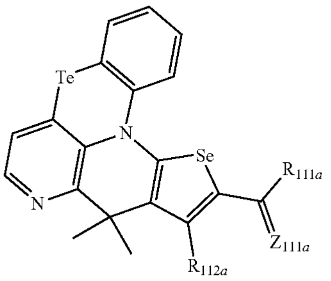

-continued
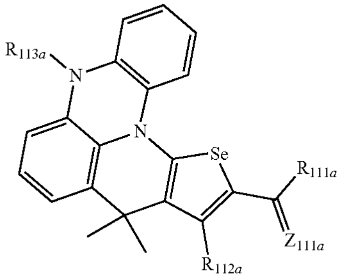
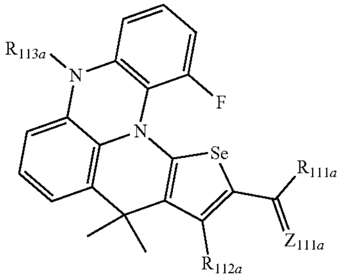
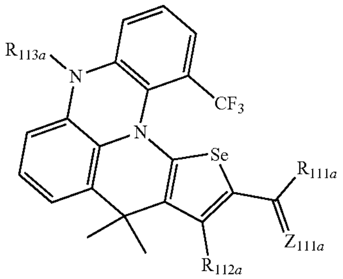
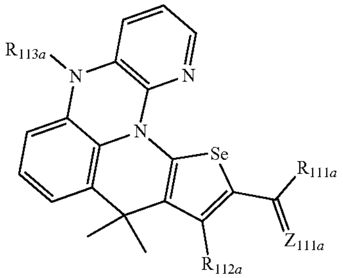
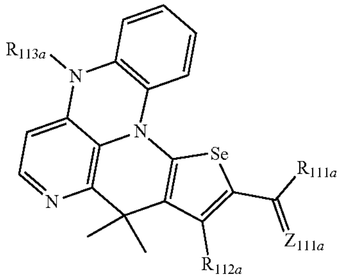
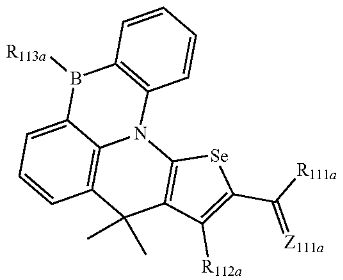
-continued
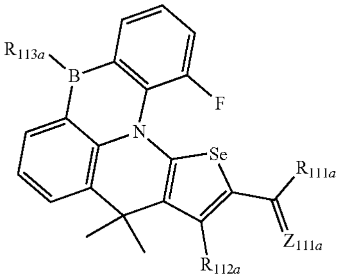
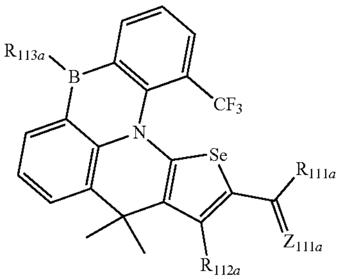
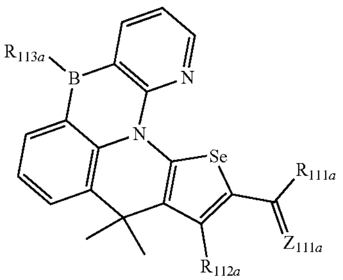
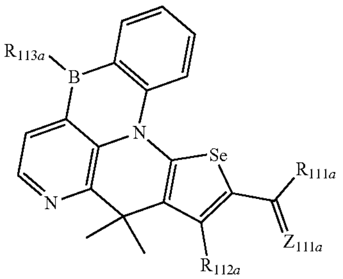
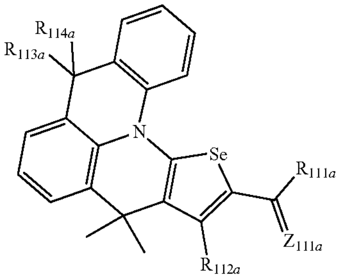
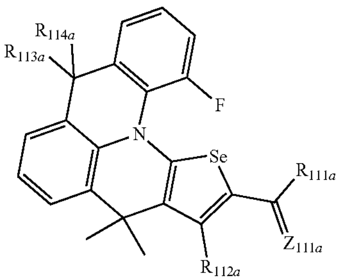

-continued
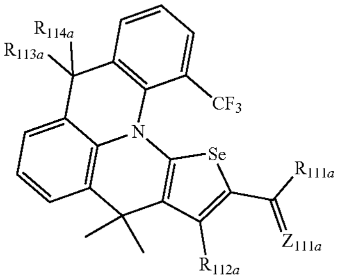
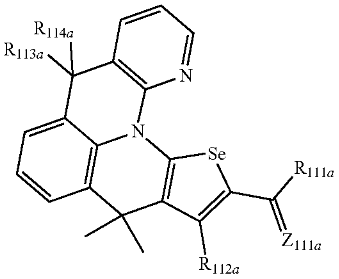
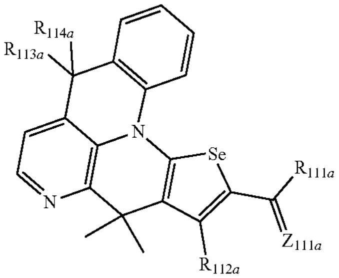
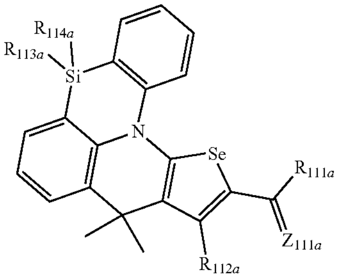
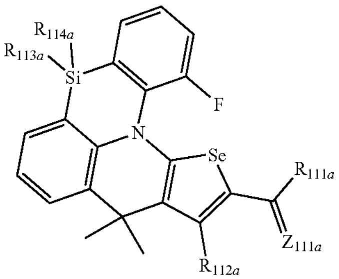
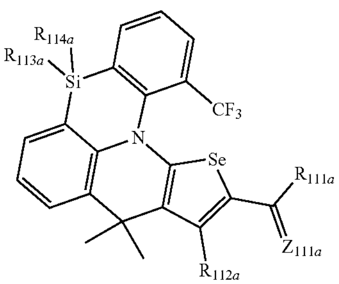
-continued
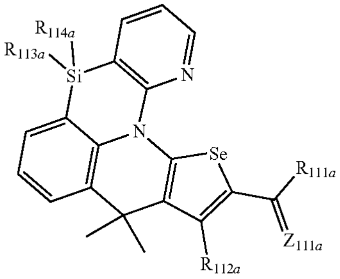
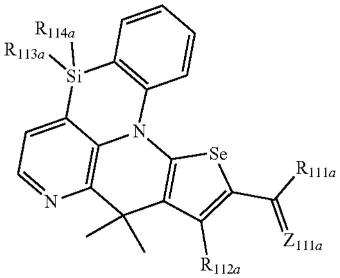
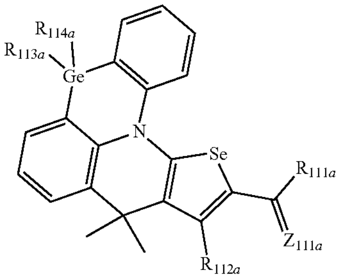
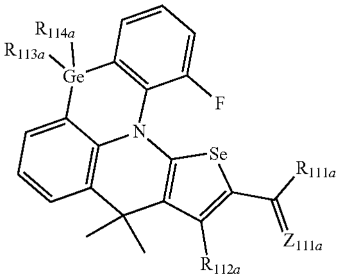
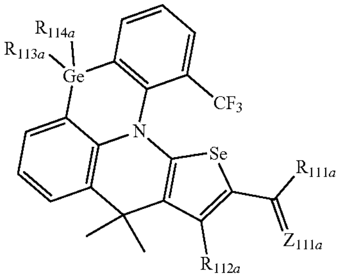
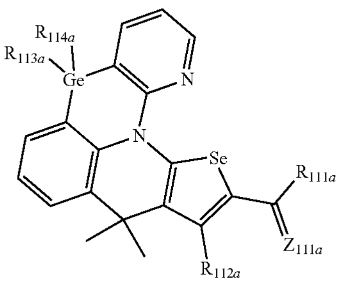

-continued
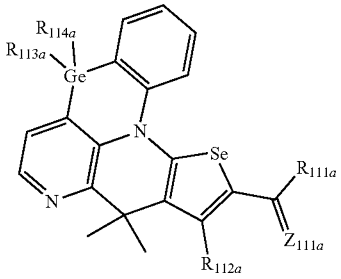
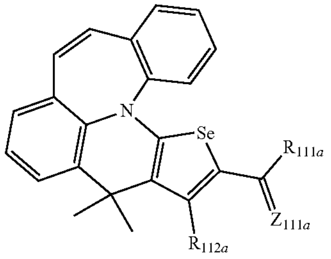
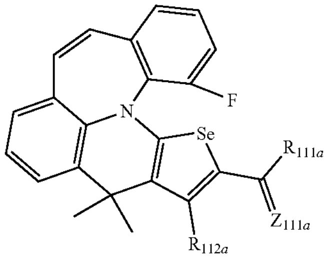
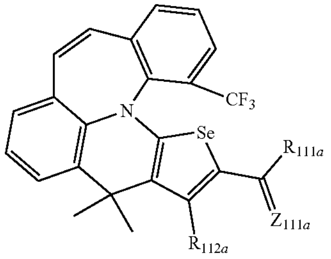
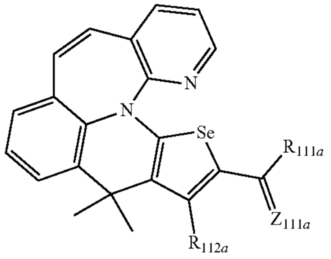
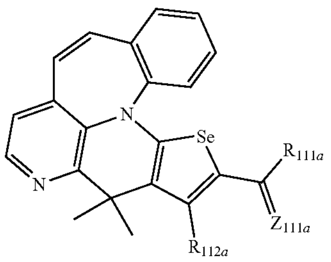
-continued
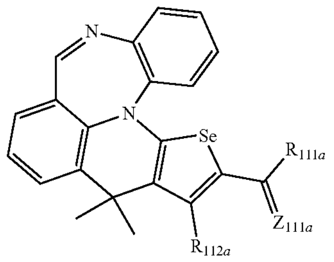
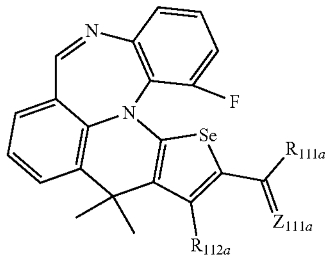
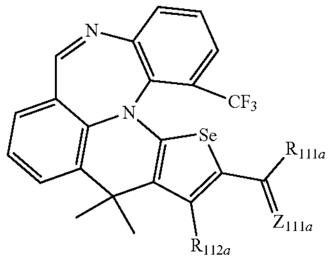
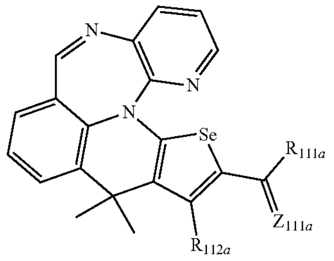
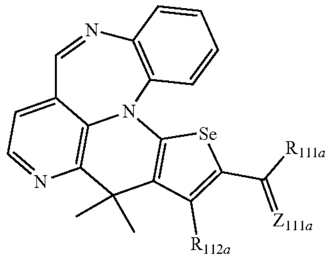
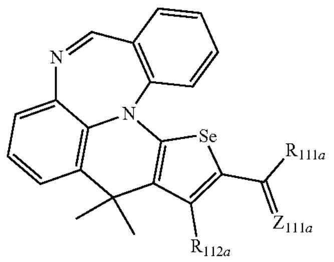

-continued
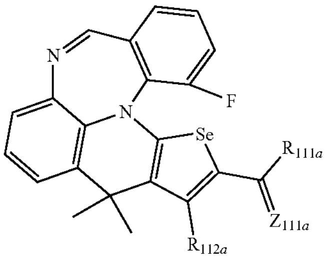
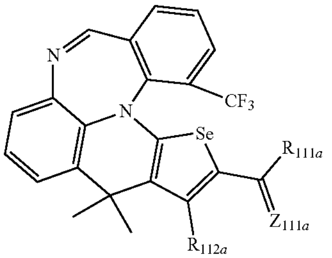
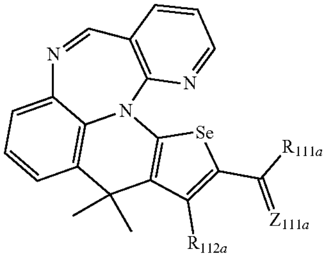
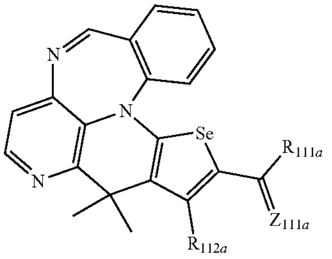
Group 2
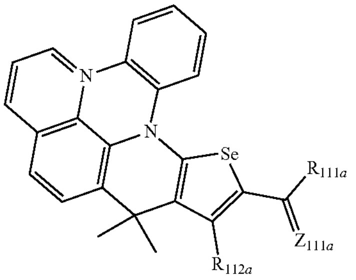
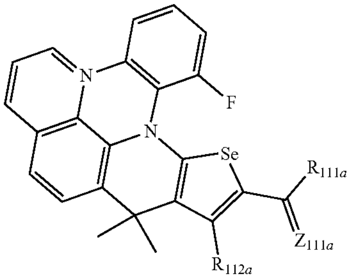
-continued
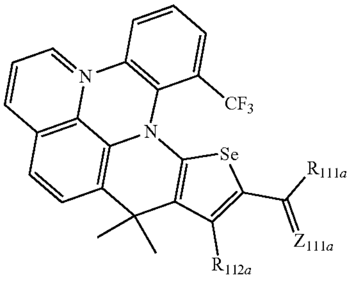
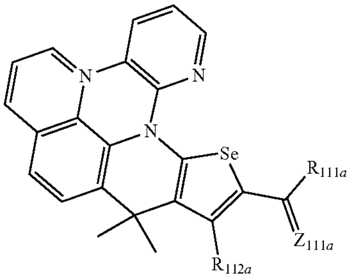
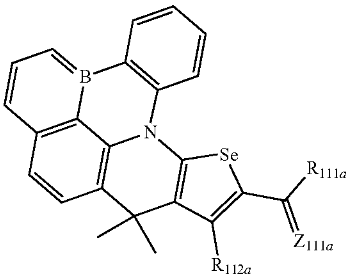
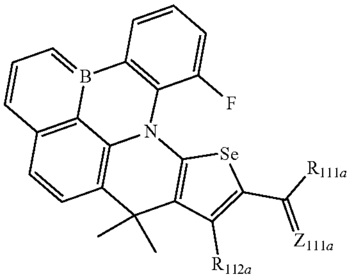
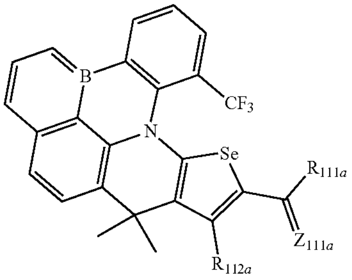
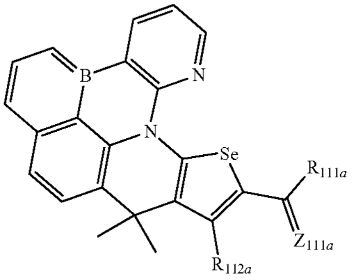

-continued
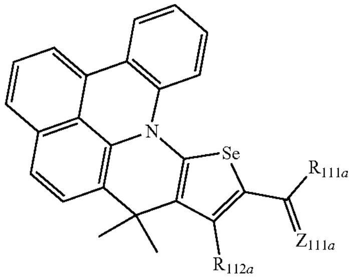
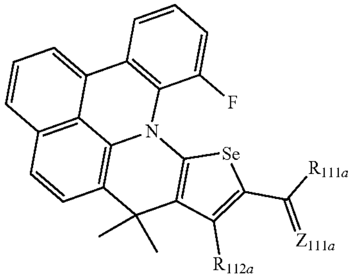
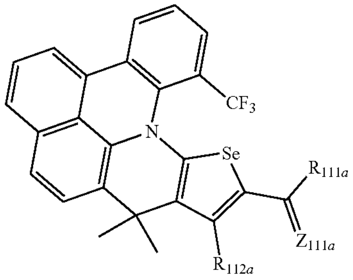
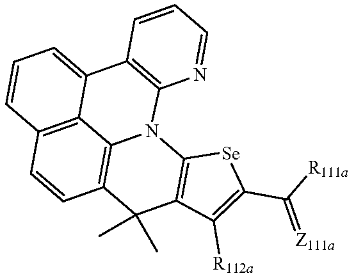
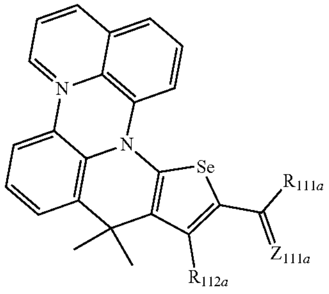
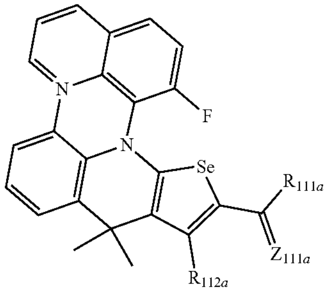
-continued
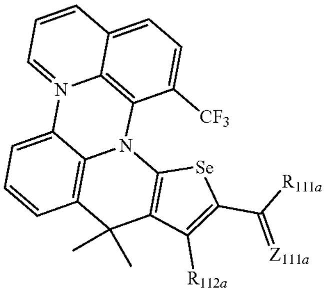
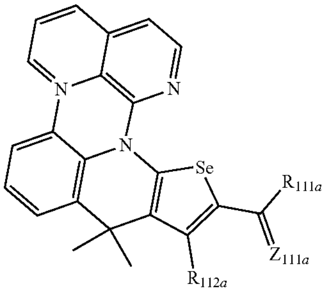
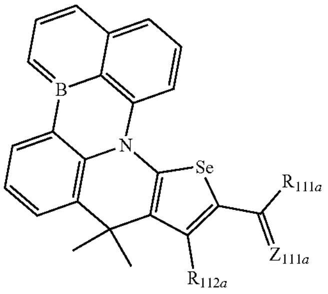
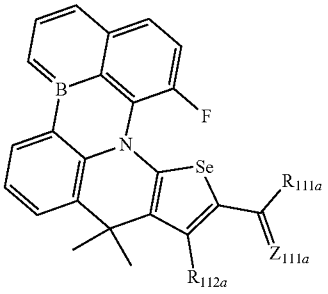
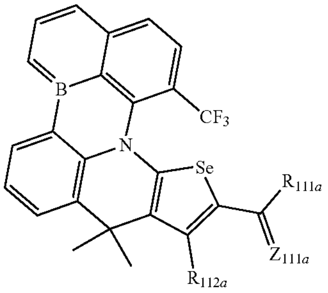

-continued
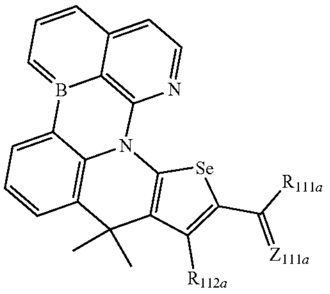
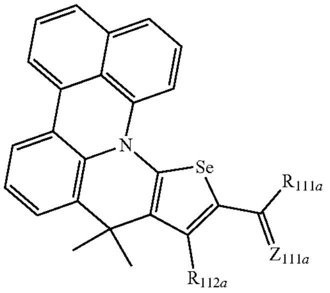
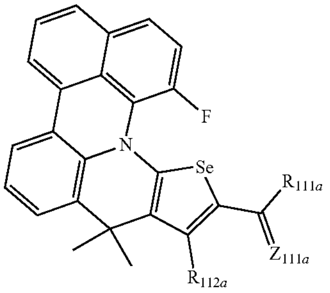
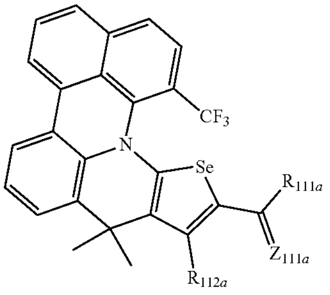
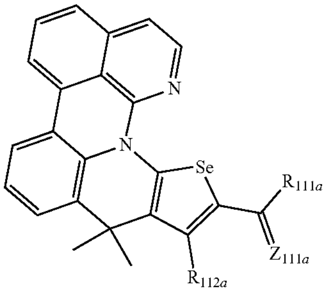
-continued
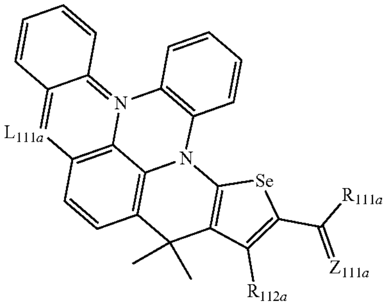
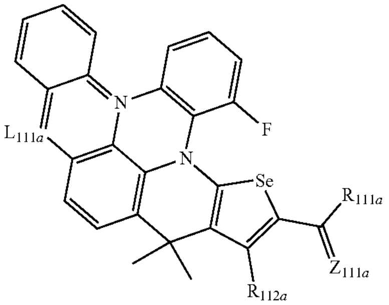
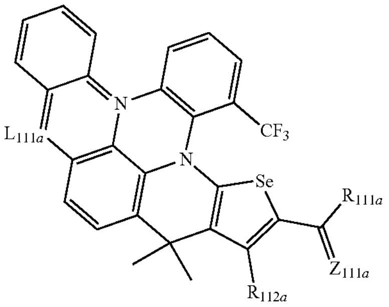
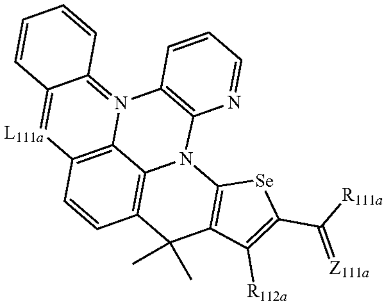
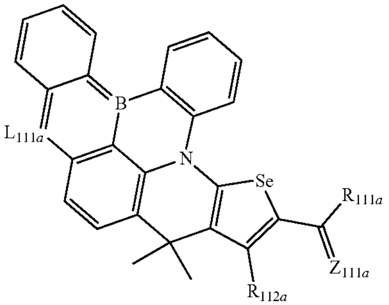

-continued
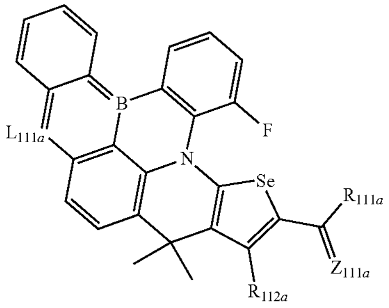
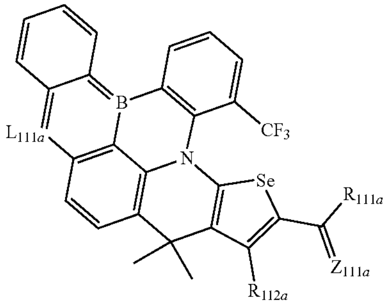
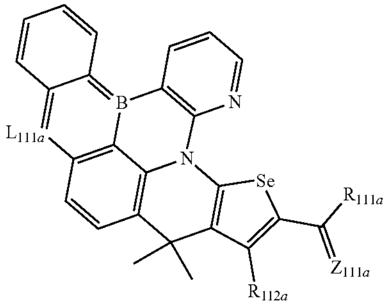
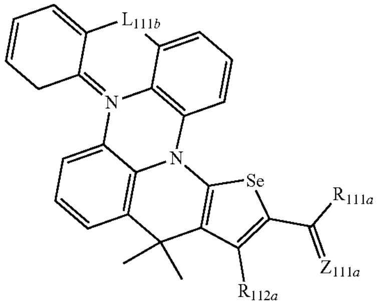
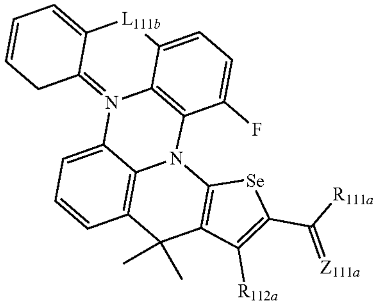
-continued
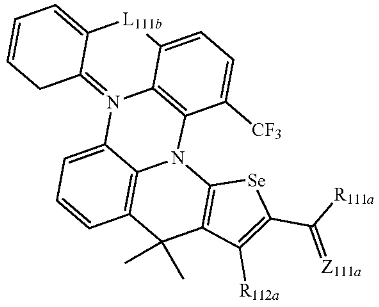
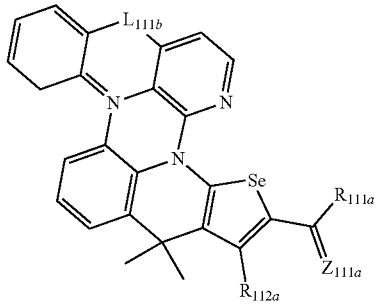
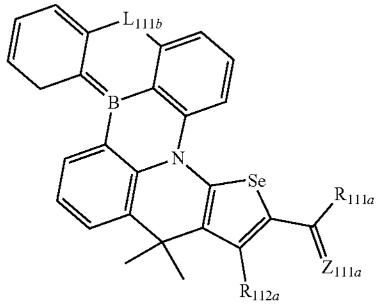
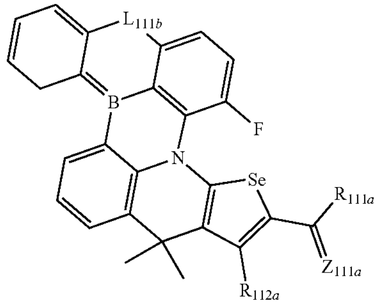
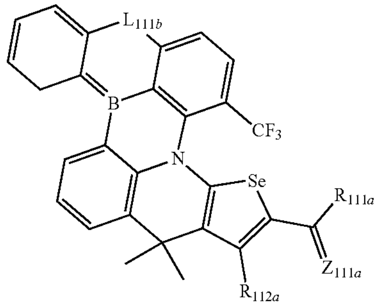

-continued
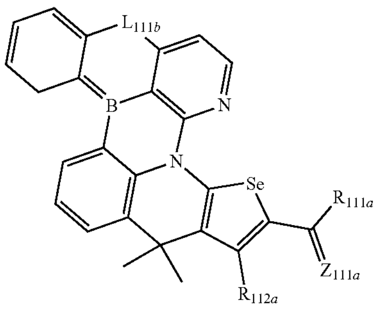
Group 3
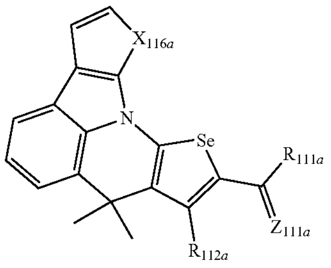
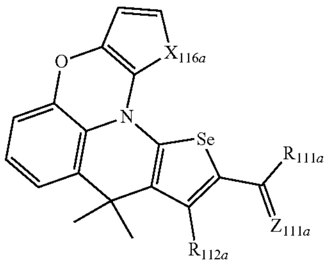
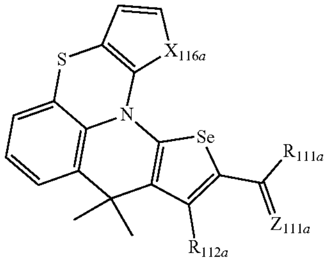
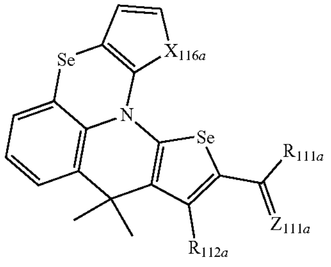
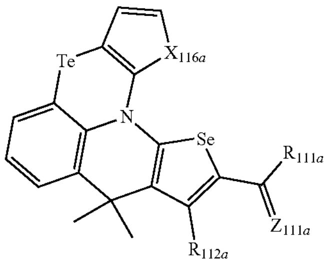
-continued
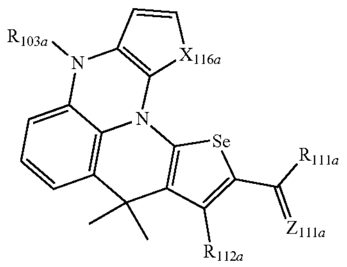
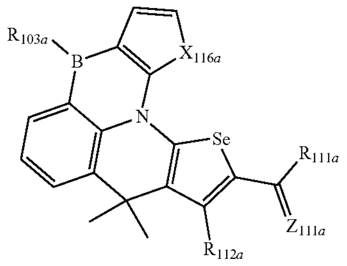
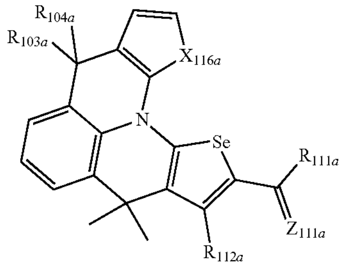
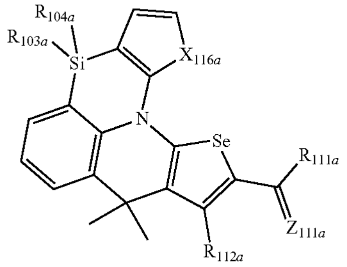
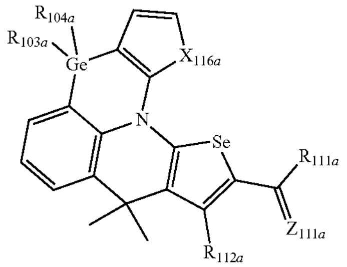
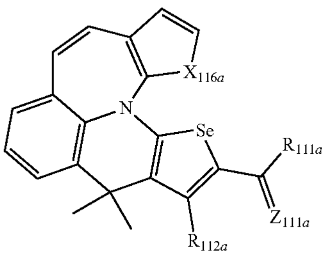

-continued
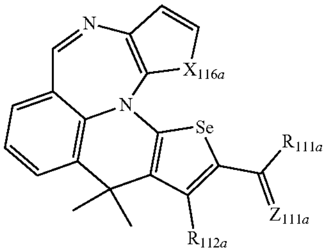
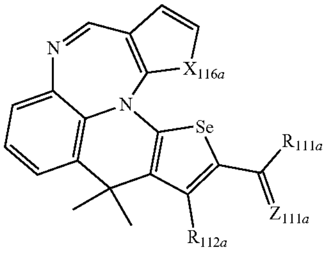
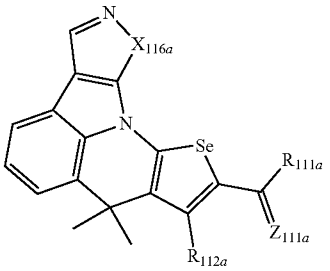
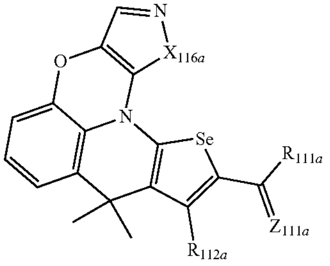
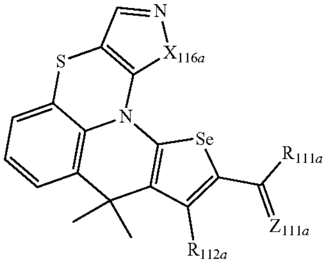
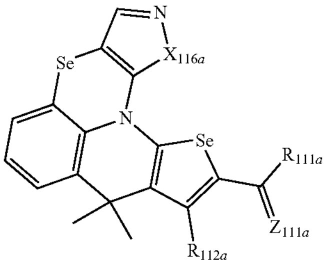
-continued
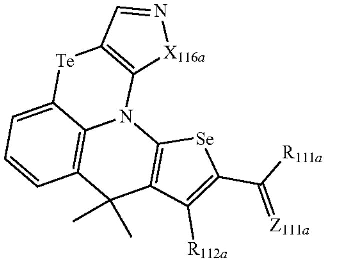
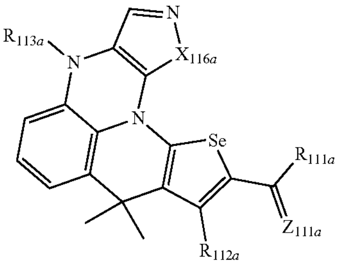
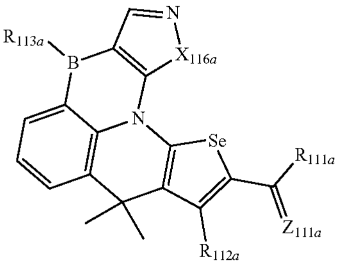
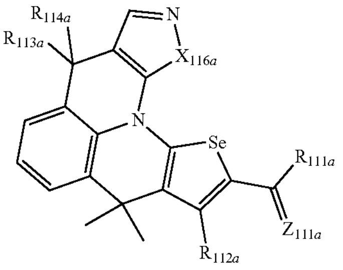
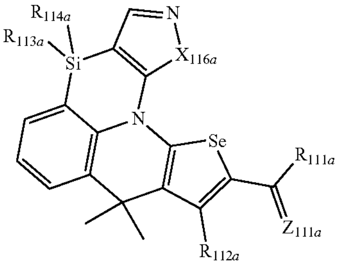
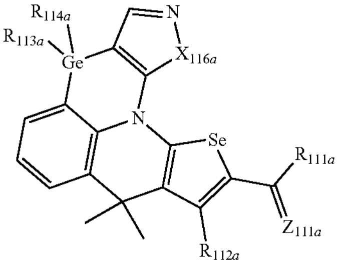

-continued
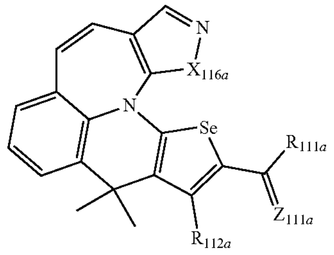
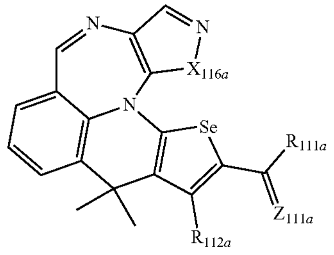
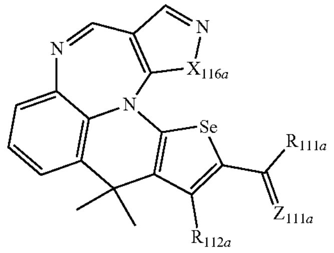
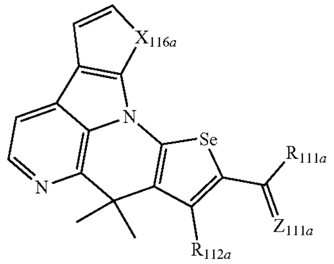
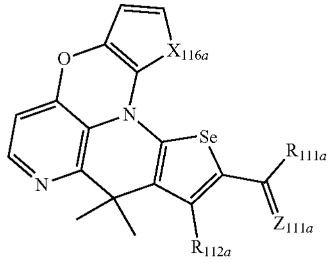
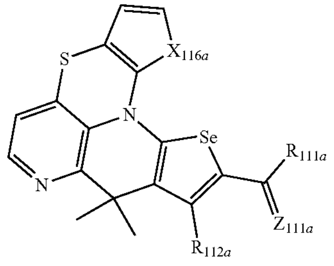
-continued
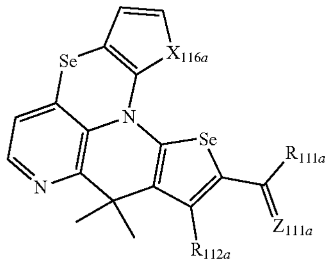
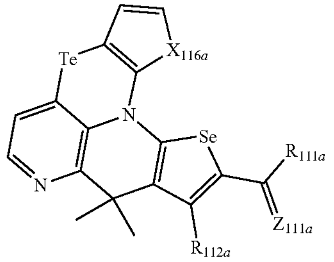
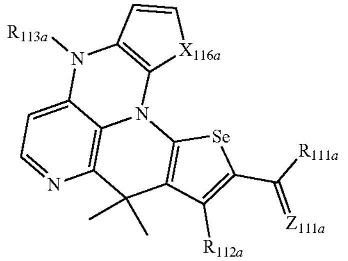
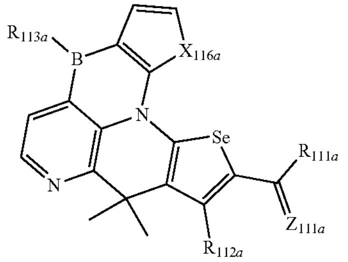
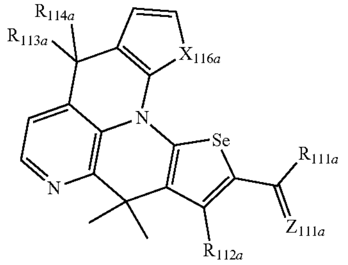
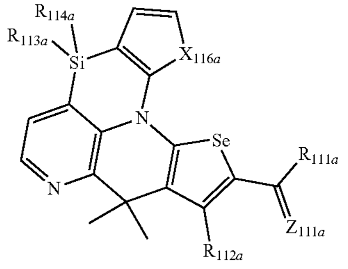

-continued

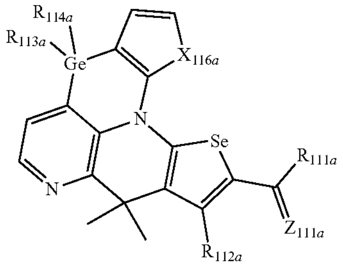

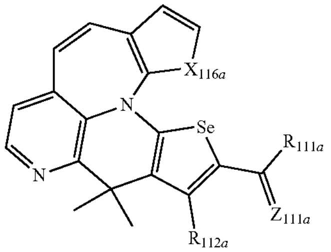

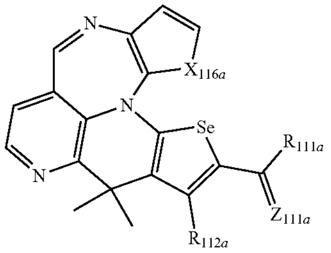

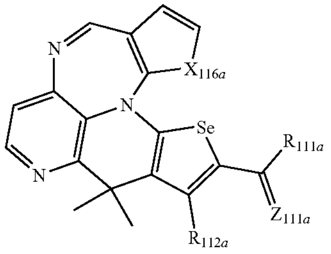

wherein, in the compounds of Groups 1 to 3, $R_{111a}$ to $R_{114a}$ may each be as described for $R_{111}$, $Z_{111a}$ may be as described for $Z_{111}$, and $X_{116a}$ may be as described for $X_{116}$.

In an embodiment, $R_{111a}$ to $R_{114a}$ may each independently be hydrogen, a $C_1$-$C_{30}$ alkyl group, a $C_6$-$C_{30}$ aryl group, or a $C_3$-$C_{30}$ heteroaryl group. For example, $R_{111a}$ and $R_{112a}$ may be hydrogen. For example, $R_{113a}$ and $R_{114a}$ may be hydrogen, a methyl group, or a phenyl group.

In an embodiment, $Z_{111a}$ may be a group represented by Formula 111A. For example, in Formula 111A, $Z_{112}$ and $Z_{113}$ may be 0, $X_{113}$ may be N or CH, and $R_{113}$ to $R_{117}$ may be hydrogen.

In an embodiment, the acceptor layer may include a mixed acceptor layer including a first acceptor compound and a second acceptor compound, each independently represented by Formula 120. In this regard, the first acceptor compound and the second acceptor compound may be different from each other.

Formula 120

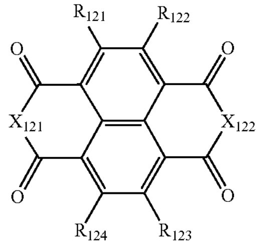

In Formula 120, $X_{121}$ and $X_{122}$ may each independently be O or $NR_{125}$, and $R_{121}$ to $R_{124}$ and $R_{125}$ may each independently be hydrogen, deuterium, halogen, a cyano group, a nitro group, a hydroxy group, a $C_1$-$C_{30}$ alkyl group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10}$, or a combination thereof.

In Formulae 110 and 120, $R_{10a}$ may be:

deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or a combination thereof; or Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, wherein $Q_{11}$ to $Q_{13}$, $Q_{21}$ to $Q_{23}$, $Q_{31}$ to $Q_{33}$, and $Q_{41}$ to $Q_{43}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In an embodiment, the compound represented by Formula 120 may be a compound represented by Formula 121 or 122:

Formula 121

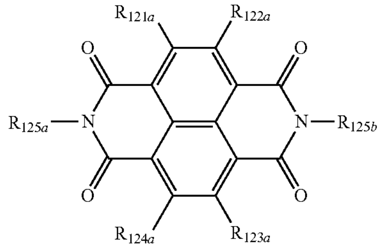

Formula 122

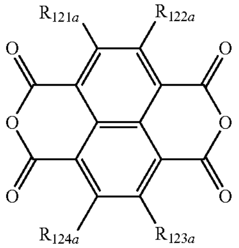

wherein, in Formulae 121 and 122, $R_{121a}$ to $R_{124a}$ may each independently be hydrogen, deuterium, halogen, a cyano group, a $C_1$-$C_{30}$ alkyl group, a $C_6$-$C_{30}$ aryl group, or a $C_3$-$C_{30}$ heteroaryl group, and $R_{125a}$ and $R_{125b}$ may each independently be hydrogen, deuterium, halogen, a cyano group, a $C_1$-$C_{30}$ alkyl group unsubstituted or substituted with at least one $R_{10a}$, a $C_6$-$C_{30}$ aryl group unsubstituted or substituted with at least one $R_{10a}$, or a $C_3$-$C_{30}$ heteroaryl group unsubstituted or substituted with at least one $R_{10a}$.

In an embodiment, $R_{121a}$ to $R_{124a}$ may each independently be hydrogen, deuterium, halogen, a cyano group, a methyl group, or a phenyl group. For example, $R_{121a}$ to $R_{124a}$ may be hydrogen.

In an embodiment, $R_{125a}$ and $R_{125b}$ may each independently be: hydrogen, halogen, a cyano group; a $C_1$-$C_{30}$ alkyl group; or a $C_1$-$C_{30}$ aryl group substituted with halogen, a cyano group, an alkyl group, or halogen.

In an embodiment, a compound represented by Formula 120 may be selected from the following compounds:

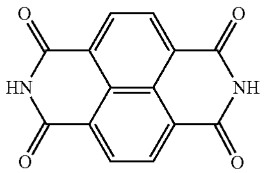

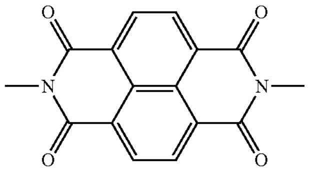

-continued

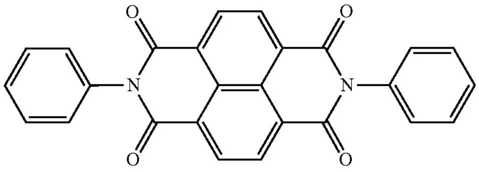

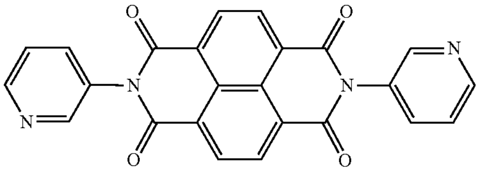

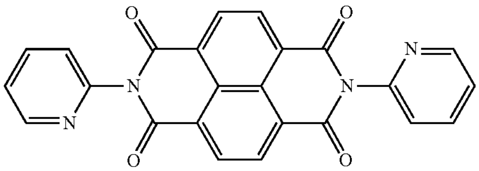

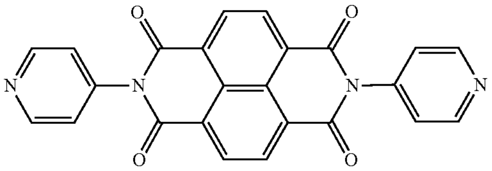

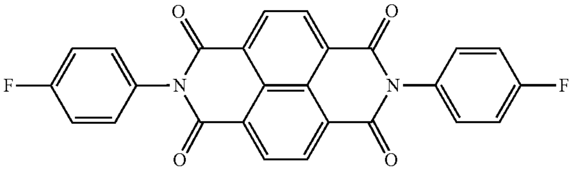

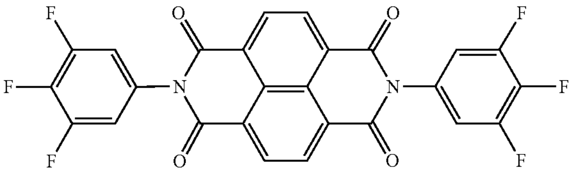

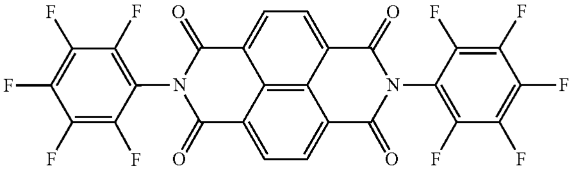

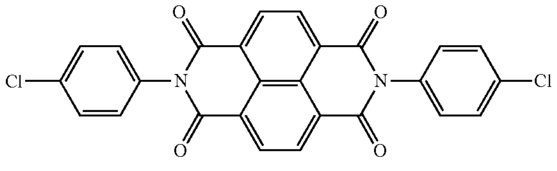

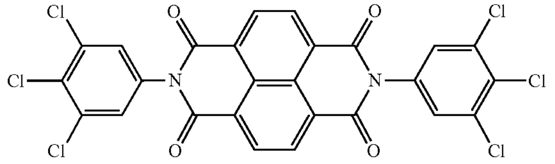

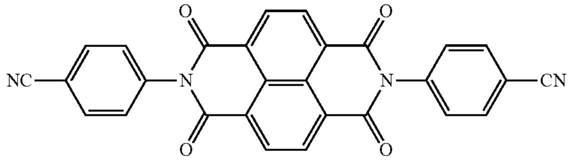

-continued

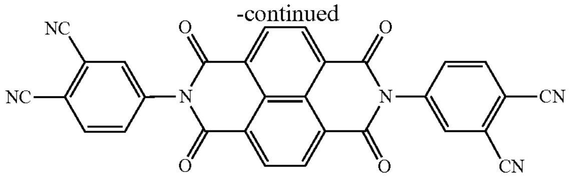

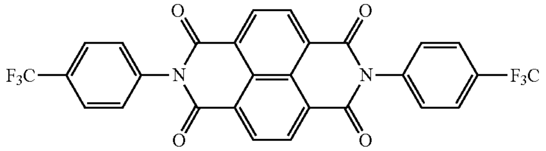

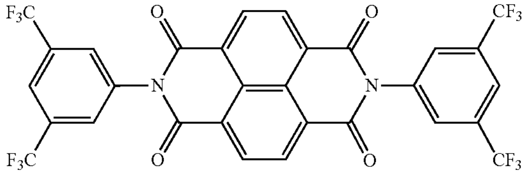

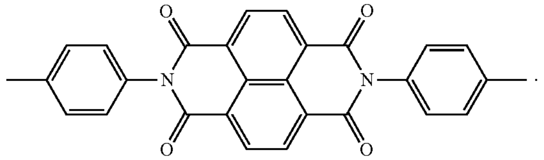

In an embodiment, the acceptor layer may further include an additional acceptor layer, and the additional acceptor layer may include a third acceptor compound represented by Formula 120. For example, the additional acceptor layer may consist of a single compound, and may be referred to as a single acceptor layer herein.

For example, the third acceptor compound may be identical to any one selected from the first acceptor compound and the second acceptor compound. In an embodiment, the third acceptor compound may be different from the first acceptor compound and the second acceptor compound.

Figure 2A:
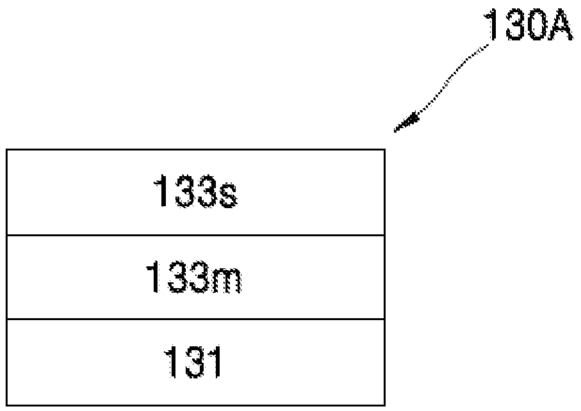
FIGS. 2A-2C are each a conceptual view of a photoactive layer according to an embodiment.
Figure 2B:
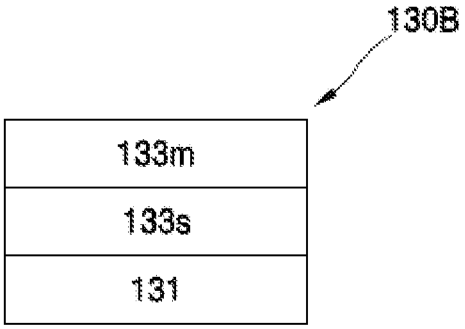

Referring to FIG. 2A, a photoactive layer 130A according to an embodiment may sequentially include a donor layer 131, a mixed acceptor layer 133*m*, and a single acceptor layer 133*s*. In an embodiment, referring to FIG. 2B, a photoactive layer 130B according to an embodiment may sequentially include the donor layer 131, the single acceptor layer 133*s*, and the mixed acceptor layer 133*m*.

Figure 2C:
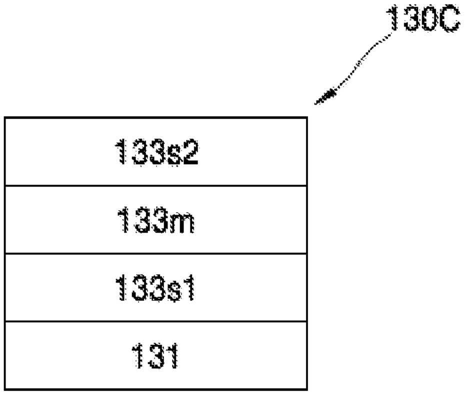

In an embodiment, the acceptor layer may include the two single acceptor layers and the mixed acceptor layer between the two single acceptor layers. Referring to FIG. 2C, a photoactive layer 130C according to an embodiment may sequentially include the donor layer 131, a single acceptor layer 133*s*1, the mixed acceptor layer 133*m*, and a single acceptor layer 133*s*2. The mixed acceptor layer 133*m* may include the first acceptor compound and the second acceptor compound, the single acceptor layer 133*s*1 may include the third acceptor compound, and the single acceptor layer 133*s*2 may include the fourth acceptor compound. In this regard, the first acceptor compound to the fourth acceptor compound may be compounds represented by Formula 120. The first acceptor compound and the second acceptor compound may be different from each other, and the third acceptor compound may be the same as one selected from the first acceptor compound and the second acceptor compound. In an embodiment, the third acceptor compound may be different from the first acceptor compound and the second acceptor compound. The fourth acceptor compound may be the same as or different from the third acceptor compound.

A film quality of the photoactive layer may affect an external quantum efficiency (EQE) of the organic photodiode. In the organic photodiode 10 according to an embodiment, the donor layer and the acceptor layer of the photoactive layer 130 may form a planar heterojunction. In this regard, the acceptor layer may include a mixed layer of two planar compounds having different shapes, thereby effectively maintaining the crystallinity of the acceptor layer. Because the crystallinity of the acceptor layer is maintained effectively, the thickness of the acceptor layer may be increased to improve light absorption efficiency. In addition, because the photoactive layer according to an embodiment has high hole and electron mobility, a barrier of the movement of charges at an interface of the photoactive layer is low, thereby improving the EQE of the organic photodiode.

The thickness of the photoactive layer 130 may be, for example, about 100 Å to about 500 Å, about 150 Å to about 400 Å, or about 200 Å to about 340 Å. The thickness of the donor layer 131 may be, for example, about 50 Å to about 200 Å, about 70 Å to about 170 Å, or about 100 Å to about 150 Å. The thickness of the acceptor layer 133 may be, for example, about 100 Å to about 400 Å, about 150 Å to about 350 Å, or about 200 Å to about 300 Å. When the acceptor layer 133 includes the mixed acceptor layer 133*m* and the single acceptor layer 133*s*, the mixed acceptor layer 133*m* may be, for example, about 20 Å to about 150 Å or about 30 Å to about 120 Å. When the thicknesses of the photoactive layer, the donor layer, the acceptor layer, and the mixed acceptor layer are within the above range, suitable or appropriate light absorption efficiency and EQE may be maintained.

The hole transport region 120 may further include an auxiliary layer in contact with the photoactive layer 130. The auxiliary layer may compensate for an optical resonance distance according to a wavelength of light incident on the photoactive layer 130 to increase light absorption efficiency. Also, the auxiliary layer may lower an energy barrier of holes moving in a direction of the hole transport layer and the anode to facilitate migration of holes.

The auxiliary layer may include, for example, a fluorene-based compound, a carbazole-based compound, a diarylamine-based compound, a triarylamine-based compound, a dibenzofuran-based compound, a dibenzothiophene-based compound, a dibenzosilole-based compound, or a combination thereof. In an embodiment, the auxiliary layer may include (or consist of) a compound having a refractive index in a range of about 1.7 to about 2.0.

The first electrode 110, the second electrode 150, the hole transport region 120, and the electron transport region 140 of the organic photodiode 10 may each use the same (or substantially the same) material as those of the anode, the cathode, the hole transport region, and the electron transport region of the organic light-emitting device.

Figure 3:
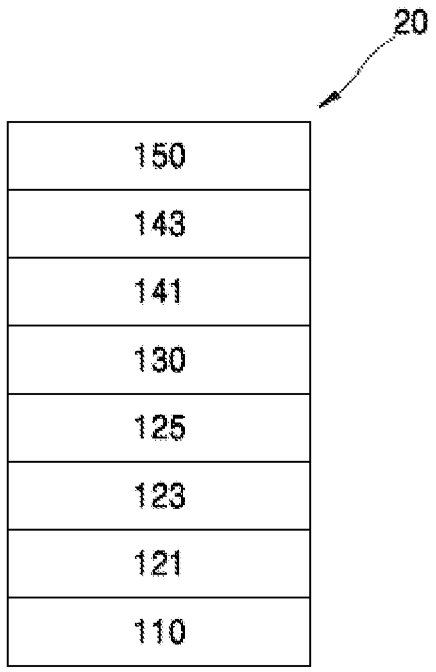
FIG. 3 is a schematic cross-sectional view of an organic photodiode according to another embodiment.

FIG. 3 is a schematic cross-sectional view of an organic photodiode 20 according to another embodiment.

Referring to FIG. 3, a hole injection layer 121, a hole transport layer 123, and an auxiliary layer 125 may be arranged between the first electrode 110 and the photoactive layer 130. In this regard, the photoactive layer 130 may be in direct contact with the auxiliary layer 125, and the auxiliary layer 125 is in direct contact with the hole transport layer 123. As used herein, the term "direct contact" may mean that two elements physically contact each other without any intervening elements between the two elements. In an embodiment, an electron blocking layer may further be included between the photoactive layer 130 and the auxiliary layer 125.

An electron transport layer 141 and an electron injection layer 143 may be arranged between the photoactive layer 130 and the second electrode 150. In an embodiment, a hole blocking layer may further be included between the photoactive layer 130 and the electron transport layer 121.

The photoactive layer 130 of the organic photodiode 20 may be as described for the photoactive layer 130 of the organic photodiode 10.

Hereinafter, layers constituting the organic photodiodes 10 and 20 of FIGS. 1 and 3 will be described in more detail.

First Electrode 110

A substrate may be additionally located under the first electrode 110 and/or on the second electrode 150 of FIGS. 1-3. As the substrate, a glass substrate and/or a plastic substrate may be used. In an embodiment, the substrate may be a flexible substrate, and may include plastics having excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing and/or sputtering a material for forming the first electrode 110 on the substrate. When the first electrode 110 is an anode, the material for forming the first electrode 110 may be a high-work function material.

The first electrode 110 may be a reflective electrode, a semi-transmissive electrode, or a transmissive electrode. When the first electrode 110 is a transmissive electrode, indium tin oxide (ITO), indium zinc oxide (IZO), tin oxide ($SnO_2$), zinc oxide (ZnO), or a combination thereof may be used as a material for forming the first electrode 110. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or a combinations thereof may be used as a material for forming the first electrode 110.

The first electrode 110 may have a single-layered structure consisting of a single layer or a multi-layered structure including a plurality of layers. For example, the first electrode 110 may have a three-layered structure of ITO/Ag/ITO.

Charge Auxiliary Layer

The organic photodiode 10 or 20 according to an embodiment may include a charge auxiliary layer that may facilitate migration of holes and electrons from the photoactive layer 130. The charge auxiliary layer may include a hole injection layer and a hole transport layer, which facilitate migration of holes, and an electron transport layer and an electron injection layer, which facilitate migration of electrons.

Hole Transport Region

Charge auxiliary layers located between the first electrode 110 and the photoactive layer 130 may be referred to as a hole transport region. The hole transport region 120 may facilitate migration of holes generated in the photoactive layer 130.

The hole transport region 120 may include a hole transport layer, a hole injection layer, an electron blocking layer, or a combination thereof.

The hole transport region may include a hole transport material. For example, the hole transport material may include a compound represented by Formula 201, a compound represented by Formula 202, or a combination thereof:

Formula 201

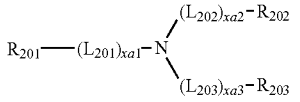

Formula 202

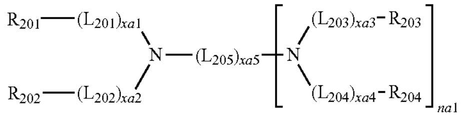

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_6$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from groups represented by Formulae CY201 to CY217:

CY201

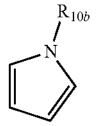

CY202

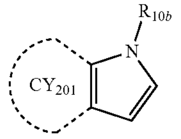

-continued

CY203

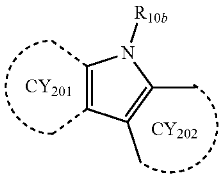

CY204

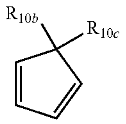

CY205

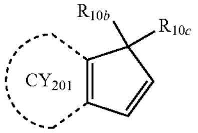

CY206

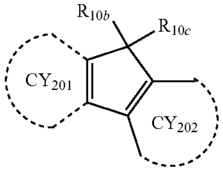

CY207

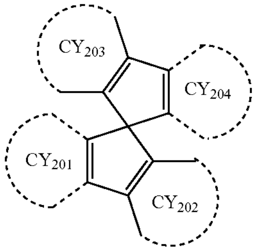

CY207

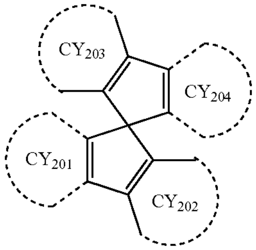

CY208

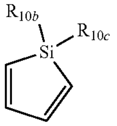

CY209

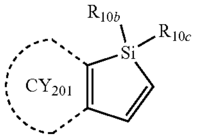

-continued

CY210

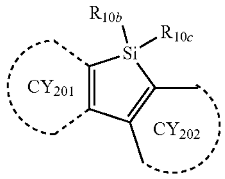

CY211

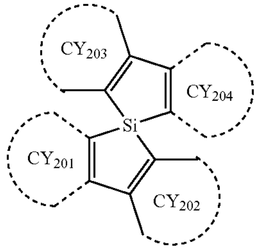

CY212

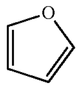

CY213

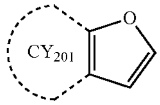

CY214

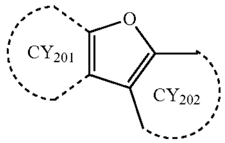

CY215

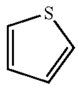

CY216

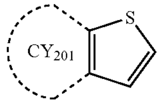

CY217

CY214

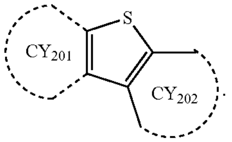

$R_{10b}$ and $R_{10c}$ in Formulae $CY_{201}$ to $CY_{217}$ may be as described for $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae $CY_{201}$ to $CY_{217}$ may be unsubstituted or substituted with $R_{10a}$.

In an embodiment, rings $CY_{201}$ to $CY_{204}$ in Formulae $CY_{201}$ to $CY_{217}$ may each independently be a benzene group, a naphthalene group, a phenanthrene group, or an anthracene group.

In an embodiment, each of Formulae 201 and 202 may include at least one selected from groups represented by Formulae $CY_{201}$ to $CY_{203}$.

In an embodiment, Formula 201 may include at least one selected from the groups represented by Formulae $CY_{201}$ to $CY_{203}$ and at least one selected from the groups represented by Formulae $CY_{204}$ to $CY_{217}$.

In an embodiment, in Formula 201, xa1 may be 1, $R_{201}$ may be a group represented by one of Formulae $CY_{201}$ to $CY_{203}$, xa2 may be 0, and $R_{202}$ may be a group represented by one of Formulae $CY_{204}$ to $CY_{207}$.

In an embodiment, each of Formulae 201 and 202 may not include a group represented by one selected from Formulae $CY_{201}$ to $CY_{203}$.

In an embodiment, each of Formulae 201 and 202 may not include a group represented by one selected from Formulae $CY_{201}$ to $CY_{203}$, and may include at least one selected from the groups represented by Formulae $CY_{204}$ to $CY_{217}$.

In an embodiment, each of Formulae 201 and 202 may not include a group represented by one selected from Formulae $CY_{201}$ to $CY_{217}$.

In an embodiment, the hole transport region may include one selected from Compounds HT1 to HT46, m-MTDATA, TDATA, 2-TNATA, NPB(NPD), 8-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANT/CSA), polyaniline/poly(4-styrenesulfonate) (PANI/PSS), or a combination thereof:

HT1

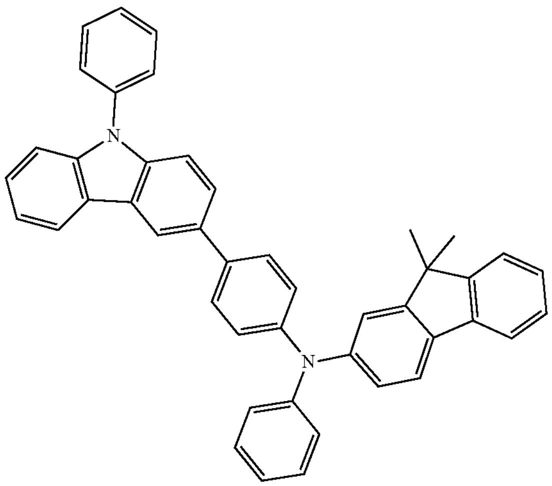

HT2

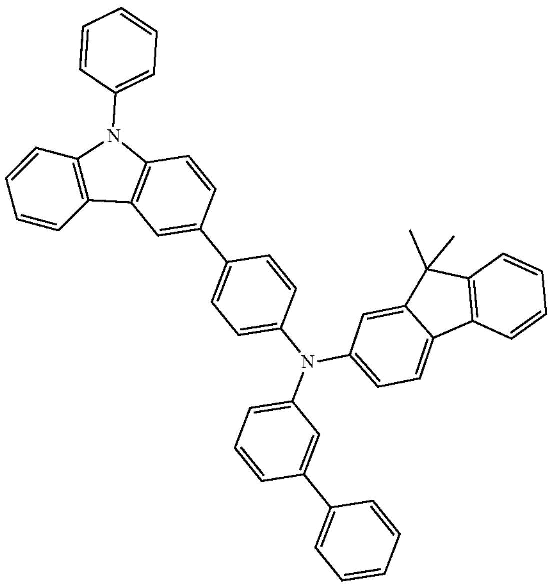

HT3

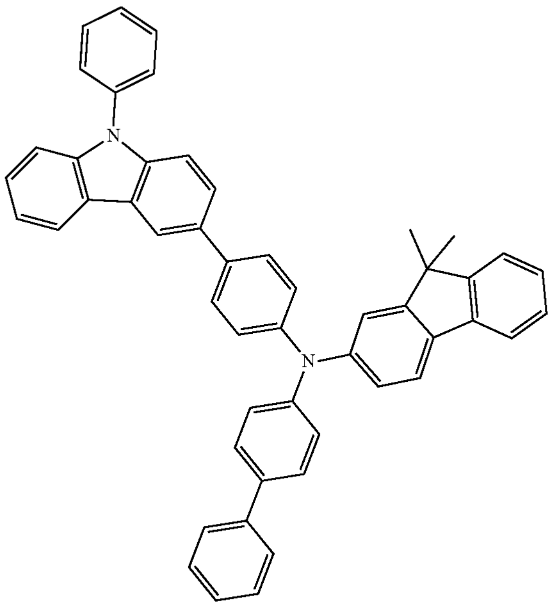

HT4

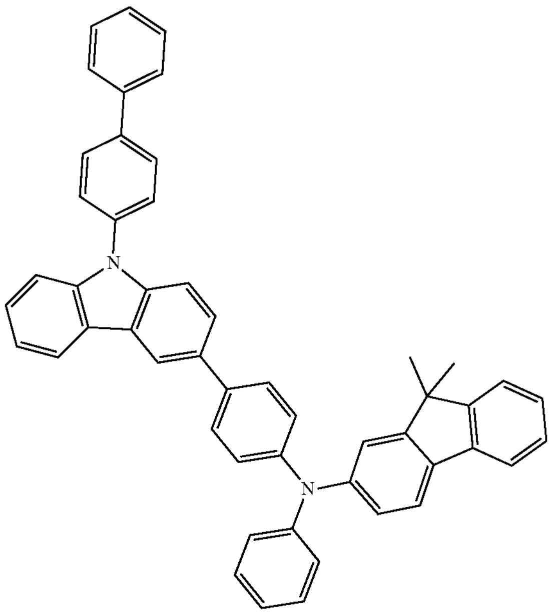

-continued
HT5
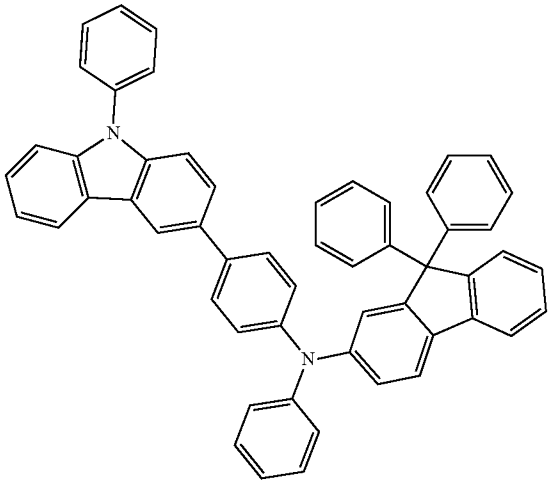
HT6
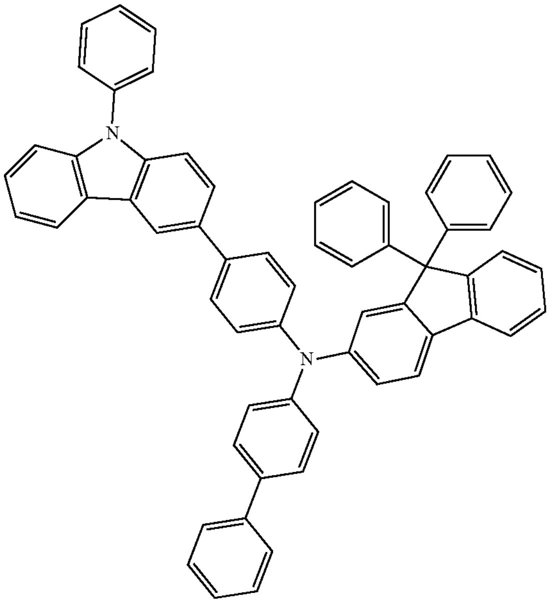
HT7
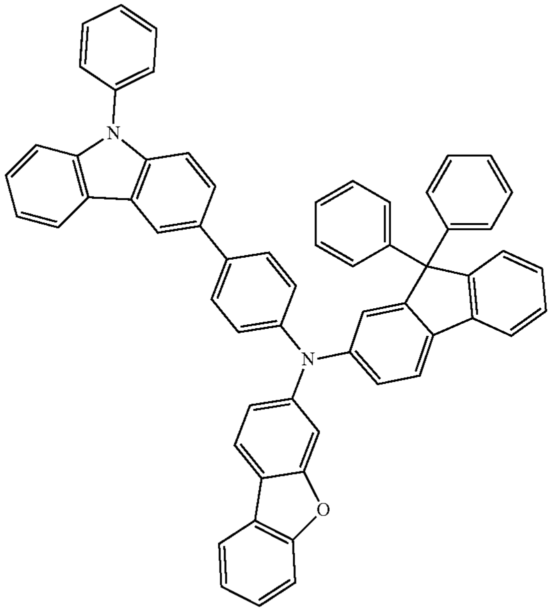
HT8
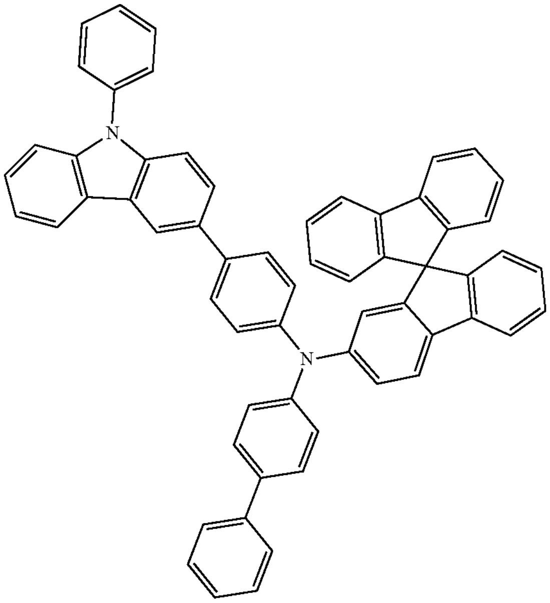

-continued
HT9
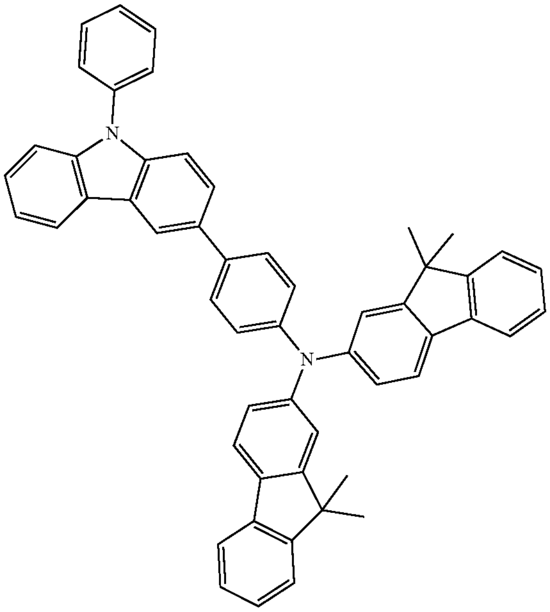
HT10
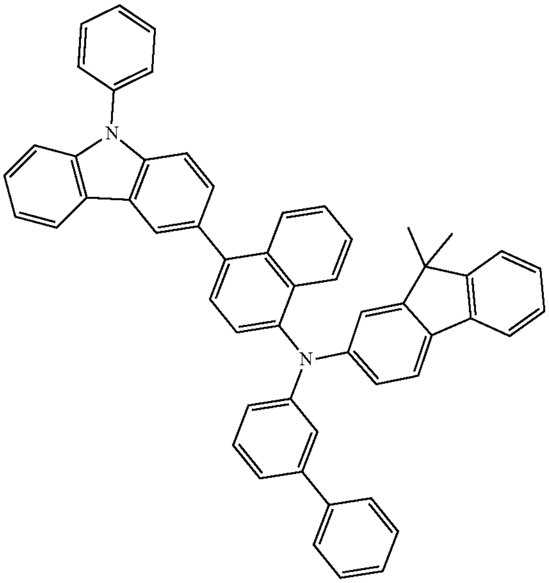
HT11
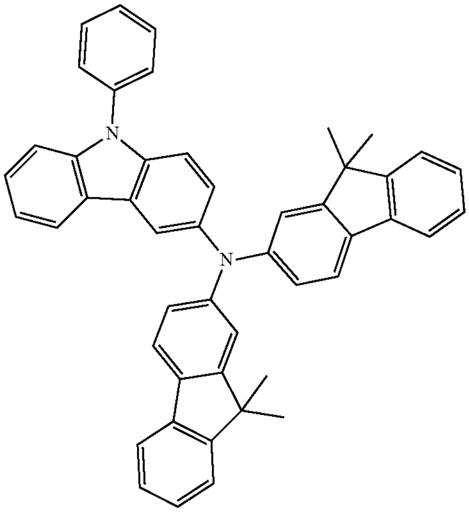
HT12
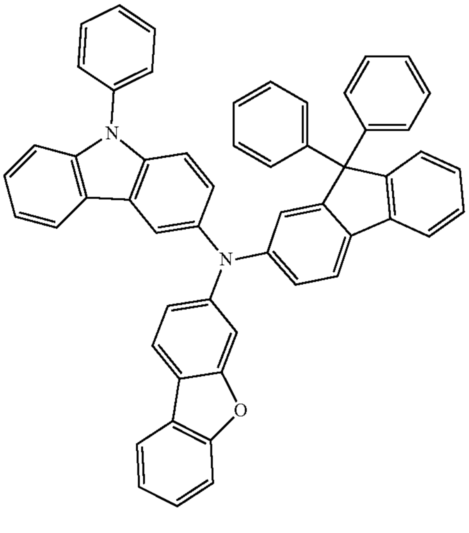

-continued
HT13
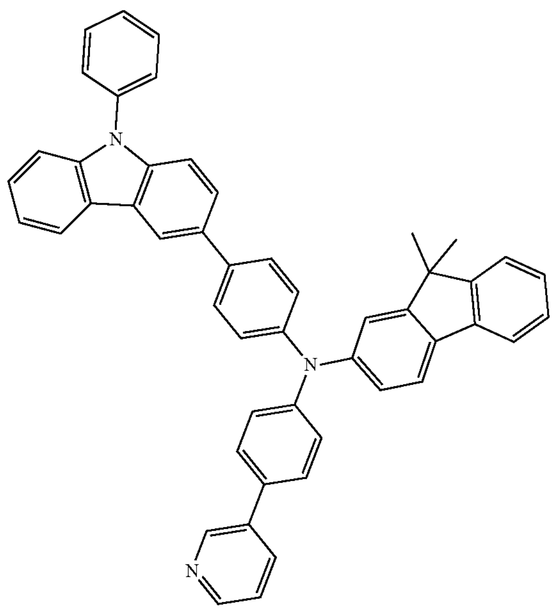
HT14
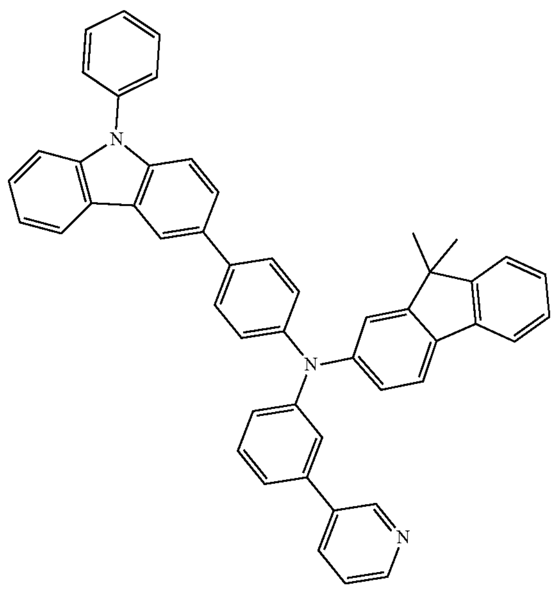
HT15
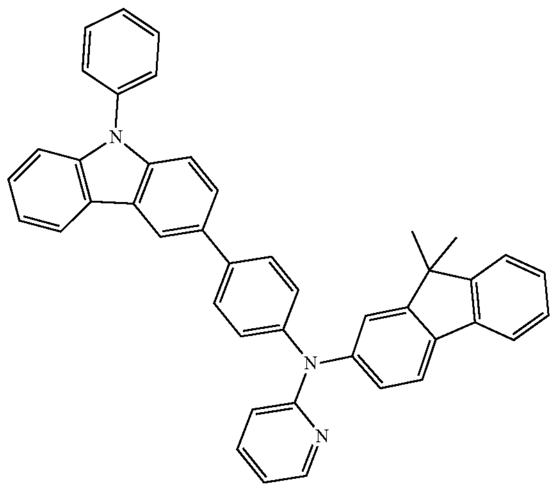
HT16
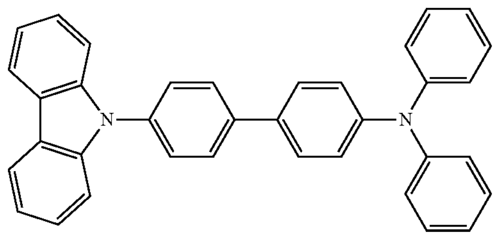
HT17
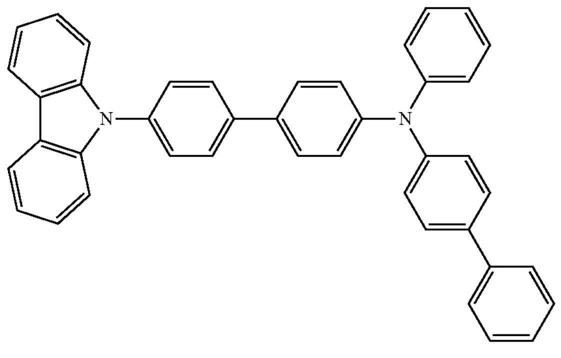
HT18
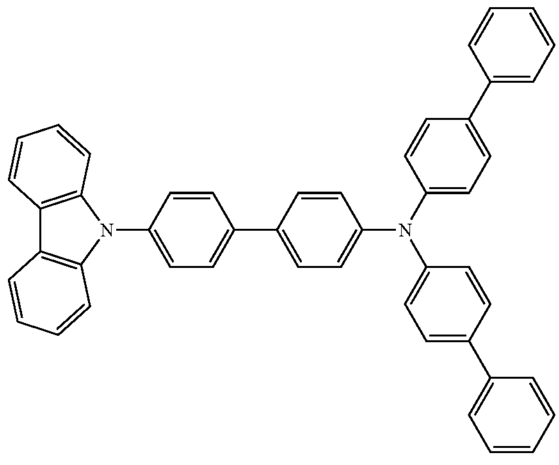

-continued
HT19
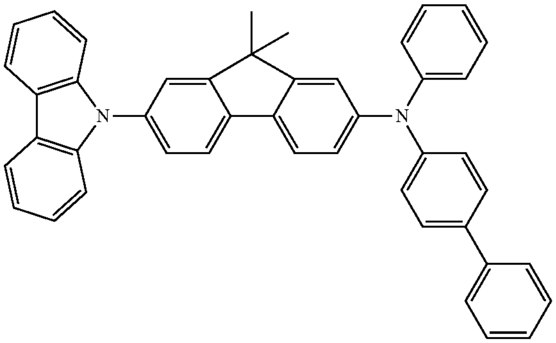
HT20
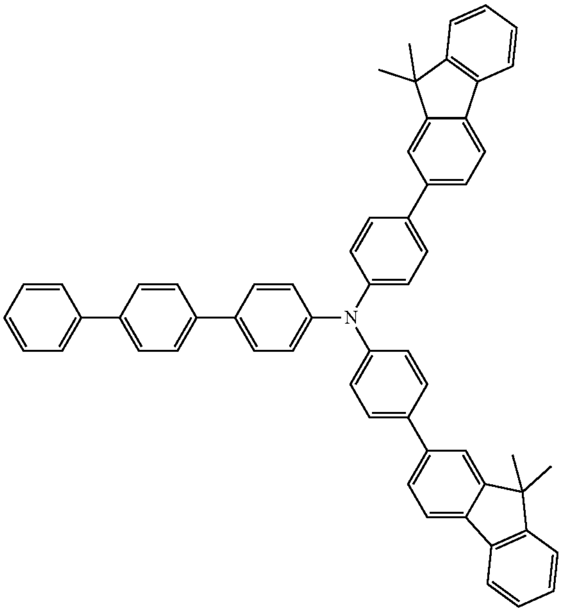
HT21
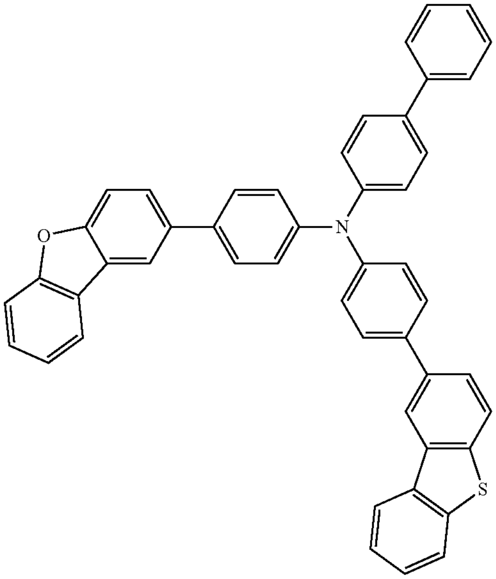
HT22
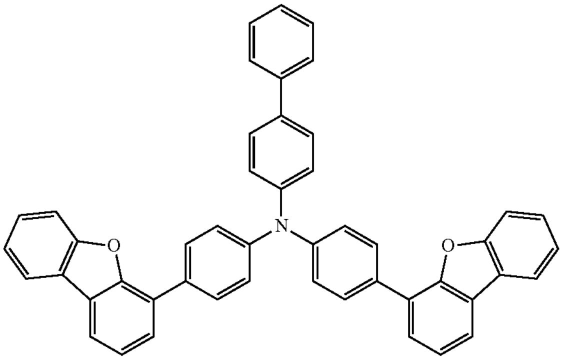

-continued
HT23
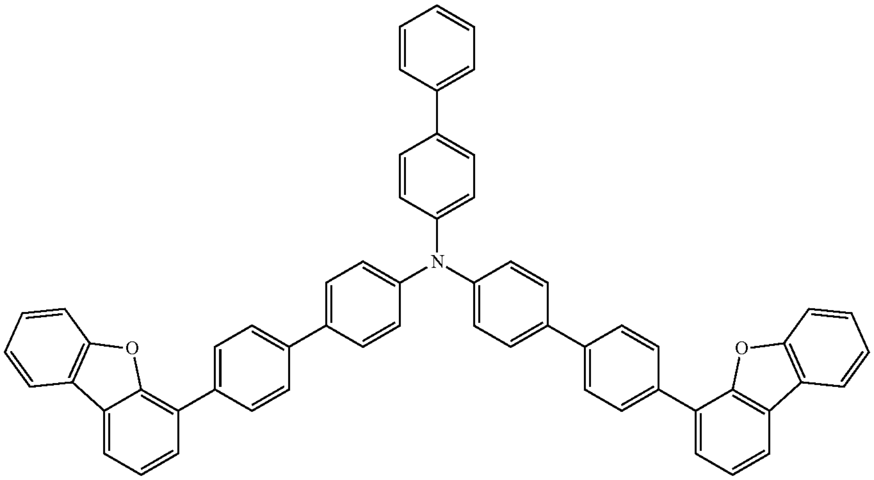
HT24
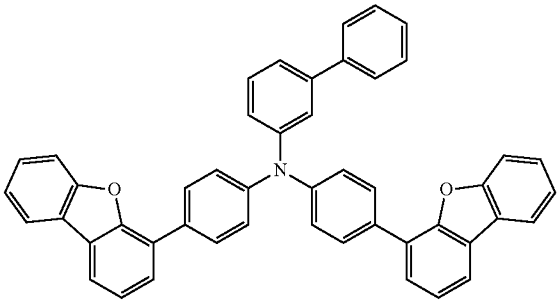
HT25
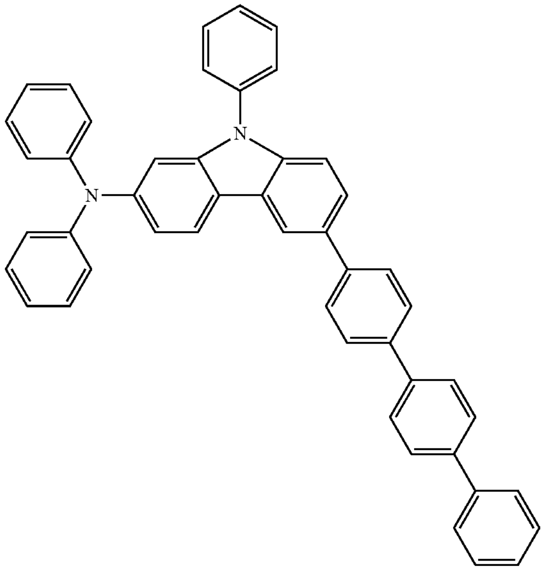
HT26
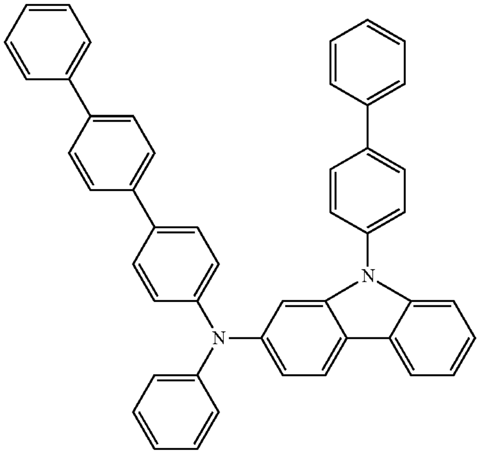
HT27
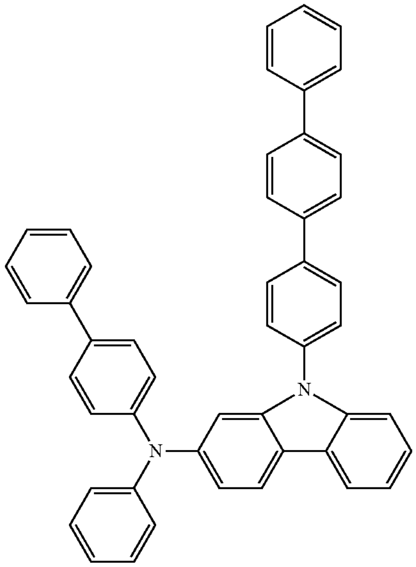

-continued
HT28
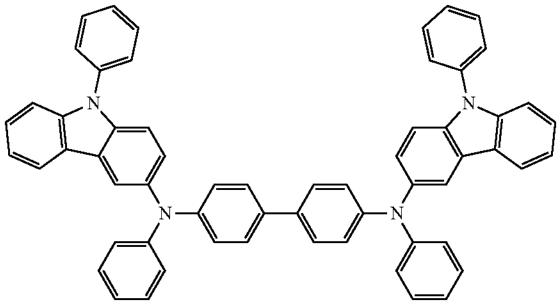
HT29
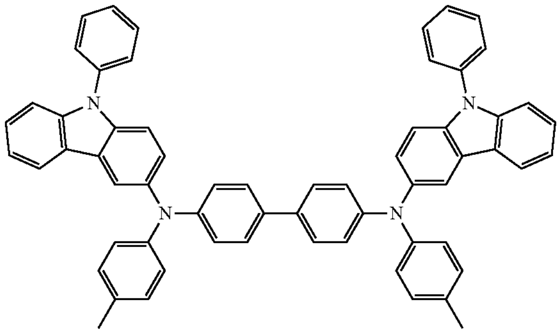
HT30
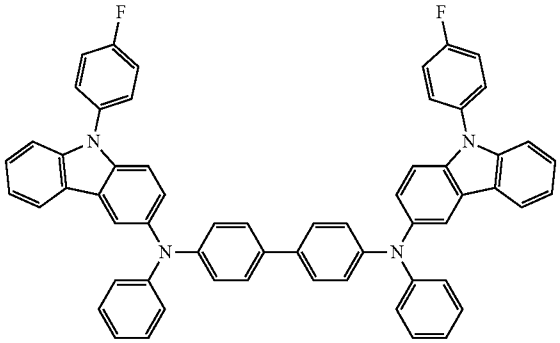
HT31
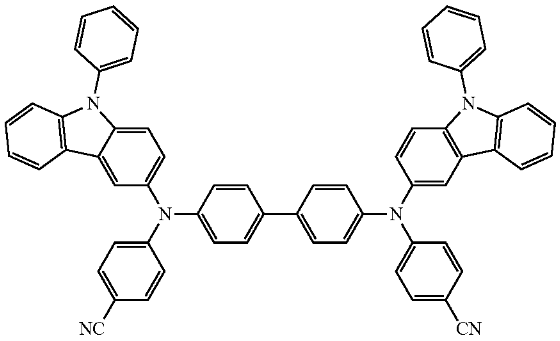
HT32
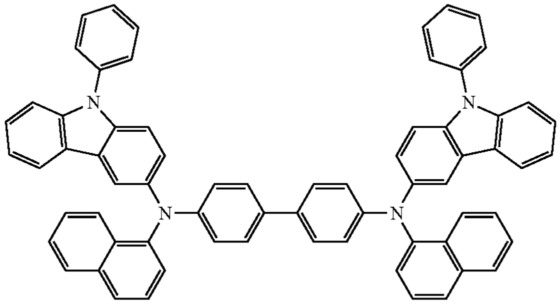
HT33
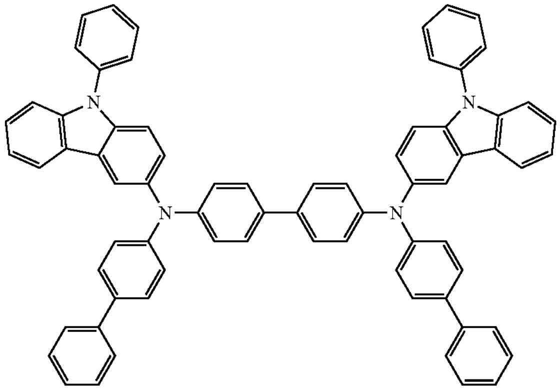

-continued
HT34
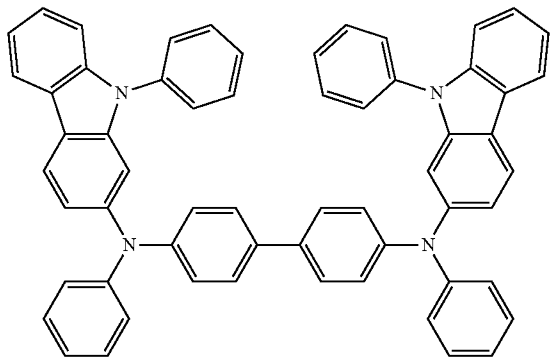
HT35
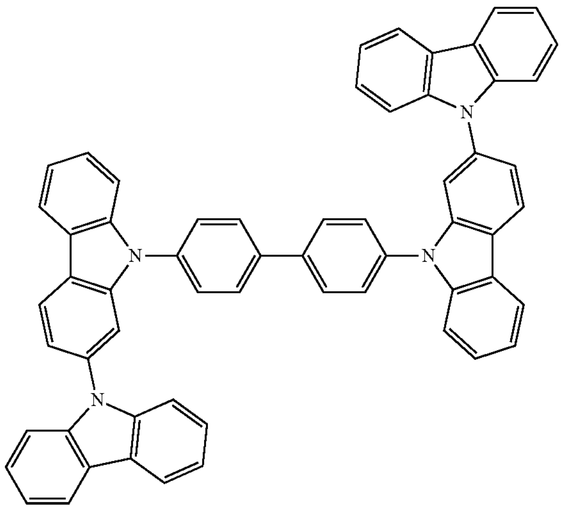
HT36
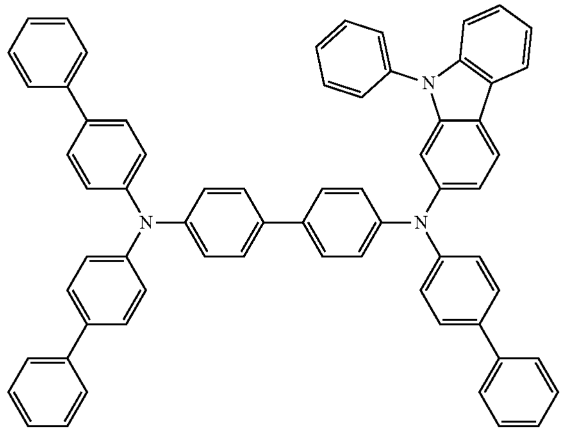
HT37
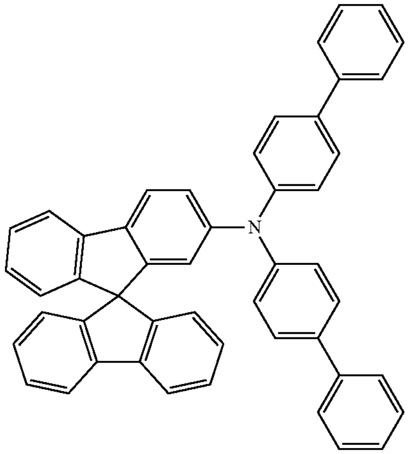
HT38
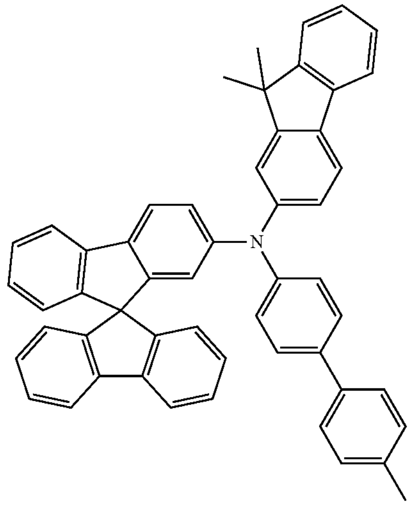
HT39
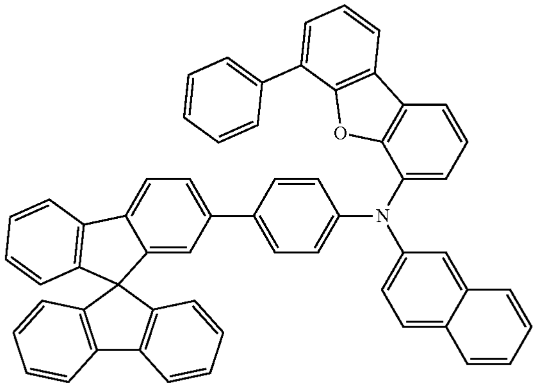

-continued
HT40
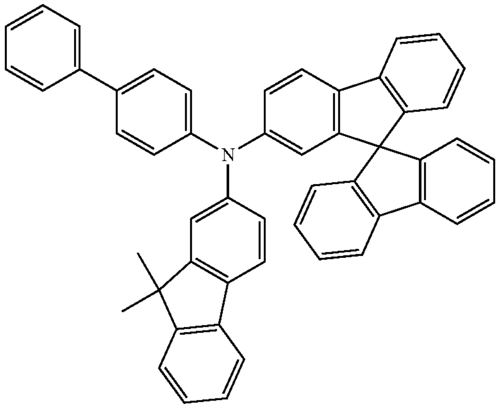
HT41
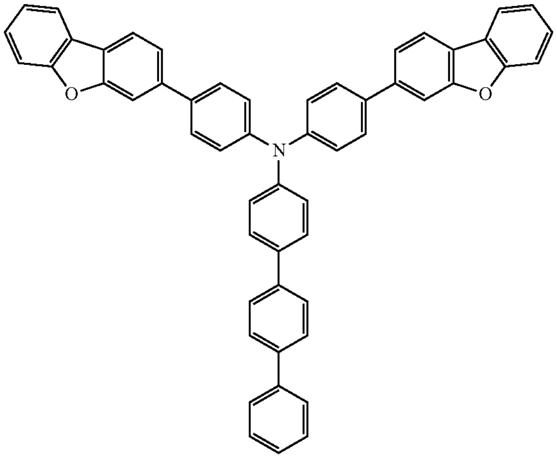
HT42
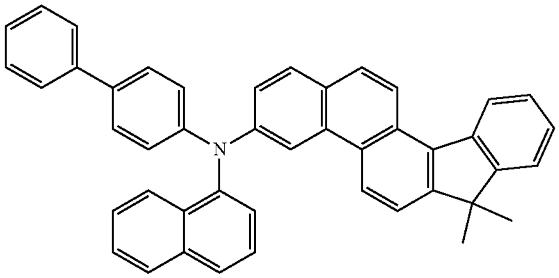
HT43
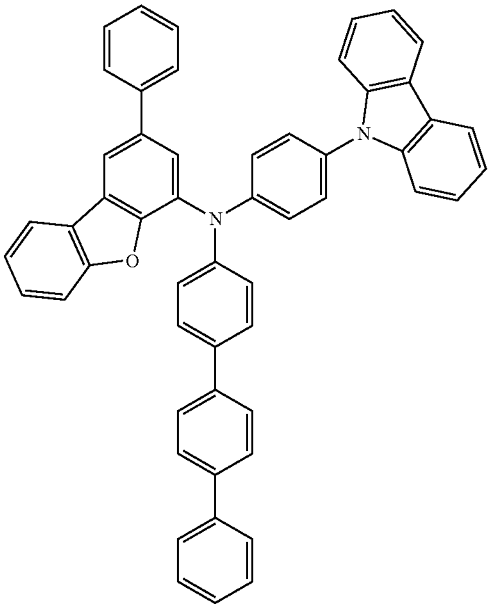
HT44
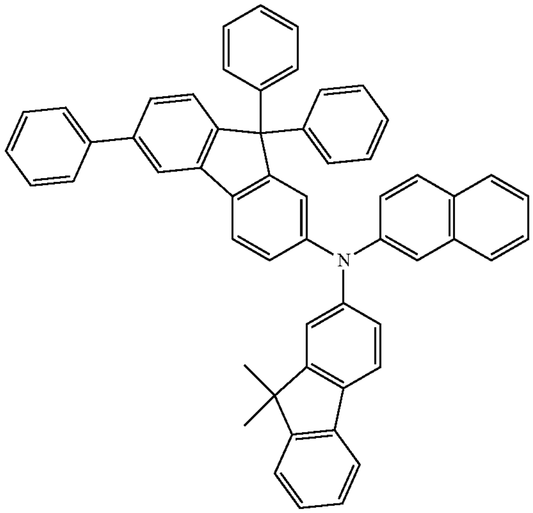
HT45
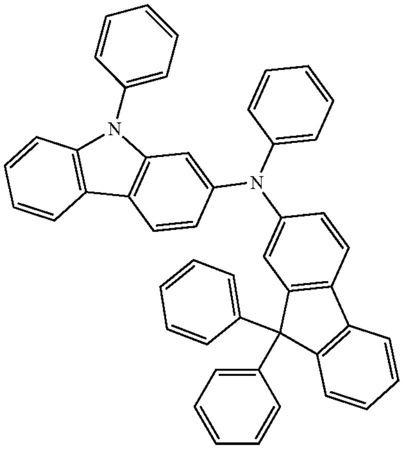

-continued
HT46
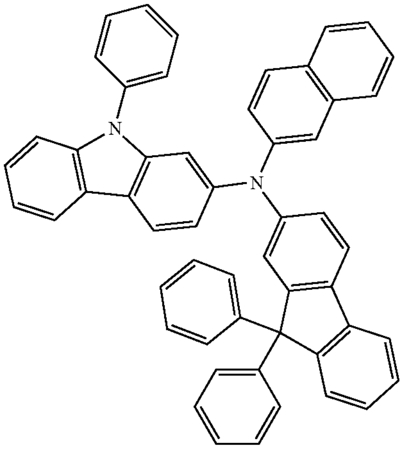
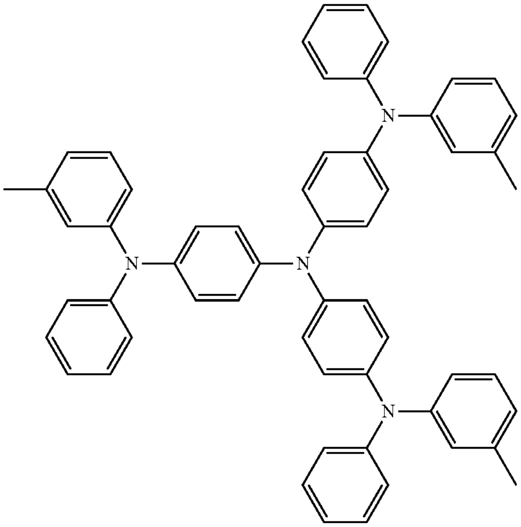
m-MTDATA
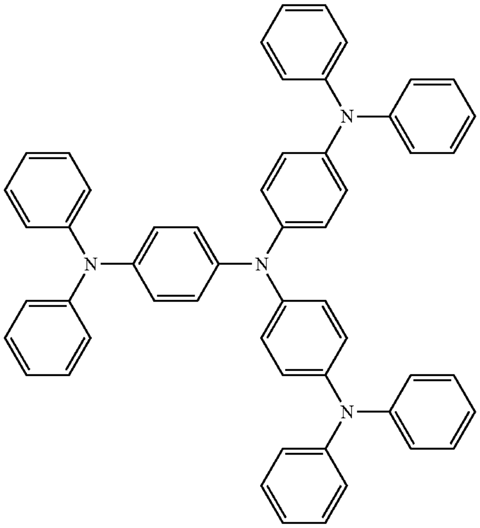
TDATA
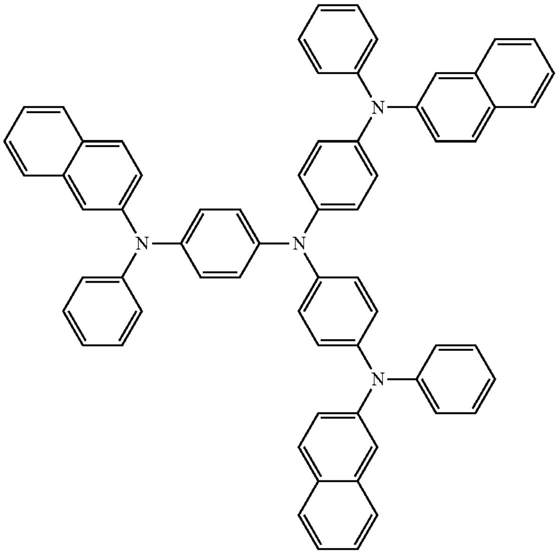
2-TNATA
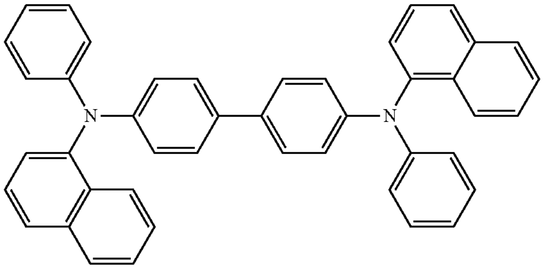
NPB
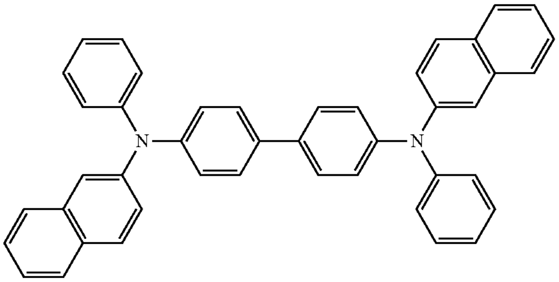
β-NPB -continued

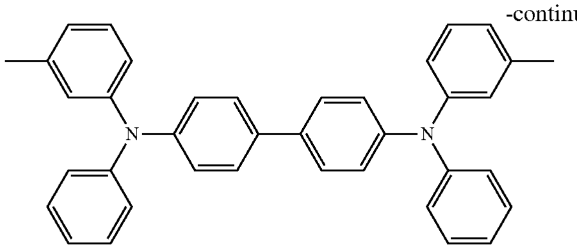

TPD

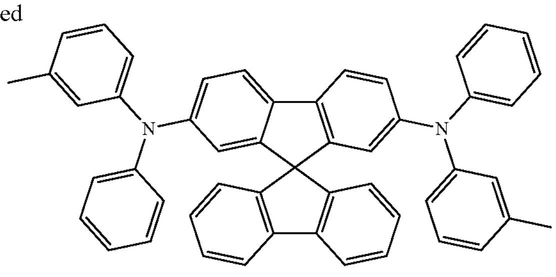

Spiro-TPD

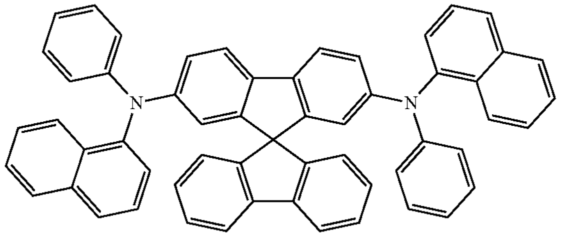

Spiro-NPB

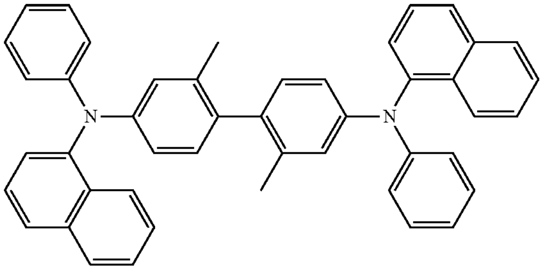

methylated-NPB

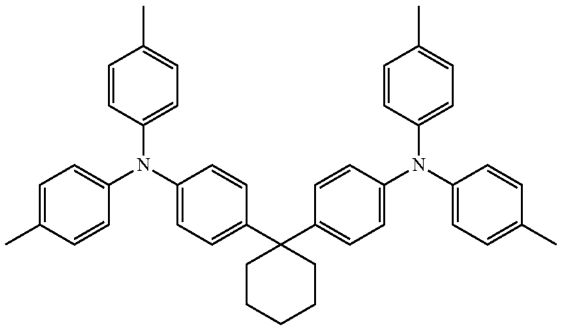

TAPC

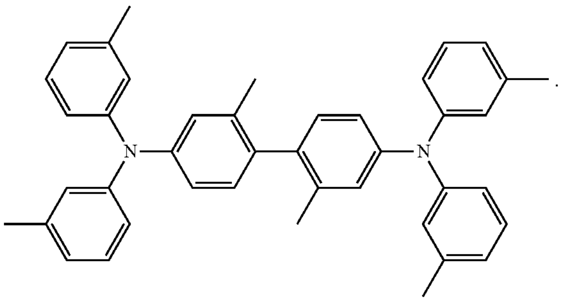

HMTPD

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The electron blocking layer may be a layer that prevents or reduces electron leakage from the active layer 130 to the hole transport region. The hole transport material as described above may be included in the electron blocking layer.

p-Dopant

The hole transport region may further include, in addition to these materials, a charge-generation material for the improvement of conductive properties (e.g., electrically conductive properties). The charge-generation material may be uniformly or non-uniformly dispersed in the hole transport region (for example, in the form of a single layer consisting of a charge-generation material).

The charge-generation material may be, for example, a p-dopant.

For example, the lowest unoccupied molecular orbital (LUMO) energy level of the p-dopant may be −3.5 eV or less.

In an embodiment, the p-dopant may include a quinone derivative, a cyano group-containing compound, a compound including element EL1 and element EL2, or a combination thereof.

Examples of the quinone derivative are TCNQ, F4-TCNQ, etc.

Examples of the cyano group-containing compound are HAT-CN and a compound represented by Formula 221 below.

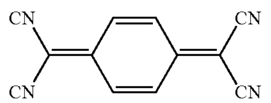

TCNQ

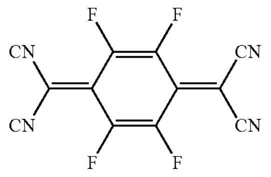

F4-TCNQ

-continued

HAT-CN

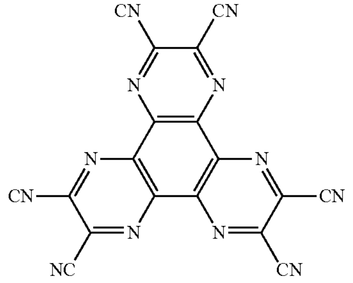

Formula 221

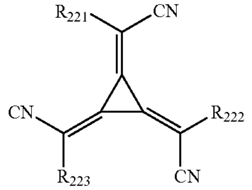

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or a combination thereof; or a combination thereof.

In the compound including element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te).

Examples of the non-metal are oxygen (O) and halogen (for example, F, Cl, Br, I, etc.).

Examples of the compound including element EL1 and element EL2 are metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or a combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halogen may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Electron Transport Region

The charge auxiliary layer between the photoactive layer 130 and the cathode 150 may be referred to as an electron transport region. The electron transport region 140 may facilitate migration of electrons generated in the photoactive layer 130.

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or a combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601 below:

$$[Ar_{601}]_{xe11}\text{-}[(L_{601})_{xe1}\text{-}R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be as described for Qi, xe21 may be 1, 2, 3, 4, or 5, at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

Formula 601-1

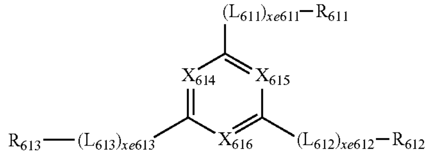

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be as described for $L_{601}$, xe611 to xe613 may each be as described for xe1, $R_{611}$ to $R_{613}$ may each be as described for $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one selected from Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or a combination thereof:

ET1

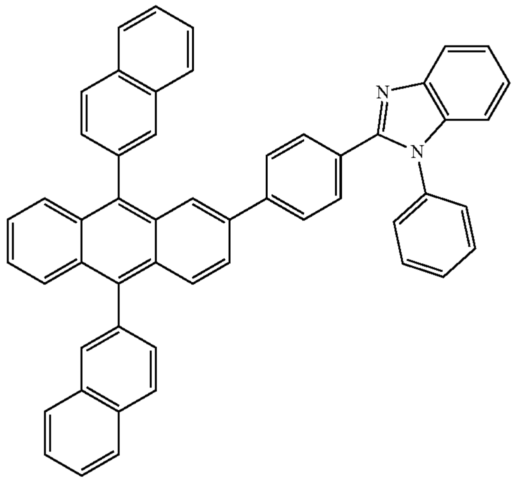

ET2

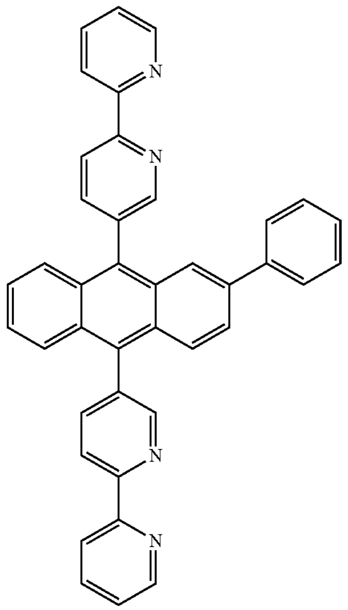

-continued
ET3
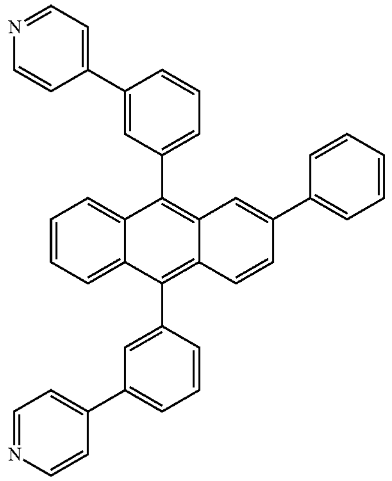
ET4
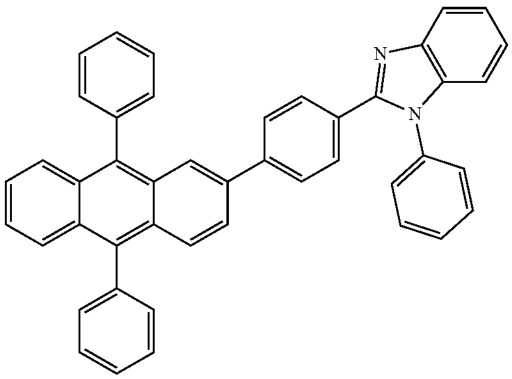
ET5
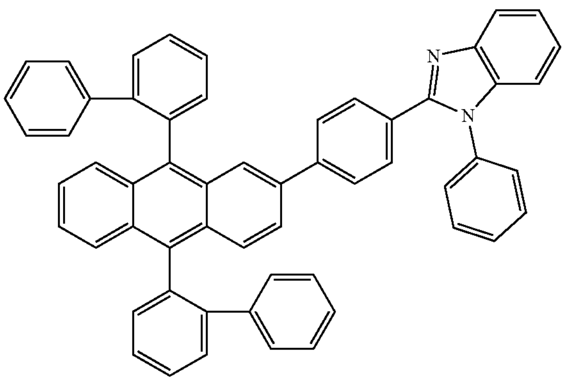
-continued
ET6
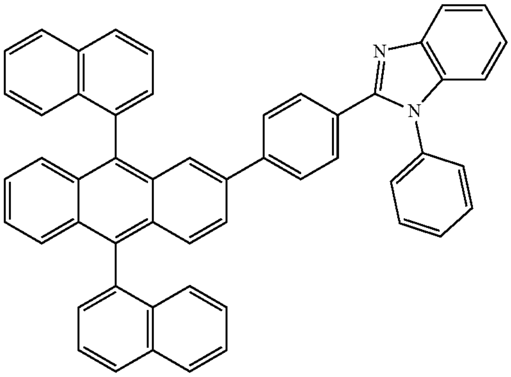
ET7
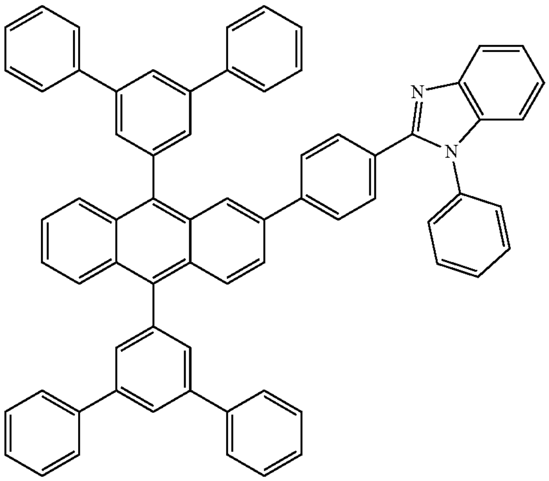
ET8
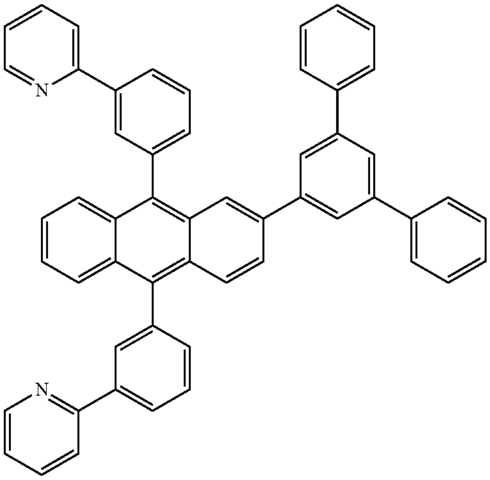

-continued
ET9
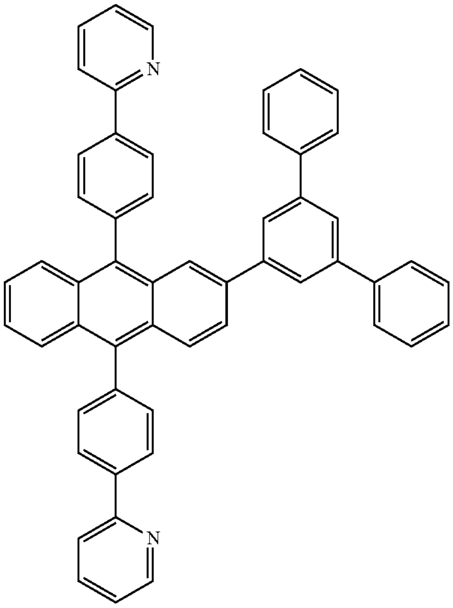
ET10
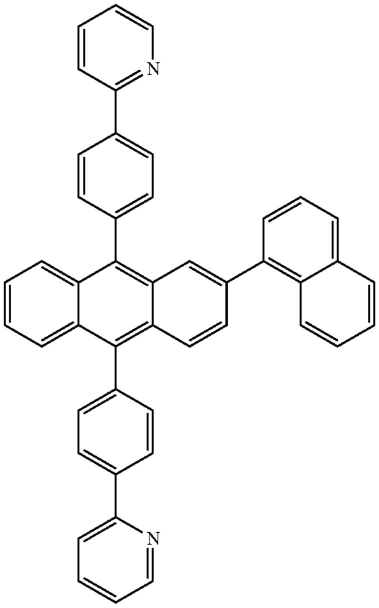
-continued
ET11
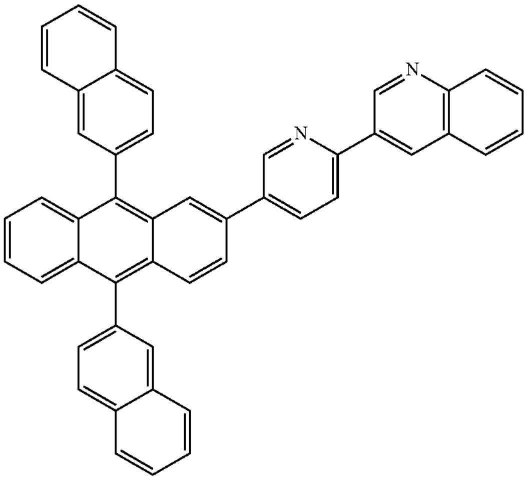
ET12
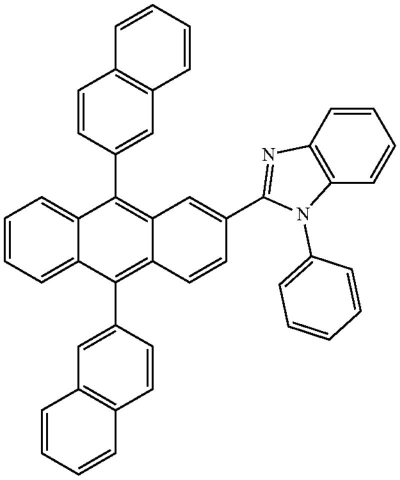
ET13
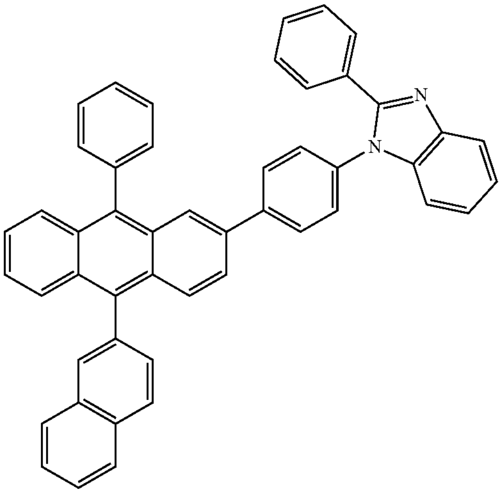

-continued
ET14
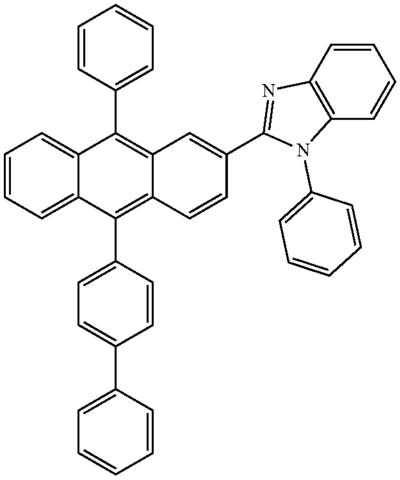
ET15
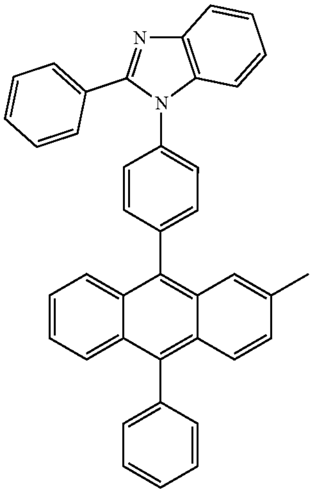
ET16
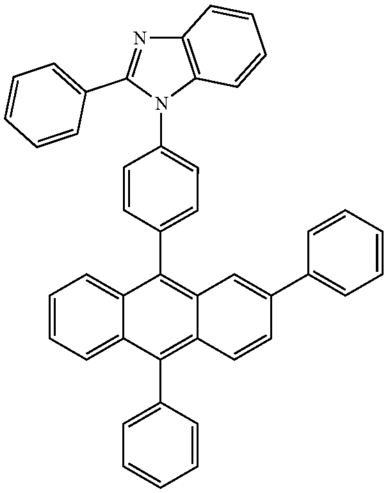
-continued
ET17
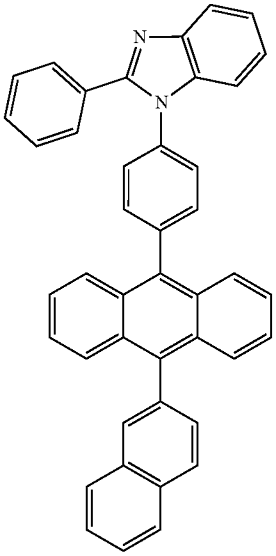
ET18
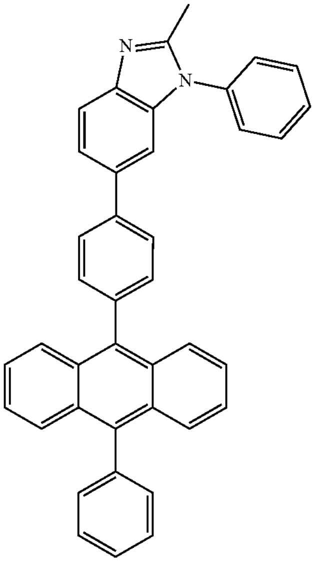
ET19
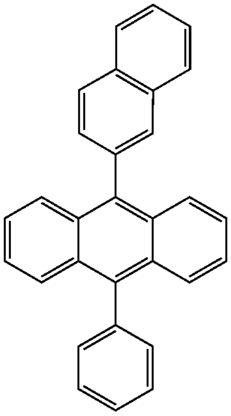

-continued
ET20
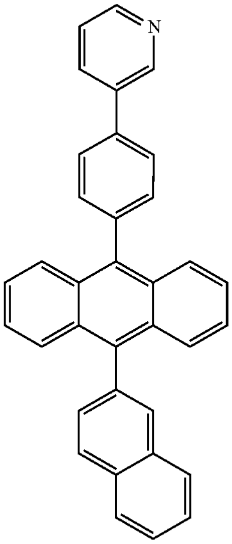
ET21
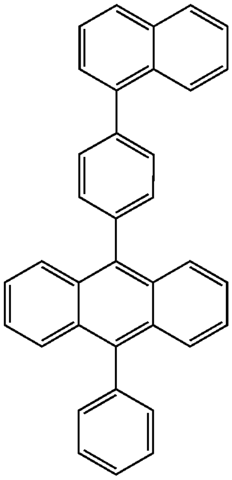
ET22
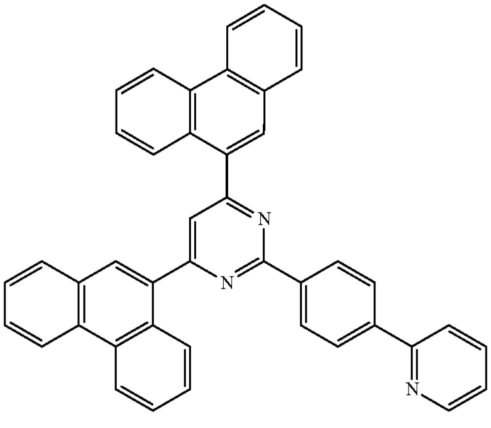
-continued
ET23
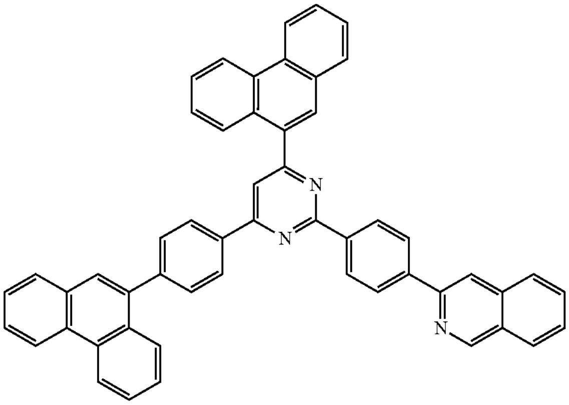
ET24
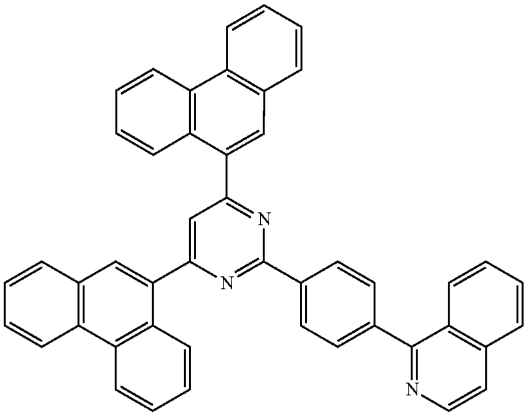
ET25
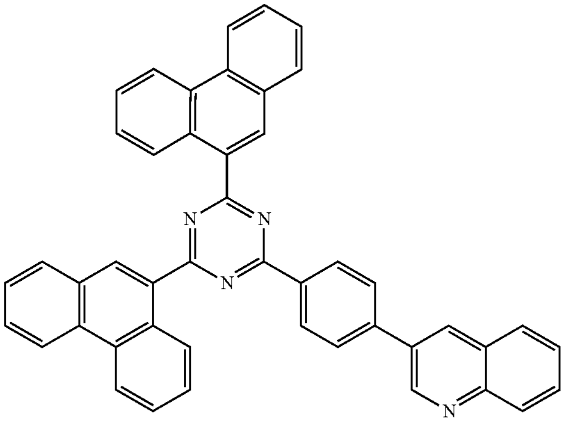

ET26
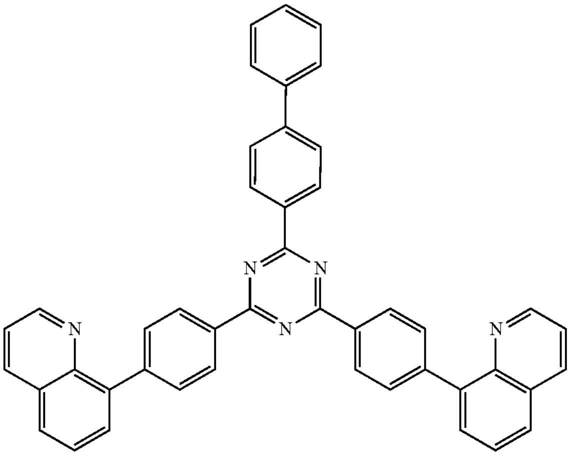
ET27
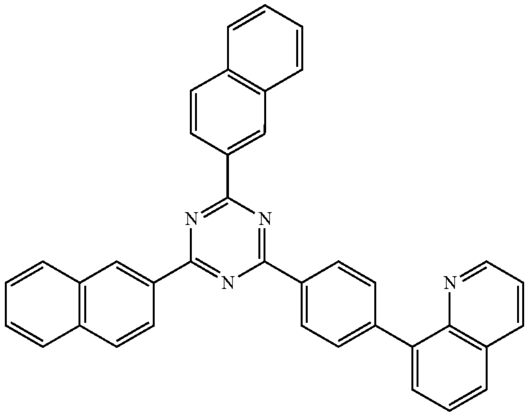
ET28
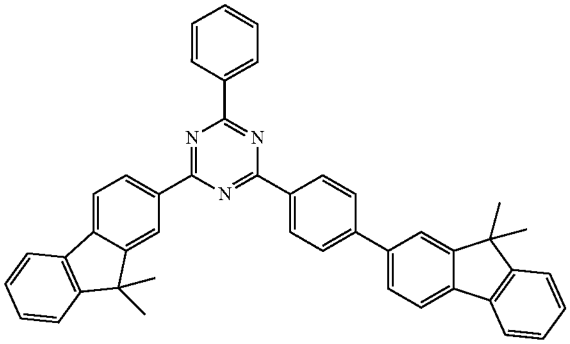
ET29
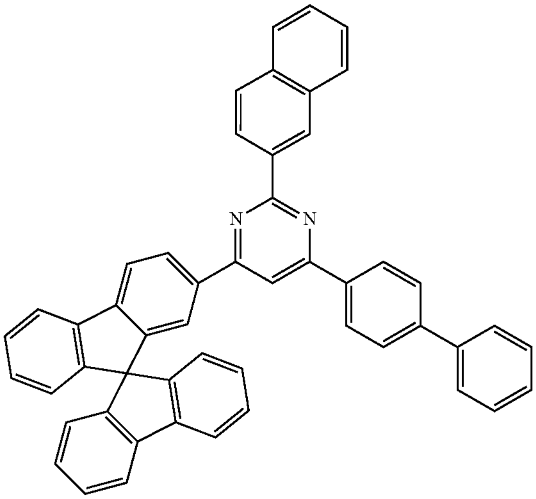
ET30
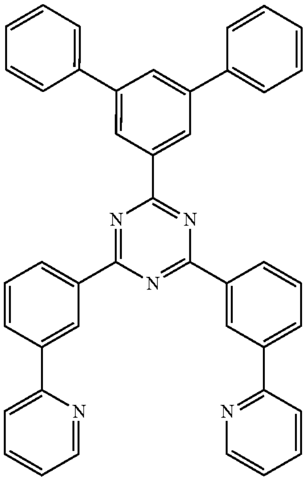
ET31
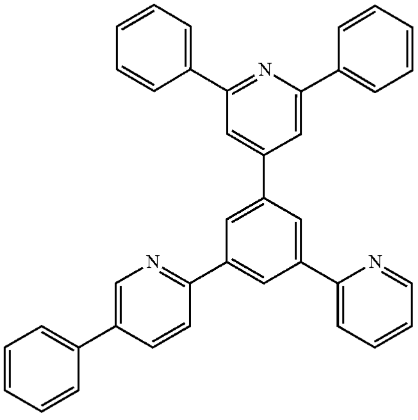

-continued
ET32
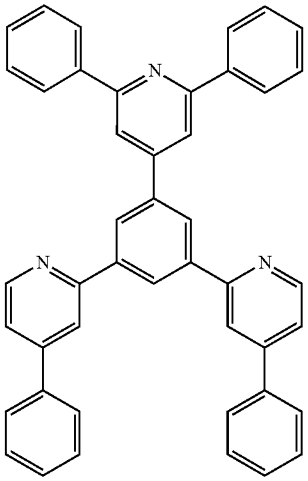
ET33
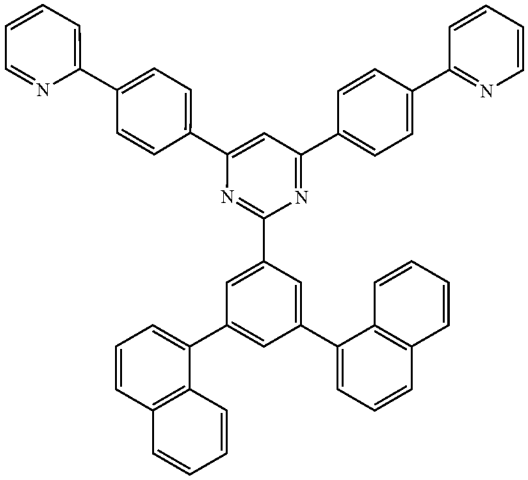
ET34
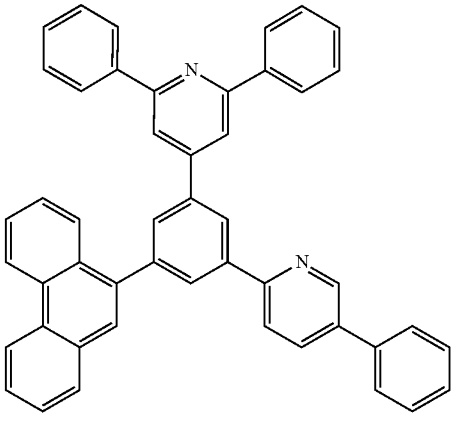
-continued
ET35
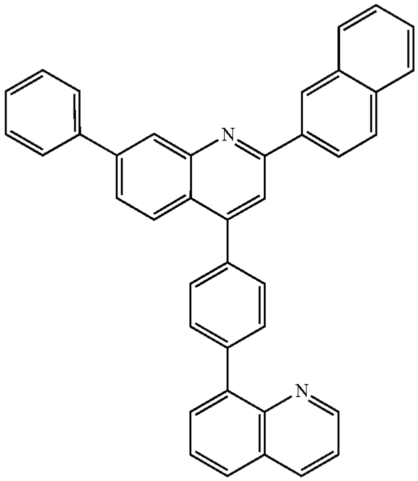
ET36
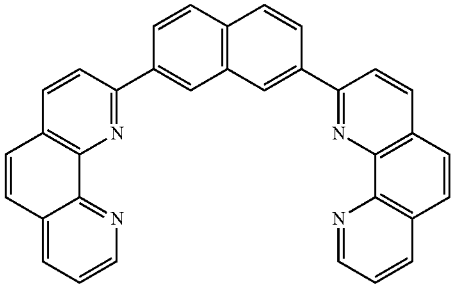
ET37
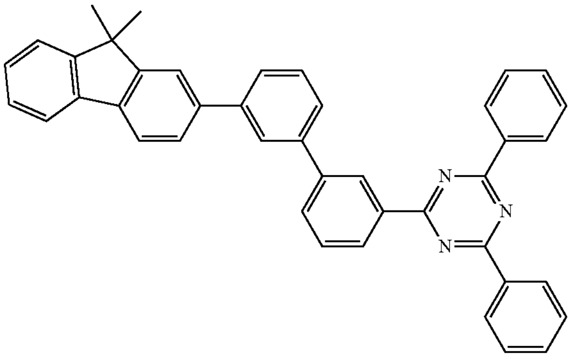
ET38
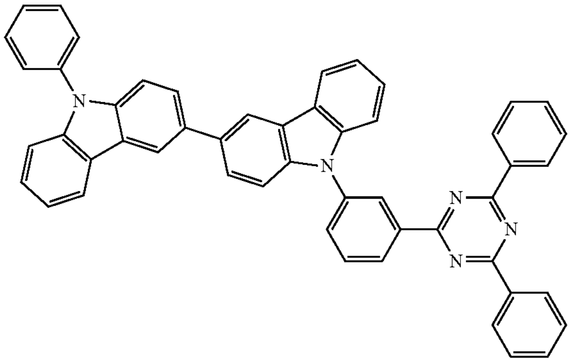

-continued
ET39
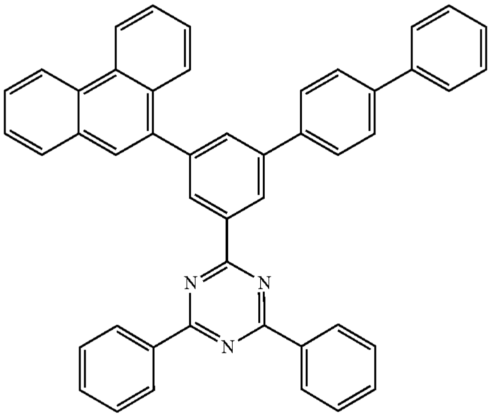
ET40
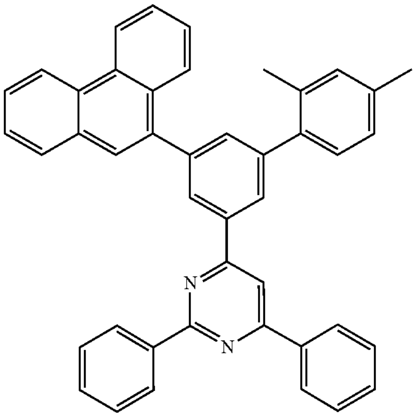
ET41
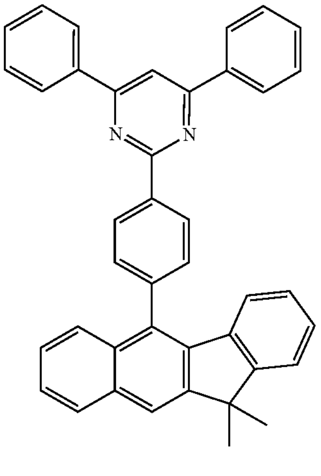
-continued
ET42
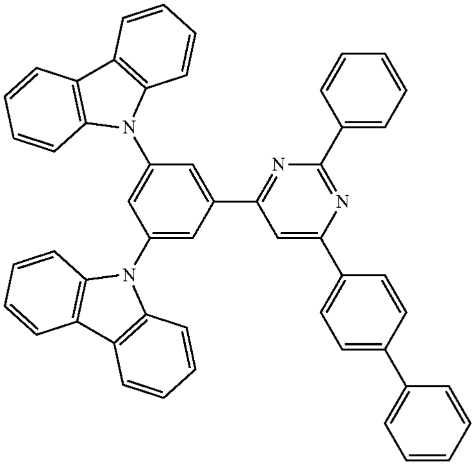
ET43
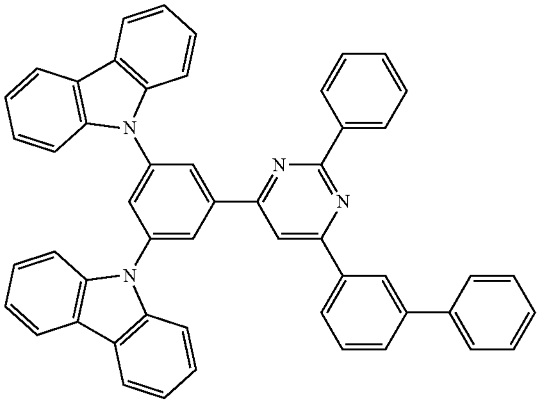
ET44
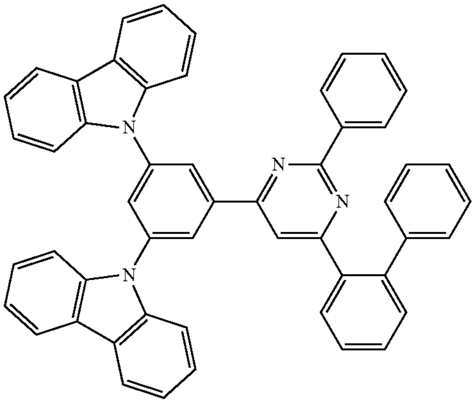
ET45
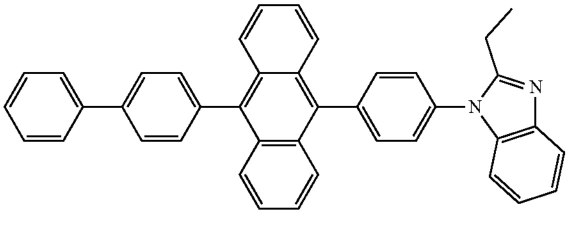

-continued

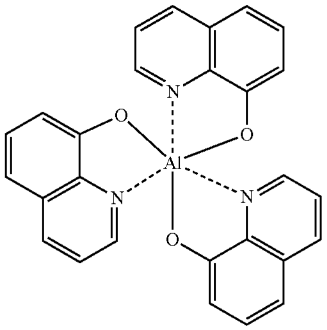

Alq3

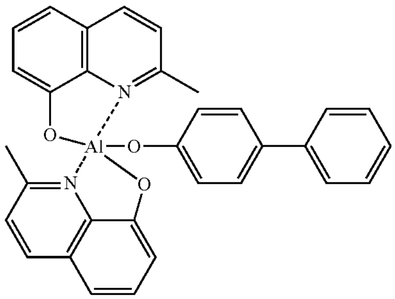

BAlq

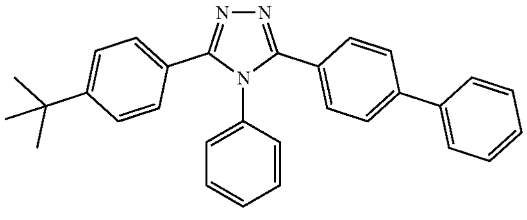

TAZ

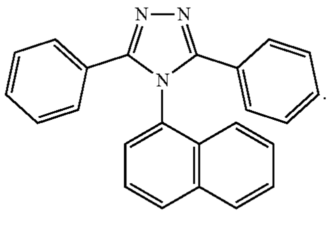

NTAZ

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or a combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole blocking layer, the electron control layer, the electron transport layer, and/or the electron transport region are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or a combination thereof.

For example, the metal-containing material may include a Li complex. The Li complex may include, for example, Compound ET-D1 (LiQ) and/or ET-D2:

ET-D1

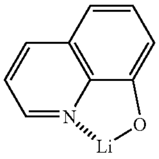

ET-D2

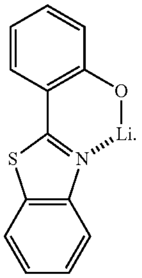

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or a combination thereof.

The alkali metal-containing compound may include: alkali metal oxides, such as $Li_2O$, $Cs_2O$, and/or $K_2O$; alkali metal halides, such as LiF, NaF, CsF, KF, LiI, NaI, CsI, and/or KI; or a combination thereof. The alkaline earth metal-containing compound may include an alkaline earth metal compound, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or a combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one selected from ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or a combination thereof.

The electron injection layer may include (or consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described above. In an embodiment, the electron injection layer may further include an organic material (for example, a compound represented by Formula 601).

In an embodiment, the electron injection layer may include (or consist of i) an alkali metal-containing compound (for example, alkali metal halide), ii) a) an alkali metal-containing compound (for example, alkali metal halide); and b) an alkali metal, an alkaline earth metal, a rare earth metal, or a combination thereof. For example, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, suitable or satisfactory electron injection characteristics may be obtained without a substantial increase in driving voltage.

Second Electrode 150

The second electrode 150 may be located on the photoactive layer 130 having a structure as described above. The second electrode 150 may be a cathode, which is an electron injection electrode, and as the material for the second electrode 150, a metal, an alloy, an electrically conductive compound, or a combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be arranged outside the first electrode 110, and/or a second capping layer may be arranged outside the second electrode 150.

The first capping layer and/or the second capping layer may prevent or reduce penetration of impurities, such as water and/or oxygen, to the organic photodiode 10 and/or 20 to thereby improve reliability of the organic photodiode 10 and/or 20.

The first capping layer and the second capping layer may each include a material having a refractive index of 1.6 or more (at a wavelength of 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or a combination thereof. Optionally, the carbocyclic compound, the heterocyclic compound, and the amine group-containing compound may be substituted with a substituent including O, N, S, Se, Si, F, Cl, Br, I, or a combination thereof. In one embodiment, at least one selected from the first capping layer and the second capping layer may each independently include an amine-based compound.

For example, at least one selected from the first capping layer and the second capping layer may each independently include a compound represented by Formula 201, a compound represented by Formula 202, or a combination thereof. In an embodiment, at least one selected from the first capping layer and the second capping layer may each independently include one selected from Compounds HT28 to HT33, one selected from Compounds CP1 to CP6, β-NPB, or a combination thereof:

CP1

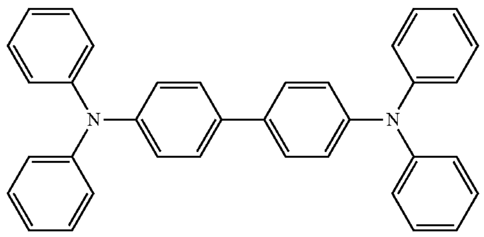

-continued

CP2

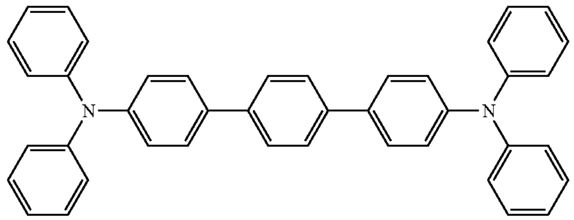

CP3

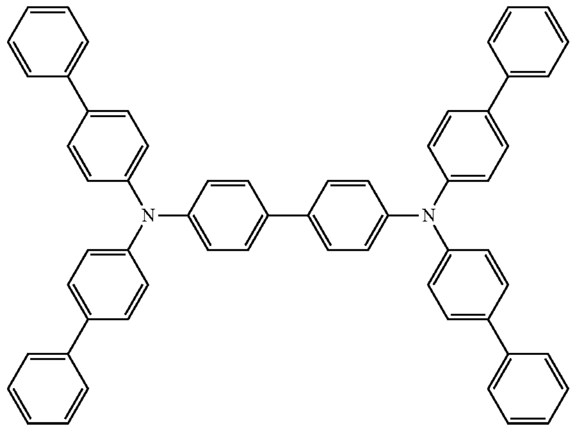

CP4

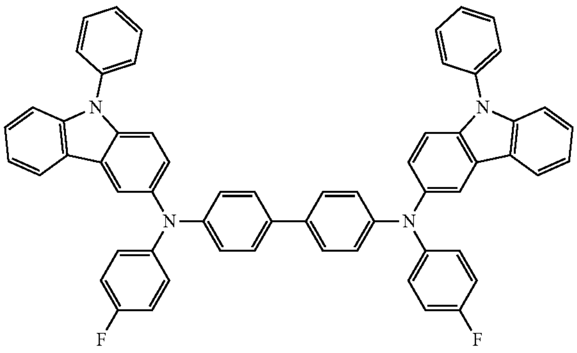

CP5

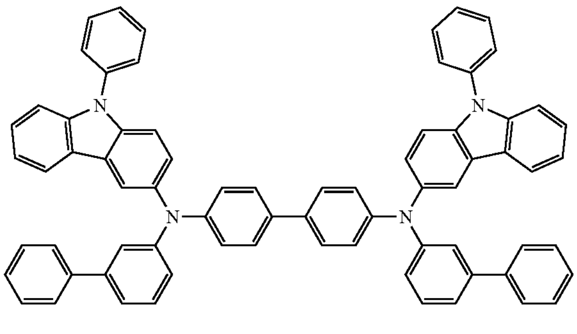

-continued

CP6

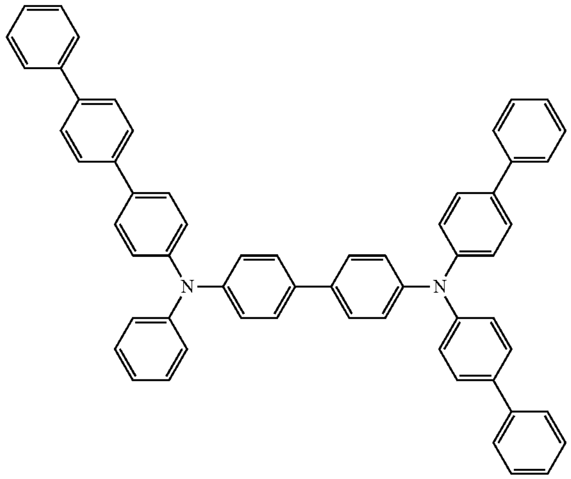

β-NPB

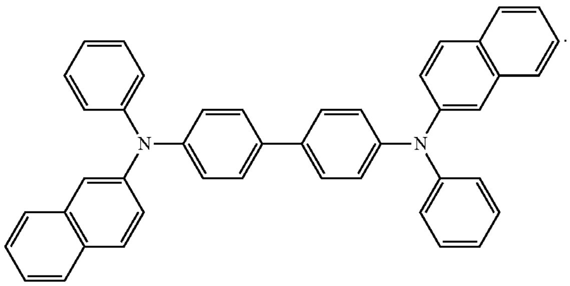

.

Electronic Apparatus

An electronic apparatus including the organic photodiode and the organic light-emitting device may be provided.

The electronic apparatus according to an embodiment may include:

a substrate; and at least one organic light-emitting device and at least one organic photodiode on the substrate.

The organic photodiode may sequentially include a first electrode, a photoactive layer, and a common electrode.

The organic light-emitting device may sequentially include a pixel electrode, an emission layer, and the common electrode. In an embodiment, the organic light-emitting device may include at least two organic light-emitting devices, and the at least two organic light-emitting devices may each independently include a pixel electrode, an emission layer, and the common electrode.

The organic photodiode and the organic light-emitting device may have the same (or substantially the same) resonance distance. In an embodiment, the organic photodiode may have the same (or substantially the same) resonance distance as any one selected from the organic light-emitting devices of the plurality of organic light-emitting devices.

In an embodiment, a first common layer may be included between the first electrode and the photoactive layer, and between the pixel electrode and the emission layer, and a second common layer may be included between the photoactive layer and the common electrode, and the emission layer and the common electrode. The first common layer may include at least one selected from a hole injection layer, a hole transport layer, and an electron blocking layer. The second common layer may include at least one selected from a buffer layer, a hole blocking layer, an electron transport layer, and an electron injection layer.

In an embodiment, the organic light-emitting device may include a first light-emitting device, a second light-emitting device, and a third light-emitting device, wherein the first light-emitting device may sequentially include a second electrode, a first emission layer, and the common electrode, the second light-emitting device may sequentially include a third electrode, a second emission layer, and the common electrode, and the third light-emitting device may sequentially include a fourth electrode, a third emission layer, and the common electrode.

In an embodiment, the first common layer may be included between the first electrode and the first photoactive layer, between the second electrode and the first emission layer, between the third electrode and the second emission layer, and between the fourth electrode and the third emission layer.

In an embodiment, the second common layer may be included between the photoactive layer and the common electrode, between the first emission layer and the common electrode, between the second emission layer and the common electrode, and between the third emission layer and the common electrode.

In an embodiment, a first auxiliary layer may be included between the first common layer and the photoactive layer, a second auxiliary layer may be included between the first common layer and the first emission layer, a third auxiliary layer may be included between the first common layer and the second emission layer, and a fourth auxiliary layer may be included between the first common layer and the third emission layer. The thicknesses of the second auxiliary layer, the third auxiliary layer, and the fourth auxiliary layer may be proportional to the emission wavelength of the first light-emitting device, the second light-emitting device, and the third light-emitting device. The first auxiliary layer may have the same (or substantially the same) thickness as any one selected from the second to fourth auxiliary layers. For example, the first auxiliary layer and the second auxiliary layer may have the same (or substantially the same) thickness.

In an embodiment, the first light-emitting device may emit a red color, the second light-emitting device may emit a green color, and the third light-emitting device may emit a blue color. In an embodiment, the first light-emitting device, the second light-emitting device, and the third light-emitting device may emit colors in combinations other than combinations of red, green, and blue.

The organic photodiode may detect light emitted from the organic light-emitting device and reflected from a subject. In an embodiment, the organic photodiode may detect light emitted from any one selected from the plurality of organic light-emitting devices and reflected from the subject.

In an embodiment, the at least one organic light-emitting device and the at least one organic photodiode may form one pixel, and the electronic apparatus may include a plurality of the pixels.

In an embodiment, the electronic apparatus may include a plurality of pixels, and the plurality of pixels may include the organic photodiode.

In an embodiment, the electronic apparatus may further include a fourth light-emitting device, and the fourth light-emitting device may be the same (or substantially the same) as any one selected from the first light-emitting device, the second light-emitting device, and the third light-emitting device.

In an embodiment, the organic photodiode may be arranged adjacent to the second light-emitting device.

In an embodiment, the electronic apparatus may be a display apparatus.

Figure 4:
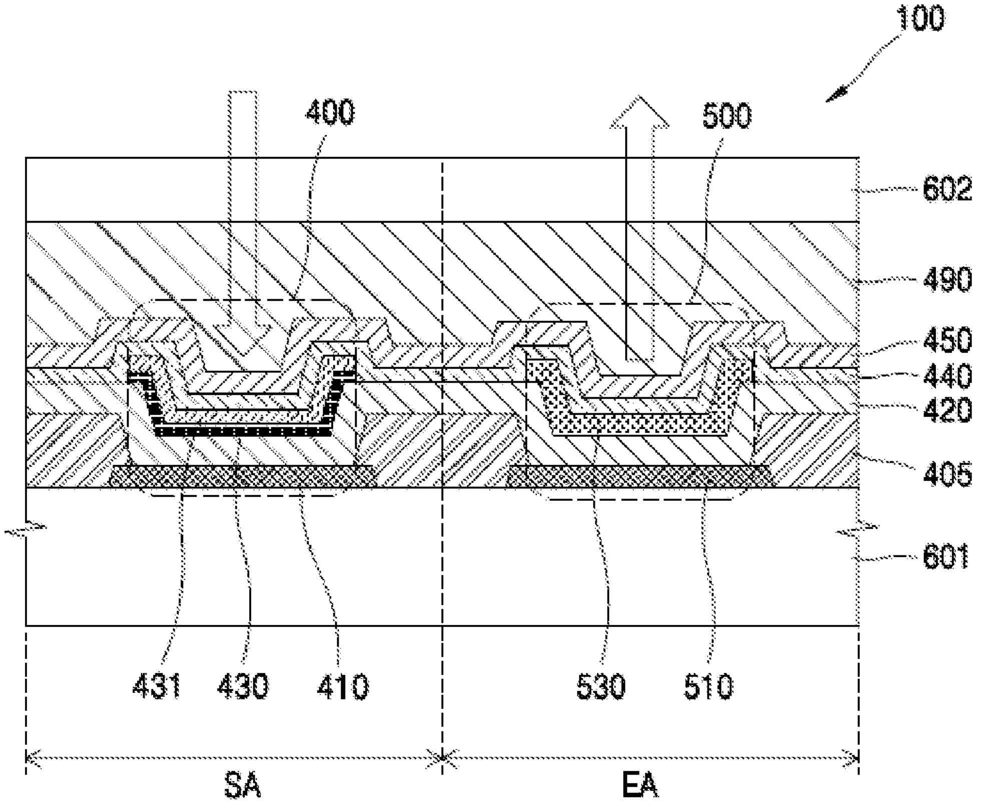
FIG. 4 is a schematic cross-sectional view of an electronic apparatus according to an embodiment.
Figure 5:
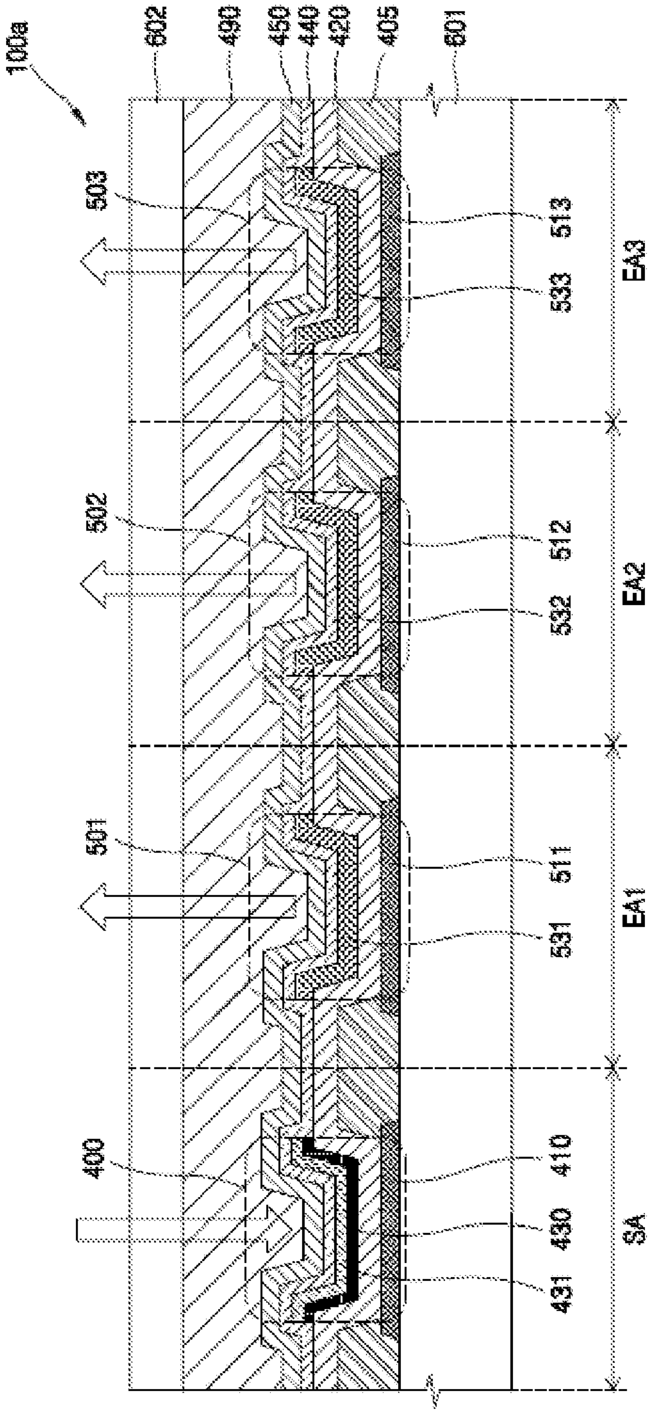
FIG. 5 is a schematic cross-sectional view of an electronic apparatus according to an embodiment.

Description of FIGS. 4-5

FIG. 4 is a schematic cross-sectional view of an electronic apparatus 100 according to an embodiment.

Referring to FIG. 4, the electronic apparatus 100 may include an organic photodiode 400 and a light-emitting device 500 between a substrate 601 and a substrate 602. The organic photodiode 400 may include a first electrode 410, a first common layer 420, a first auxiliary layer 427, a photoactive layer 430, a second common layer 440, and a common electrode 450, and the organic light-emitting device 500 may include a second electrode 510, a first common layer 420, a second auxiliary layer 524, an emission layer 530, a second common layer 440, and a common electrode 450.

The substrates 601 and 602 may each independently be a flexible substrate, a glass substrate, and/or a metal substrate. A buffer layer and a thin-film transistor may be located on the substrate 601.

The buffer layer serves to prevent or reduce infiltration of impurities through the substrate 601 and provide a flat surface on the substrate 601. The thin-film transistor is located on the buffer layer, and may include an activation layer, a gate electrode, a source electrode, and a drain electrode.

Such a thin-film transistor may be electrically connected to the organic light-emitting device 500 to drive the light-emitting device. One selected from the source electrode and drain electrode may be electrically connected to the second electrode 510 of the organic light-emitting device 500.

Another thin-film transistor may be electrically connected to the organic photodiode 400. One selected from the source electrode and drain electrode may be electrically connected to a first electrode 410 of the organic photodiode 400.

In an embodiment, the first electrode 410 may be an anode, and the common electrode 450 may be a cathode. In one or more embodiments, by applying a reverse bias to a place between the first electrode 410 and the common electrode 450 to drive the organic photodiode 400, the electronic apparatus 100 may detect light by absorbing light incident on the organic photodiode 400, generating charges, and extracting a current.

When the photoactive layer absorbs light, electrons of the highest occupied molecular orbital (HOMO) of the photoactive layer may be transferred to the LUMO to generate excitons. In the p-n bond-based photoactive layer, excitons generated by absorbing light by the donor (p-type) may move to the interface of the acceptor, and the electron is passed on to the acceptor to thereby form an electron-hole pair. In the case of inorganic materials, the electrons and holes are separated at room temperature because energy required for separating the electron-hole pair is only several meV, but in case of the organic material, a high energy of about 100 meV is required. The separated electrons and holes may move to the cathode and the anode, respectively, to produce a current, and for this purpose, the loss at the interface between the photoactive layer and the electrode should be minimized or reduced, and the electrons and holes separated in the photoactive layer need to move rapidly to the electrode. The photoactive layer according to an embodiment satisfies such a condition.

In an embodiment, the second pixel electrode 510 may be an anode, and the common electrode 450 may be a cathode. In one or more embodiments, in the organic light-emitting device 500, holes injected from the second electrode 510 and the electrons injected from the common electrode 450 may recombine in the emission layer 530 to form excitons, and the excitons may transition from an excited state to a ground state, thereby generating light.

Descriptions of the first electrode 410 and the second electrode 510 may each be understood by referring to the description of the anode 110 provided herein.

A pixel-defining film 405 may be formed on an edge of the first electrode 410 and on an edge of the second electrode 510. The pixel-defining film 405 may define a pixel region and may electrically insulate between the first electrode 410 and the second electrode 510. The pixel-defining film 405 may include, for example, various suitable organic insulating materials (for example, silicone-based materials, and/or the like), inorganic insulating materials, or organic/inorganic composite insulating materials. The pixel-defining film 405 may be a transmissive film that transmits visible light, or a blocking film that blocks (or reduces transmission of) visible light.

The first common layer 420 and the second common layer 440 may be formed as a common layer across the organic photodiode 400 and the organic light-emitting device 500. The first common layer 420 may include, for example, a hole injection layer, a hole transport layer, an electron blocking layer, or a combination thereof. The second common layer 440 may include, for example, a buffer layer, a hole blocking layer, an electron transport layer, an electron injection layer, or a combination thereof. For descriptions of the first common layer 420 and the second common layer 440, related descriptions provided herein may be referred to.

As such, in the electronic apparatus 100, because the organic photodiode 400 and the organic light-emitting device 500 use a common layer, the two devices may be arranged in-pixel in the electronic apparatus 100, and the manufacturing process may be simplified.

In the organic photodiode 400, the photoactive layer 430 may be formed on the first common layer 420. In the organic light-emitting device 500, the emission layer 530 may be formed on the first common layer 420. The emission layer 530 may be formed by using one or more of any suitable light-emitting materials generally used in the art. For example, as the light-emitting material, an organic material, an inorganic material, and/or a quantum dot may be used. Descriptions of the photoactive layer 430 may be understood by referring to the previous description, and the emission layer 530 may be understood by referring to the description below.

The second common layer 440 and the common electrode 450 are formed on the photoactive layer 430 and the emission layer 530 as a common layer across the organic photodiode 400 and the organic light-emitting device 500. The common electrode 450 may be understood by referring to the description of the cathode 150 provided herein.

A capping layer may be arranged on the common electrode 450. A material that can be used for the capping layer may include an organic material and/or inorganic material as described above. The capping layer may serve to protect the organic photodiode 400 and the organic light-emitting device 500 and to assist effective light emission from the organic light-emitting device 500. The capping layer may be as described herein.

An encapsulation portion 490 may be located on the capping layer. The encapsulation portion 490 may be arranged on the organic photodiode 400 and the organic light-emitting device 500 to thereby protect the organic photodiode 400 and the organic light-emitting device 500 from water and/or oxygen. The encapsulation portion 490 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

The electronic apparatus 100 may be, for example, a display apparatus. As the electronic apparatus 100 includes the organic photodiode 400 and the organic light-emitting device 500, the electronic apparatus 100 may be a display apparatus capable of light detection.

FIG. 5 is a schematic cross-sectional view of an electronic apparatus 200 according to an embodiment.

Referring to FIG. 5, the electronic apparatus 200 may include an organic photodiode 400 and organic light-emitting devices 501, 502, and 503 between a substrate 601 and a substrate 602. The electronic apparatus 200 of FIG. 5 is different from the electronic apparatus 100 including one organic light-emitting device in that the former includes a plurality of organic light-emitting devices. Each of the organic light-emitting devices 501, 502, and 503 may be used to implement full colors. Components illustrated in FIG. 4 may be understood by referring to the descriptions of the electronic apparatus 200.

The organic photodiode 400 may include the first electrode 410, the first common layer 420, the first auxiliary layer 427, the photoactive layer 430, the second common layer 440, and the common electrode 450.

The first organic light-emitting device 501 may include a second electrode 511, a first common layer 420, a second auxiliary layer 521, a first emission layer 531, a second common layer 440, and a common electrode 450.

The second organic light-emitting device 502 may include a third electrode 512, a first common layer 420, a third auxiliary layer 522, a second emission layer 532, a second common layer 440, and a common electrode 450.

The third organic light-emitting device 503 may include a fourth electrode 513, a first common layer 420, a fourth auxiliary layer 523, a third emission layer 533, a second common layer 440, and a common electrode 450.

A thin-film transistor may be electrically connected to the organic photodiode 400 to drive the organic photodiode 400. One selected from the source electrode and drain electrode may be electrically connected to the first electrode 410 of the organic photodiode 400.

A thin-film transistor may be electrically connected to each of the organic light-emitting devices 501, 502, and 503 to drive the organic light-emitting devices 501, 502, and 503. One selected from the source electrode and drain electrode of the thin-film transistor may be electrically connected to each of the second, third, and fourth electrodes 511, 512, and 513 of the organic light-emitting devices 501, 502, and 503.

In an embodiment, the second, third, and fourth electrodes 511, 512, and 513 may be an anode, and the common electrode 450 may be a cathode. In one or more embodiments, in the organic light-emitting devices 501, 502, and 503, holes injected from the second, third, and fourth electrodes 511, 512, and 513 and electrons injected from the common electrode 450 may recombine in the emission layers 531, 532, and 533 to generate excitons, and the excitons may transition from an excited state to a ground state, thereby generating light.

Descriptions of the first electrode 410 and the second, third, and fourth electrodes 511, 512, and 513 may each be understood by referring to the description of the anode 110 provided herein.

The pixel-defining film 405 may be formed on an edge of the first electrode 410 and on edges of the second, third, and fourth electrodes 511, 512, and 513. The pixel-defining film 405 may define a pixel region and may electrically insulate between the first electrode 410 and the second, third, and fourth electrodes 511, 512, and 513. The pixel-defining film 405 may include, for example, various suitable organic insulating materials (for example, silicone-based materials, and/or the like), inorganic insulating materials, or organic/inorganic composite insulating materials. The pixel-defining film 405 may be a transmissive film that transmits visible light, or a blocking film that blocks (or reduces transmission of) visible light.

The first common layer 420 and the second common layer 440 may be formed as a common layer across the organic photodiode 400 and the first, second, and third organic light-emitting devices 501, 502, and 503. The first common layer 420 may include, for example, a hole injection layer, a hole transport layer, an electron blocking layer, or a combination thereof. The second common layer 440 may include, for example, a buffer layer, a hole blocking layer, an electron transport layer, an electron injection layer, or a combination thereof.

The photoactive layer 431 may be arranged to be corresponding to the organic photodiode 400 on the first common layer 420.

The emission layers 531, 532, and 533 may be arranged to correspond to the organic light-emitting devices 501, 502, and 503 on the first common layer 420.

The first emission layer 531 emits a first color light, the second emission layer 532 emits a second color light, and the third emission layer 533 emits a third color light.

A maximum emission wavelength of the first color light, a maximum emission wavelength of the second color light, and a maximum emission wavelength of the third color light may be identical to or different from each other. In an embodiment, a maximum emission wavelength of the first color light and a maximum emission wavelength of the second color light may each be longer than a maximum emission wavelength of the third color light.

In an embodiment, the first color light may be red light, the second color light may be green light, and the third color light may be blue light, but embodiments are not limited thereto. Thus, the electronic apparatus 100 may be capable of full color emission. The first color light, the second color light, and the third color light are not limited to red light, green light, and blue light, respectively, and may be a combination of light of different colors, as long as mixed light thereof is white light.

The first emission layer 531, the second emission layer 532, and the third emission layer 533 may each be formed by using one or more of any suitable light-emitting materials generally used in the art. For example, as the light-emitting material, an organic material, an inorganic material, and/or a quantum dot may be used.

The organic photodiode 400, the first organic light-emitting device 501, the second organic light-emitting device 502, and the third organic light-emitting device 503 may form one pixel, and each of the first, second, and third organic light-emitting devices 501, 502, and 503 may be a subpixel constituting the pixel.

In an embodiment, the pixel may include at least one organic photodiode 400.

The second common layer 440 and the common electrode 450 are sequentially formed on the photoactive layer 430 and the emission layers 531, 532, and 533.

A capping layer may be arranged on the common electrode 450.

The encapsulation portion 490 may be located on the capping layer. The encapsulation portion 490 may be arranged on the organic photodiode 400 and the organic light-emitting devices 501, 502, and 503 to thereby protect the organic photodiode 400 and the organic light-emitting devices 501, 502, and 503 from water and/or oxygen. The encapsulation portion 490 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

The electronic apparatus 200 may be a display apparatus. As the electronic apparatus 200 may include the organic photodiode 400, the first organic light-emitting device 501, the second organic light-emitting device 502, and the third organic light-emitting device 503, the electronic apparatus 200 may be a full-color display apparatus having a light detection function.

Hereinafter, the emission layers 530, 531, 532, and 533 of FIGS. 4-5 will be described in more detail.

Emission Layer

The emission layer may be a red emission layer, a green emission layer, a blue emission layer, or a white emission layer. The emission layer may have a structure in which a red light-emitting material, a green light-emitting material, and a blue light-emitting material are used alone or are mixed together.

The emission layer may include a host and a dopant. The dopant may include a phosphorescent dopant, a fluorescent dopant, or a combination thereof.

The amount of the dopant in the emission layer may be from about 0.01 part by weight to about 15 parts by weight based on 100 parts by weight of the host.

In an embodiment, the emission layer may include a quantum dot.

In one or more embodiments, the emission layer may include a delayed fluorescence material. The delayed fluorescence material may act as a host or a dopant in the emission layer.

Host

In an embodiment, the host may include a compound represented by Formula 301:

$$[Ar_{301}]_{xb11}-[(L_{301})_{xb1}-R_{301}]_{xb21} \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(0301)(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be as described for Qi.

For example, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or a combination thereof:

Formula 301-1

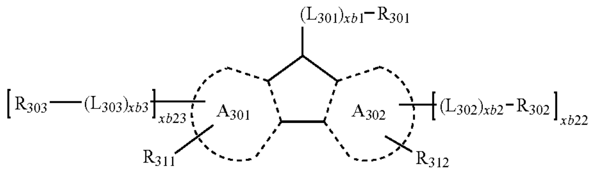

Formula 301-2

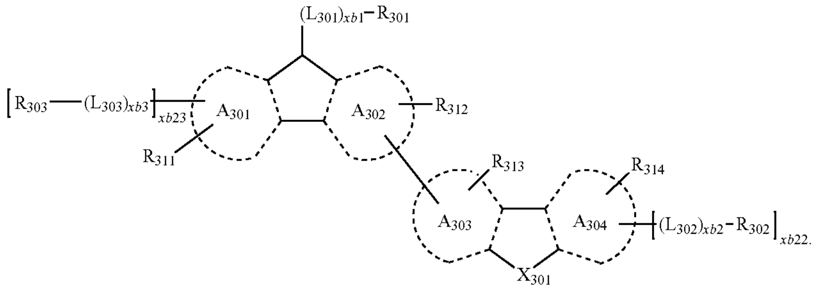

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each be as described herein, $L_{302}$ to $L_{304}$ may each independently be as described for $L_{301}$, xb2 to xb4 may each independently be as described for xb1, and $R_{302}$ to $R_{305}$ and $R_{311}$ to $R_{314}$ may each be as described for $R_{301}$.

In an embodiment, the host may include an alkali earth metal complex, a post-transition metal complex, or a combination thereof. For example, the host may include a Be complex (for example, Compound H55), an Mg complex, a Zn complex, or a combination thereof.

In an embodiment, the host may include one selected from Compounds H1 to H126, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or a combination thereof:

H1

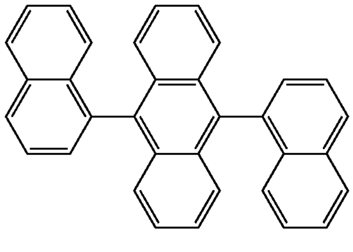

H2

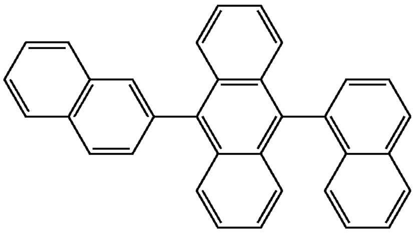

-continued
H3
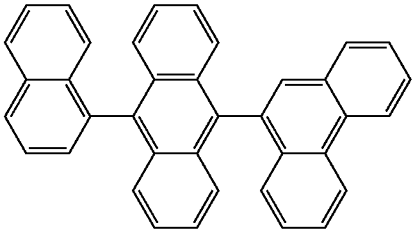
H4
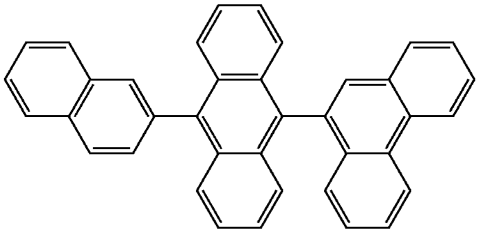
H5
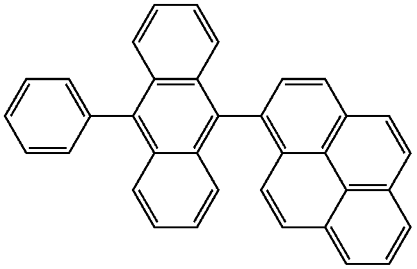
H6
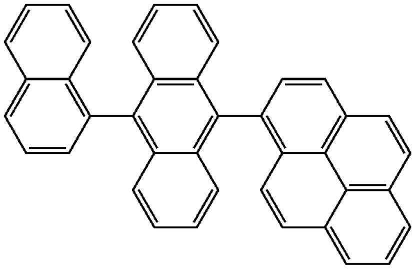
H7
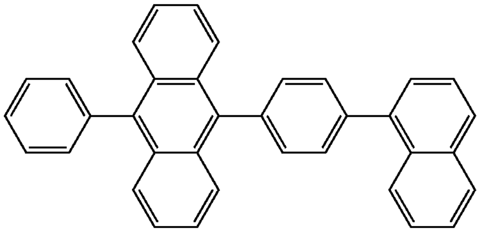
H8
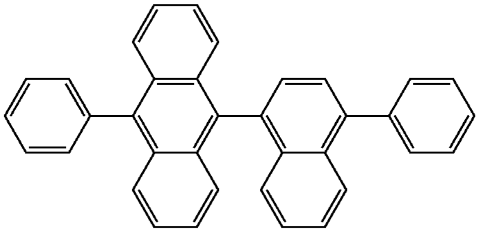
H9
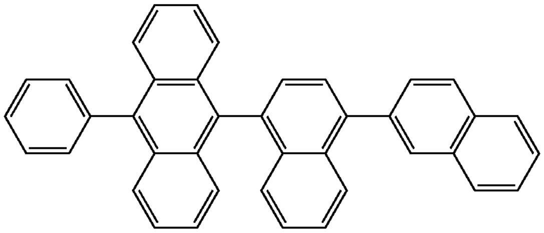
H10
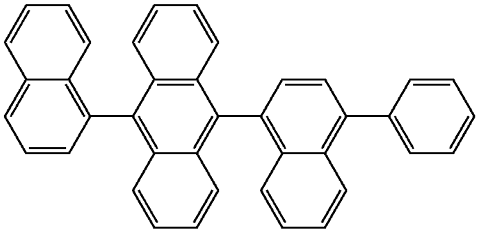
H11
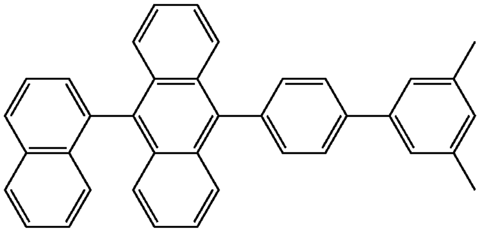
H12
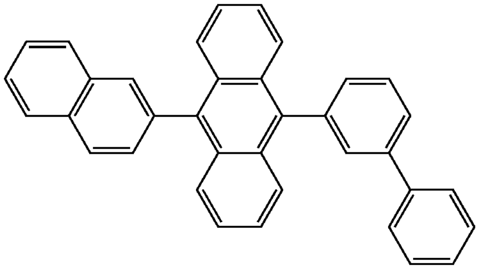

-continued
H13
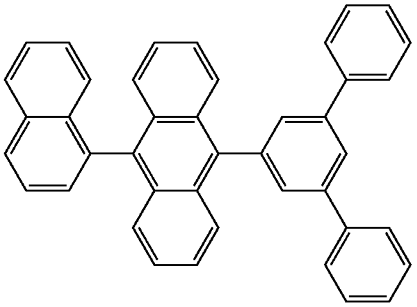
H14
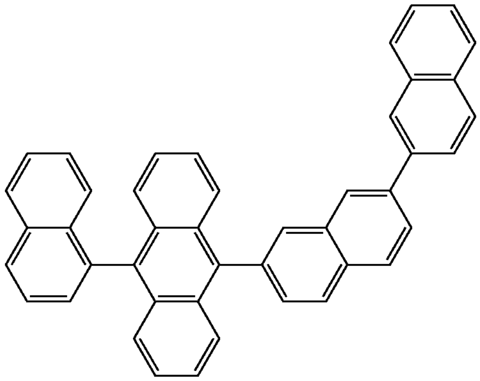
H15
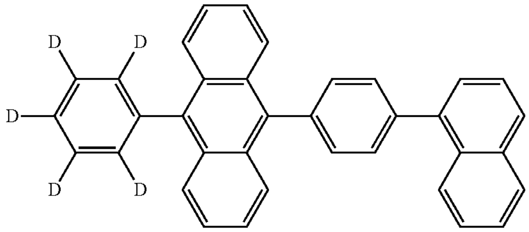
H16
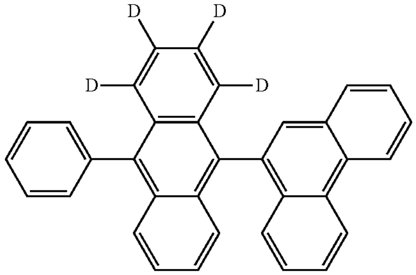
H17
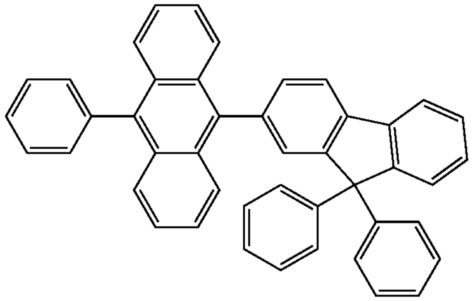
H18
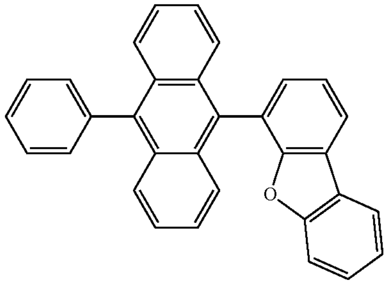
H19
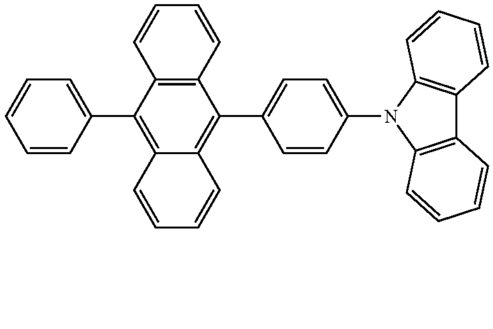
H20
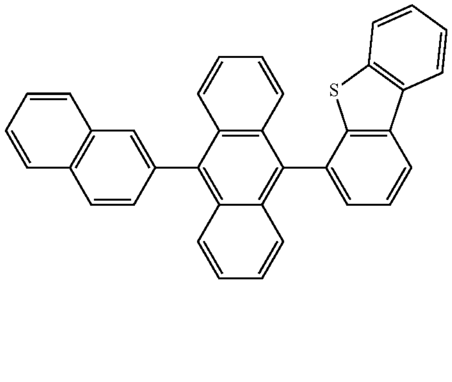

-continued
H21
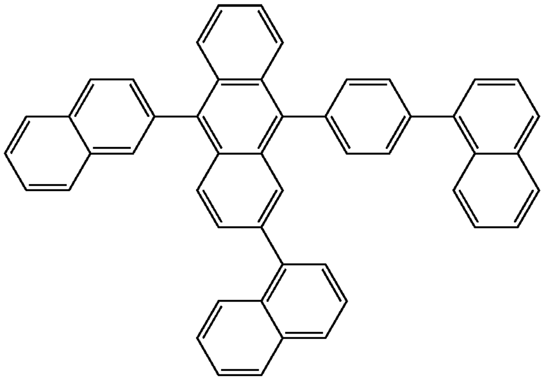
H22
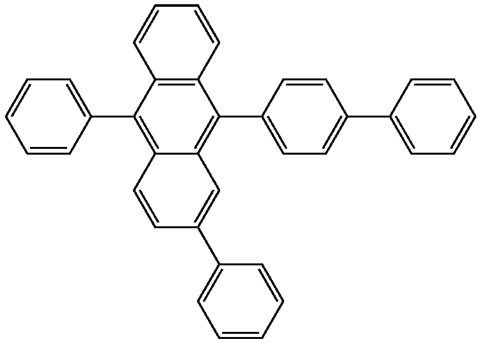
H23
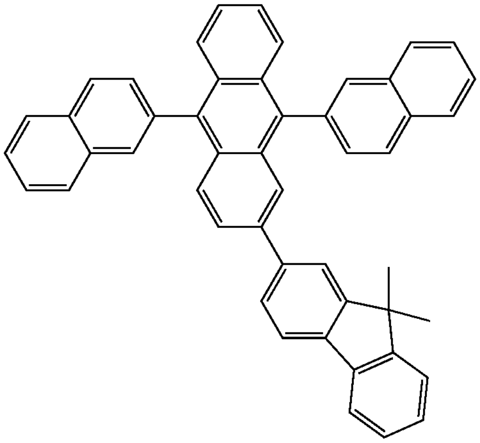
H24
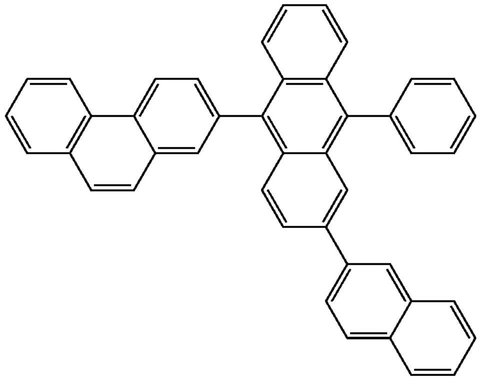
H25
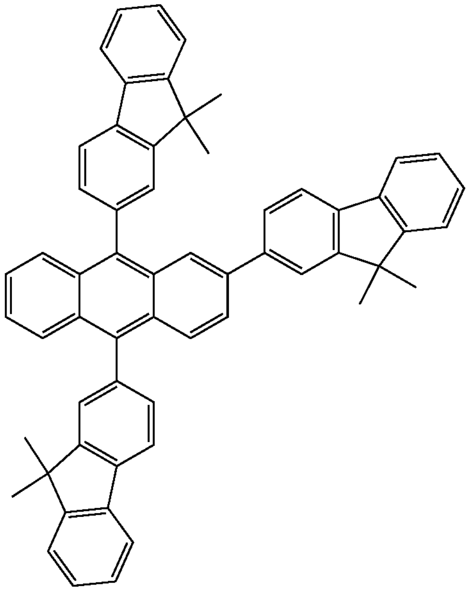
H26
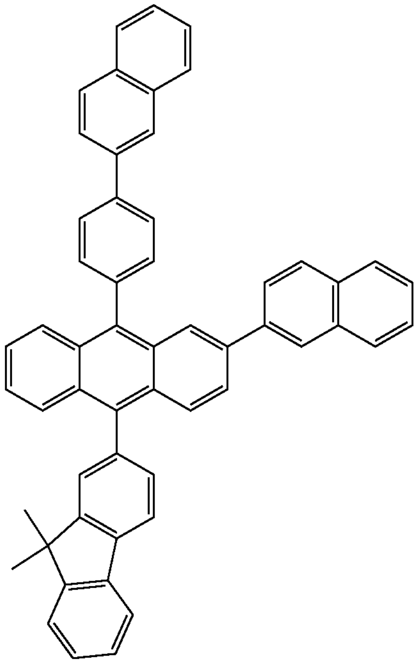

-continued
H27
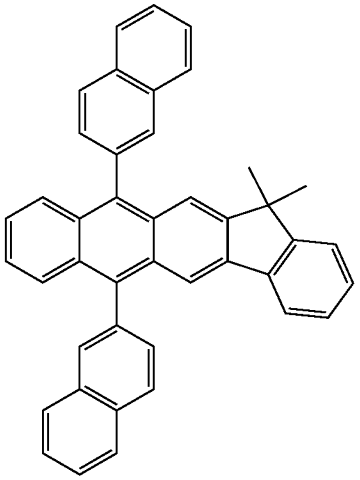
H28
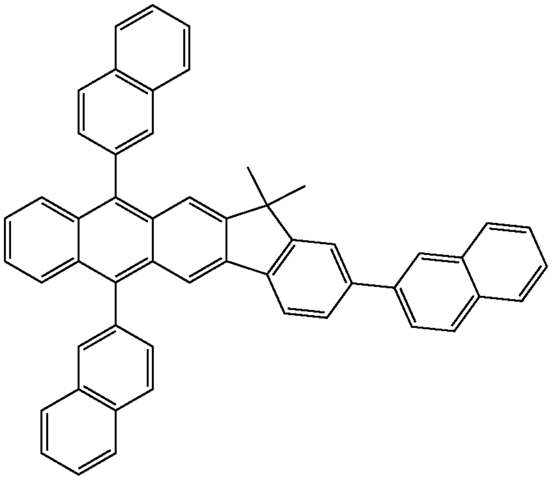
H29
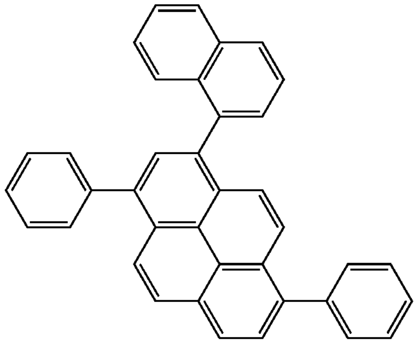
H30
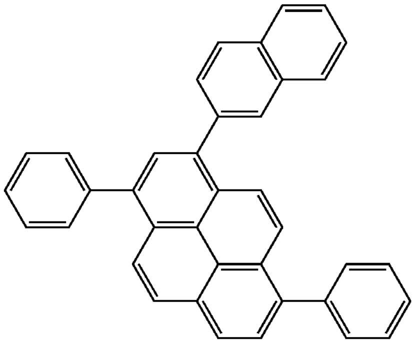
H31
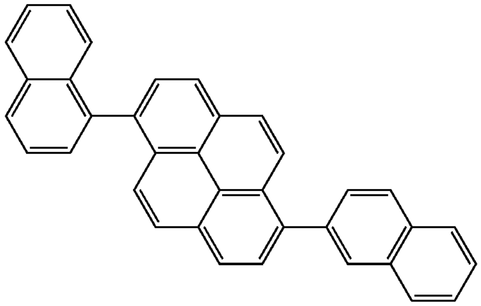
H32
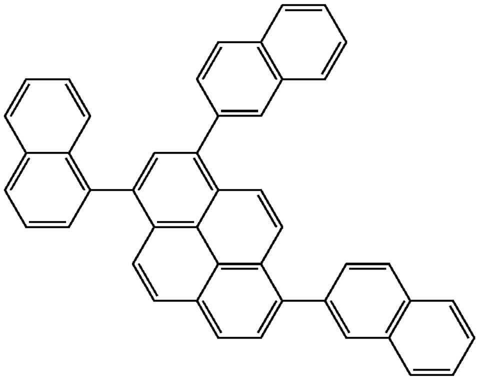
H33
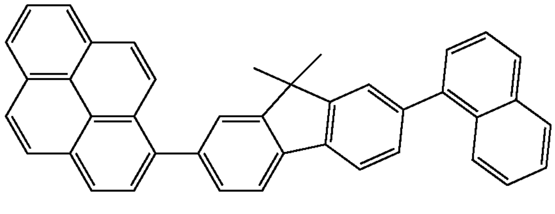
H34
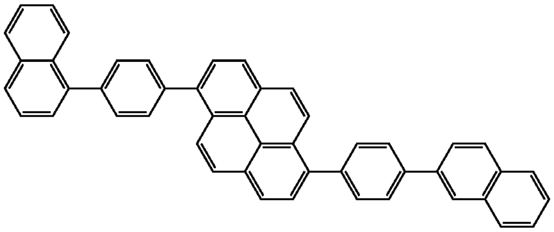

-continued
H35
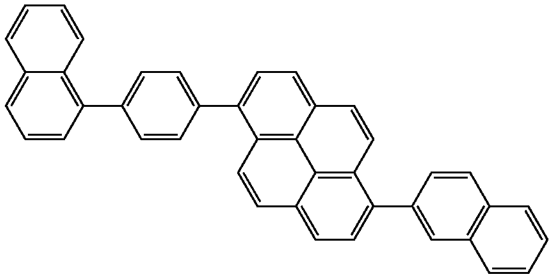
H36
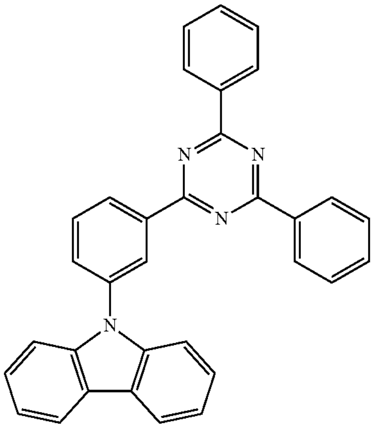
H37
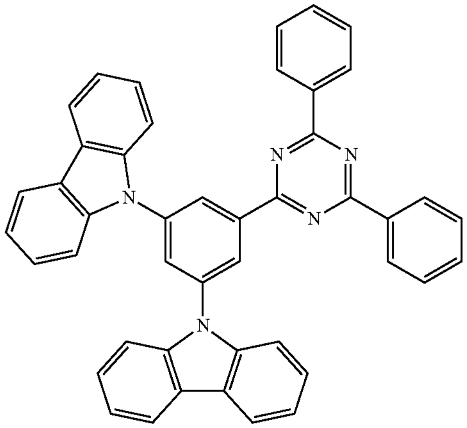
H38
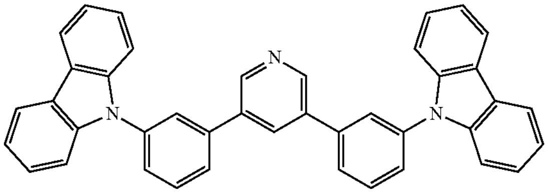
H39
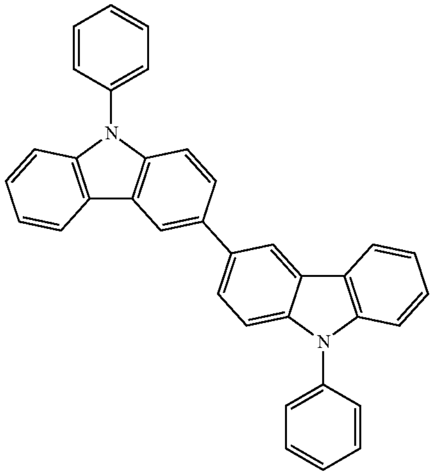
H40
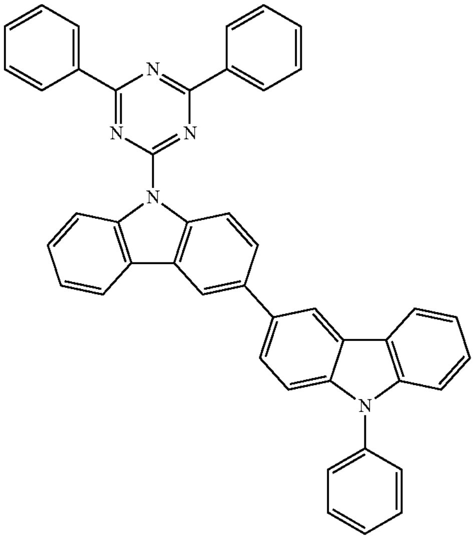

-continued
H41
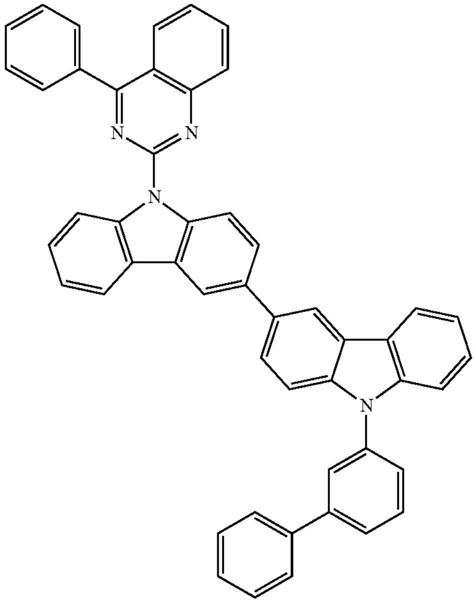
H42
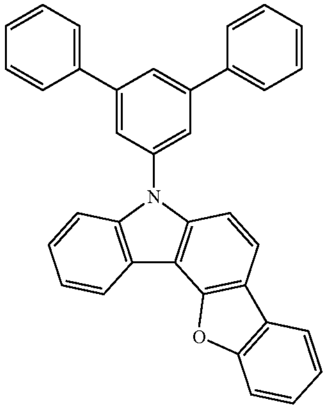
H43
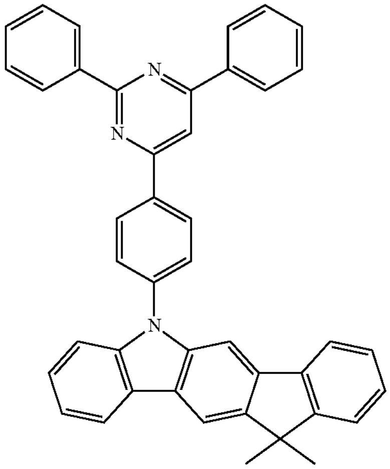
H44
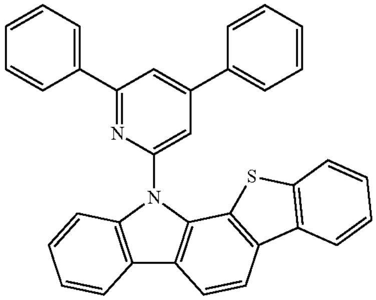
H45
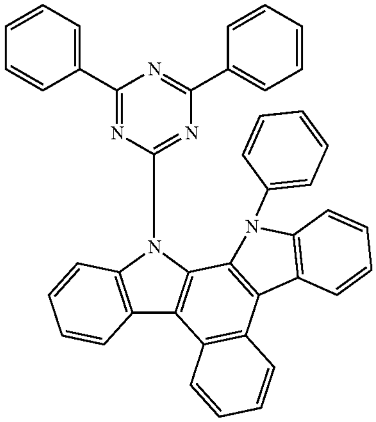
H46
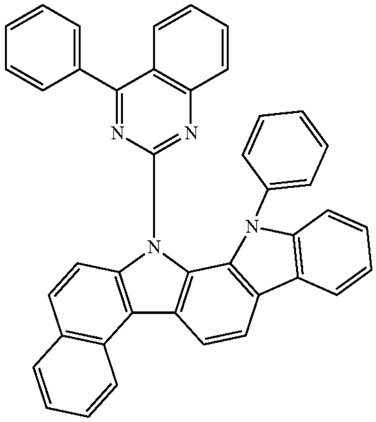

-continued
H47
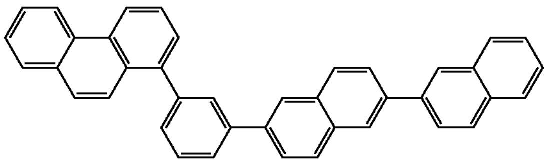
H48
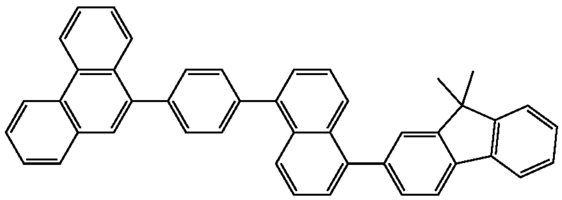
H49
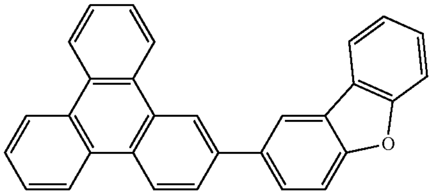
H50
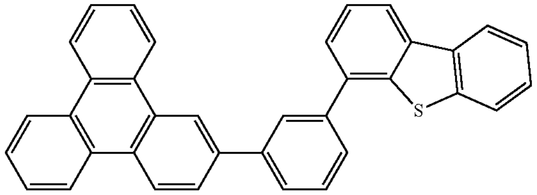
H51
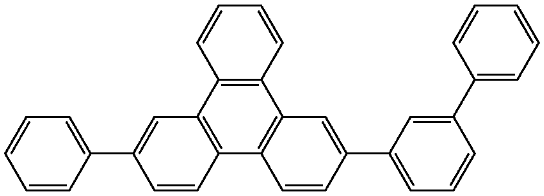
H52
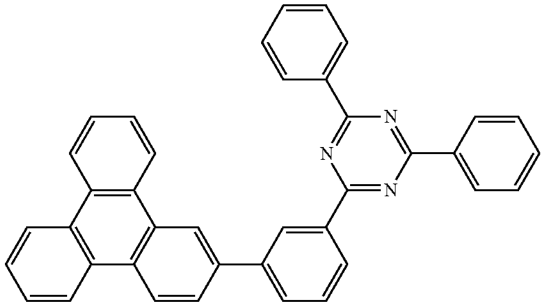
H53
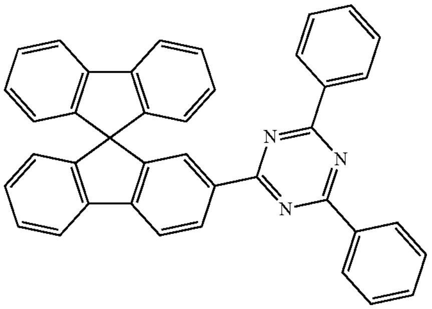
H54
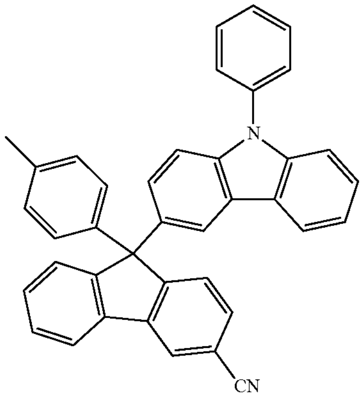
H55
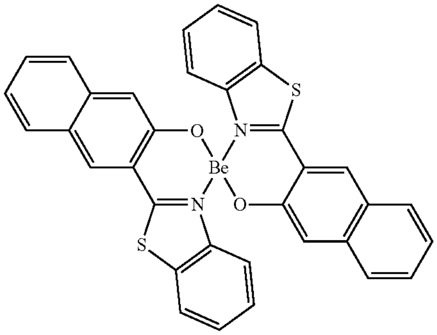
H56
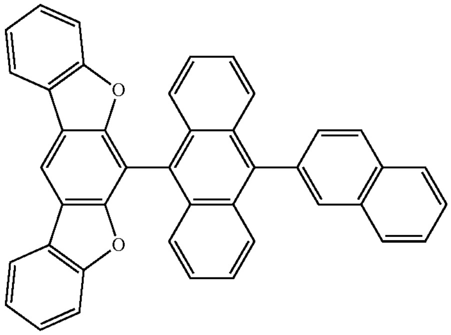

-continued
H57
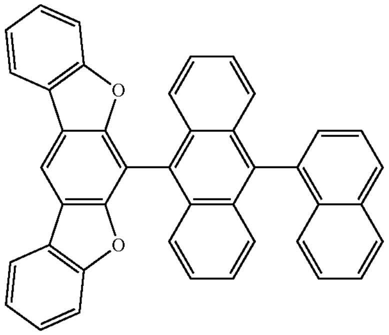
H58
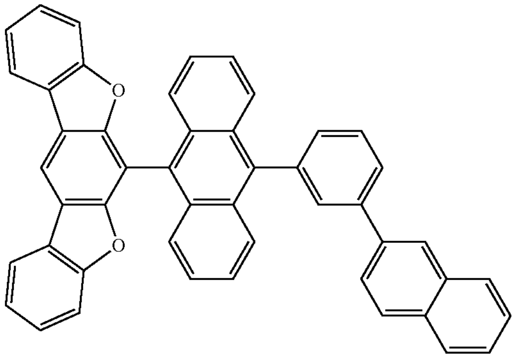
H59
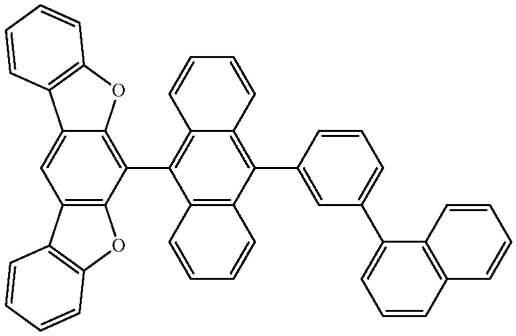
H60
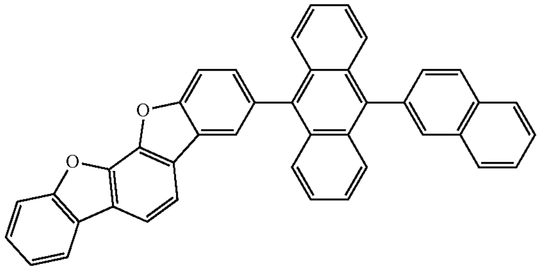
H61
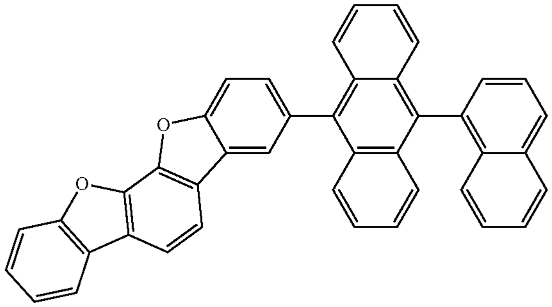
H62
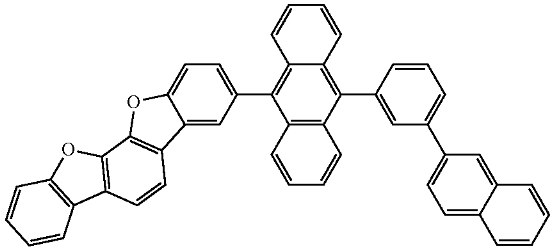
H63
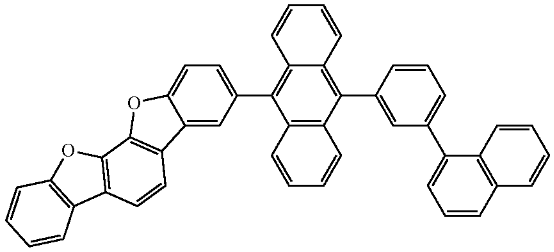
H64
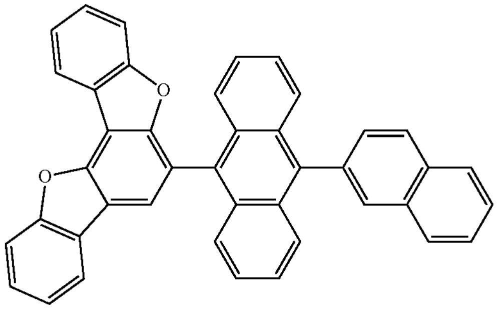

-continued
H65
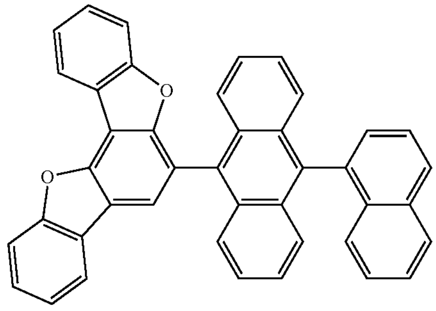
H66
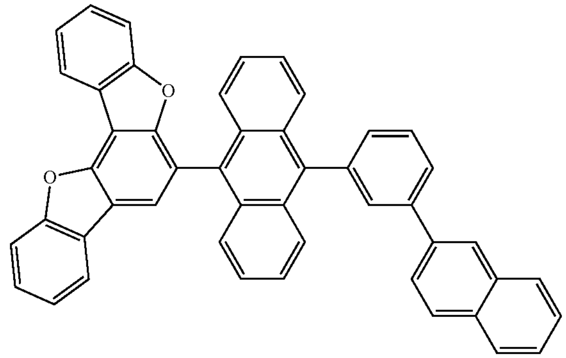
H67
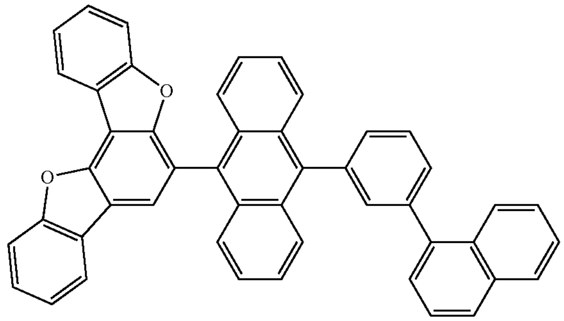
H68
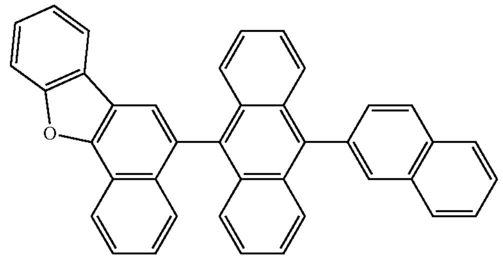
H69
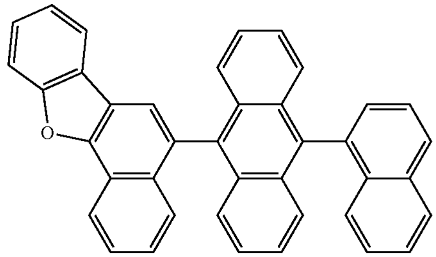
H70
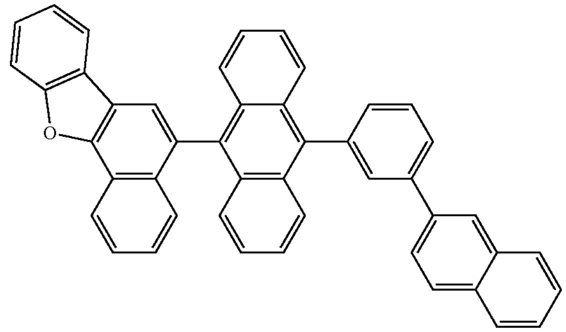
H71
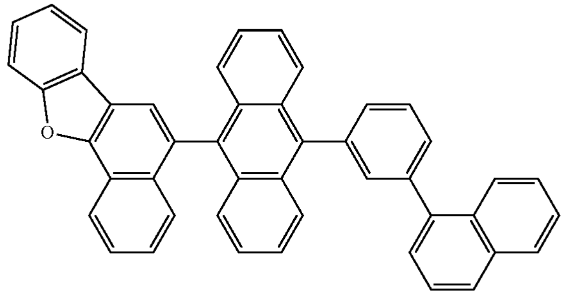
H72
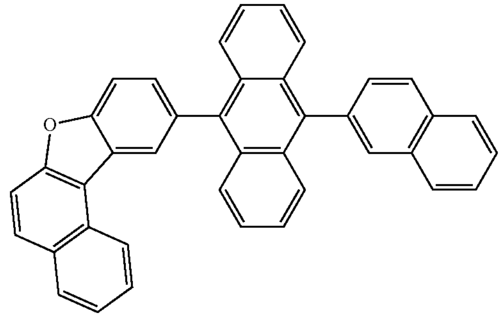

-continued
H73
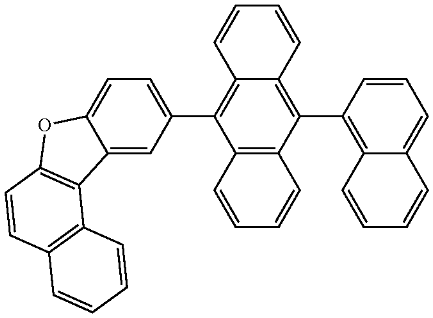
H74
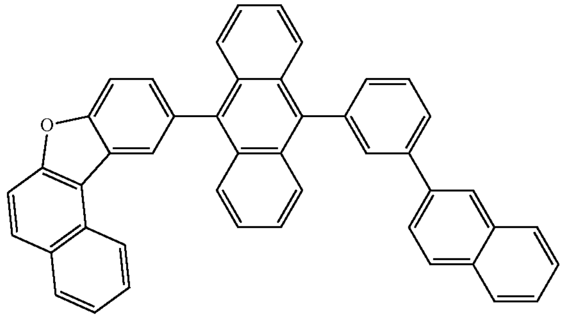
H75
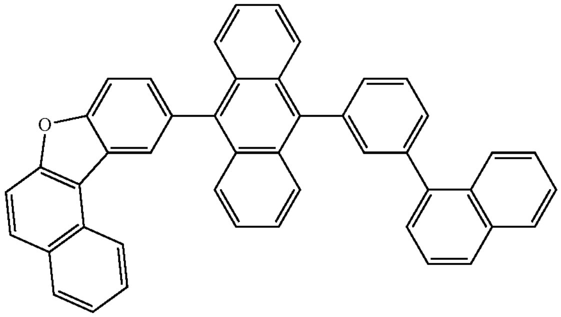
H76
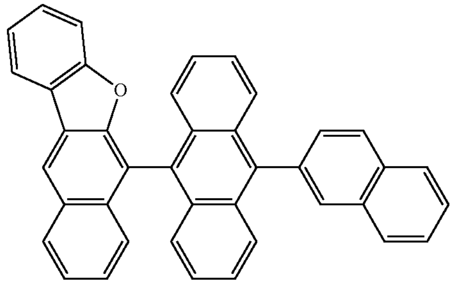
H77
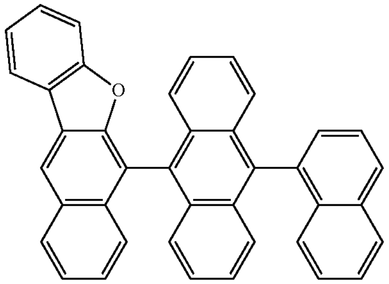
H78
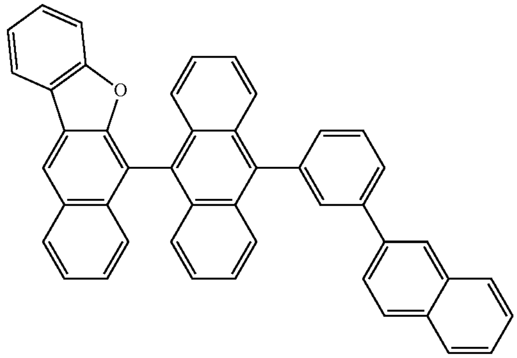
H79
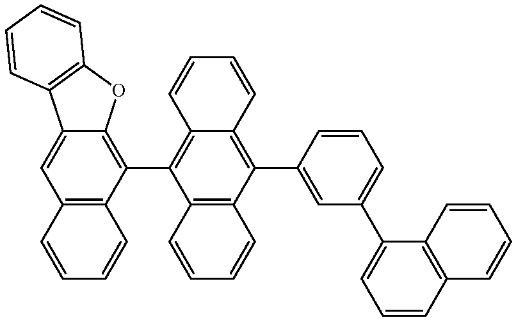
H80
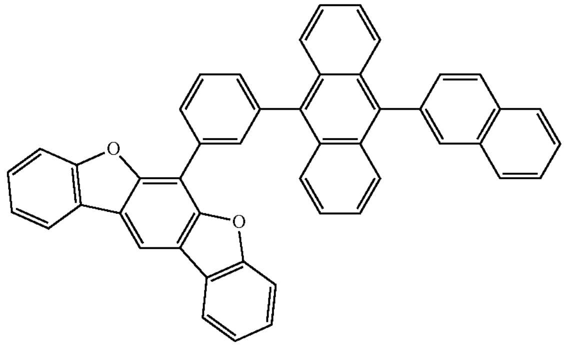

-continued
H81
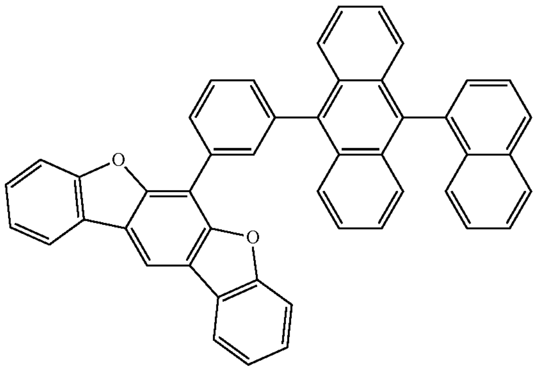
H82
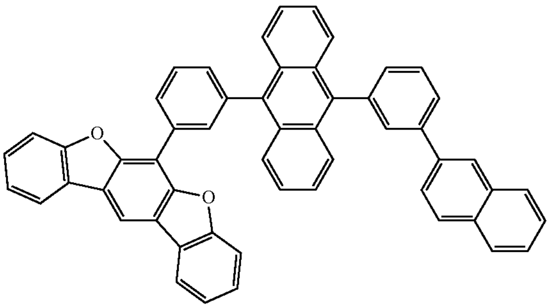
H83
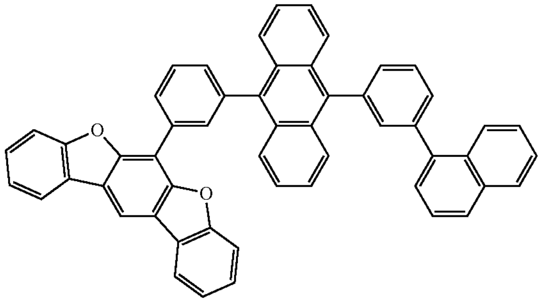
H84
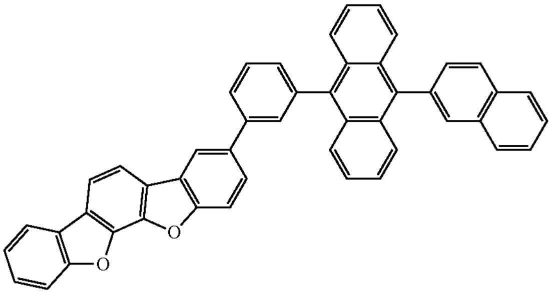
H85
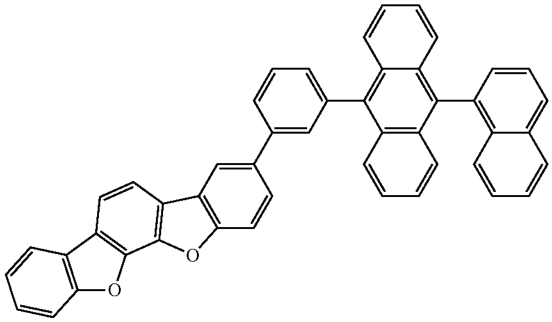
H86
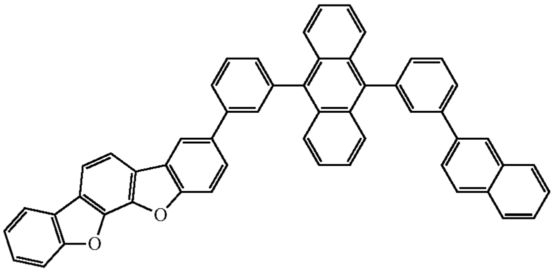
H87
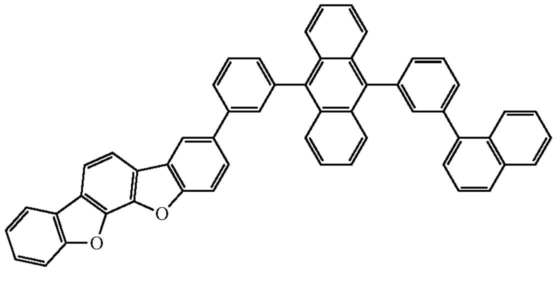
H88
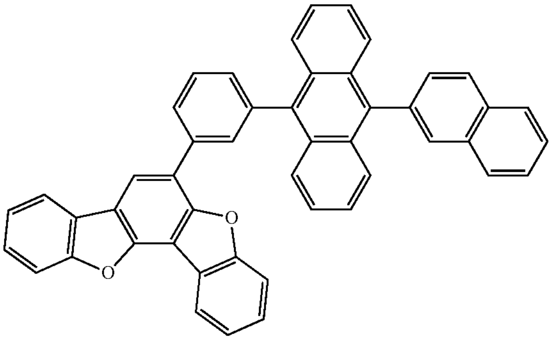

-continued
H89
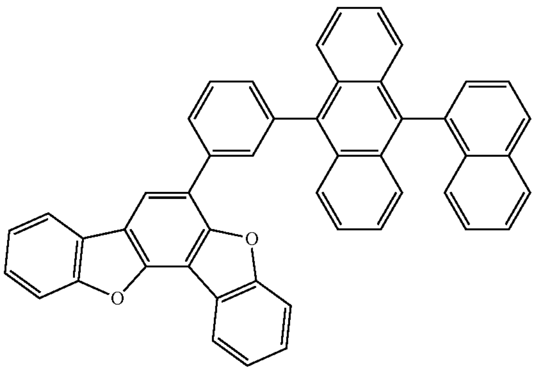
H90
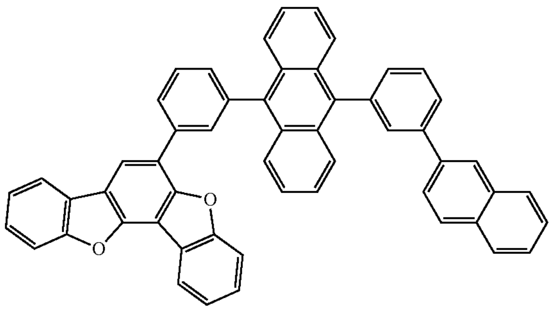
H91
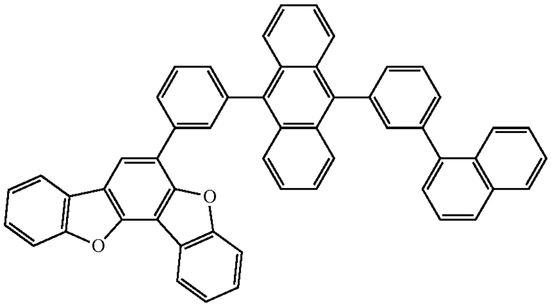
H92
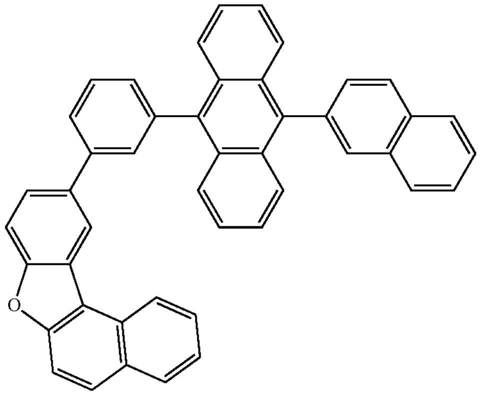
H93
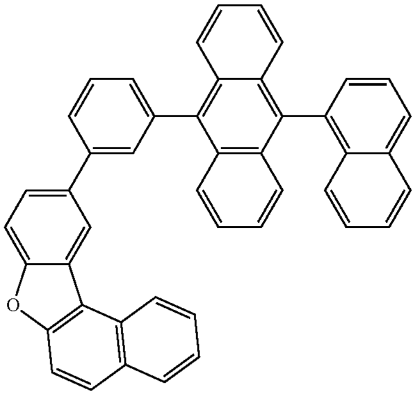
H94
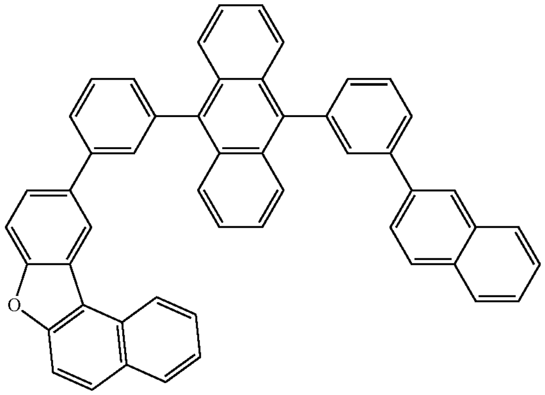
H95
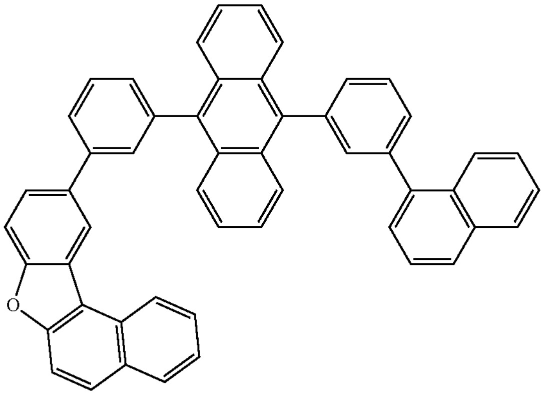
H96
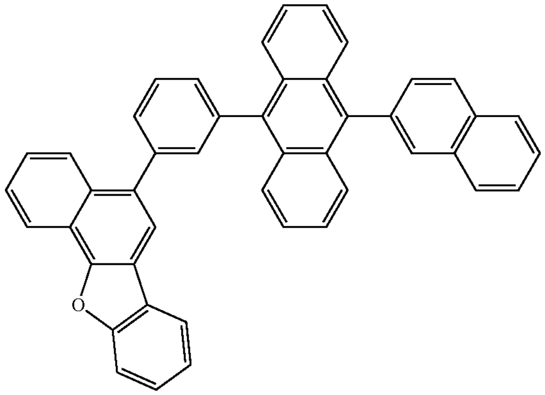

-continued
H97
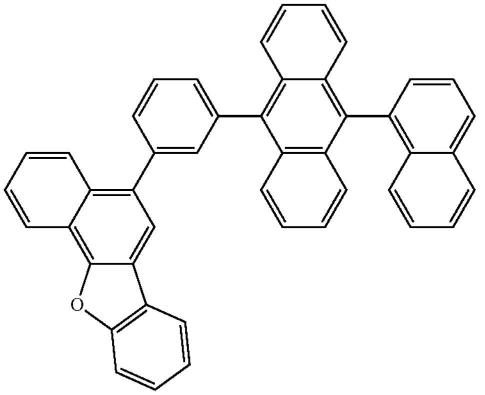
H98
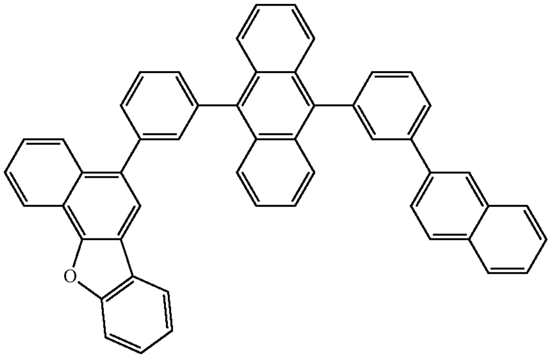
H99
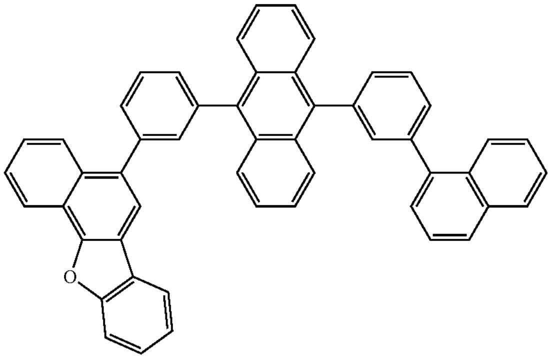
H100
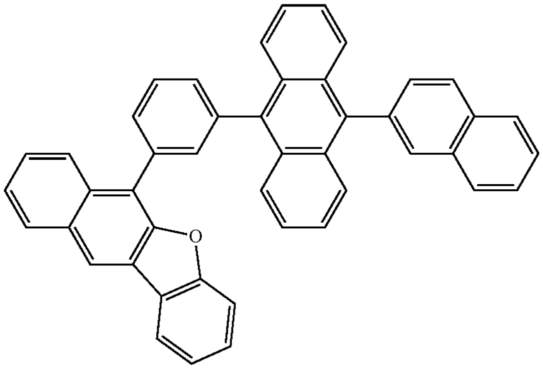
H101
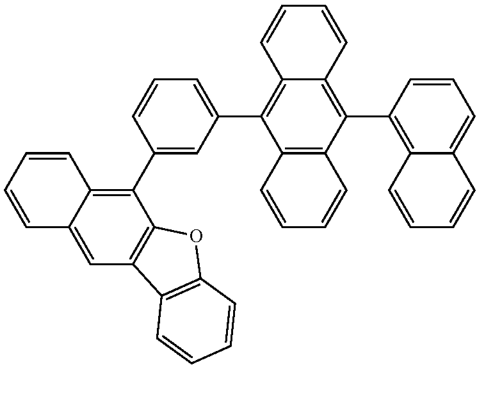
H102
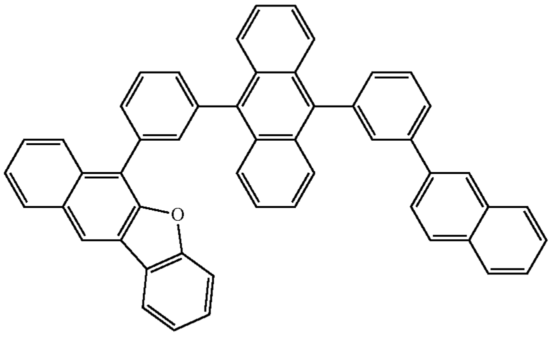

-continued
H103
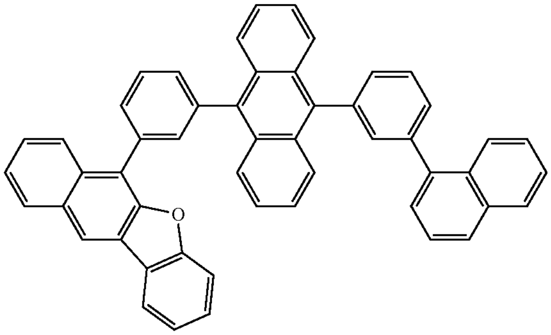
H104
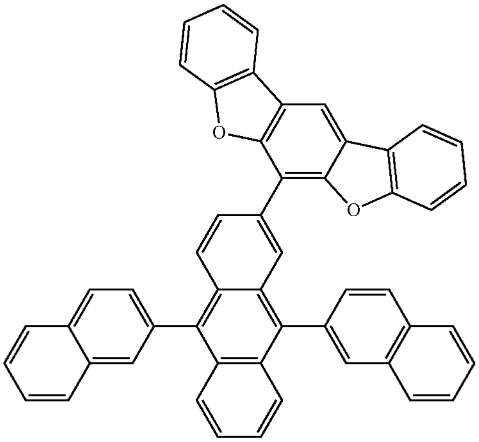
H105
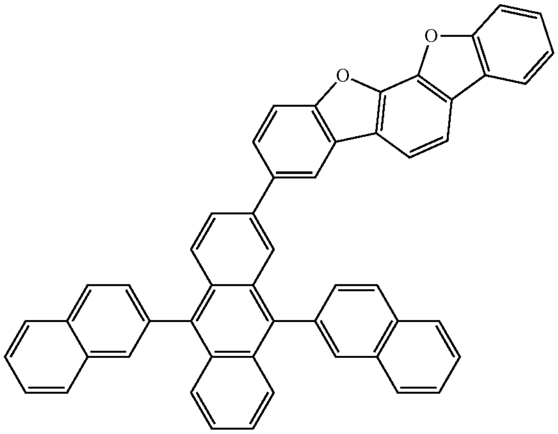
H106
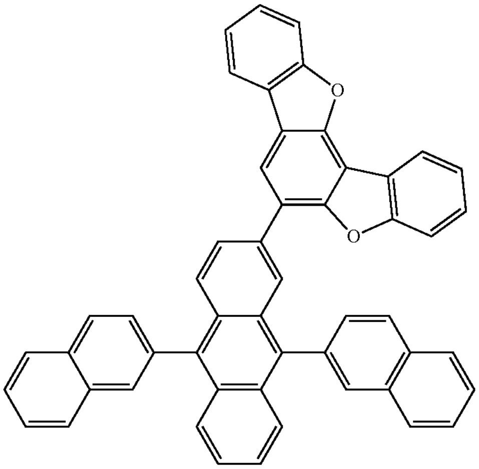
H107
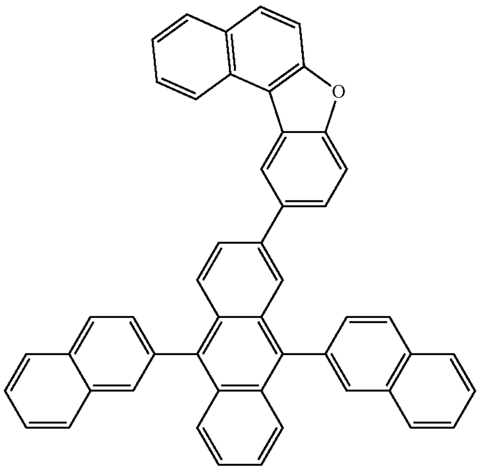
H108
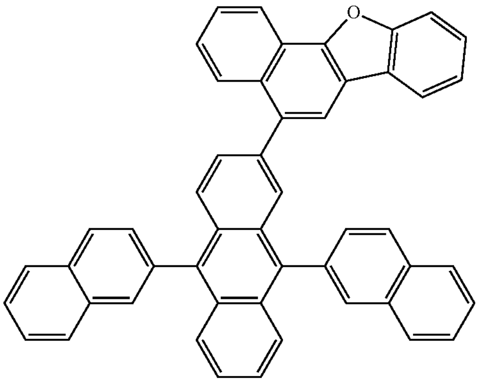

-continued
H109
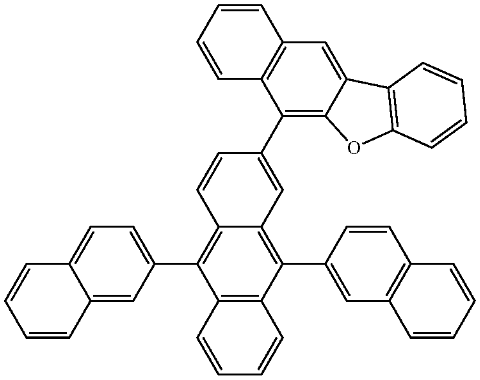
H110
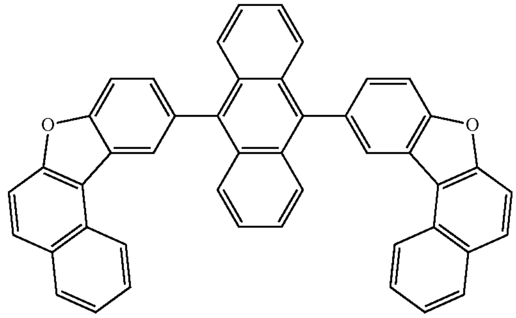
H111
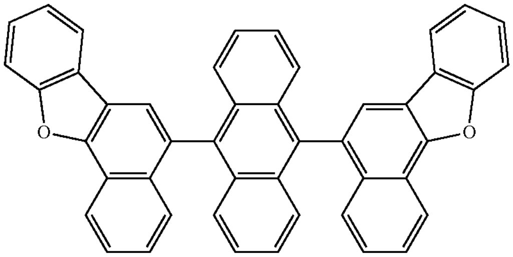
H112
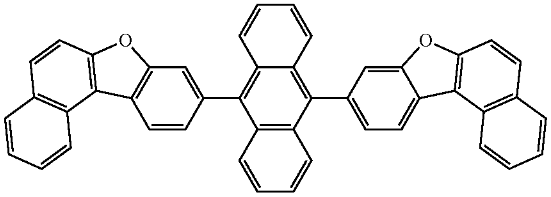
H113
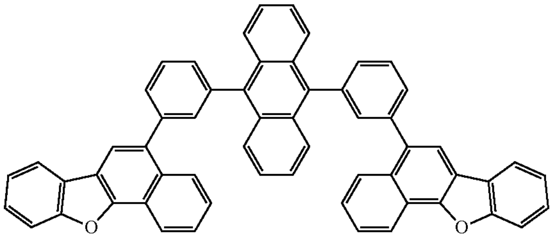
H114
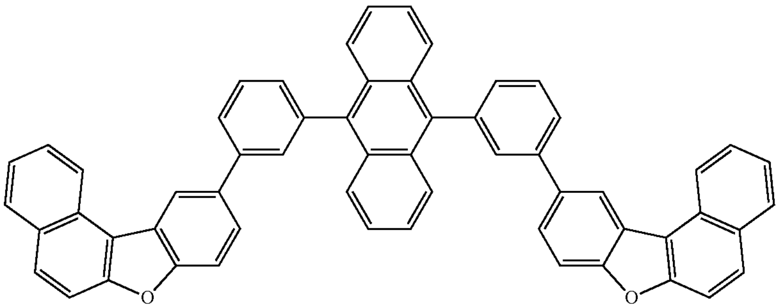

-continued
H115
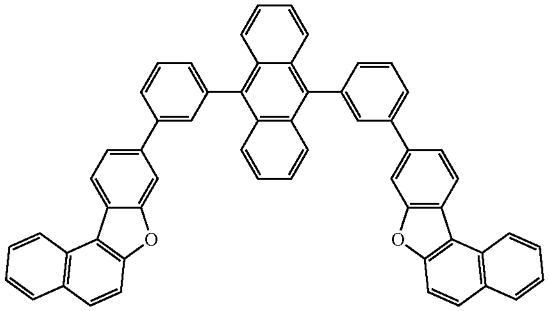
H116
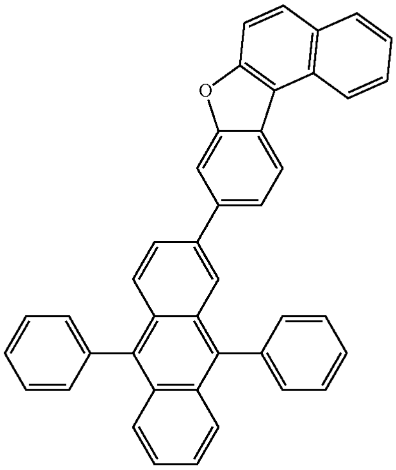
H117
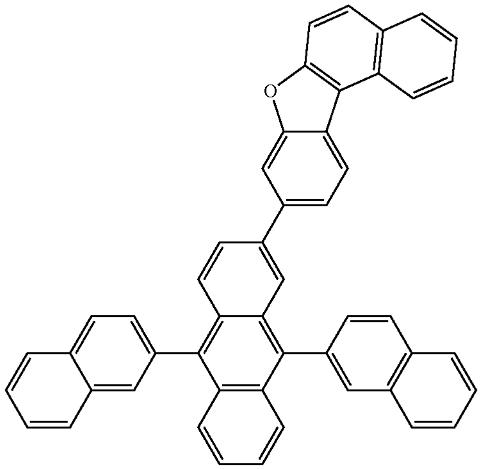
H118
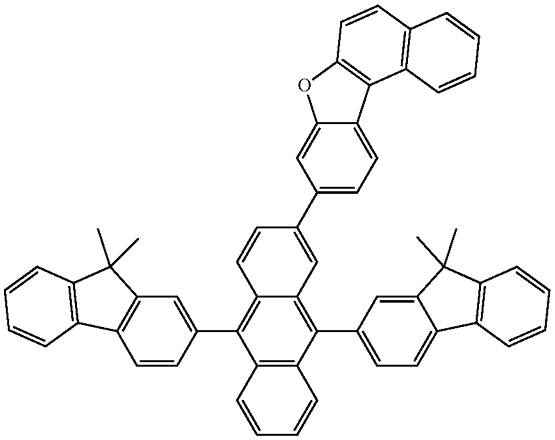
H119
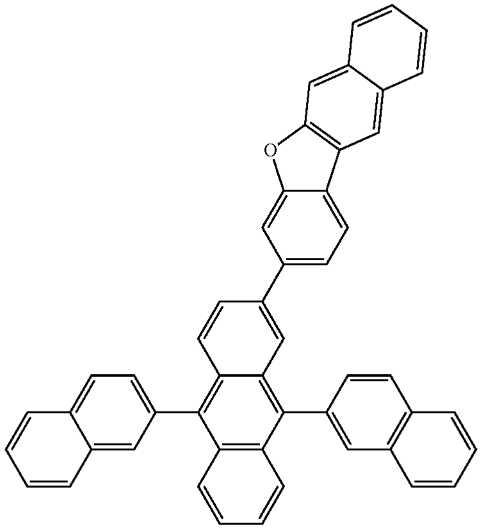
H120
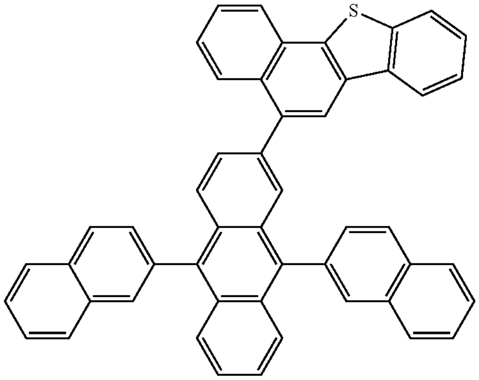

-continued
H121
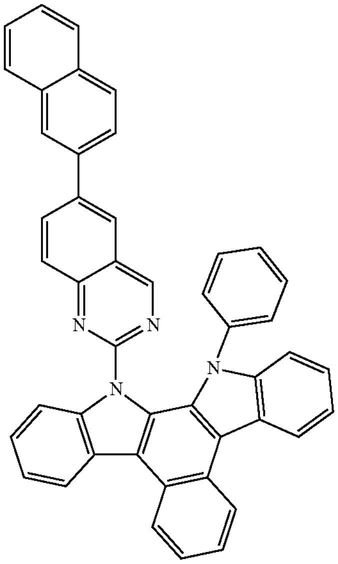
H122
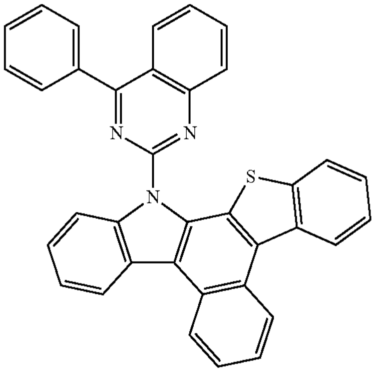
H123
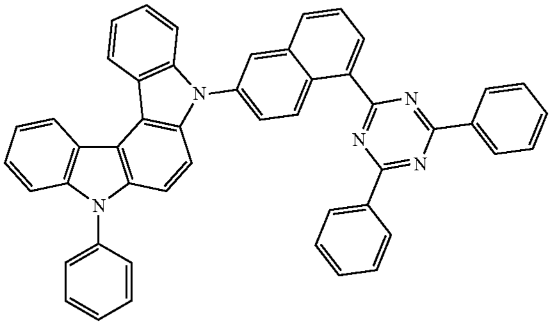
H124
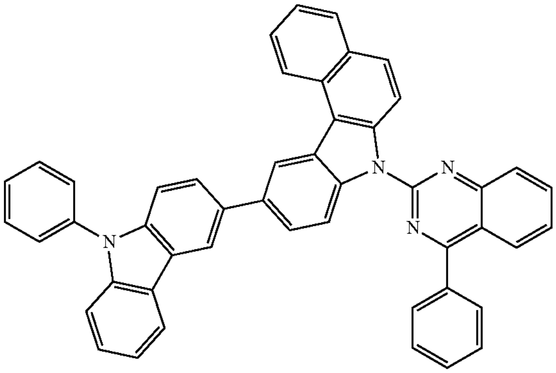
H125
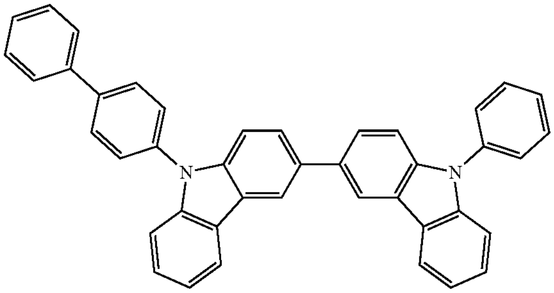
H126
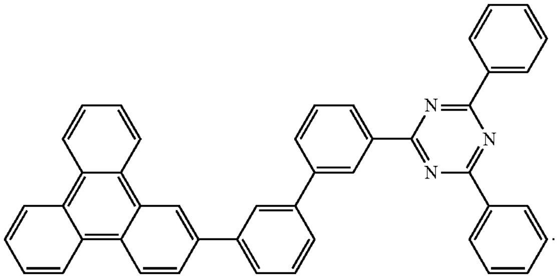
.

Phosphorescent Dopant

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or a combination thereof.

The phosphorescent dopant may be electrically neutral.

For example, the phosphorescent dopant may include an organometallic compound represented by Formula 401:

$M(L_{401})_{xc1}(L_{402})_{xc2}$ Formula 401

Formula 402

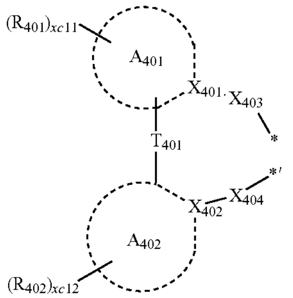

wherein, in Formulae 401 and 402,

M may be transition metal (for example, iridium Or), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(═O)—, —N($Q_{411}$)—, —C($Q_{411}$)($Q_{412}$)-, —C($Q_{411}$)=C($Q_{412}$)-, —C($Q_{411}$)═, or ═C($Q_{411}$)═, $X_{403}$ and $X_{404}$ may each independently be a chemical bond (for example, a covalent bond or a coordination bond (which may also be referred to as a coordinate covalent bond or a dative bond)), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be as described for $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be as described for Qi, xc11 and xc12 may each independently be an integer from 0 to 10, and

* and *' in Formula 402 each indicates a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 401 is 2 or more, two ring $A_{401}$(s) in two or more of $L_{402}$(s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each be as described for $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or a combination thereof.

The phosphorescent dopant may include, for example, one selected from Compounds PD1 to PD40 or a combination thereof:

PD1

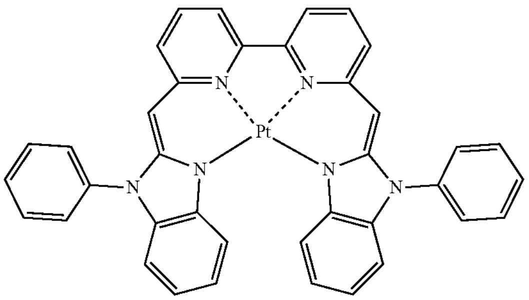

PD2

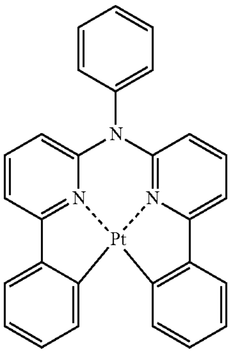

PD3

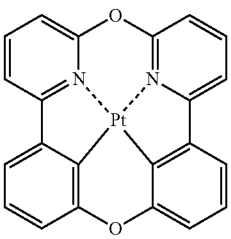

-continued
PD4
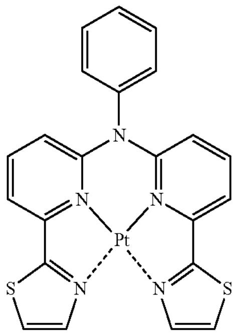
PD5
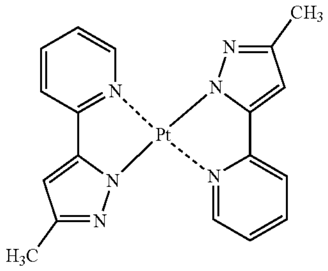
PD6
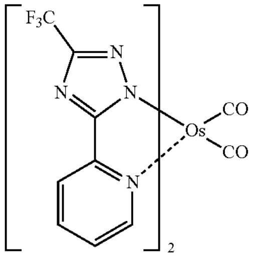
PD7
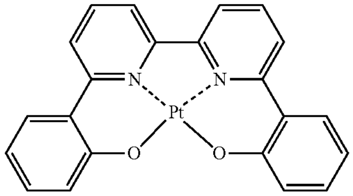
PD8
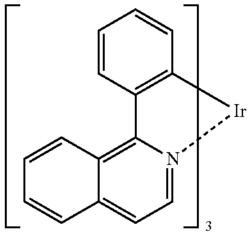
PD9
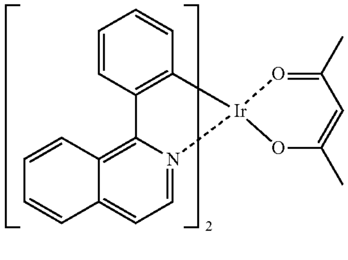
-continued
PD10
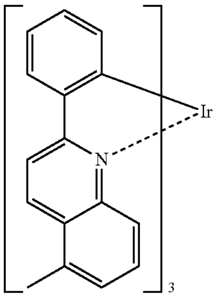
PD11
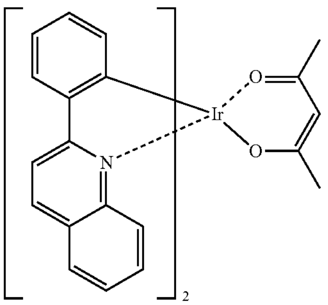
PD12
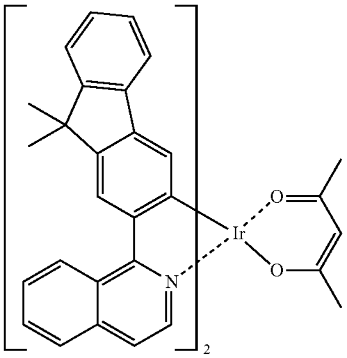
PD13
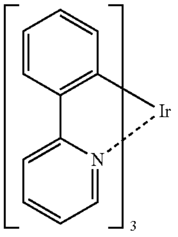
PD14
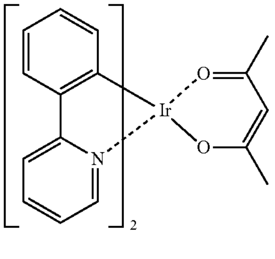

PD15
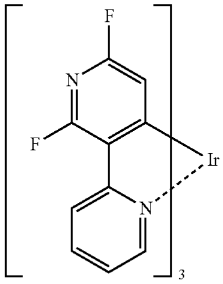
PD16
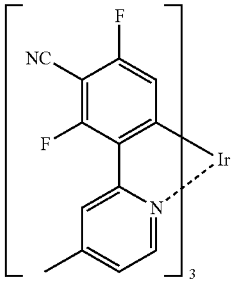
PD17
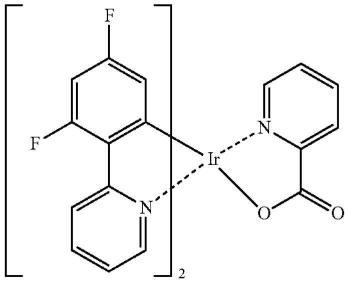
PD18
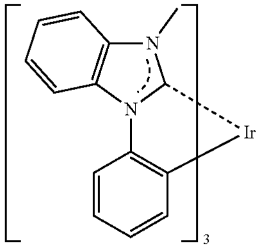
PD19
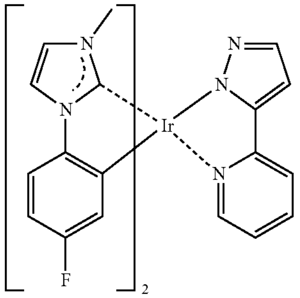
PD20
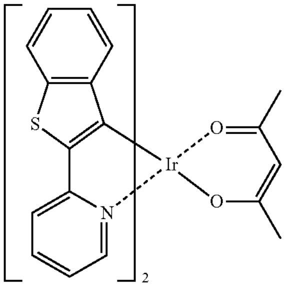
PD21
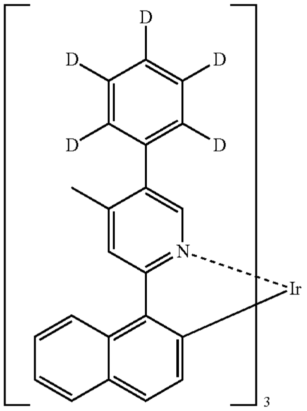
PD22
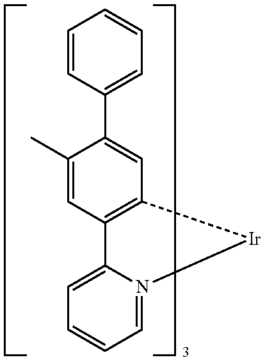
PD23
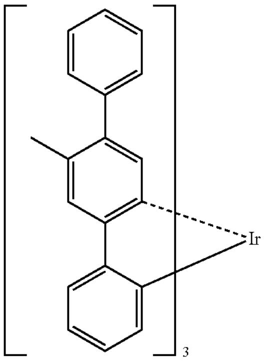

PD24
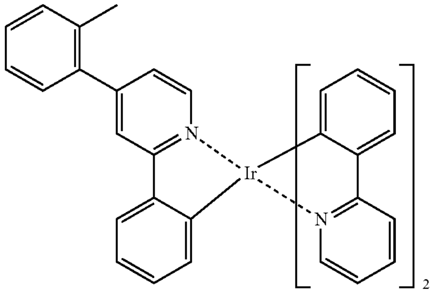
PD25
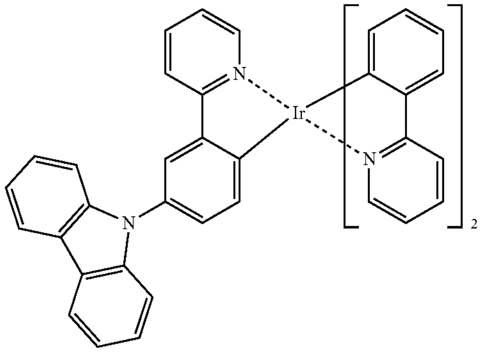
PD26
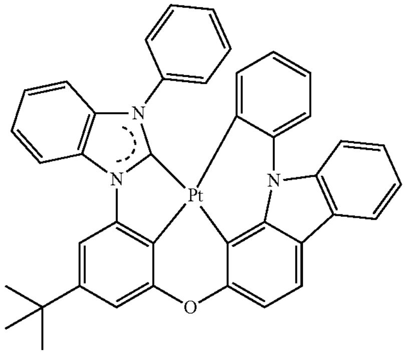
PD27
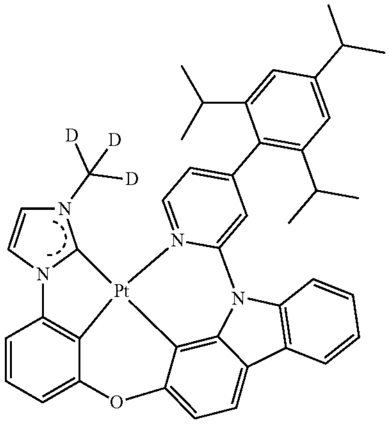
PD28
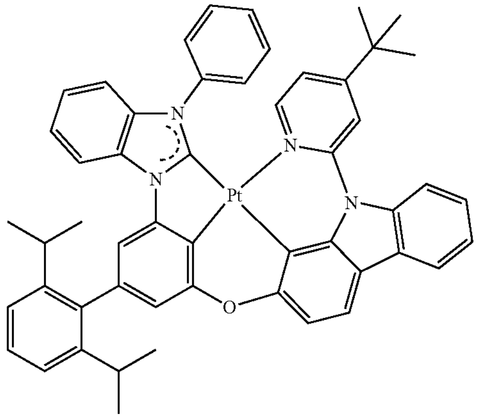
PD29
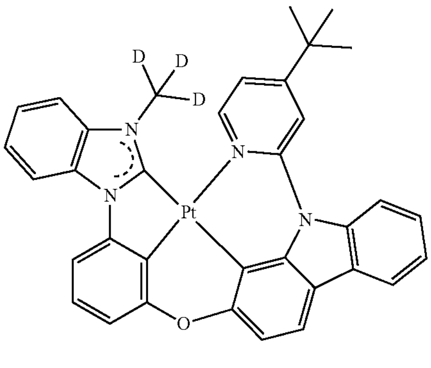
PD30
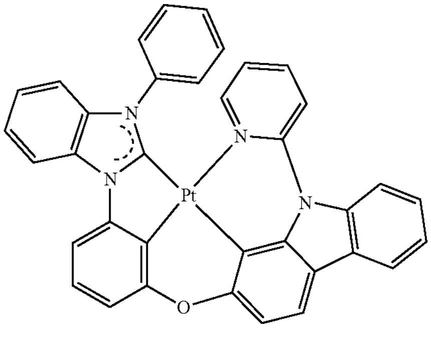

-continued
PD31
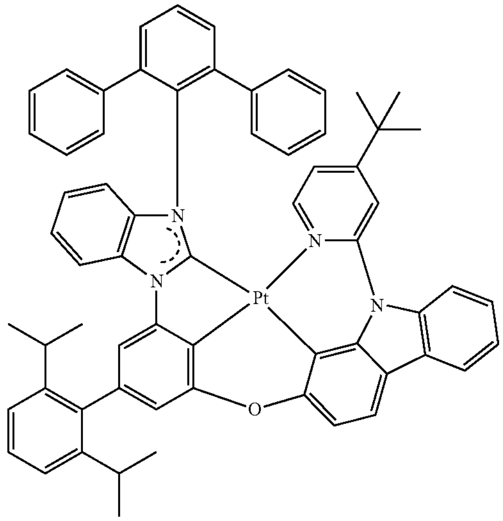
PD32
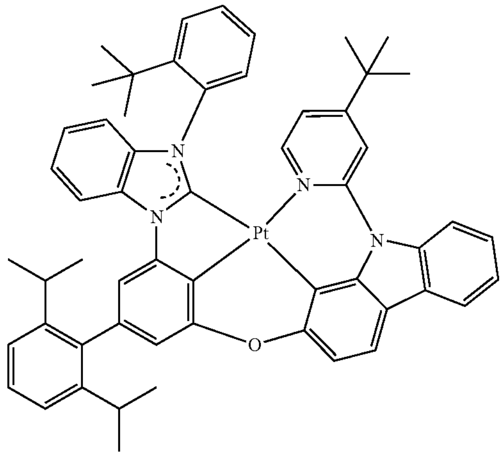
PD33
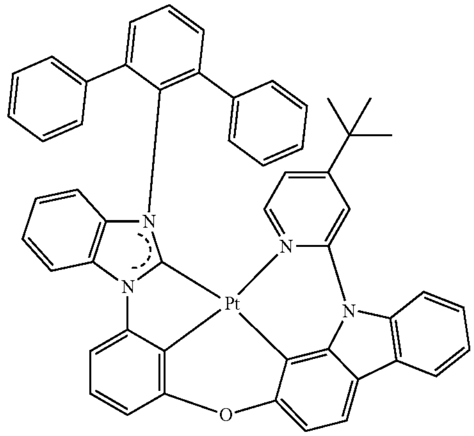
-continued
PD34
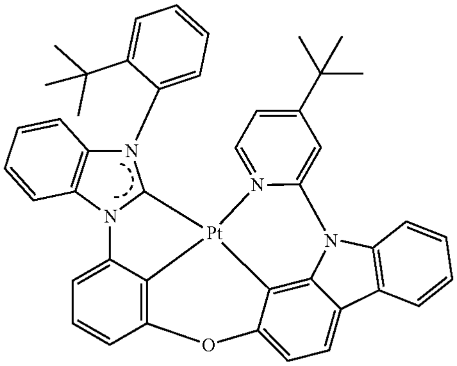
PD35
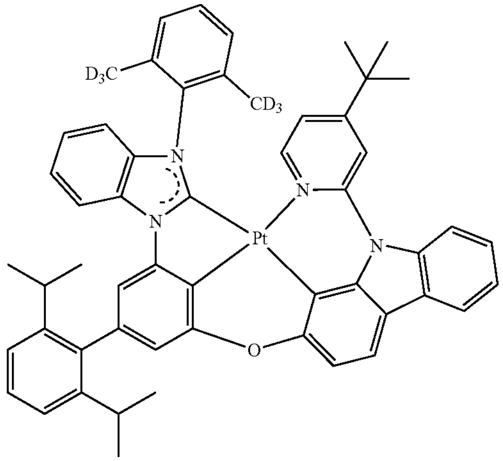
PD36
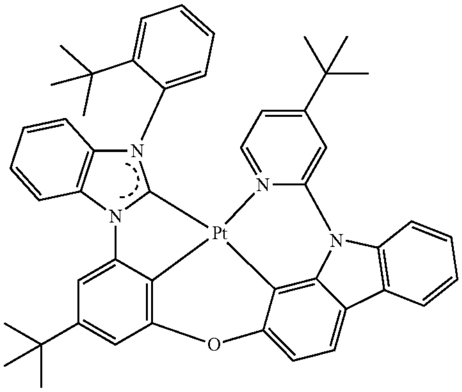

-continued

PD37

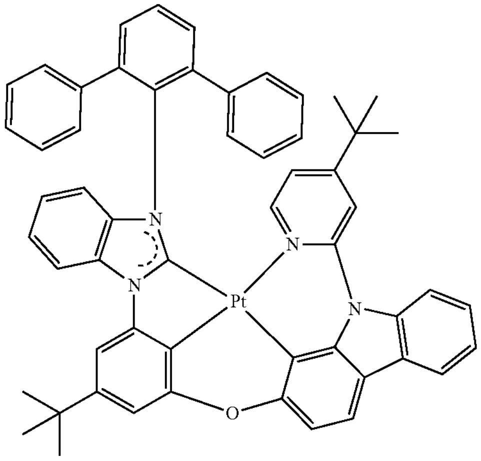

PD38

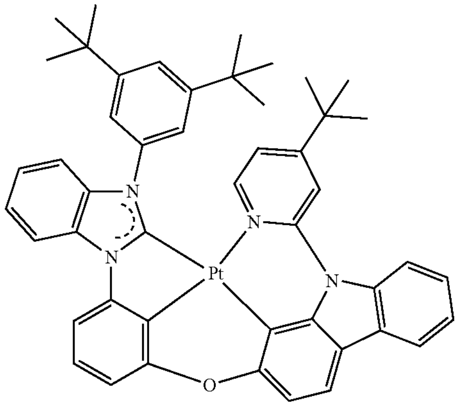

PD39

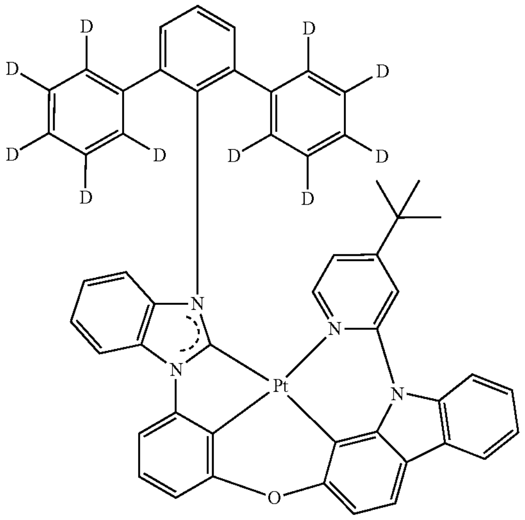

-continued

PD40

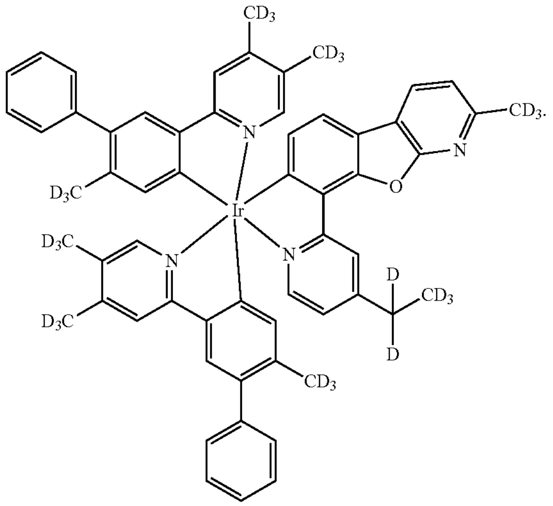

Fluorescent Dopant

The fluorescent dopant may include an amine group-containing compound, a styryl group-containing compound, or a combination thereof.

For example, the fluorescent dopant may include a compound represented by Formula 501:

Formula 501

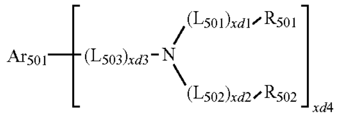

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

For example, the fluorescent dopant may include: one selected from Compounds FD1 to FD36; DPVBi; DPAVBi; or a combination thereof;

FD1
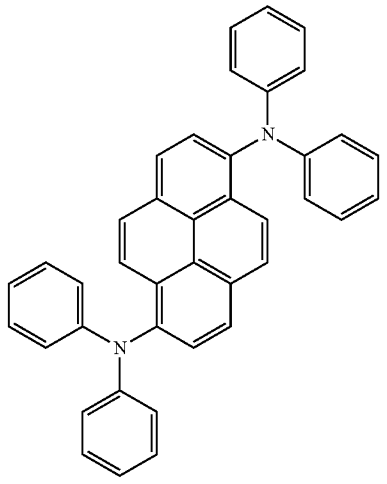
FD2
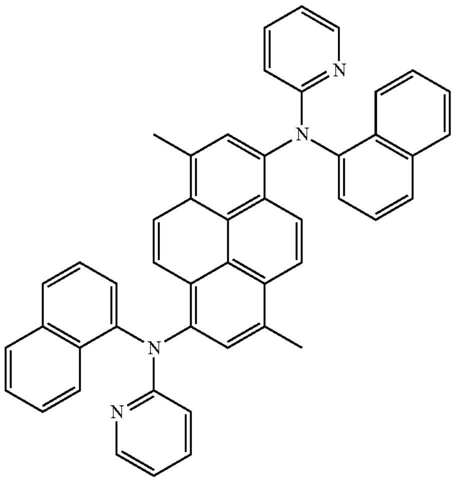
FD3
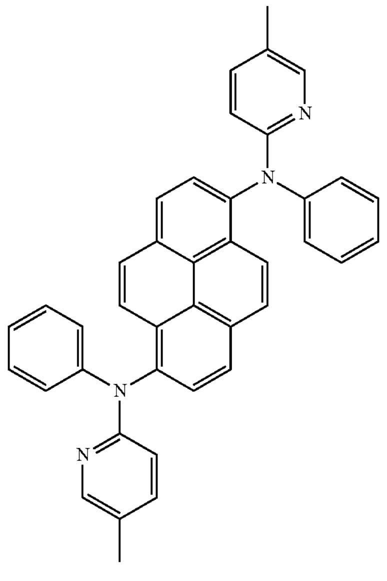
FD4
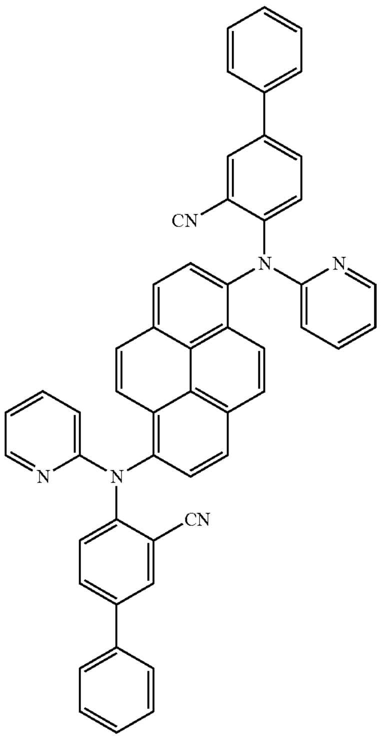

-continued
FD5
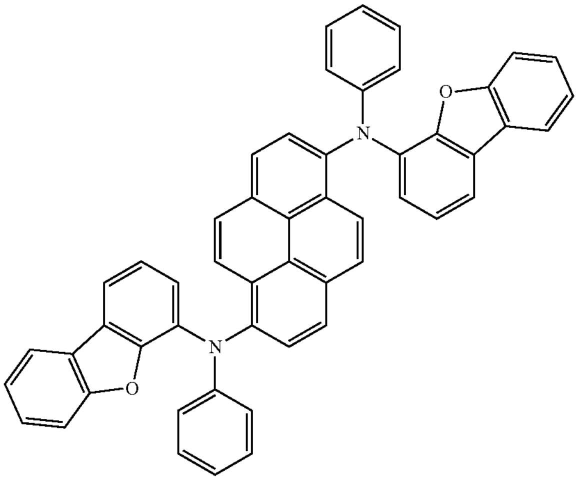
FD6
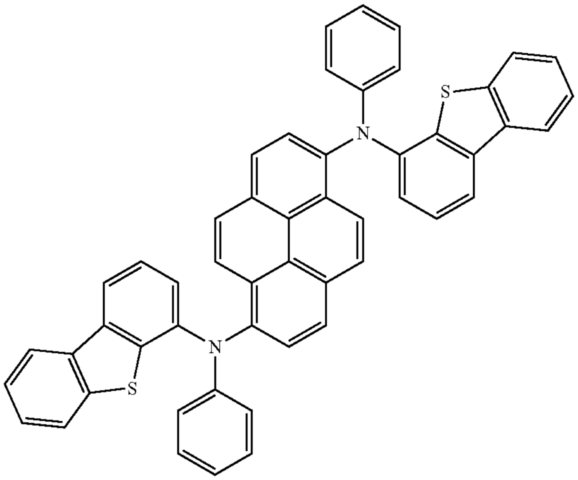
FD7
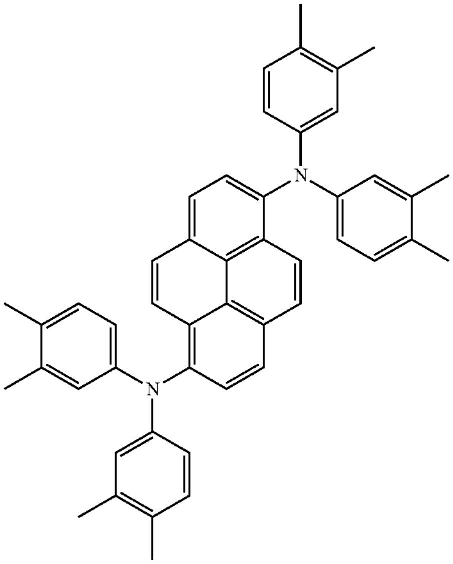
FD8
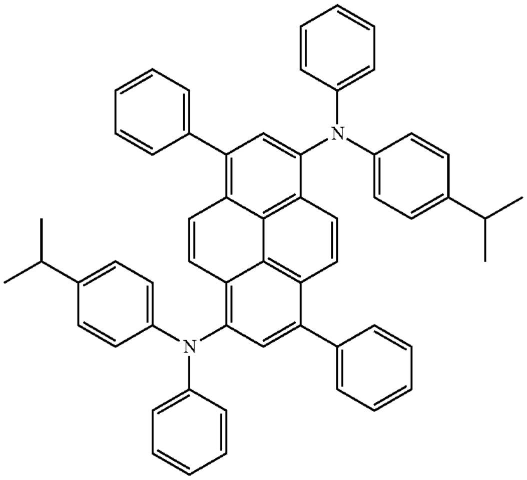
FD9
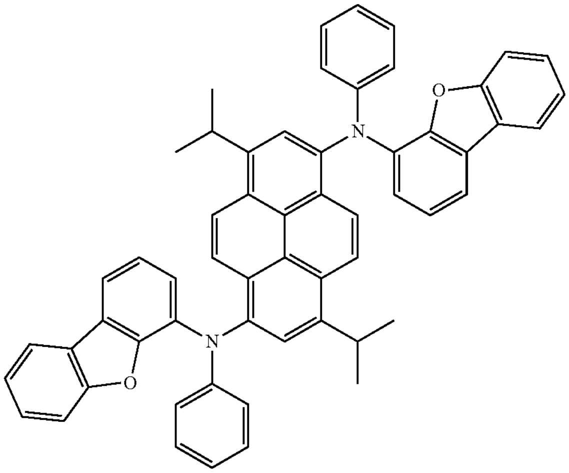
FD10
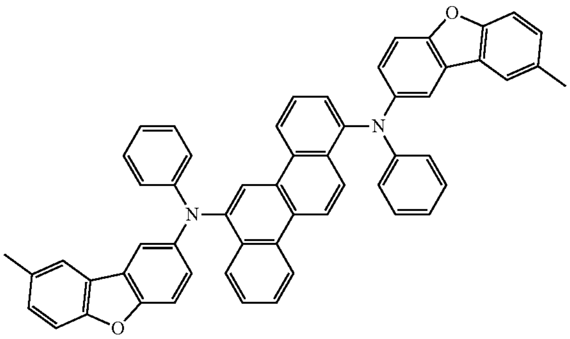

-continued
FD11
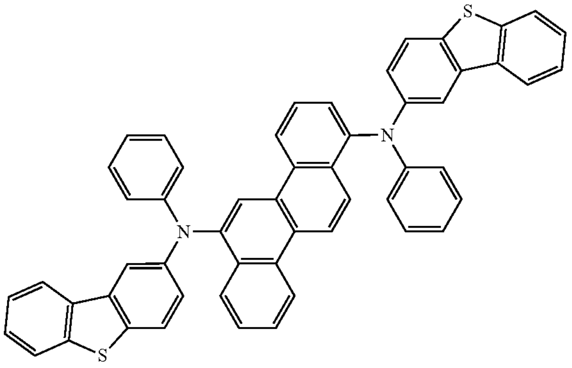
FD12
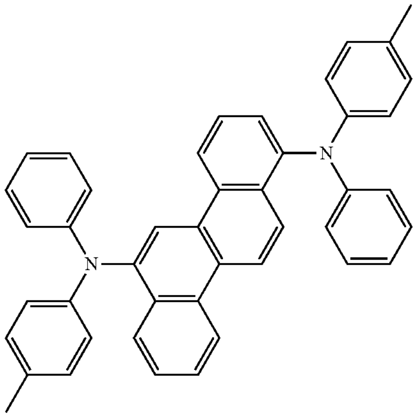
FD13
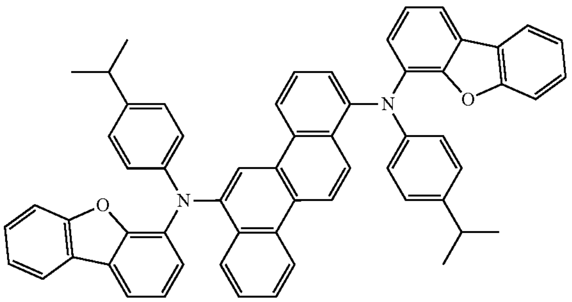
FD14
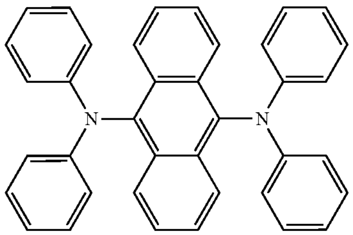
FD15
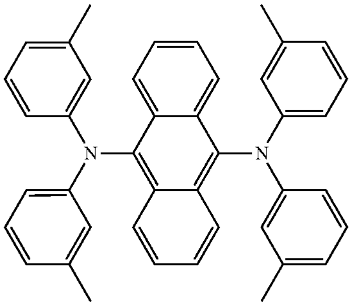
FD16
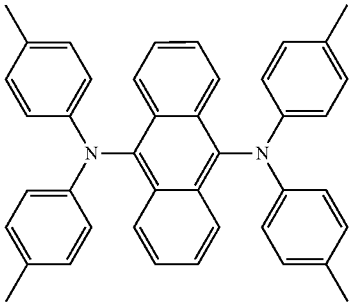
FD17
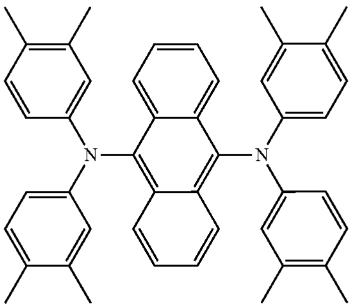
FD18
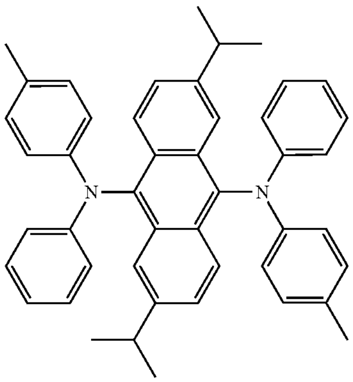

-continued
FD19
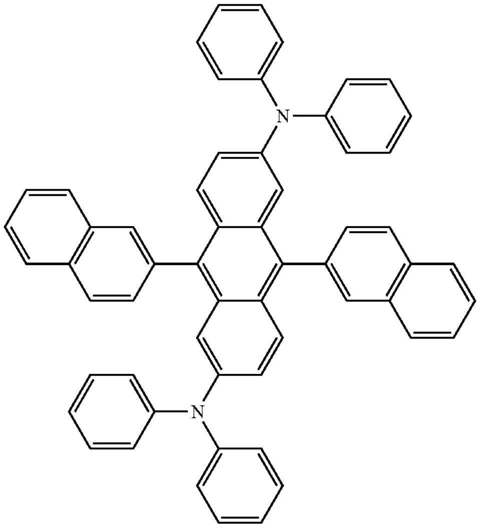
FD20
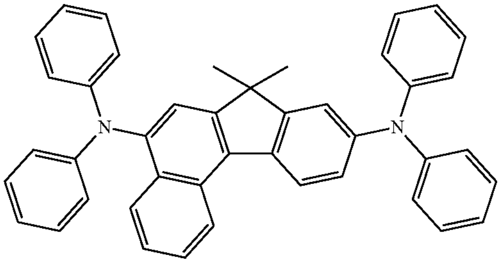
FD21
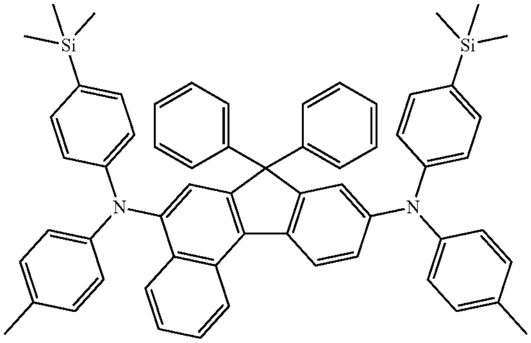
FD22
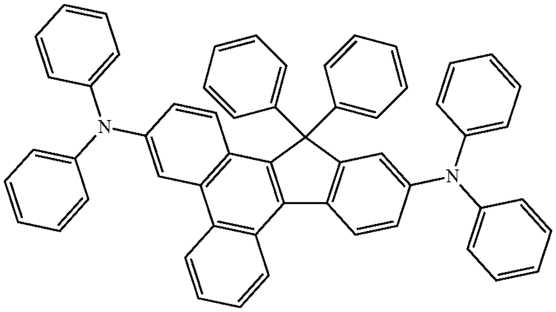
FD23
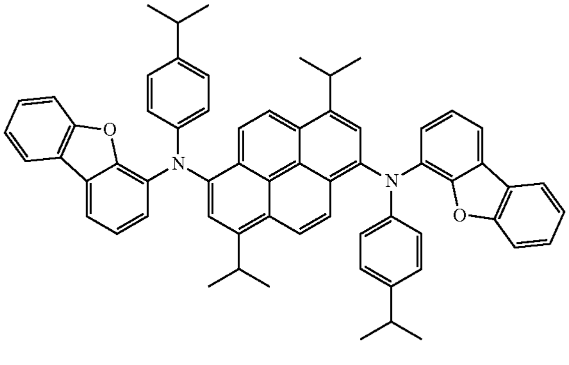
FD24
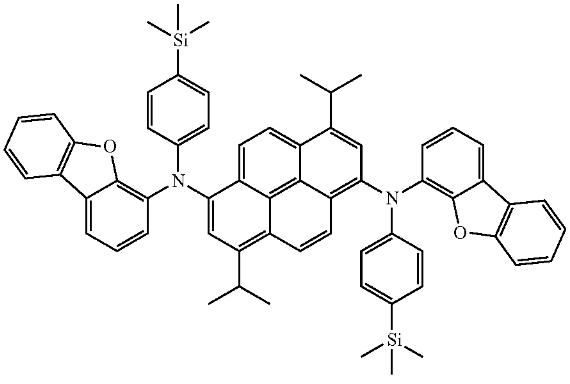

-continued
FD25
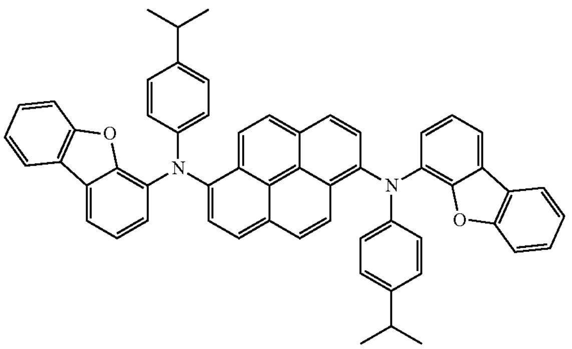
FD26
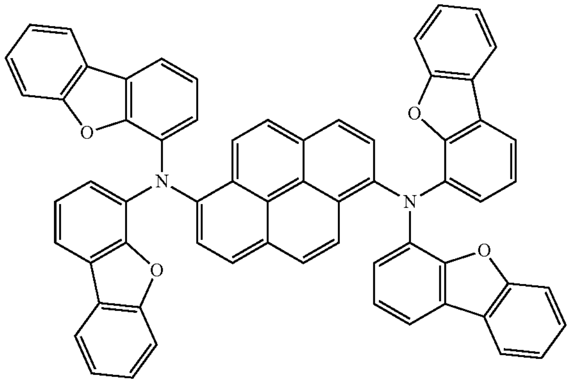
FD27
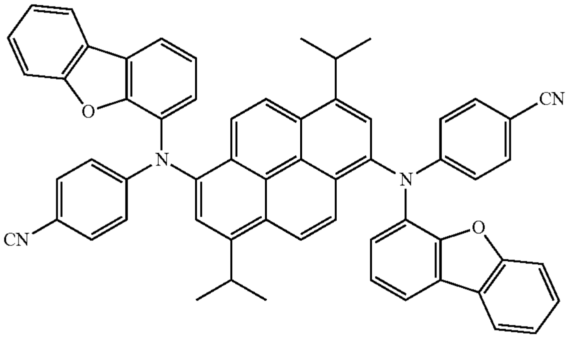
FD28
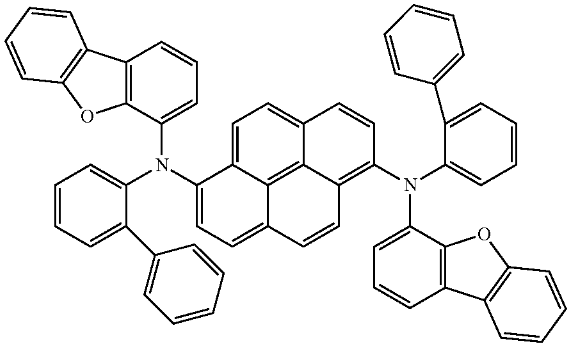
FD29
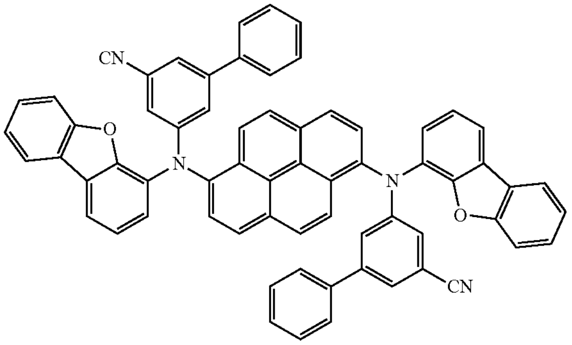
FD30
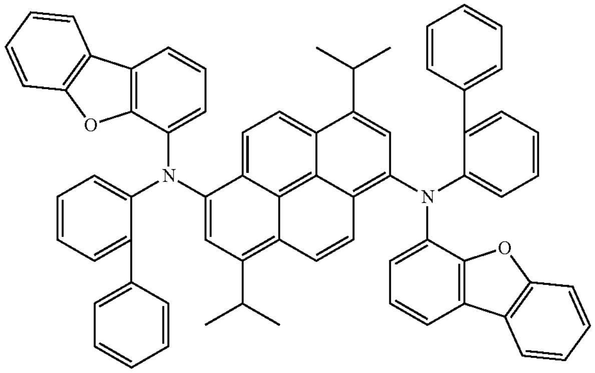
FD31
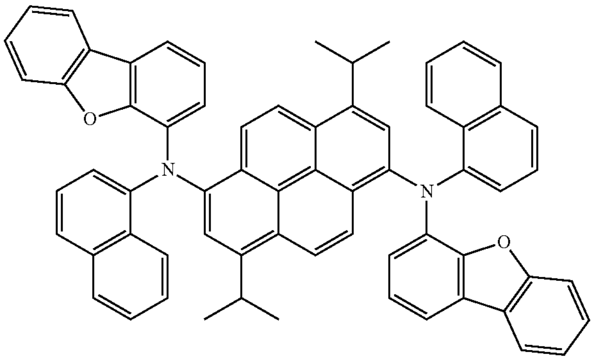
FD32
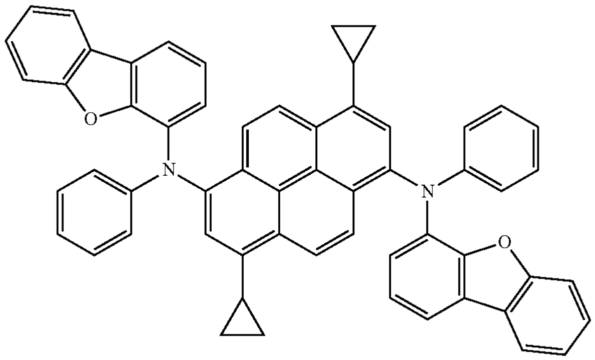

-continued

FD33

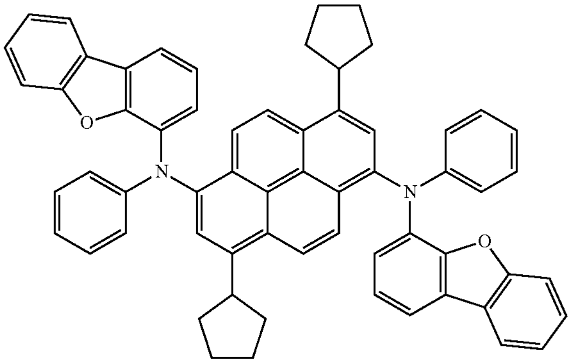

FD34

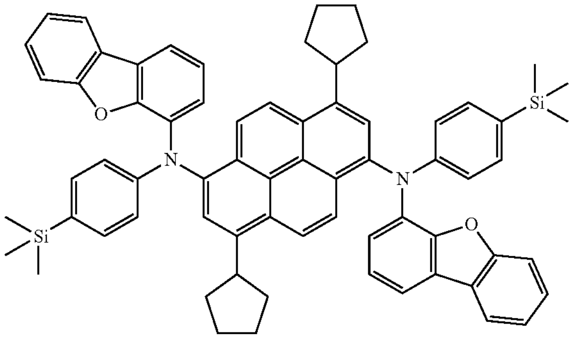

FD35

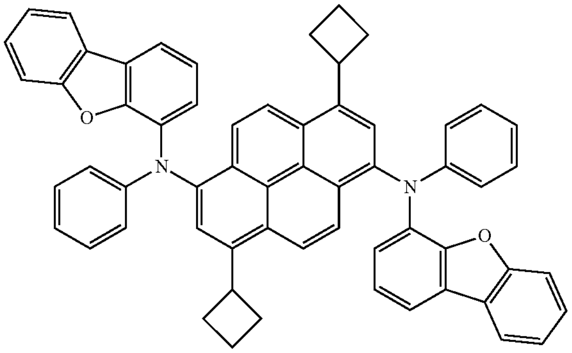

FD36

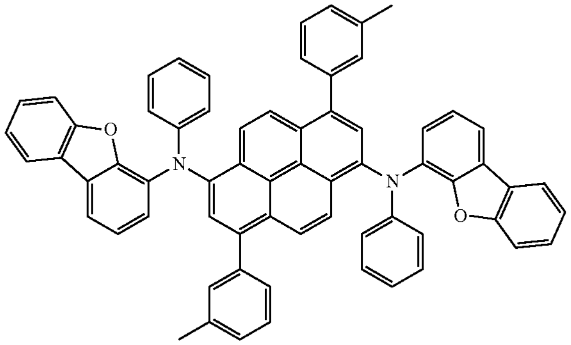

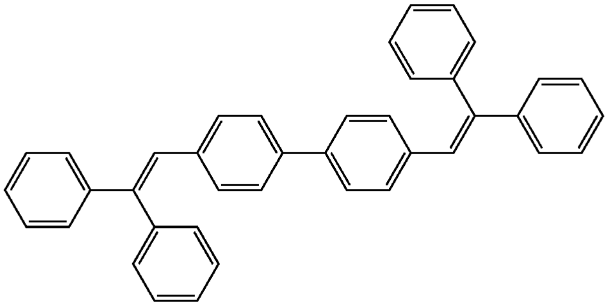

DPVBi

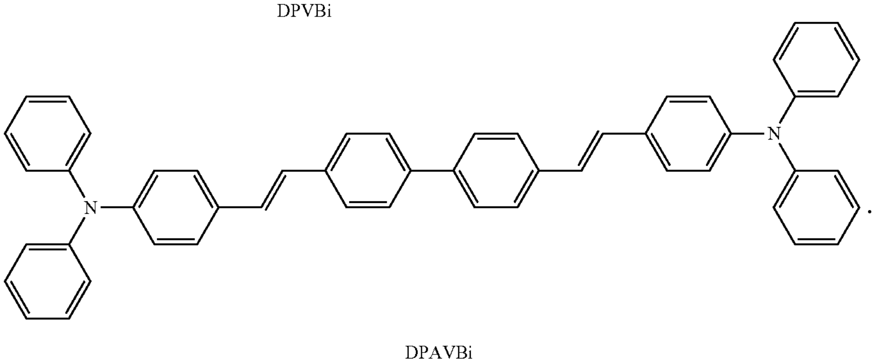

DPAVBi

Delayed Fluorescence Material

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type (or kind) of other materials included in the emission layer.

In an embodiment, the difference between the triplet energy level of the delayed fluorescence material and the singlet energy level of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed together while sharing boron (B).

Examples of the delayed fluorescence material may include at least one selected from the following compounds DF1 to DF9:

DF1(DMAC-DPS)

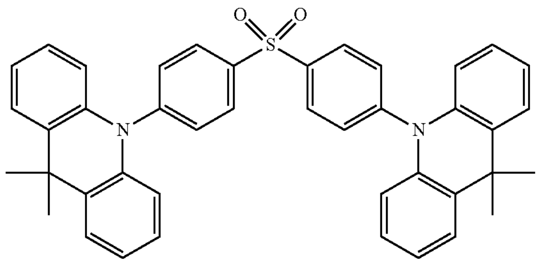

DF2(ACRFLCN)

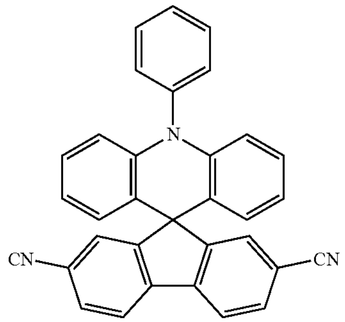

DF3(ACRSA)

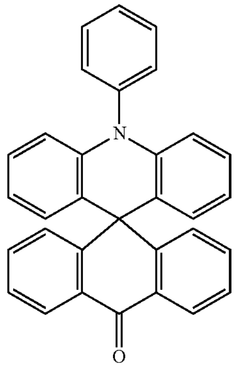

-continued

DF4(CC2TA)

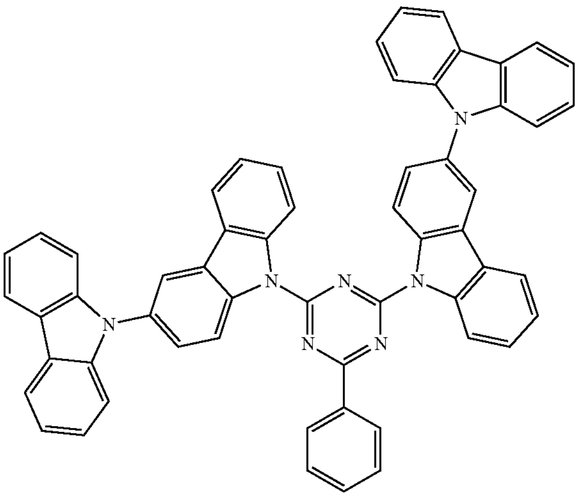

DF5(PIC-TRZ)

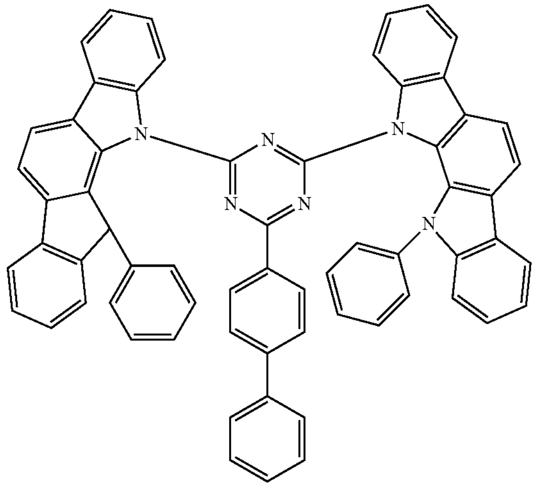

DF6(PIC-TRZ2)

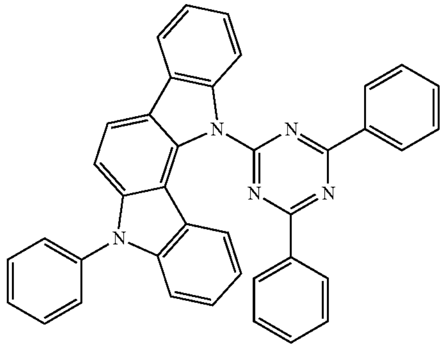

-continued

DF7(PXZ-TRZ)

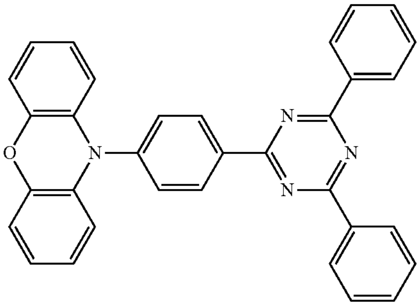

DF8(DABNA-1)

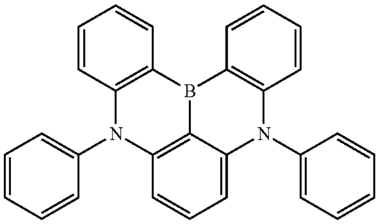

DF9(DABNA-2)

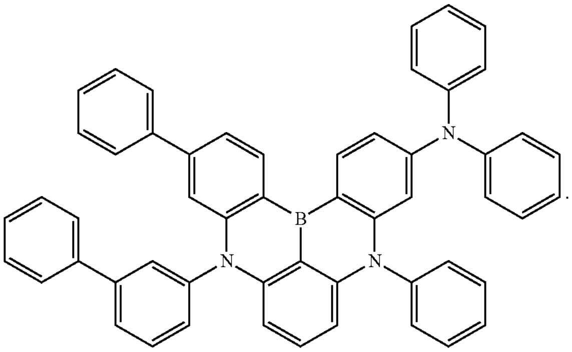

Quantum Dot

The emission layer may include a quantum dot.

The term "quantum dot" as used herein refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or any suitable process similar thereto.

The wet chemical process is a method including mixing a precursor material together with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs lower, and is easier than vapor deposition methods, such as metal organic chemical vapor deposition (MOCVD) or molecular beam epitaxy (MBE).

The quantum dot may include Group II-VI semiconductor compounds, Group III-V semiconductor compounds, Group III-VI semiconductor compounds, Group IIII-VI semiconductor compounds, Group IV-VI semiconductor compounds, a Group IV element or compound, or a combination thereof.

Examples of the Group II-VI semiconductor compound are a binary compound, such as CdS, CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or a combination thereof.

Examples of the Group III-V semiconductor compound are a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and/or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or a combination thereof. In one or more embodiments, the Group III-V semiconductor compound may further include a Group II element. Examples of the Group III-V semiconductor compound further including a Group II element are InZnP, InGaZnP, InAlZnP, etc.

Examples of the Group III-VI semiconductor compound are: a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; and a combination thereof.

Examples of the Group I-III-VI semiconductor compound are: a ternary compound, such as AgInS, $AgInS_2$, CuInS, $CuInS_2$, $CuGaO_2$, $AgGaO_2$, and/or $AgAlO_2$; or a combination thereof.

Examples of the Group IV-VI semiconductor compound are: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or a combination thereof.

The Group IV element or compound may include: a single element compound, such as Si and/or Ge; a binary compound, such as SiC and/or SiGe; or a combination thereof.

Each element included in a multi-element compound such as the binary compound, the ternary compound, and the quaternary compound may be present at a uniform concentration or non-uniform concentration in a particle.

In one or more embodiments, the quantum dot may have a single structure in which the concentration of each element in the quantum dot is uniform (e.g., substantially uniform), or a core-shell dual structure. For example, the material included in the core and the material included in the shell may be different from each other.

The shell of the quantum dot may act as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases along a direction toward the center of the core.

Examples of the shell of the quantum dot may be an oxide of metal, metalloid, and/or non-metal, a semiconductor compound, and a combination thereof. Examples of the oxide of metal, metalloid, and/or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO;

a ternary compound, such as $MgAl_2O_4$, $CoFe_2O_4$, $NiFe_2O_4$, and/or $CoMn_2O_4$; and a combination thereof. Examples of the semiconductor compound are, as described herein, a Group II-VI semiconductor compound; a Group III-V semiconductor compound; a Group III-VI semiconductor compound; a Group I-III-VI semiconductor compound; a Group 1V-VI semiconductor compound; and a combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

A full width at half maximum (FWHM) of the emission wavelength spectrum of the quantum dot may be about 45 nm or less, for example, about 40 nm or less, for example, about 30 nm or less, and within these ranges, color purity and/or color reproducibility may be increased. In addition, because the light emitted through the quantum dot is emitted in all (e.g., substantially all) directions, the wide viewing angle may be improved.

In addition, the quantum dot may be in the form of a spherical particle, a pyramidal particle, a multi-arm particle, a cubic nanoparticle, a nanotube particle, a nanowire particle, a nanofiber particle, and/or a nanoplate particle.

Because the energy band gap may be adjusted by controlling the size of the quantum dot, light having various suitable wavelength bands may be obtained from the quantum dot emission layer. Accordingly, by using quantum dots of different sizes, a light-emitting device that emits light of various suitable wavelengths may be implemented. In an embodiment, the size of the quantum dot may be selected to emit red, green and/or blue light. In addition, the size of the quantum dot may be configured to emit white light by combination of light of various suitable colors.

Figure 6:
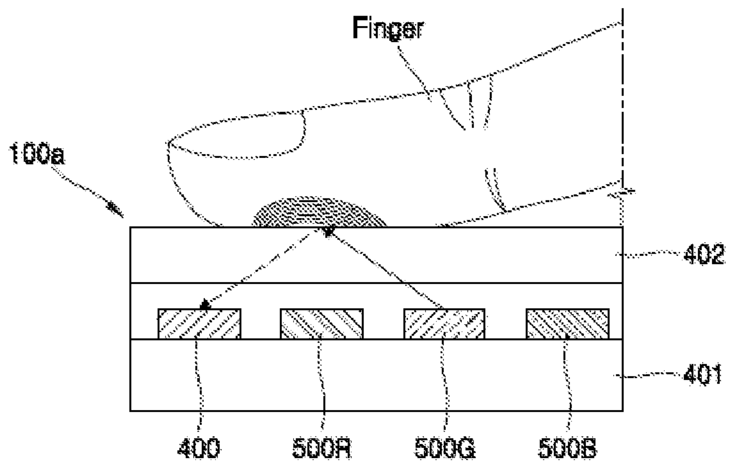
FIG. 6 is a view of an example of an electronic apparatus according to an embodiment.
Figure 7:
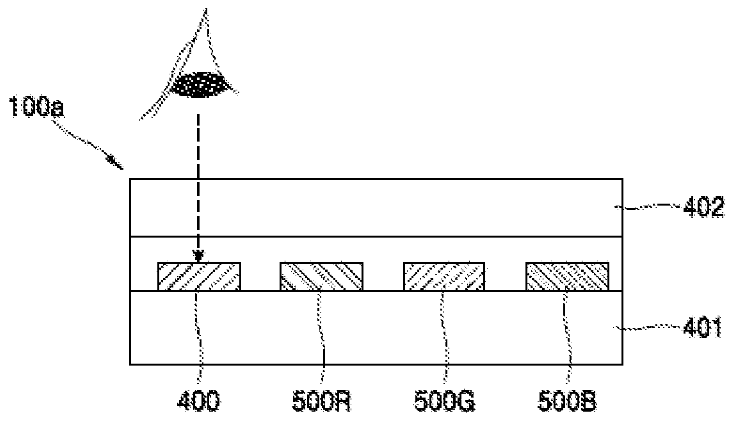
FIG. 7 is a view of an example of an electronic apparatus according to an embodiment.

Description of FIGS. 6-7

FIG. 6 is a view of an example of an electronic apparatus 100 according to an embodiment.

In the electronic apparatus 200 shown in FIG. 6, the organic photodiode 400 and the light-emitting devices 501, 502, and 503 may be arranged between the substrate 601 and the substrate 602.

For example, red light, green light, and blue light may be emitted from the light-emitting device 501, the light-emitting device 502, and the light-emitting device 503, respectively.

The electronic apparatus 200 according to an embodiment may have a function of detecting an object being in contact with the electronic apparatus 200, for example, a fingerprint of a finger. For example, as shown in FIG. 6, at least some light emitted from the light-emitting device 502 and reflected by a fingerprint of a finger may be incident on the organic photodiode 400, and thus, the organic photodiode 400 may detect the reflected light. A ridge in a fingerprint pattern of a finger may adhere to the substrate 602, and thus, the organic photodiode 400 may selectively obtain the fingerprint pattern of a user, for example, image information of the ridge. Although FIG. 6 shows an embodiment in which information of an object in contact with the electronic apparatus 200 is obtained by using light emitted from the light-emitting device 502, light emitted from the light-emitting device 501 and/or light emitted from the light-emitting device 503 may also be used in the same (or substantially the same) manner when obtaining information by using emitted light.

FIG. 7 is a view of an example of an electronic apparatus 200 according to an embodiment.

In an embodiment, as shown in FIG. 7, the electronic apparatus 200 according to an embodiment may detect an object that is not in contact with the electronic apparatus 200.

Manufacturing Method

The layers included in the hole transport region, the activation layer, and the layers included in the electron transport region may be formed in certain regions by using one or more suitable methods selected from vacuum deposition, spin coating, casting, Langmuir-Blodgett (LB) deposition, ink-jet printing, laser-printing, and laser-induced thermal imaging (LITI).

When the layers of the hole transport region, the activation layer, and the layers of the electron transport region are formed by vacuum deposition, deposition conditions may be selected from within a deposition temperature of about 100° C. to about 500° C., a vacuum degree of about $10^{-8}$ torr to about $10^{-3}$ torr, and a deposition rate of about 0.01 Å/sec to about 100 Å/sec, in consideration of the material and structure of a layer to be formed.

Definition of Terms

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed together with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "$T_1$ electron-deficient nitrogen-containing $C_1$-$C_{60}$ cyclic group" as used herein refers to a heterocyclic group that has one to sixty carbon atoms and includes *—N═*' as a ring-forming moiety.

For example, the $C_3$-$C_{60}$ carbocyclic group may be i) a group T1 or ii) a condensed cyclic group in which two or more groups $T_1$ are condensed together with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups $T_2$ are condensed together with each other, or iii) a condensed cyclic group in which at least one group T2 and at least one group T1 are condensed together with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups $T_1$ are condensed together with each other, iii) a group T3, iv) a condensed cyclic group in which two or more groups $T_3$ are condensed together with each other, or v) a condensed cyclic group in which at least one group T3 and at least one group T1 are condensed together with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4, ii) a condensed cyclic group in which two or more groups $T_4$ are condensed together with each other, iii) a condensed cyclic group in which at least one group T4 and at least one group T1 are condensed together with each other, iv) a condensed cyclic group in which at least one group T4 and at least one group T3 are condensed together with each other, or v) a condensed cyclic group in which at least one group $T_4$, at least one group T1, and at least one group T3 are condensed together with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, etc.) according to the structure of a formula for which the corresponding term is used. In an embodiment, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group, a propynyl group, and the like. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by $—OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and examples are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity (e.g., is not aromatic), and examples thereof are a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed together with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed together with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure (e.g., is not aromatic when considered as a whole). Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having substantially the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure (e.g., is not aromatic when considered as a whole). Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group described above.

The term "$C_6$-$C_{60}$ aryloxy group" as used herein indicates —$OA_{102}$ (wherein $A_{102}$ is a $C_6$-$C_{60}$ aryl group), and the term "$C_6$-$C_{60}$ arylthio group" as used herein indicates —$SA_{103}$ (wherein $A_{103}$ is a $C_6$-$C_{60}$ aryl group).

The term "$C_7$-$C_{60}$ arylalkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroarylalkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(O_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or $Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof; a $C_7$-$C_{60}$ arylalkyl group; or a $C_2$-$C_{60}$ heteroarylalkyl group.

The term "heteroatom" as used herein refers to any atom other than a carbon atom. Examples of the heteroatom are O, S, N, P, Si, B, Ge, Se, and a combinations thereof.

The term "third-row transition metal" used herein includes hafnium (Hf), tantalum (Ta), tungsten (W), rhenium (Re), osmium (Os), iridium (Ir), platinum (Pt), gold (Au), and/or the like.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, and the term "Ome" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, manufacture of electronic apparatuses according to embodiments of the disclosure and evaluation results thereof will be described with reference to examples.

EXAMPLE

Example 1

An ITO glass substrate (anode) was cut to a size of 50 mm×50 mm×0.5 mm, ultrasonically cleaned with isopropyl alcohol and pure water each for 10 minutes, and then cleaned by irradiation of ultraviolet rays and exposure to ozone for 10 minutes. Then, the ITO substrate was loaded into a vacuum deposition apparatus. HAT-CN was vacuum-deposited on the anode to form a hole injection layer of a thickness of 100 Å, and HT3 was vacuum-deposited on the hole injection layer to form a hole transport layer of a thickness of 1250 Å.

Compound HT38 was vacuum-deposited on the hole transport layer to form an auxiliary layer. Compound D1 was deposited on the auxiliary layer at a deposition rate of 2 Å/sec to form a donor layer having a thickness of 100 Å. A mixture of Compounds $A_1$ and $A_2$ (a weight ratio of 3:7) were deposited on the donor layer at a deposition rate of 4 Å/sec to form a first acceptor layer having a thickness of 50 Å, and Compound $A_1$ was deposited on the first acceptor layer at a deposition rate of 4 Å/sec to form a second acceptor layer having a thickness of 300 Å, thereby manufacturing a photoactive layer.

Next, BAlq was vacuum-deposited thereon to form a buffer layer having a thickness of 50 Å, and ET1 was vacuum-deposited on the buffer layer to form an electron transport layer having a thickness of 300 Å.

Liq of a thickness of 10 Å and MgAg of a thickness of 100 Å were sequentially deposited on the electron transport layer to form a cathode, thereby manufacturing an organic photodiode:

HAT-CN

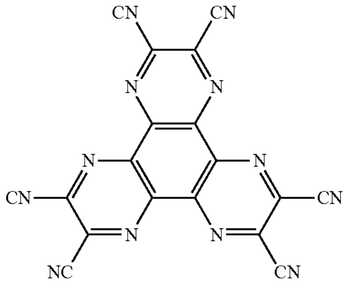

HT3

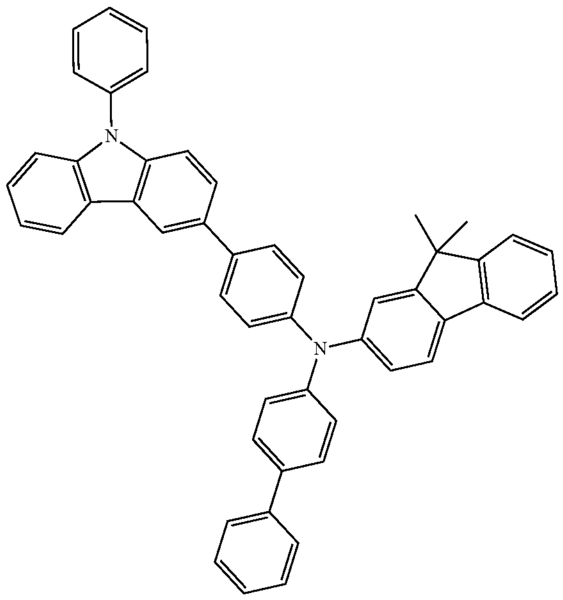

-continued

HT38

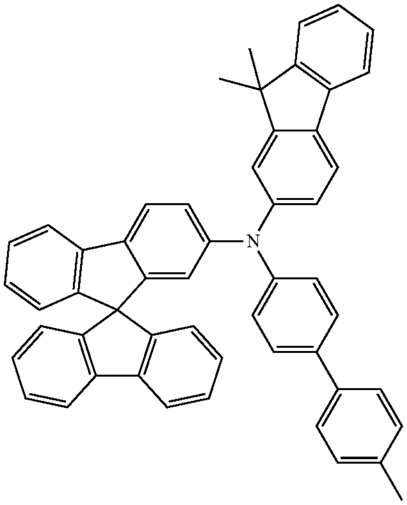

D1

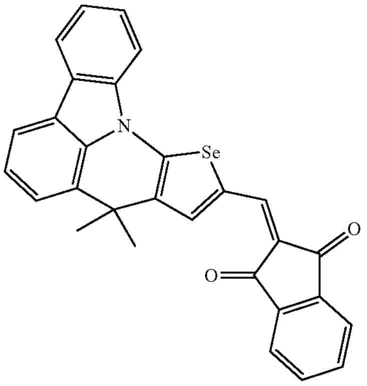

A1

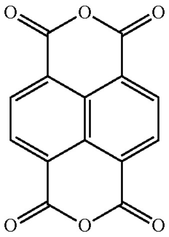

A2

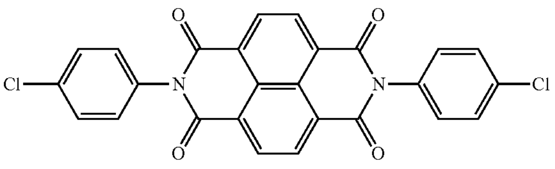

BAlq

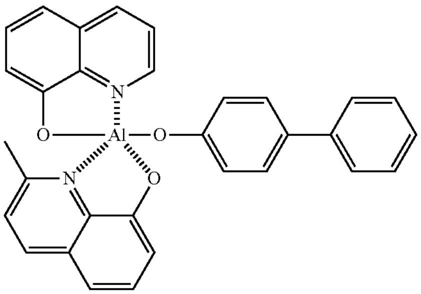

-continued

ET1

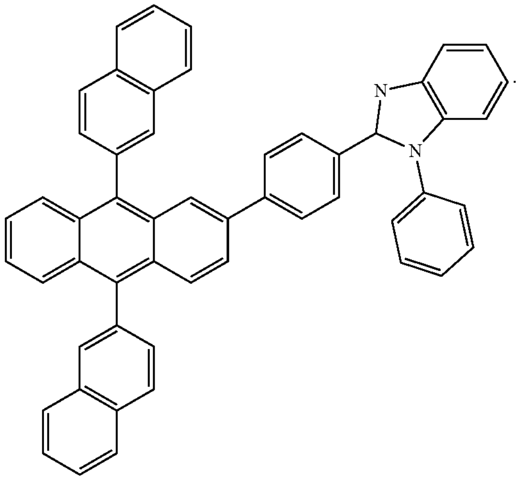

Examples 2 to 18

An organic photodiode was manufactured in substantially the same manner as in Example 1, except that the weight ratio of Compound $A_1$ to Compound $A_2$ of the first acceptor layer and the thickness of the first acceptor layer and the second acceptor layer were changed as shown in Table 1.

Example 19

An organic photodiode was manufactured in substantially the same manner as in Example 1, except that the first acceptor layer was formed to have a thickness of 100 Å and the second acceptor layer was not formed.

Example 20

An organic photodiode was manufactured in substantially the same manner as in Example 1, except that the first acceptor layer was formed with Compound $A_2$ to have a thickness of 50 Å and the second acceptor layer was formed with a mixture of Compounds $A_1$ and $A_2$ (a weight ratio of 5:5).

Comparative Examples 1 to 15

An organic photodiode was manufactured in substantially the same manner as in Example 1, except that the weight ratio of Compound $A_1$ to Compound $A_2$ of the first acceptor layer and the thickness of the first acceptor layer and the second acceptor layer were changed as shown in Table 1.

Comparative Example 16

An organic photodiode was manufactured in substantially the same manner as in Example 1, except that the first acceptor layer was not formed, and the second acceptor layer was formed to have a thickness of 350 Å with Compound $A_1$.

Evaluation Example

For the organic photodiodes manufactured according to Examples 1 to 21 and Comparative Examples 1 to 16, light (530 nm) was irradiated using an EQE measurement system (K3100EQX, McScience, Korea), and a current generated by the light irradiation was measured by using a current meter (Keithley, Tektronix, U.S.A.) and EQE values calculated from the measured values are shown in Tables 1 and 2.

TABLE 1

| Example | Composition and weight ratio of first acceptor layer | Thickness (Å) of first acceptor layer | Thickness (Å) of second acceptor layer (A1) | EQE@530 nm (%) |
|---|---|---|---|---|
| Example 1 | A1:A2 = 3:7 | 30 Å | 320 Å | 33.1 |
| Example 2 | A1:A2 = 3:7 | 50 Å | 300 Å | 43.1 |
| Example 3 | A1:A2 = 3:7 | 100 Å | 250 Å | 44.6 |
| Example 4 | A1:A2 = 4:6 | 30 Å | 320 Å | 34.4 |
| Example 5 | A1:A2 = 4:6 | 50 Å | 300 Å | 44.5 |
| Example 6 | A1:A2 = 4:6 | 100 Å | 250 Å | 46.8 |
| Example 7 | A1:A2 = 5:5 | 30 Å | 320 Å | 36.8 |
| Example 8 | A1:A2 = 5:5 | 50 Å | 300 Å | 44.3 |
| Example 9 | A1:A2 = 5:5 | 100 Å | 250 Å | 45.6 |
| Example 10 | A1:A2 = 6:4 | 30 Å | 320 Å | 34.8 |
| Example 11 | A1:A2 = 6:4 | 50 Å | 300 Å | 42.5 |
| Example 12 | A1:A2 = 6:4 | 100 Å | 250 Å | 43.2 |
| Example 13 | A1:A2 = 7:3 | 30 Å | 320 Å | 33.9 |
| Example 14 | A1:A2 = 7:3 | 50 Å | 300 Å | 39.4 |
| Example 15 | A1:A2 = 7:3 | 100 Å | 250 Å | 41.6 |
| Example 16 | A1:A2 = 8:2 | 30 Å | 320 Å | 25.8 |
| Example 17 | A1:A2 = 8:2 | 50 Å | 300 Å | 33.5 |
| Example 18 | A1:A2 = 8:2 | 100 Å | 250 Å | 37.3 |
| Comparative Example 1 | A1:A2 = 2:8 | 30 Å | 320 Å | 10.7 |
| Comparative Example 2 | A1:A2 = 2:8 | 50 Å | 300 Å | 14.7 |
| Comparative Example 3 | A1:A2 = 2:8 | 100 Å | 250 Å | 16.5 |
| Comparative Example 4 | A1:A2 = 3:7 | 5 Å | 345 Å | 8.1 |
| Comparative Example 5 | A1:A2 = 3:7 | 10 Å | 340 Å | 9.3 |
| Comparative Example 6 | A1:A2 = 4:6 | 5 Å | 345 Å | 8.1 |
| Comparative Example 7 | A1:A2 = 4:6 | 10 Å | 340 Å | 9.3 |
| Comparative Example 8 | A1:A2 = 5:5 | 5 Å | 345 Å | 8.1 |
| Comparative Example 9 | A1:A2 = 5:5 | 10 Å | 340 Å | 9.4 |
| Comparative Example 10 | A1:A2 = 6:4 | 5 Å | 345 Å | 8.2 |
| Comparative Example 11 | A1:A2 = 6:4 | 10 Å | 340 Å | 9.4 |
| Comparative Example 12 | A1:A2 = 7:3 | 5 Å | 345 Å | 8.2 |
| Comparative Example 13 | A1:A2 = 7:3 | 10 Å | 340 Å | 9.6 |
| Comparative Example 14 | A1:A2 = 8:2 | 5 Å | 345 Å | 8.2 |
| Comparative Example 15 | A1:A2 = 8:2 | 10 Å | 340 Å | 9.5 |

TABLE 2

| Example | First acceptor layer | Second acceptor layer | EQE@530 nm (%) |
|---|---|---|---|
| Example 19 | A1:A2 = 3:7 (350 Å) | — | 40.2 |
| Example 20 | A2 (50 Å) | A1:A2 = 5:5 (300 Å) | 35.5 |
| Comparative Example 16 | — | A1 (350 Å) | 7.8 |

Referring to Tables 1 and 2, it can be seen that the external quantum efficiency of the organic photodiode of Examples 1 to 20 is significantly excellent as compared to the external quantum efficiency of the organic photodiode of Comparative Examples 1 to 16.

According to one or more embodiments, a photoactive layer of an organic photodiode may include (or consist of) a planar layer of a donor layer and an acceptor layer, a certain donor layer material and an acceptor layer material may be used, and a mixed layer may be included as an acceptor layer to improve crystallinity of the acceptor layer, thereby concurrently (or simultaneously) improving EQE efficiency and processing efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic photodiode comprising:

a first electrode;

a common electrode facing the first electrode; and a photoactive layer located between the first electrode and the common electrode, wherein:

the photoactive layer comprises a donor layer and an acceptor layer, the donor layer comprises a donor compound represented by Formula 110, the acceptor layer comprises a first acceptor layer comprising a first acceptor compound and a second acceptor compound, each independently represented by Formula 120, and the first acceptor compound and the second acceptor compound are different from each other:

Formula 110

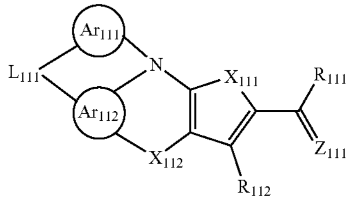

Formula 120

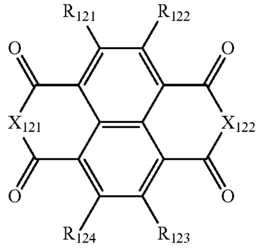

wherein, in Formula 110, $Ar_{111}$ and $Ar_{112}$ are each independently a $C_6$-$C_{30}$ arylene group unsubstituted or substituted with at least one $R_{10a}$ or a $C_3$-$C_{30}$ heteroarylene group unsubstituted or substituted with at least one $R_{10a}$, $X_{111}$ is selected from —Se—, —Te—, —S(=O)—, —S(=O)$_2$—, —N($Q_{111}$)-, —B($Q_{111}$)-, —C($Q_{111}$)($Q_{112}$)-, —Si($Q_{111}$)($Q_{112}$)-, and —Ge($Q_{111}$)($Q_{112}$)-, $X_{112}$ and $L_{111}$ are each independently selected from a single bond, —O—, —S—, —Se—, —Te—, —S(=O)—, —S(=O)$_2$—, —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)=C($Q_{112}$))—, and —(C($Q_{111}$)=N))—, when $L_{111}$ is selected from a single bond, —N($Q_{111}$)-, —B($Q_{111}$)-, —C($Q_{111}$)($Q_{112}$)-, —Si($Q_{111}$)($Q_{112}$)-, —Ge($Q_{111}$)($Q_{112}$)-, —(C($Q_{111}$)=C($Q_{112}$))—, and —(C($Q_{111}$)=N))—, $L_{111}$ is optionally linked to $Ar_{111}$ or $Ar_{112}$ to form a condensed ring, $Z_{111}$ is a $C_6$-$C_{30}$ carbocyclic group comprising at least one functional group selected from C=O, C=S, C=Se, and C=Te and unsubstituted or substituted with at least one $R_{10a}$, or a $C_1$-$C_{30}$ heterocyclic group comprising at least one functional group selected from C=O, C=S, C=Se, and C=Te and unsubstituted or substituted with at least one $R_{10a}$, and $R_{111}$ to $R_{112}$ are each independently hydrogen, deuterium, halogen, a cyano group, a nitro group, a hydroxy group, a $C_1$-$C_{30}$ alkyl group unsubstituted or substituted with at least one $R_{10a}$, a $C_1$-$C_{30}$ alkoxy group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10a}$, a $C_2$-$C_{30}$ acyl group unsubstituted or substituted with at least one $R_{10a}$, or a combination thereof, wherein, in Formula 120, $X_{121}$ and $X_{122}$ are each independently O or $NR_{125}$, and $R_{121}$ to $R_{124}$ and $R_{125}$ are each independently hydrogen, deuterium, halogen, a cyano group, a nitro group, a hydroxy group, a $C_1$-$C_{30}$ alkyl group unsubstituted or substituted with at least one $R_{10a}$, a $C_6$-$C_{30}$ aryl group unsubstituted or substituted with at least one $R_{10a}$, a $C_3$-$C_{30}$ heteroaryl group unsubstituted or substituted with at least one $R_{10}$, or a combination thereof, wherein, in Formulae 110 and 120, $R_{10a}$ is:

deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, $Q_{31}$ to $Q_{33}$, and $Q_{41}$ to $Q_{43}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$) heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The organic photodiode of claim 1, wherein $Z_{111}$ of Formula 110 is a group represented by one selected from Formulae 111A to 111F:

111A

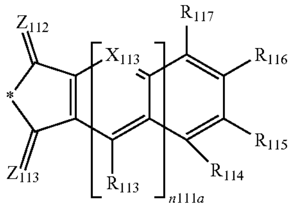

111B

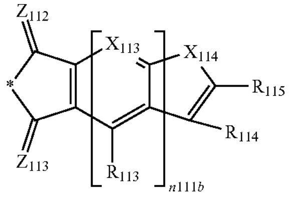

111C

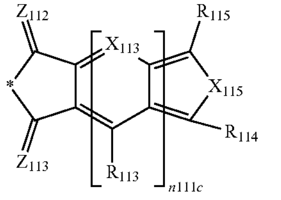

111D

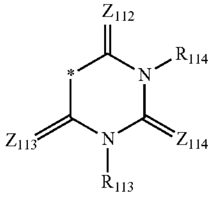

111E

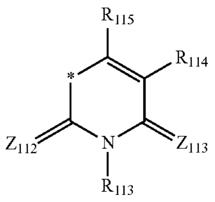

111F

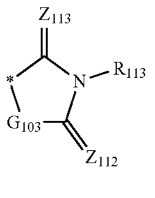

wherein, in Formulae 111A to 111F, $Z_{112}$ to $Z_{114}$ are each independently O, S, Se, or Te, $X_{113}$ is N or $C(Q_{113})$, $X_{114}$ and $X_{115}$ are each independently O, S, Se, Te, $Si(Q_{111})(Q_{112})$, or $Ge(Q_{111})(Q_{112})$, $n_{111}$ to $n_{111c}$ are each independently an integer from 0 to 3, $R_{113}$ to $R_{117}$ are each independently as described for $R_{121}$ in claim 1, and $Q_{111}$ to $Q_{113}$ are each independently as described for $Q_{111}$ in claim 1.

3. The organic photodiode of claim 1, wherein a compound represented by Formula 110 is selected from compounds of Groups 1 to 4:

Group 1

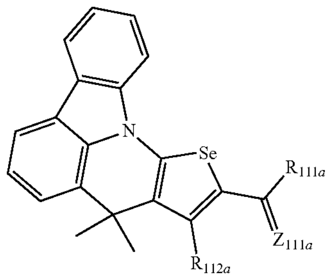

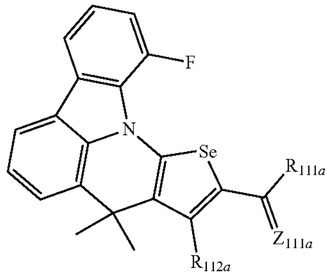

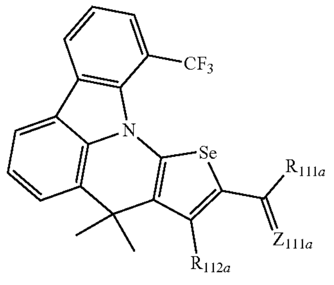

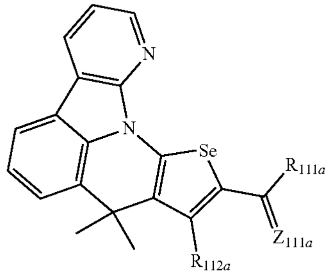

-continued
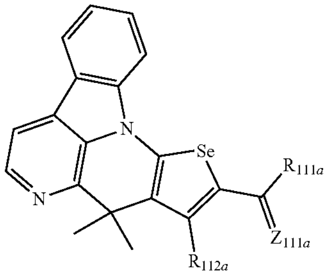
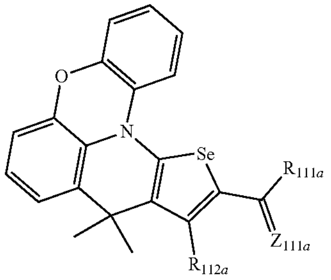
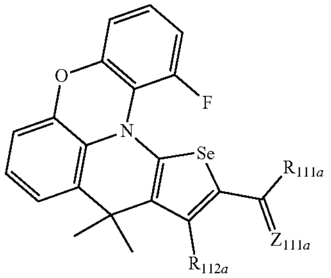
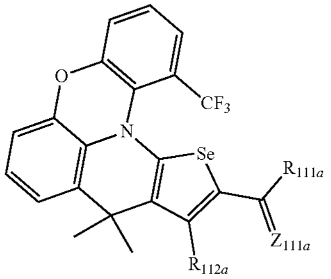
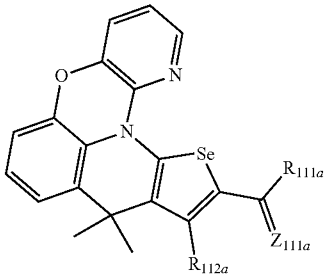
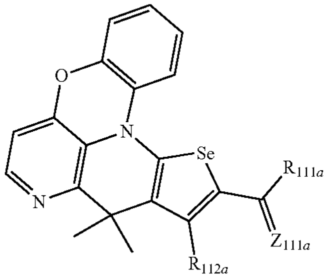
-continued
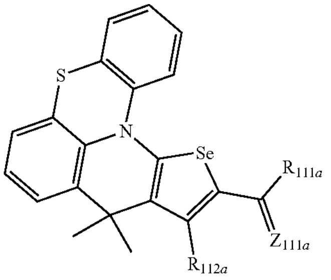
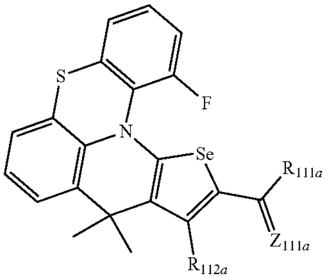
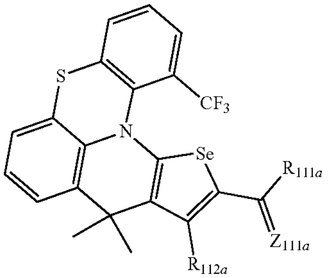
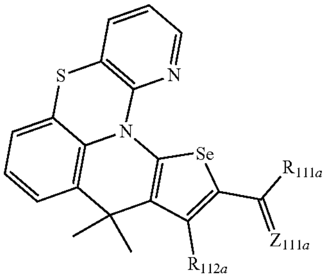
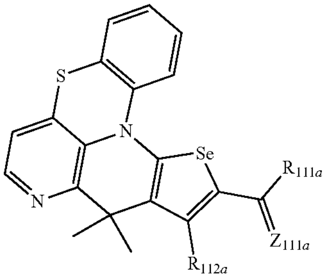
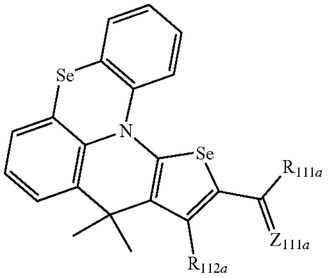

-continued
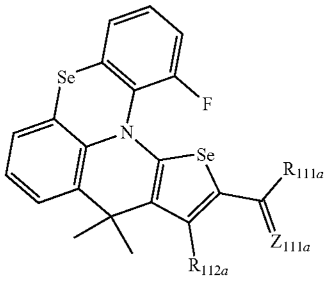
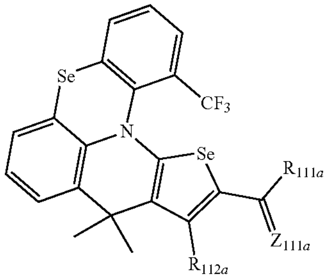
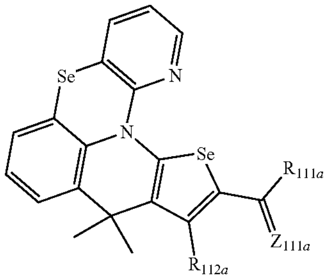
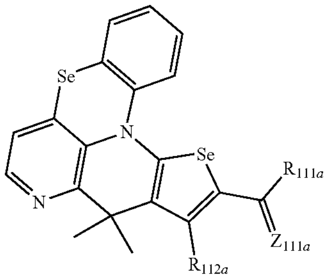
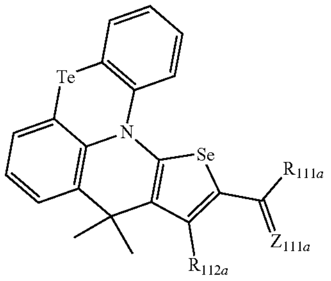
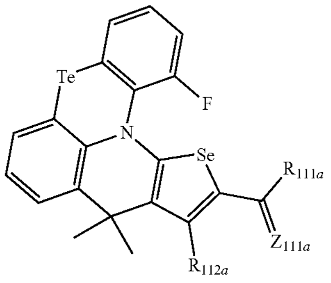
-continued
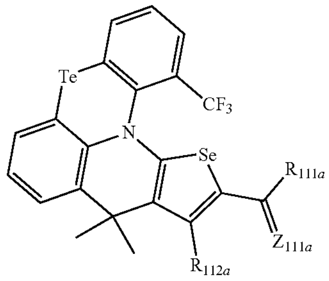
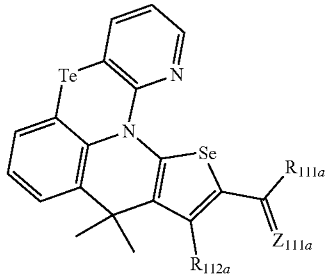
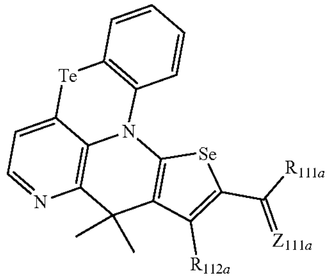
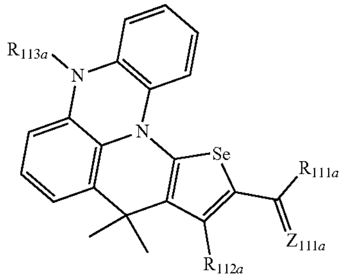
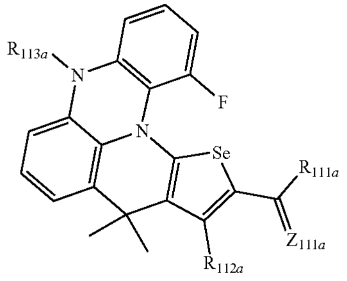
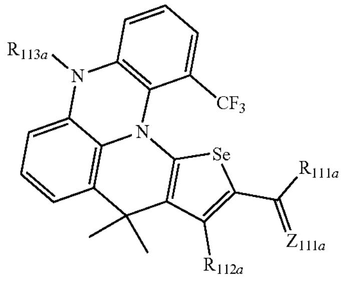

-continued
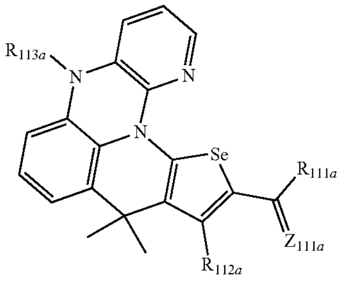
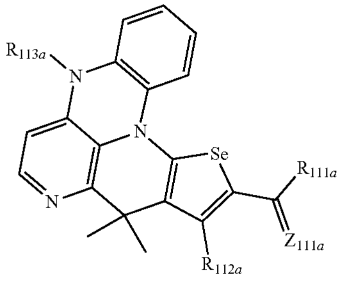
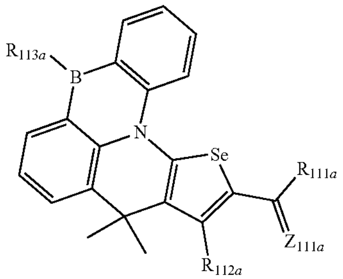
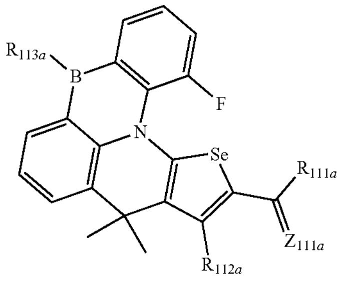
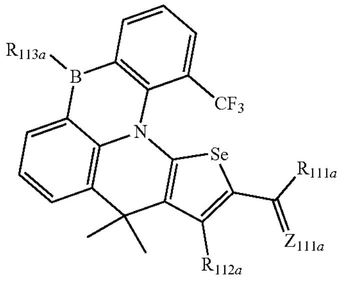
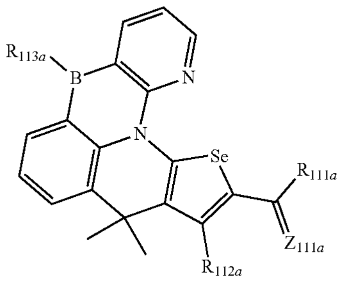
-continued
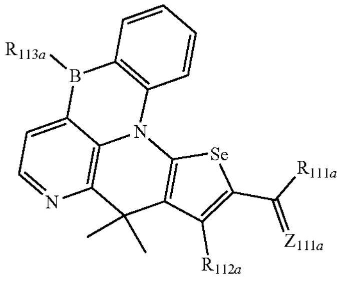
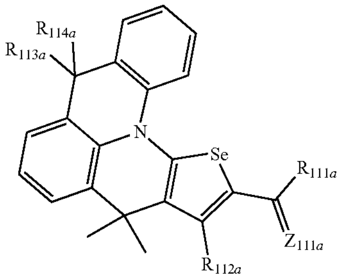
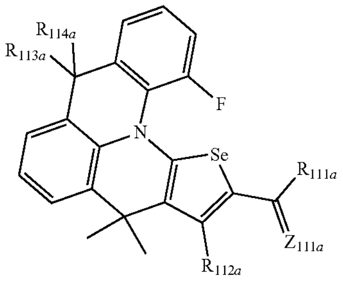
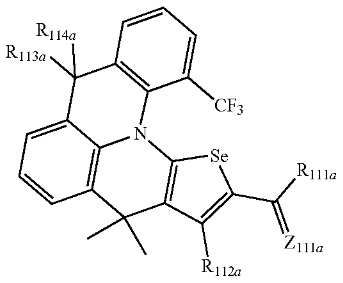
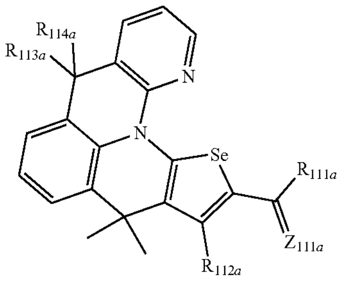
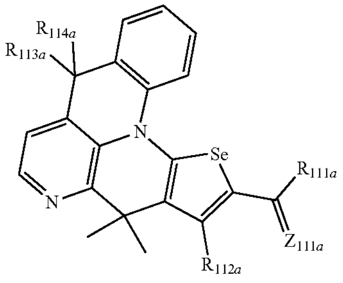

-continued
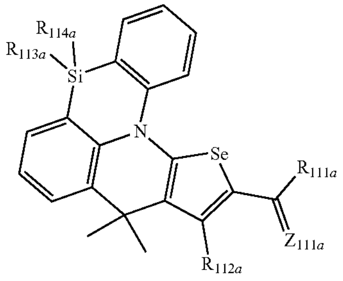
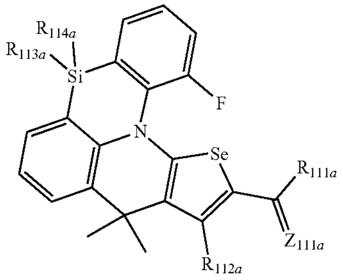
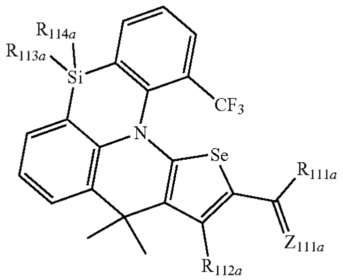
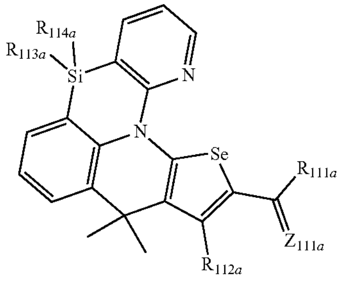
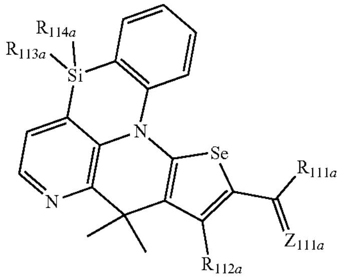
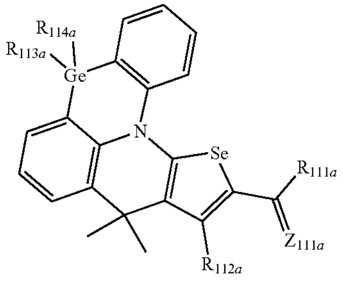
-continued
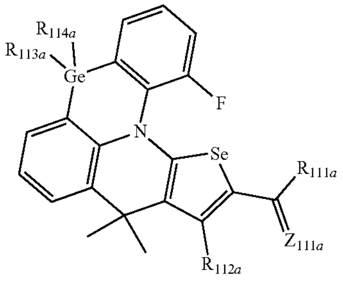
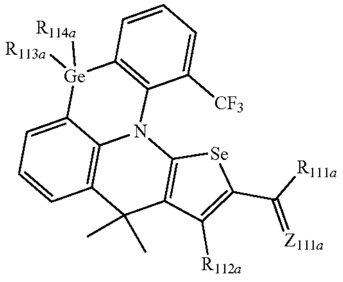
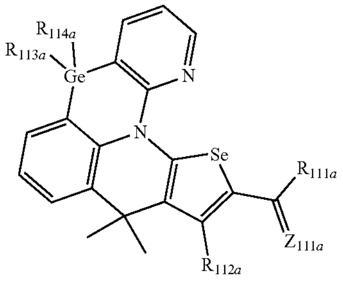
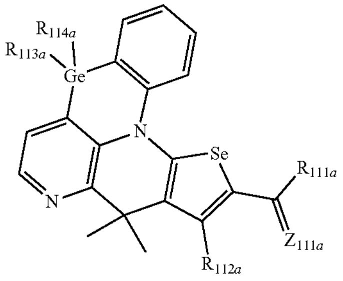
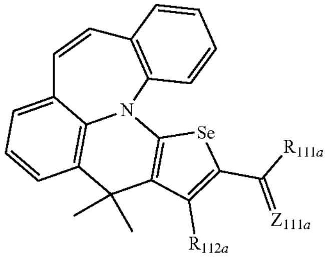
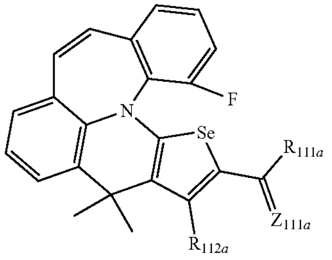

-continued
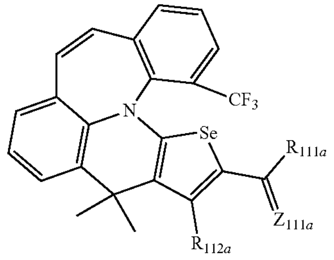
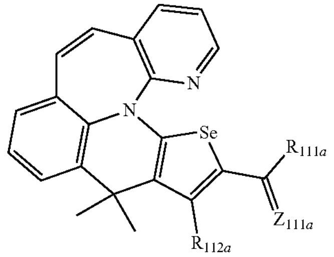
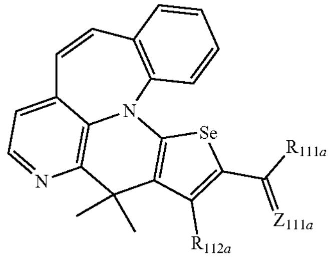
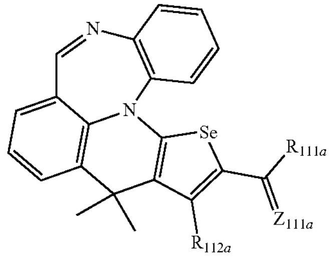
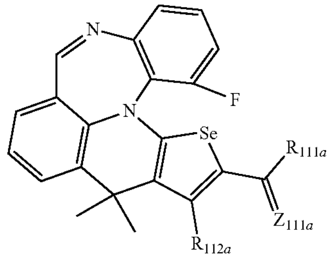
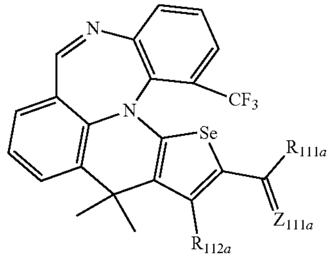
-continued
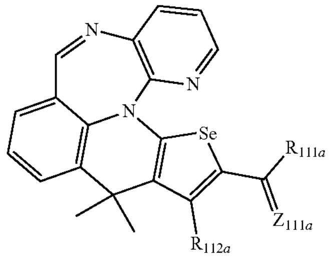
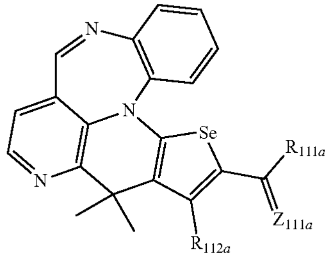
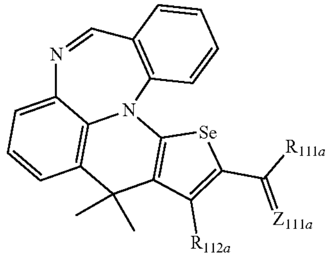
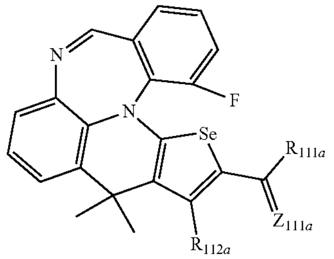
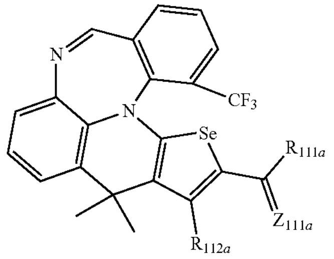
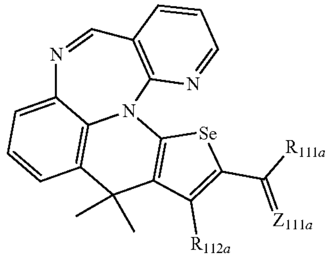

-continued
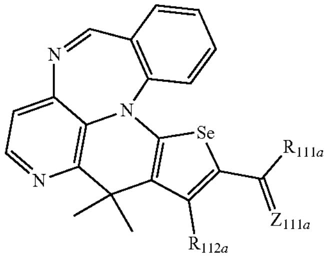
Group 2
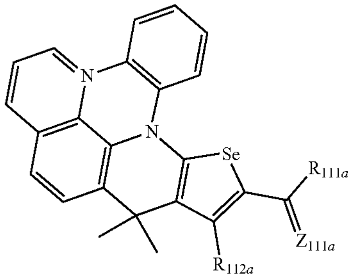
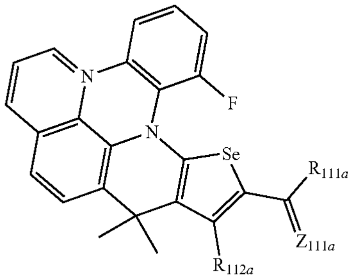
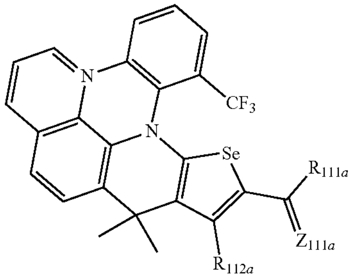
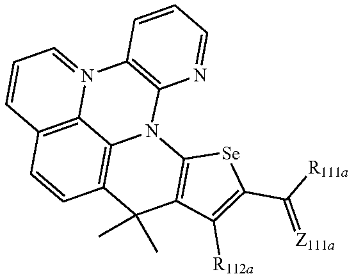
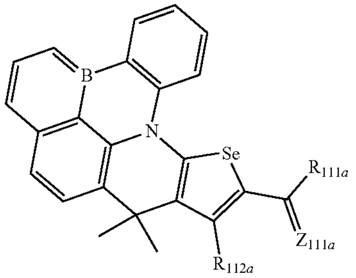
-continued
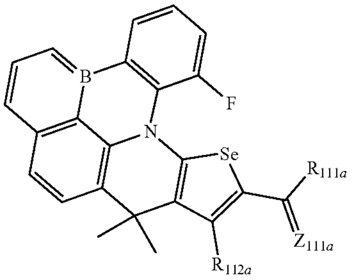
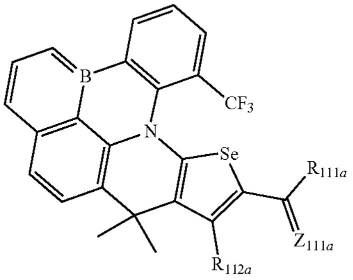
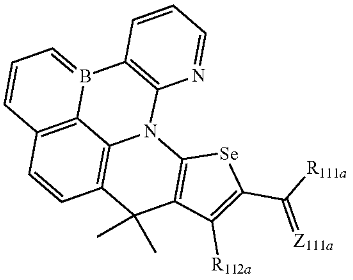
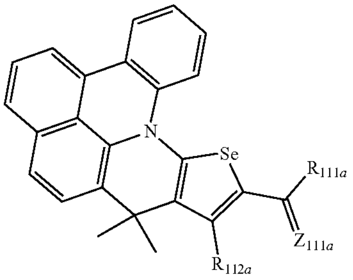
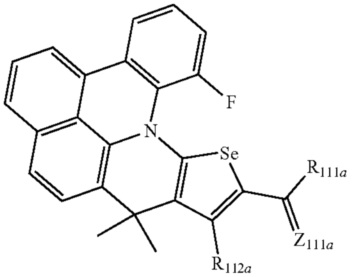
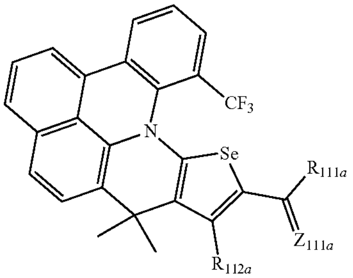

-continued
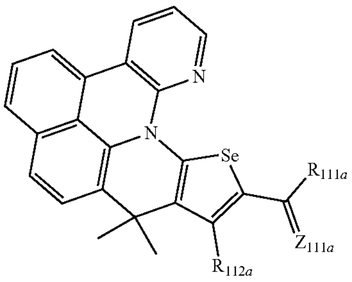
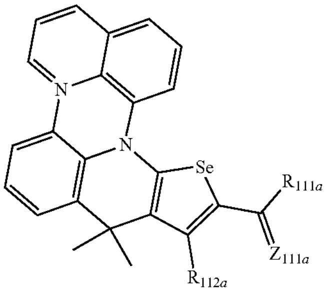
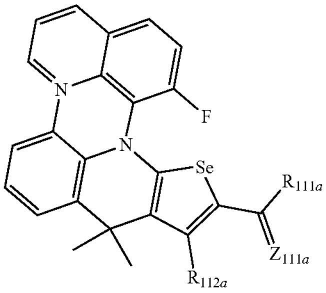
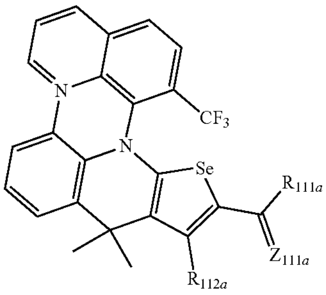
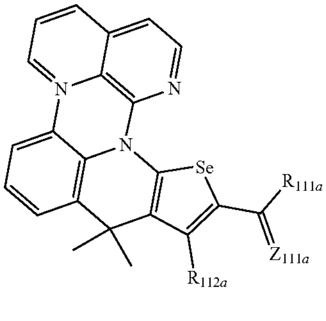
-continued
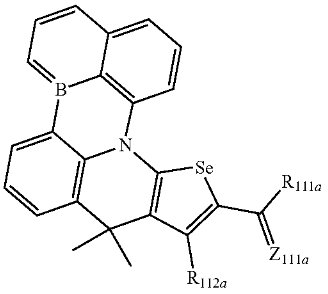
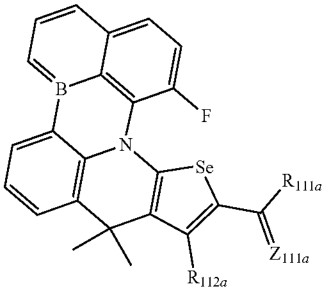
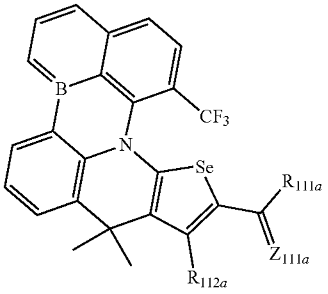
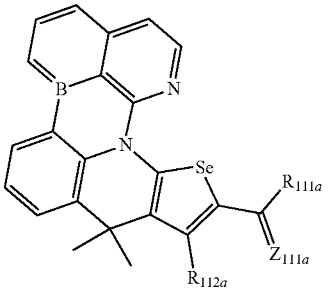
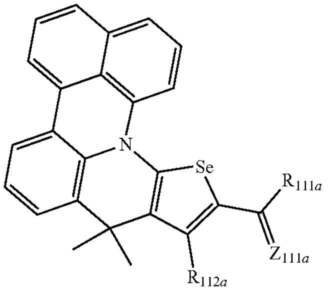

-continued
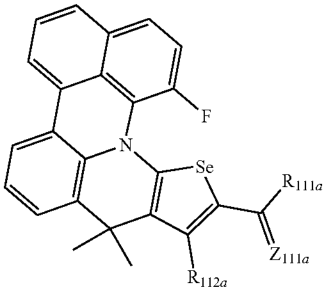
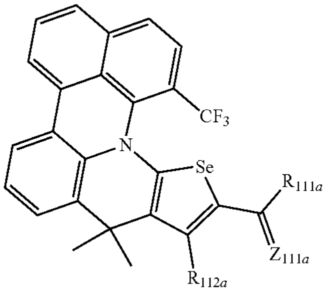
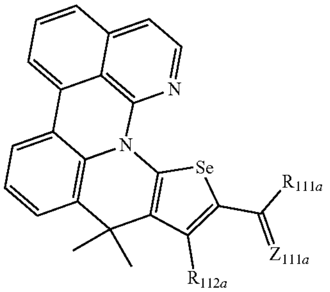
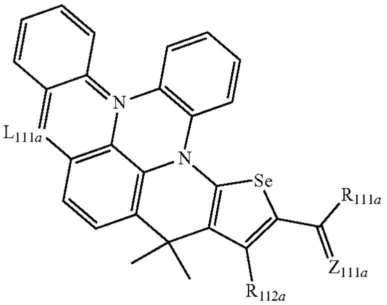
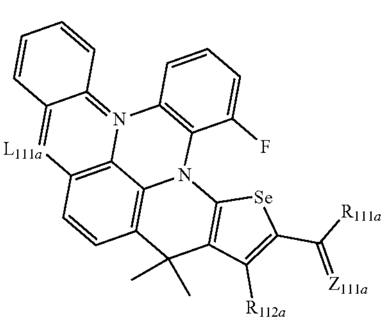
-continued
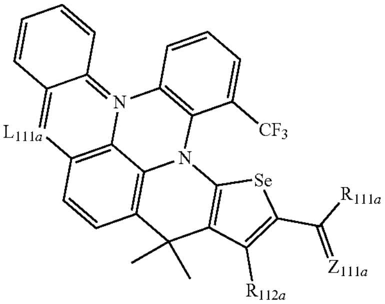
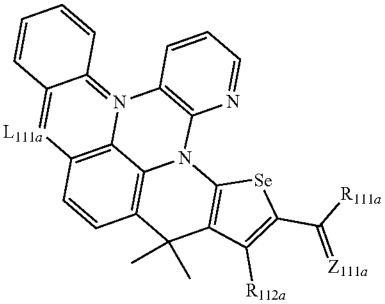
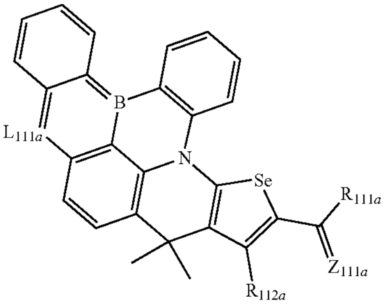
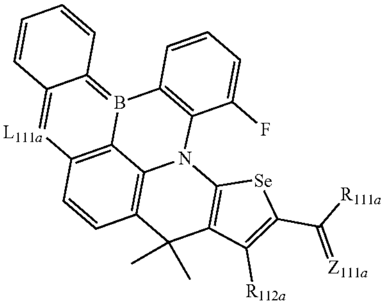
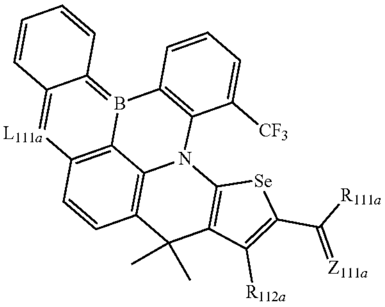

-continued
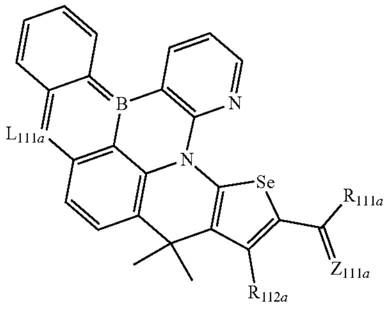
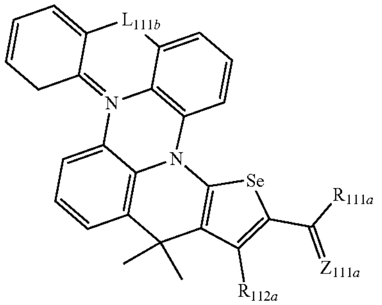
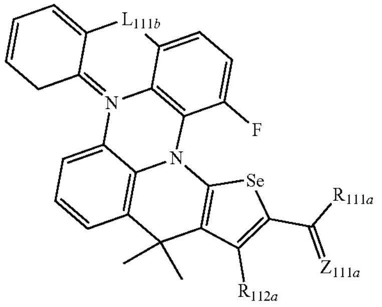
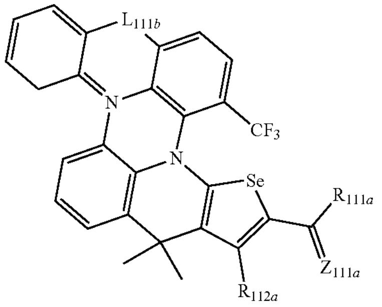
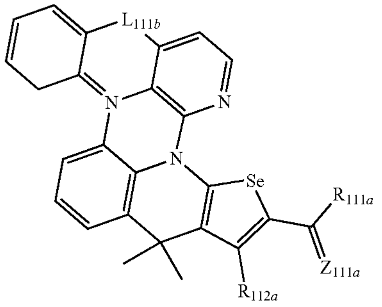
-continued
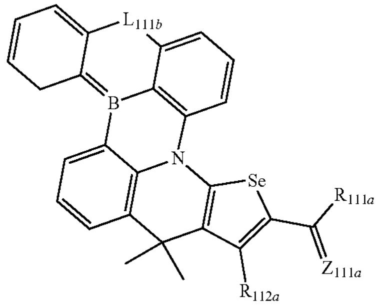
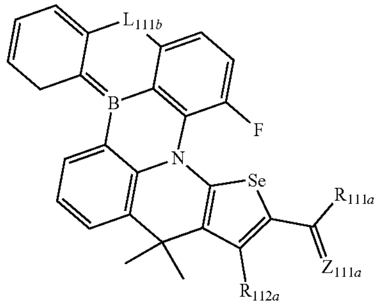
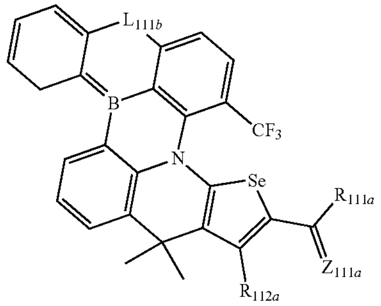
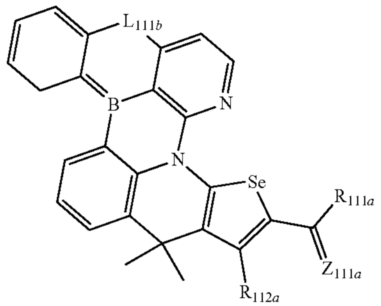
Group 3
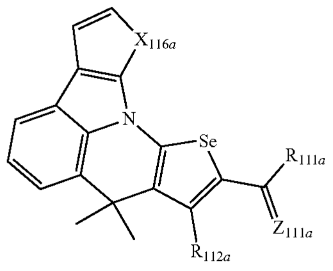

-continued
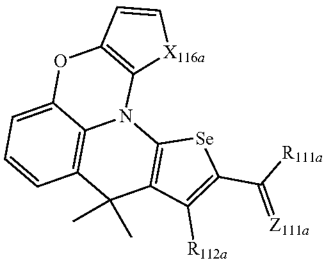
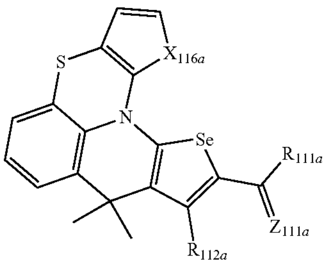
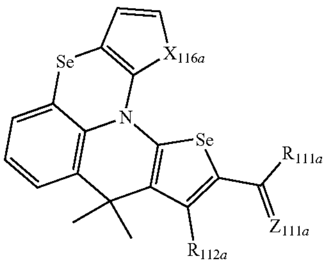
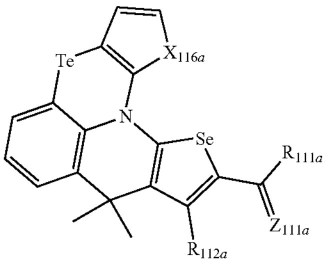
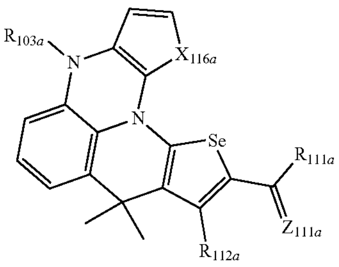
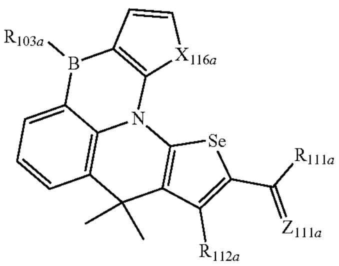
-continued
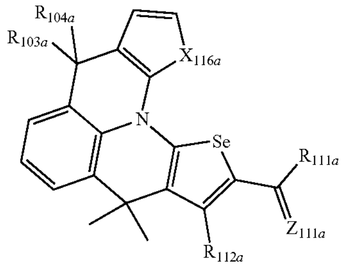
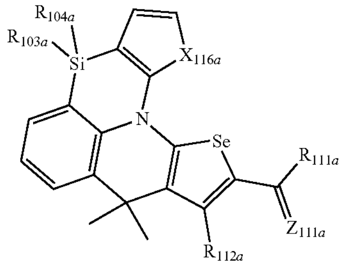
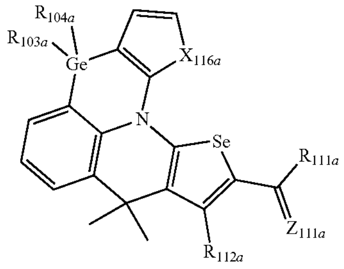
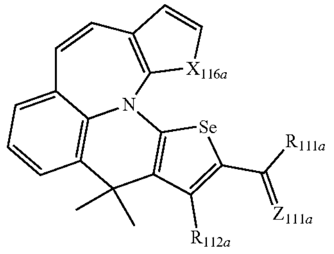
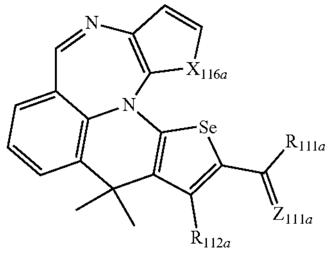
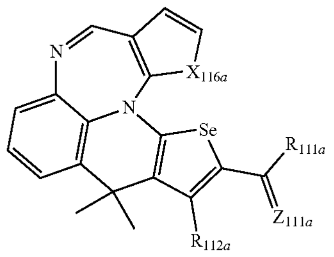

-continued
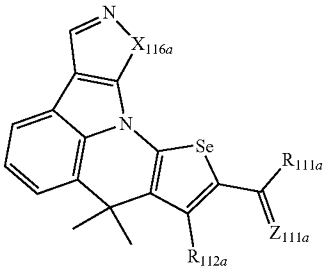
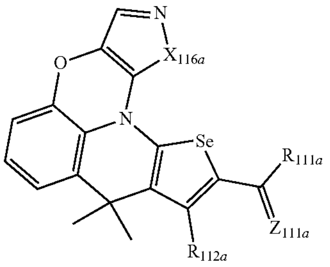
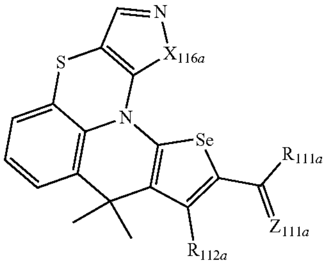
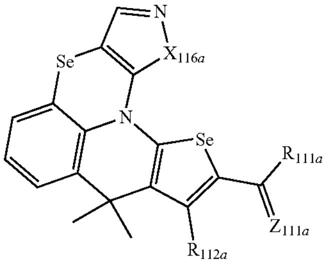
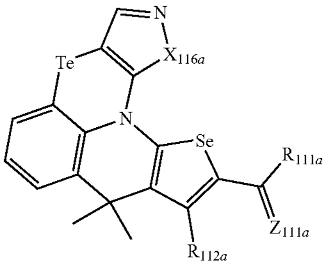
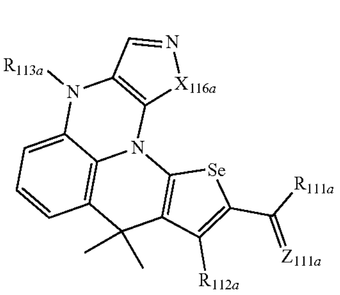
-continued
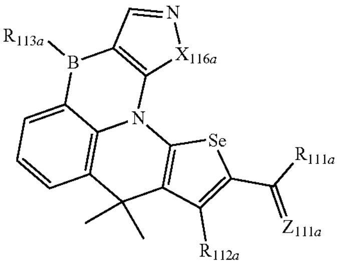
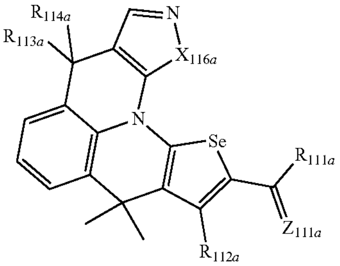
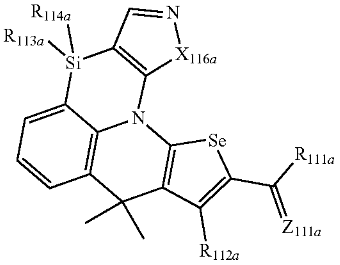
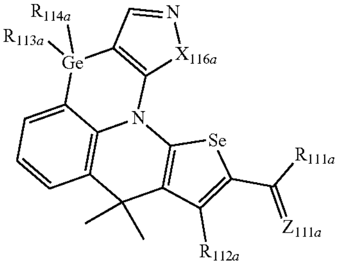
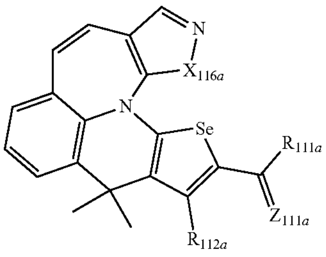
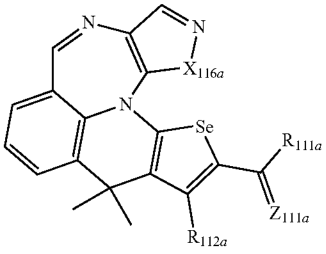

-continued
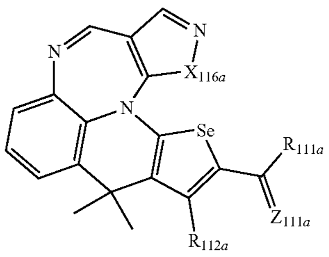
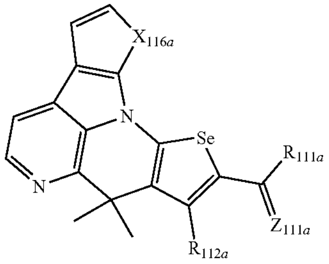
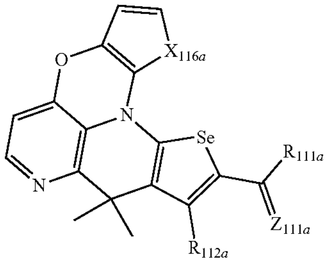
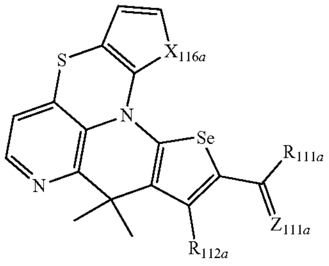
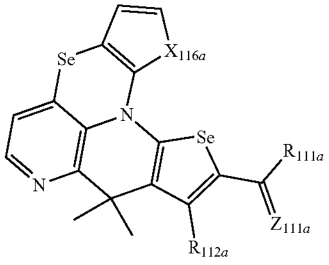
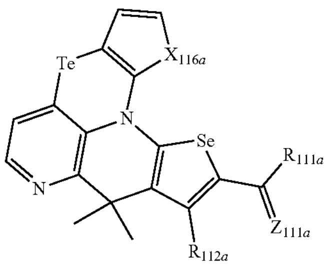
-continued
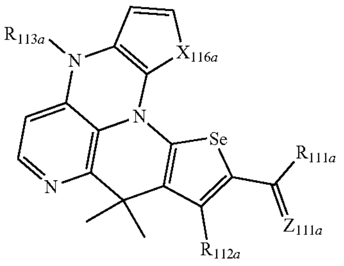
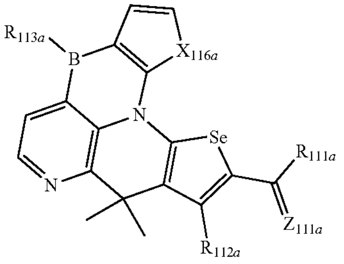
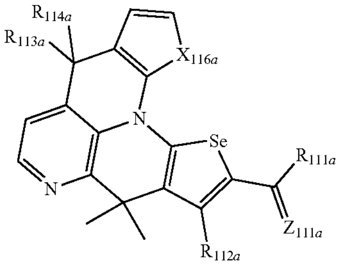
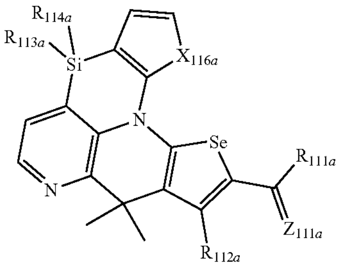
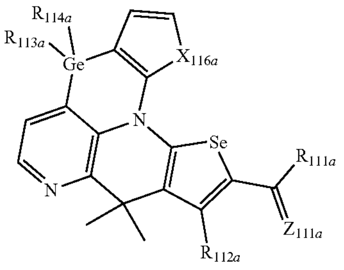
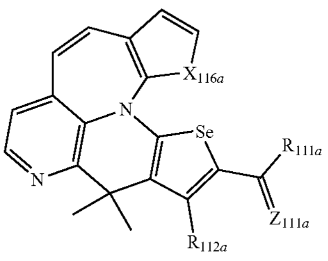

-continued

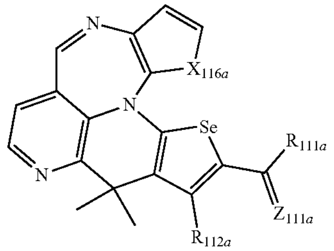

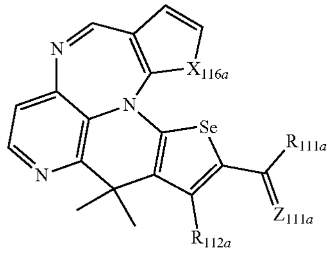

wherein, in the compounds of Groups 1 to 3, $R_{111a}$ to $R_{114a}$ are each independently as described for $R_{111}$ in claim 1, $Z_{111a}$ is as described for $Z_{111}$ in claim 1, and $X_{116a}$ is as described for $X_{116}$ in claim 1.

4. The organic photodiode of claim 1, wherein the compound represented by Formula 120 is a compound represented by Formula 121 or 122:

Formula 121

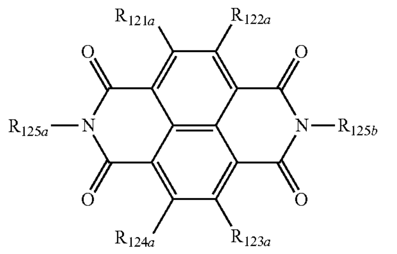

Formula 122

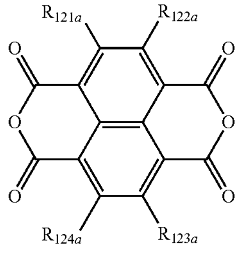

wherein, in Formulae 121 and 122, $R_{121a}$ to $R_{124a}$ are each independently hydrogen, deuterium, halogen, a cyano group, a $C_1$-$C_{30}$ alkyl group, a $C_6$-$C_{30}$ aryl group, or a $C_3$-$C_{30}$ heteroaryl group, $R_{125a}$ and $R_{125b}$ are each independently: hydrogen, deuterium, halogen, a cyano group, a $C_1$-$C_{30}$ alkyl group unsubstituted or substituted with at least one $R_{10a}$, a $C_6$-$C_{30}$ aryl group unsubstituted or substituted with at least one $R_{10a}$, or a $C_3$-$C_{30}$ heteroaryl group unsubstituted or substituted with at least one $R_{10a}$, and $R_{10a}$ is: deuterium, a halogen group, or a cyano group; a $C_1$-$C_{30}$ alkyl group or a $C_2$-$C_{30}$ alkenyl group, each substituted with deuterium, a halogen group, a cyano group, a $C_3$-$C_{30}$ carbocyclic group, a $C_1$-$C_{30}$ heterocyclic group, or a combination thereof; or a $C_3$-$C_{30}$ carbocyclic group or a $C_1$-$C_{30}$ heterocyclic group, each substituted with deuterium, a halogen group, a cyano group, a $C_1$-$C_{30}$ alkyl group, a $C_2$-$C_{30}$ alkenyl group, or a combination thereof.

5. The organic photodiode of claim 1, wherein a compound represented by Formula 120 is selected from the following compounds:

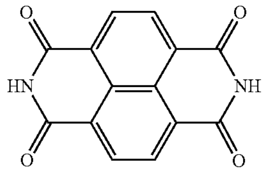

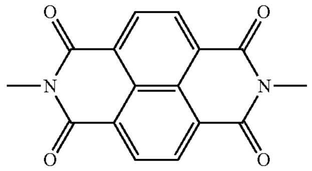

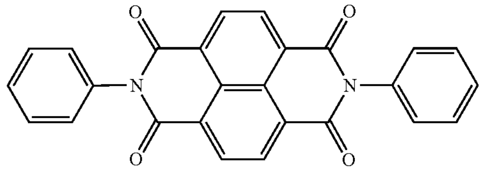

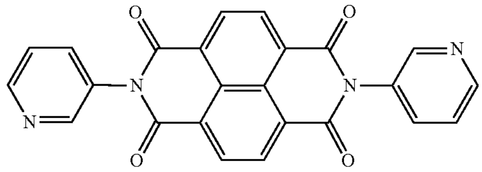

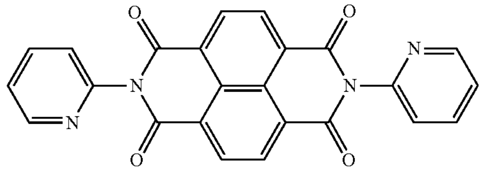

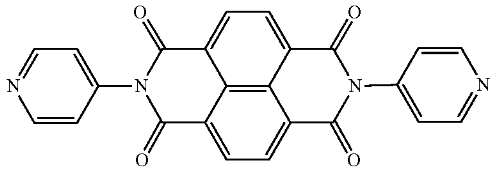

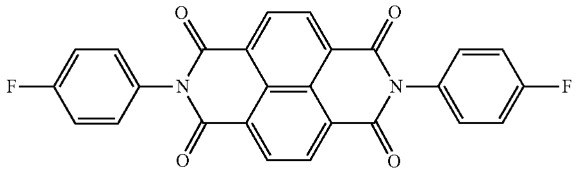

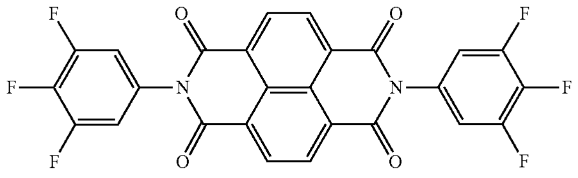

-continued

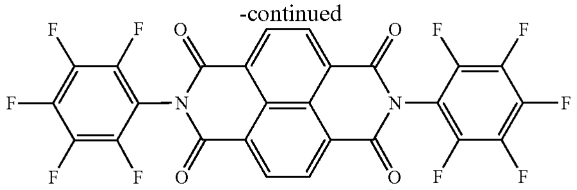

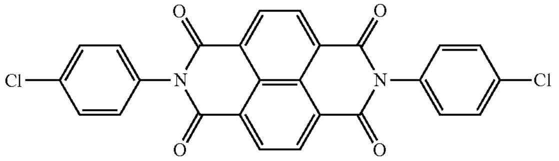

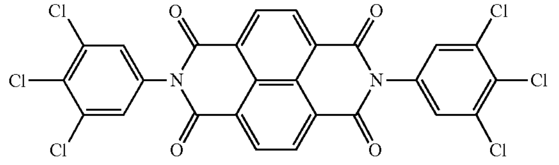

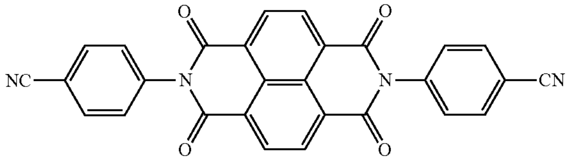

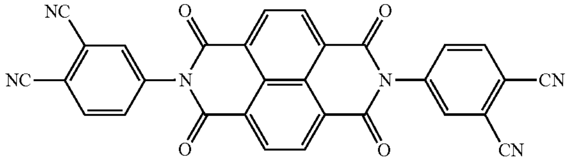

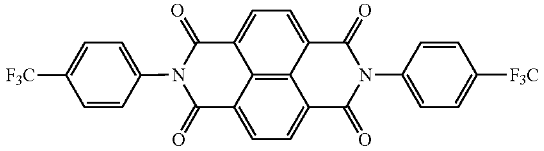

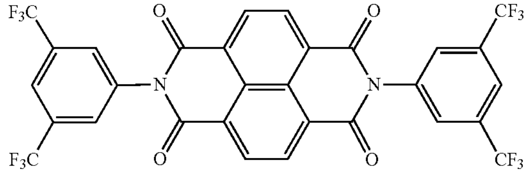

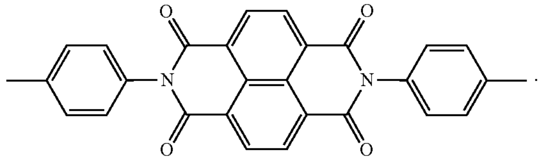

6. The organic photodiode of claim 1, wherein:

the acceptor layer further comprises a second acceptor layer, and the second acceptor layer comprises a third acceptor compound represented by Formula 120.

7. The organic photodiode of claim 6, wherein the third acceptor compound is identical to any one selected from the first acceptor compound and the second acceptor compound.

8. The organic photodiode of claim 6, wherein the third acceptor compound is different from the first acceptor compound and the second acceptor compound.

9. The organic photodiode of claim 6, wherein the donor layer is in contact with the first acceptor layer.

10. The organic photodiode of claim 6, wherein the donor layer is in contact with the second acceptor layer.

11. The organic photodiode of claim 6, wherein:

the acceptor layer further comprises a third acceptor layer comprising a fourth acceptor compound, and the first acceptor layer is located between the second acceptor layer and the third acceptor layer.

12. The organic photodiode of claim 11, wherein the third acceptor compound of the second acceptor layer and the fourth acceptor compound of the third acceptor layer are identical to each other.

13. An electronic apparatus comprising:

a substrate; and at least one organic light-emitting device and at least one organic photodiode according to claim 1 on the substrate.

14. The electronic apparatus of claim 13, wherein:

the at least one organic light-emitting device comprises two or more organic light-emitting devices, and each organic light-emitting device of the two or more organic light-emitting devices comprises a pixel electrode, an emission layer, and the common electrode.

15. The electronic apparatus of claim 13, wherein:

the at least one organic light-emitting device comprises a first light-emitting device, a second light-emitting device, and a third light-emitting device, the first light-emitting device sequentially comprises a second electrode, a first emission layer, and the common electrode, the second light-emitting device sequentially comprises a third electrode, a second emission layer, and the common electrode, and the third light-emitting device sequentially comprises a fourth electrode, a third emission layer, and the common electrode.

16. The electronic apparatus of claim 15, wherein:

the first light-emitting device emits red light, the second light-emitting device emits green light, and the third light-emitting device emits blue light.

17. The electronic apparatus of claim 15, further comprising:

a first common layer between the first electrode and the photoactive layer, between the second electrode and the first emission layer, between the third electrode and the second emission layer, and between the fourth electrode and the third emission layer, and a second common layer between the photoactive layer and the common electrode, between the first emission layer and the common electrode, between the second emission layer and the common electrode, and between the third emission layer and the common electrode.

18. The electronic apparatus of claim 17, wherein:

the first common layer comprises at least one selected from a hole injection layer, a hole transport layer, and an electron blocking layer, and the second common layer comprises at least one selected from a buffer layer, a hole blocking layer, an electron transport layer, and an electron injection layer.

19. The electronic apparatus of claim 16, wherein the at least one organic photodiode detects light emitted from the second light-emitting device and reflected from a subject.

20. The electronic apparatus of claim 13, wherein:

the at least one organic light-emitting device and the at least one organic photodiode form one pixel, and the electronic apparatus further comprises a plurality of the pixels.

* * * * *